(12) United States Patent
Shedd et al.

(10) Patent No.: US 9,901,008 B2
(45) Date of Patent: Feb. 20, 2018

(54) REDUNDANT HEAT SINK MODULE

(71) Applicant: EBULLIENT LLC, Madison, WI (US)

(72) Inventors: Timothy A. Shedd, Madison, WI (US); Brett A. Lindeman, Madison, WI (US)

(73) Assignee: EBULLIENT, INC., Madison, WI (US)

( * ) Notice: Subject to any disclaimer, the term of this patent is extended or adjusted under 35 U.S.C. 154(b) by 308 days.

(21) Appl. No.: 14/623,524

(22) Filed: Feb. 17, 2015

(65) Prior Publication Data

US 2016/0120064 A1 Apr. 28, 2016

Related U.S. Application Data

(63) Continuation-in-part of application No. 14/604,727, filed on Jan. 25, 2015, and a continuation-in-part of application No. 14/612,276, filed on Feb. 2, 2015.

(Continued)

(51) Int. Cl.
| | |
|---|---|
| *F25D 23/12* | (2006.01) |
| *H05K 7/20* | (2006.01) |
| *F25B 23/00* | (2006.01) |
| *F28F 3/12* | (2006.01) |
| *F25B 41/00* | (2006.01) |
| *F28F 9/26* | (2006.01) |
| *F28F 13/02* | (2006.01) |
| *F28D 15/00* | (2006.01) |

(52) U.S. Cl.
CPC ....... *H05K 7/20327* (2013.01); *F25B 23/006* (2013.01); *F25B 41/003* (2013.01);
(Continued)

(58) Field of Classification Search
CPC ...... F25B 20/006; F25B 41/003; F28D 15/00; F28F 9/26; F28F 13/02; F28F 3/12;
(Continued)

(56) References Cited

U.S. PATENT DOCUMENTS

| | | |
|---|---|---|
| 3,406,244 A | 10/1968 | Sevgin |
| 4,352,392 A | 10/1982 | Eastman |
| 4,493,010 A | 1/1985 | Morrison et al. |
| 5,103,897 A | 4/1992 | Cullimore et al. |
| 5,383,340 A | 1/1995 | Larson et al. |
| 5,412,536 A | 5/1995 | Anderson et al. |
| 5,421,536 A | 6/1995 | Hertel et al. |

(Continued)

FOREIGN PATENT DOCUMENTS

| | | |
|---|---|---|
| EP | 1519646 A2 | 3/2005 |
| EP | 1143778 B1 | 12/2006 |

(Continued)

OTHER PUBLICATIONS

Bar-Cohen, Thermal Management of Electronic Components with Dielectric Liquids, JSME International Journal, 1993, Series B, vol. 36, No. 1, The Japan Society of Mechanical Engineers, Japan.

(Continued)

*Primary Examiner* — Joseph Trpisovsky
(74) *Attorney, Agent, or Firm* — Nicholas J. Boyarski

(57) ABSTRACT

A redundant heat sink module can include a first independent coolant pathway and a second independent coolant pathway. The first independent coolant pathway can include a first inlet chamber, a first outlet chamber, and a first plurality of orifices extending from the first inlet chamber to the first outlet chamber and providing a first plurality of impinging jet streams of coolant against a first region of a surface to be cooled when pressurized coolant is provided to the first inlet chamber. The second independent coolant pathway can include a second inlet chamber, a second outlet chamber, and a second plurality of orifices extending from the second inlet chamber to the second outlet chamber and providing a second plurality of impinging jet streams of coolant against a second region of the surface to be cooled when pressurized coolant is provided to the second inlet chamber.

17 Claims, 64 Drawing Sheets

Related U.S. Application Data

(60) Provisional application No. 62/069,301, filed on Oct. 27, 2014, provisional application No. 62/072,421, filed on Oct. 29, 2014, provisional application No. 62/099,200, filed on Jan. 1, 2015.

(52) U.S. Cl.
CPC ................ *F28D 15/00* (2013.01); *F28F 3/12* (2013.01); *F28F 9/26* (2013.01); *F28F 13/02* (2013.01)

(58) Field of Classification Search
CPC ............. H05K 7/20345; H05K 7/2029; H05K 7/20809; H01L 23/4735; H01L 23/46; H01L 23/473
USPC ............................. 62/64, 62, 517, 373, 259.2
See application file for complete search history.

(56) References Cited

U.S. PATENT DOCUMENTS

| | | | |
|---|---|---|---|
| 5,587,880 A | 12/1996 | Phillips et al. | |
| 5,634,351 A | 6/1997 | Larson et al. | |
| 5,704,416 A | 1/1998 | Larson et al. | |
| 5,761,045 A | 6/1998 | Olson et al. | |
| 5,924,482 A | 7/1999 | Edwards et al. | |
| 5,940,270 A | 8/1999 | Puckett | |
| 6,115,251 A | 9/2000 | Patel et al. | |
| 6,222,264 B1 | 4/2001 | Liao et al. | |
| 6,230,791 B1 * | 5/2001 | Van Dine | H01L 23/473 |
| | | | 165/168 |
| 6,349,554 B2 | 2/2002 | Patel et al. | |
| 6,498,725 B2 | 12/2002 | Cole et al. | |
| 6,519,955 B2 | 2/2003 | Marsala | |
| 6,580,609 B2 | 6/2003 | Pautsch | |
| 6,580,610 B2 | 6/2003 | Morris et al. | |
| 6,594,149 B2 | 7/2003 | Yamada et al. | |
| 6,598,911 B2 | 7/2003 | Mejean et al. | |
| 6,646,879 B2 | 11/2003 | Pautsch | |
| 6,679,081 B2 | 1/2004 | Marsala | |
| 6,687,124 B2 | 2/2004 | Ostby | |
| 6,845,625 B1 | 1/2005 | Pokharna | |
| 6,866,092 B1 | 3/2005 | Molivadas | |
| 6,877,327 B2 * | 4/2005 | Newman | F25D 3/11 |
| | | | 62/374 |
| 6,948,556 B1 | 9/2005 | Anderson et al. | |
| 6,958,911 B2 | 10/2005 | Cader et al. | |
| 6,981,542 B2 | 1/2006 | Lopatinsky et al. | |
| 6,990,816 B1 | 1/2006 | Zuo et al. | |
| 7,042,726 B2 | 5/2006 | Cader et al. | |
| 7,174,738 B2 | 2/2007 | Scott | |
| 7,283,360 B2 | 10/2007 | Chang et al. | |
| 7,484,552 B2 | 2/2009 | Pfahnl | |
| 7,522,417 B2 | 4/2009 | Pautsch et al. | |
| 7,791,885 B2 | 9/2010 | Agostini et al. | |
| 8,000,103 B2 | 8/2011 | Lipp et al. | |
| 8,184,436 B2 | 5/2012 | Campbell et al. | |
| 8,188,595 B2 | 5/2012 | Shuja | |
| 8,240,362 B2 | 8/2012 | Eriksen | |
| 8,245,764 B2 | 8/2012 | Eriksen | |
| 8,274,787 B2 | 9/2012 | Alyaser et al. | |
| 8,322,154 B2 | 12/2012 | Campbell et al. | |
| 8,490,419 B2 | 7/2013 | Zrodnikov et al. | |
| 8,550,372 B2 | 10/2013 | Shedd et al. | |
| 8,724,315 B2 | 5/2014 | Branton | |
| 8,746,330 B2 | 6/2014 | Lyon | |
| 8,749,968 B1 | 6/2014 | Branton | |
| 8,806,749 B2 | 8/2014 | Campbell et al. | |
| 8,851,154 B2 | 10/2014 | Cheng et al. | |
| 8,867,209 B2 | 10/2014 | Campbell et al. | |
| 2002/0080584 A1 | 6/2002 | Prasher et al. | |
| 2002/0135979 A1 | 9/2002 | Estes et al. | |
| 2002/0152761 A1 | 10/2002 | Patel et al. | |
| 2003/0205364 A1 | 11/2003 | Sauciuc et al. | |
| 2004/0036161 A1 | 2/2004 | Williams et al. | |
| 2004/0221604 A1 | 11/2004 | Ota et al. | |
| 2005/0039889 A1 | 2/2005 | Huang | |
| 2005/0068724 A1 | 3/2005 | Pokharna et al. | |
| 2005/0072177 A1 * | 4/2005 | Hale | F28F 13/02 |
| | | | 62/310 |
| 2005/0128705 A1 | 6/2005 | Chu et al. | |
| 2005/0185378 A1 | 8/2005 | Tilton et al. | |
| 2005/0199372 A1 | 9/2005 | Frazer et al. | |
| 2005/0219820 A1 | 10/2005 | Belady et al. | |
| 2005/0284615 A1 | 12/2005 | Parish et al. | |
| 2006/0002080 A1 | 1/2006 | Leija et al. | |
| 2006/0026983 A1 | 2/2006 | Tilton et al. | |
| 2006/0117782 A1 * | 6/2006 | Rini | F25B 1/00 |
| | | | 62/310 |
| 2006/0187638 A1 | 8/2006 | Vinson et al. | |
| 2006/0196627 A1 * | 9/2006 | Shedd | H01L 23/4735 |
| | | | 164/371 |
| 2006/0250773 A1 | 11/2006 | Campbell et al. | |
| 2006/0258209 A1 | 11/2006 | Hall | |
| 2006/0289987 A1 | 12/2006 | Chiu | |
| 2007/0119568 A1 | 5/2007 | Weber et al. | |
| 2007/0256810 A1 | 11/2007 | Stefano et al. | |
| 2007/0289317 A1 | 12/2007 | Minor et al. | |
| 2007/0295480 A1 | 12/2007 | Campbell et al. | |
| 2008/0041574 A1 | 2/2008 | Arik et al. | |
| 2008/0093054 A1 | 4/2008 | Tilton et al. | |
| 2008/0170368 A1 | 7/2008 | Chen et al. | |
| 2008/0186670 A1 | 8/2008 | Lyon et al. | |
| 2008/0295535 A1 | 12/2008 | Robinet et al. | |
| 2009/0020266 A1 | 1/2009 | Weber et al. | |
| 2009/0032937 A1 | 2/2009 | Mann et al. | |
| 2009/0034184 A1 | 2/2009 | Atallah | |
| 2009/0113905 A1 | 5/2009 | Ericsson | |
| 2009/0272144 A1 | 11/2009 | Lin | |
| 2010/0101765 A1 | 4/2010 | Campbell et al. | |
| 2010/0252238 A1 | 10/2010 | Batty et al. | |
| 2010/0254758 A1 | 10/2010 | Campbell et al. | |
| 2011/0085301 A1 | 4/2011 | Dunn | |
| 2011/0277491 A1 | 11/2011 | Wu et al. | |
| 2011/0290448 A1 | 12/2011 | Campbell et al. | |
| 2011/0313576 A1 | 12/2011 | Nicewonger | |
| 2012/0020022 A1 | 1/2012 | Peterson et al. | |
| 2012/0026745 A1 | 2/2012 | Cheng et al. | |
| 2012/0175094 A1 | 7/2012 | Rice | |
| 2012/0227429 A1 | 9/2012 | Louvar et al. | |
| 2012/0267077 A1 | 10/2012 | Dede | |
| 2012/0324911 A1 | 12/2012 | Shedd | |
| 2012/0325436 A1 | 12/2012 | Shedd | |
| 2013/0008628 A1 * | 1/2013 | Tiengtum | G01R 31/2874 |
| | | | 165/100 |
| 2013/0027884 A1 | 1/2013 | Campbell et al. | |
| 2013/0077247 A1 | 3/2013 | Campbell et al. | |
| 2013/0138253 A1 | 5/2013 | Chainer et al. | |
| 2013/0139998 A1 | 6/2013 | Hayashi et al. | |
| 2013/0308271 A1 | 11/2013 | Pal | |
| 2013/0340995 A1 | 12/2013 | David et al. | |
| 2014/0076523 A1 | 3/2014 | Pritzker et al. | |
| 2014/0124163 A1 | 5/2014 | Campbell et al. | |
| 2014/0137582 A1 | 5/2014 | Louvar et al. | |
| 2014/0144608 A1 * | 5/2014 | Zeng | G06F 1/203 |
| | | | 165/104.25 |
| 2014/0190665 A1 | 7/2014 | Joshi et al. | |
| 2014/0307389 A1 | 10/2014 | Arvelo et al. | |

FOREIGN PATENT DOCUMENTS

| | | | |
|---|---|---|---|
| EP | 1298975 B1 | 7/2009 | |
| FR | 2911247 A1 * | 7/2008 | ......... H01L 23/4735 |
| GB | 977090 | 12/1964 | |
| GB | 980413 | 1/1965 | |
| WO | 9839955 A | 9/1998 | |
| WO | 2005099888 A1 | 10/2005 | |

OTHER PUBLICATIONS

Horacek et al, Spray Cooling Using Multiple Nozzles: Visualization and Wall Heat Transfer Measurements, IEEE Transactions on Device and Materials Reliability, Dec. 2004, vol. 4, No. 4.

(56) References Cited

OTHER PUBLICATIONS

Horacek et al., Effects of Noncondensable Gas and Subcooling on the Spray Cooling of an Isothermal Surface, Proceedings of ASME International Mechanical Engineering Congress and Exposition 2003, Washington, D.C., Paper No. IMECE2003-41680. Heat Transfer, vol. 4 Washington, DC.

Horacek et al., Single Nozzle Spray Cooling Heat Transfer Mechanisms, International Journal of Heat and Mass Transfer, 2005, p. 1425-1438, vol. 48, Elsevier Ltd.

HFC-245fa Product Stewardship Summary (Honeywell); Dec. 2007; retrieved from internet on Jan. 25, 2016; URL:<https://www51.honeywell.com/sm/common/documents/Public-Ris-Summary-HFC-245fa.pdf>.

Honeywell Refrigerants: Genetron 245fa; Dec. 22, 2013; Retrieved from the Internet on Jan. 25, 2016; URL<https://web.archive.org/web/20131222085005/http:www.honeywell-refrigerants.com/americas/product/genetron-245fa>.

International Search Report and Written Opinion in PCT/US15/55379 dated Jan. 6, 2016.

International Search Report and Written Opinion in PCT/US15/55616 dated Feb. 5, 2016.

International Search Report and Written Opinion in PCT/US15/55841 dated Feb. 12, 2016.

International Search Report and Written Opinion in PCT/US15/56025 dated Feb. 4, 2016.

International Search Report and Written Opinion in PCT/US15/56129 dated Jan. 12, 2016.

International Search Report and Written Opinion in PCT/US15/56280 dated Jan. 19, 2016.

International Search Report and Written Opinion in PCT/US15/57252 dated Jan. 14, 2016.

International Search Report and Written Opinion in PCT/US15/57262 dated Jan. 14, 2016.

Jekel et al., Liquid Refrigerant Pumping in Industrial Refrigeration Systems, ASHRAE Journal, Aug. 2011, p. 36-44.

Zhou et al, Visualization of Bubble Behavior for Jet Impingement Cooling with Phase Change, 14th IEEE ITHERM Conference, 2014.

\* cited by examiner

SECTION B-B

SECTION A-A

SECTION B-B

SECTION A-A

SECTION B-B

SECTION C-C

SECTION D-D

SECTION B-B (a) Bubbly Flow  (b) Bubbly Flow  (c) Slug Flow  (d) Churn Flow  (e) Annular Flow

REDUNDANT HEAT SINK MODULE

CROSS-REFERENCE TO RELATED APPLICATIONS

This application is a continuation-in-part of U.S. patent application Ser. No. 13/169,355 filed Jun. 27, 2011; U.S. patent application Ser. No. 13/169,377 file Jun. 27, 2011; U.S. patent application Ser. No. 14/604,727 filed Jan. 25, 2015; and U.S. patent application Ser. No. 14/612,276 filed on Feb. 2, 2015 and claims the benefit of U.S. Provisional Patent Application No. 62/069,301 filed Oct. 27, 2014; U.S. Provisional Patent Application No. 62/072,421 filed Oct. 29, 2014; and U.S. Provisional Patent Application No. 62/099,200 filed Jan. 1, 2015, each of which is hereby incorporated by reference in its entirety as if fully set forth in this description.

FIELD

This disclosure relates to methods and apparatuses for cooling one or more heat sources, such as one or more heat sources associated with an electrical, mechanical, chemical, or electromechanical device or process.

BACKGROUND

Maintaining electronic devices, such as microprocessors in servers, within safe operating temperature ranges is a challenging problem that is only increasing in importance and difficulty as semiconductor technology continues to progress and as popularity of cloud storage continues to grow. State of the art microprocessors can easily produce more than 40 thermal watts per square centimeter, and power electronic devices can produce more than 120 thermal watts per square centimeter.

There is a need to cool these devices efficiently. According to the U.S. Department of Energy, nearly three percent of all electricity used in the United States is devoted to powering data centers and computer facilities. Approximately half of this electricity goes toward power conditioning and cooling. Increasing the efficiency of cooling systems for data centers and computer facilities would lead to dramatic savings in energy nationwide. More efficient cooling systems are also needed in transportation systems due to increasing adoption of hybrid and electric vehicles that rely on complex electrical components, including batteries, inverters, and electric motors, that produce significant amounts of heat that must be dissipated. Cooling systems capable of more efficiently cooling these electrical components would translate to an increase in range and utility for these vehicles.

The majority of computer systems in residential and commercial settings are cooled using forced air cooling systems in which room air is forced, by one or more fans, over finned heat sinks mounted on microprocessors, power supplies, or other electronic devices. The heat sinks add mass and cost to the computers and place mechanical stress on the electronic components to which they are mounted. If a computer is subject to vibration, such as vibration caused by a fan, a heat sink mounted on top of a microprocessor can oscillate in response to the vibration and can fatigue the electrical connections that attach the microprocessor to the motherboard of the computer.

Another downside of air cooling systems is that cooling fans commonly operate at high speeds and can be quite noisy. As air passes over electronic devices, the air, which is at a lower temperature than the surfaces of the electronic devices, absorbs heat from the electronic devices, thereby cooling the devices. These air cooling systems are inherently limited in terms of performance and efficiency due to the low volumetric heat capacity of air, which is much lower than the volumetric heat capacity of water and other coolants. Because air has such a low heat capacity, high flow rates are required to ensure adequate cooling of even relatively small heat loads. For instance, a flow rate of about 5 to 10 cubic feet per minute (cfm) of air is needed to cool a 100-watt heat load. For heat sources such as microprocessors, which as mentioned above can easily produce more than 40 watts per square centimeter, very high volumetric flow rates are required to prevent overheating. For an installation of one rack of servers, which is commonly used in computer rooms at small businesses and schools, two air conditioning units sized for a typical U.S. home are required to cool the computer room. Typical data centers, which can have several hundred racks of servers, must be equipped with special computer room air conditioning ("CRAC") units that are large and expensive and must be professionally installed, often requiring substantial modifications to the facility to accommodate the CRAC, including installation of structural supports, custom air ducting, and electrical wiring.

Many electronic devices operate less efficiently as their temperature increases. As one example, a typical microprocessor operates less efficiently as its junction temperature increases. FIG. 64 shows a plot of power consumption in watts versus junction temperature. The bottom curve shows static power consumption of a microprocessor and the top curves show total power consumption for switching speeds of 1.6 GHz and 2.4 GHz, respectively. Total power consumption includes both static power consumption and dynamic power consumption, which varies with switching frequency. As shown in FIG. 64, as the temperature of the microprocessor increases, it consumes more power to provide the same performance. In air cooling systems, it is common for fully utilized microprocessors to operate at or near their maximum rated temperature, resulting in poor operating efficiency. In the example shown in FIG. 64, the microprocessor uses over 35% more power when operating at 95 degrees C. than when operating at 45 degrees C. To conserve energy, it is therefore desirable to provide a cooling system that will allow the microprocessor to operate consistently at lower temperatures. Providing a consistently lower operating temperature for the microprocessor can also extend its useful life and can avoid unnecessary shutdown of the computer due to detection of an unsafe junction temperature.

Operating speeds of next generation microprocessors will continue to increase, as will heat fluxes (defined as heat load per unit area) produced by those next generation microprocessors. Conventional air cooling systems will soon be incapable of efficiently and effectively cooling these next generation microprocessors. To effectively cool next generation microprocessors, it is desirable to provide a cooling system that is significantly more effective and efficient than existing air cooling systems and is capable of managing high heat fluxes that will be produced by next generation microprocessors.

Pumped liquid cooling systems can provide improved thermal performance over conventional air cooling systems. Pumped liquid cooling systems typically include the following items connected by tubing: a heat sink attached to the microprocessor, a liquid-to-air heat exchanger, and a pump. A liquid coolant is circulated through the system by the pump. As the liquid coolant passes through channels in the heat sink, heat from the microprocessor is transferred through the thermally conductive heat sink to the coolant, thereby increasing the temperature of the coolant and transferring heat away from the microprocessor. The heat sink is typically designed to maximize heat transfer by maximizing the surface area of the channels through which the liquid passes. For example, the heat sink can be a micro-channel heat sink that utilizes fine fin channels through which the liquid coolant flows. The heated liquid coolant exiting the heat sink is then circulated through a liquid-to-air heat exchanger to reduce the temperature of the liquid coolant before it is circulated back to the pump for another cycle.

Use of closed liquid cooling systems is beginning to migrate from high performance computers to personal computers. Unfortunately, liquid cooling systems have performance constraints that will prevent them from effectively cooling next generation microprocessors. This is because liquid cooling systems rely solely on transferring sensible heat by increasing the temperature of a liquid coolant as it passes through a heat sink. The amount of heat that can be transferred is a function of, among other factors, the thermal conductivity of the fluid and the flow rate of the fluid. Dielectric fluids do not have sufficient thermal conductivities to be used in liquid cooling systems. Instead, water or a water-glycol mixture is commonly used due its significantly higher thermal conductivity. Unfortunately, if a leak develops in a liquid cooling system that uses water, the water can destroy the server and potentially an entire rack of servers. With the current price of a server being in the tens of thousands of dollars, many data center operators are simply unable to accept this risk of loss.

While more effective than air cooling, transferring heat by sensible heating requires significant flow rates of liquid coolant, and achieving high flow rates often necessitates high fluid pressures. Consequently, a liquid cooling system designed to cool a modern microprocessor can require a large pump, or a series of small pumps positioned throughout the liquid cooling system, to ensure an adequate liquid coolant pressure and flow rate. Operating large pumps, or a series of small pumps, uses a significant amount of energy and diminishes the efficiency of the liquid cooling system.

Although liquid cooling systems have proven adequate at cooling modern microprocessors, they will be unable to adequately cool next generation microprocessors while maintaining practical physical dimensions and specifications. For instance, to cool a next generation microprocessor, liquid cooling systems will require very high flow rates (e.g. of water), which will require large, heavy duty cooling lines (e.g. greater than ¾" outer diameter), such as rigid copper tubing or reinforced rubber cooling lines, that will be difficult to route in any practical manner in and out of a server housing. If installed in a server, these large plumbing lines will block access to electrical components within the server, thereby frustrating maintenance of the server. These large plumbing lines will also prevent drawers on a server rack from opening and closing as intended, thereby preventing the server from being easily accessed and further frustrating maintenance of the server. As mentioned above, water poses a catastrophic risk to servers, and increasing the pressure and flow rates of water in and out of servers only increases this risk. Consequently, increasing the capabilities of existing liquid cooling systems to meet the cooling requirements of next generation microprocessors is simply not a practical or viable option. Without further innovation in the area of cooling systems, the development of next-generation microprocessors will be hampered.

As noted above, liquid cooling systems commonly rely on flowing liquid water through channels in finned heat sinks. The heat sinks are often indirectly coupled to a heat source via a metal base plate, thermal paste, such as solder thermal interface material (STIM) or polymer thermal interface material (PTIM), and/or a direct bond adhesive. While this approach can be more effective than air cooling, the intervening materials between the water and the heat source (e.g. the microprocessor) induce significant thermal resistance, which reduces the overall efficiency of the cooling system. The intervening materials also add cost and time to manufacturing and installation processes, constitute additional points of failure, and create potential disposal issues. Finally, the intervening materials render the system unable to adapt to local hot spots on a heat source. Consequently, the liquid cooling system must be designed to accommodate the maximum anticipated heat load of one or more localized hot spots on the surface of the heat source (e.g. to adequately cool one hot core of a multicore processor), resulting in additional cost and complexity of the entire liquid cooling system.

Unlike water, dielectric coolants can be placed in direct contact with electronic devices and not harm them. Unfortunately, some dielectric coolants have a lower heat capacity than water, so they are not well suited for use in pumped liquid cooling systems, since they may be unable to adequately cool a microprocessor. Presently, use of dielectric coolants requires more aggressive cooling techniques, such as immersion cooling, to achieve a desired level of heat transfer.

Immersion cooling is an aggressive form of liquid cooling where an entire electronic device (e.g. a server) is submerged in a vat of dielectric coolant (e.g. HFE-7000 or mineral oil). Unfortunately, immersion cooling vats are large, costly, and heavy, especially when filled with a dielectric coolant. Existing vats hold upwards of 250 gallons of coolant can weigh more than 8,000 pounds when full of coolant. Typically, a room must be specially engineered to accommodate the immersion cooling vat, and containment systems may need to be specially designed and installed in the room as a precaution against vat failure. When using 250 gallons of coolant, the cost of the coolant becomes a significant capital expenditure. Certain coolants, such as mineral oil, can act as solvents and, over time, remove certain identifying information from a motherboard. For example, product labels (e.g. stickers containing serial numbers and bar codes) and other markings (e.g. values on capacitors and other devices) are prone to wash off in the vat, due to a continuous flow of the coolant over all portions of the electronic device. Over time, the coolant can become contaminated and may need to be replaced, resulting in an additional expense and downtime.

Another cooling approach, known as spray cooling or spray evaporative cooling, uses atomized sprays. In this approach, atomized liquid coolant is sprayed directly on a surface through air or vapor. As a result, small droplets impinge on the heated surface forming a thin film of liquid directly on a heated surface. Heat is then transferred from the heated surface to the liquid either by sensible heating of the bulk liquid or by boiling off of a fraction of the liquid (i.e. latent heating). This is a very efficient method of removing high heat fluxes from small surfaces. Unfortunately, the margin for error in spray cooling systems is very narrow and the onset of dry out and critical heat flux is a constant concern that can have catastrophic consequences. Critical heat flux is a condition where evaporation of coolant from the surface to be cooled prevents atomized liquid from reaching and cooling the surface, often resulting in run-away device temperatures and rapid failure. Great care must be taken to ensure uniform coverage of the spray on the heated surface and adequate drainage of fluid from the heated surface. Although achievable in a laboratory setting, mainstream adoption of spray cooling has been hampered by several factors. First, spray cooling requires a significant working volume to enable atomized sprays to form, which results in non-compact cooling components, making it impractical for most consumer products. Second, atomizing the liquid requires a significant amount of pressure upstream of the atomizer to generate an appropriate pressure drop at the atomizer-air interface to enable atomized sprays to form. Maintaining this amount of pressure within the system consumes a significant amount of energy. Third, high flow rates of atomized sprays are required to prevent dry out or critical heat flux from occurring. In the end, it has proven difficult to design a practical and compact spray cooling system, despite a large amount of time and effort that has been expended to do so.

In view of the foregoing discussion, efficient, scalable, high-performing methods and apparatuses are needed for cooling devices, such as microprocessors and power electronics, capable of producing high heat fluxes.

SUMMARY

This disclosure presents methods and apparatuses for cooling one or more heat sources, such as one or more heat sources associated with an electrical, mechanical, chemical, or electromechanical device or process.

In one example, a redundant heat sink module can be configured to transfer heat away from a surface to be cooled. The redundant heat sink module can include a first independent coolant pathway and a second independent coolant pathway. The first independent coolant pathway can be formed within the redundant heat sink module and can include a first inlet chamber, a first outlet chamber, and a first plurality of orifices extending from the first inlet chamber to the first outlet chamber. The first plurality of orifices can be configured to provide a first plurality of impinging jet streams of coolant against a first region of a surface to be cooled when the redundant heat sink module is mounted on the surface to be cooled and when pressurized coolant is provided to the first inlet chamber. The second independent coolant pathway can be formed within the redundant heat sink module and can include a second inlet chamber, a second outlet chamber, and a second plurality of orifices extending from the second inlet chamber to the second outlet chamber. The second plurality of orifices can be configured to provide a second plurality of impinging jet streams of coolant against a second region of the surface to be cooled when the redundant heat sink module is mounted on the surface to be cooled and when pressurized coolant is provided to the second inlet chamber.

The first plurality of orifices can have an average jet height of about 0.01-0.75, 0.05-0.5, 0.05-0.25, 0.020-0.25, 0.03-0.125, or 0.04-0.08 in. The first plurality of orifices can have an average diameter of D and an average length of L, and L divided by D can be greater than or equal to one or about 1-10, 1-8, 1-6, 1-4, or 1-3. The first plurality of orifices have an average diameter of about 0.001-0.020, 0.001-0.2, 0.001-0.150, 0.001-0.120, 0.001-0.005, 0.020-0.045, 0.030-0.050 in, or 0.040 in.

The first inlet chamber can decrease in cross-sectional area in a direction of flow, and the first outlet chamber can increase in cross-sectional area in the direction of flow. The second outlet chamber can circumscribe or be adjacent to the first outlet chamber. The first independent coolant pathway can include a hydrofoil located upstream of the first inlet chamber. The hydrofoil can have a curved surface that interacts with the flow of coolant to assist in providing an even distribution of coolant to the first plurality of orifices. The redundant heat sink module can include a flow-guiding lip proximate the first outlet chamber. A surface of the flow-guiding lip can have an angle of less than about 45 degrees with respect to a bottom plane of the redundant heat sink module.

In another example, a redundant apparatus for cooling a heat source can include a thermally conductive base member, a redundant heat sink module mounted on the thermally conductive base member, and one or more sealing members disposed between the redundant heat sink module and the thermally conductive base member. The thermally conductive base member can be placed in thermal communication with a heat source, such as a microprocessor or a power electronic device. The thermally conductive base member can include a surface to be cooled. The redundant heat sink module can include a first independent coolant pathway formed within the redundant heat sink module. The first independent coolant pathway can include a first inlet chamber, a first outlet chamber, and a first plurality of orifices configured to provide a first plurality of impinging jet streams of coolant against a first region of the surface to be cooled when pressurized coolant is provided to the first inlet chamber. The redundant heat sink module can include a second independent coolant pathway formed within the redundant heat sink module. The second independent coolant pathway can include a second inlet chamber, a second outlet chamber, and a second plurality of orifices configured to provide a second plurality of impinging jet streams of coolant against a second region of the surface to be cooled when pressurized coolant is provided to the second outlet chamber. The one or more sealing members can be disposed between a bottom surface of the redundant heat sink module and a surface of the thermally conductive base member to provide a first liquid-tight seal around a perimeter of the first outlet chamber and a second liquid-tight seal around a perimeter of the second outlet chamber.

The second region of the surface to be cooled can circumscribe the first region of the surface to be cooled. The thermally conductive base member can be a metallic base plate. The thermally conductive base member can be a heat pipe having a sealed vapor cavity.

In yet another example, a redundant heat sink module for cooling a heat providing surface can include a first independent coolant pathway and a second independent coolant pathway. The first independent coolant pathway can include a first inlet chamber formed within the redundant heat sink module and a first outlet chamber formed within the redundant heat sink module. The first outlet chamber can have a first open portion configured to be enclosed by the heat providing surface when the redundant heat sink module is sealed against the heat providing surface. The first independent coolant pathway can also include a first plurality of orifices extending from the first inlet chamber to the first outlet chamber. The second independent coolant pathway can include a second inlet chamber formed within the redundant heat sink module and a second outlet chamber formed within the redundant heat sink module. The second outlet chamber can have a second open portion configured to be enclosed by the heat providing surface when the redundant heat sink module is sealed against the heat providing surface. The second independent coolant pathway can also include a second plurality of orifices extending from the second inlet chamber to the second outlet chamber.

The first plurality of orifices can be arranged at an angle of about 20-80, 30-60, 40-50, or 45 degrees with respect to a bottom plane of the redundant heat sink module. The first plurality of orifices can be arranged in an array organized into staggered columns and staggered rows such that a given orifice in a given column and a given row does not have a corresponding orifice in a neighboring row in the given column or a corresponding orifice in a neighboring column in the given row.

The redundant heat sink module can include a plurality of anti-pooling orifices extending from the first inlet chamber to a rear wall of the first outlet chamber. The plurality of anti-pooling orifices can be configured to deliver a plurality of anti-pooling jet streams of coolant to a rear portion of the first outlet chamber when pressurized coolant is provided to the first inlet chamber. The first inlet chamber can have a volume of about 0.01-0.02, 0.01-0.05, 0.04-0.08, 0.07-0.15, 0.1-0.2, 0.15-0.25, 0.2-0.4, 0.3-0.5 in$^3$.

The redundant heat sink module can include one or more boiling-inducing members extending into the first outlet chamber toward the heat providing surface. A clearance distance can be provided between end portions of the boiling-inducing members and a bottom plane of the redundant heat sink module. The clearance distance can be about 0.001-0.0125, 0.001-0.05, 0.001-0.02, 0.001-0.01, or 0.005-0.010 in.

The first independent coolant pathway can include an upwardly angled inlet port fluidly connected to the first inlet chamber. The upwardly angled inlet port can have a central axis that defines an angle of about 10-80, 20-70, 30-60, or 40-50 degrees with respect to a bottom plane of the redundant heat sink module. The redundant heat sink module can include additional upwardly angled ports.

Additional objects and features of the invention are introduced below in the Detailed Description and shown in the drawings. While multiple embodiments are disclosed, still other embodiments will become apparent to those skilled in the art from the following Detailed Description, which shows and describes illustrative embodiments. As will be realized, the disclosed embodiments are susceptible to modifications in various aspects, all without departing from the scope of the present disclosure. Accordingly, the drawings and detailed description are to be regarded as illustrative in nature and not restrictive.

This Summary is provided to introduce a selection of concepts in a simplified form that are further described in the Detailed Description below. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTIONS OF DRAWINGS

Figure 5:
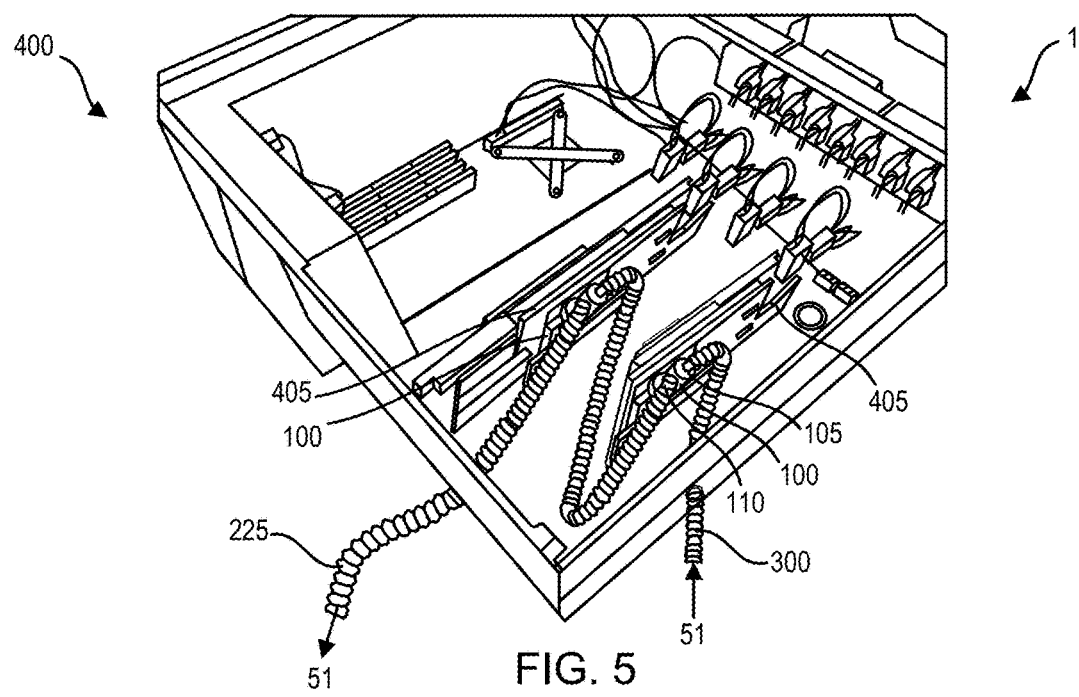

FIG. 5 shows a top perspective view of a server with its lid removed and a portion of a cooling apparatus installed within the server, the cooling apparatus having a two heat sink modules mounted on vertically-arranged heat-generating components within the server, the heat sink modules arranged in a series configuration and fluidly connected with sections of flexible tubing to transport coolant from an outlet port of a first heat sink module to an inlet port of a second heat sink module.

Figure 6:
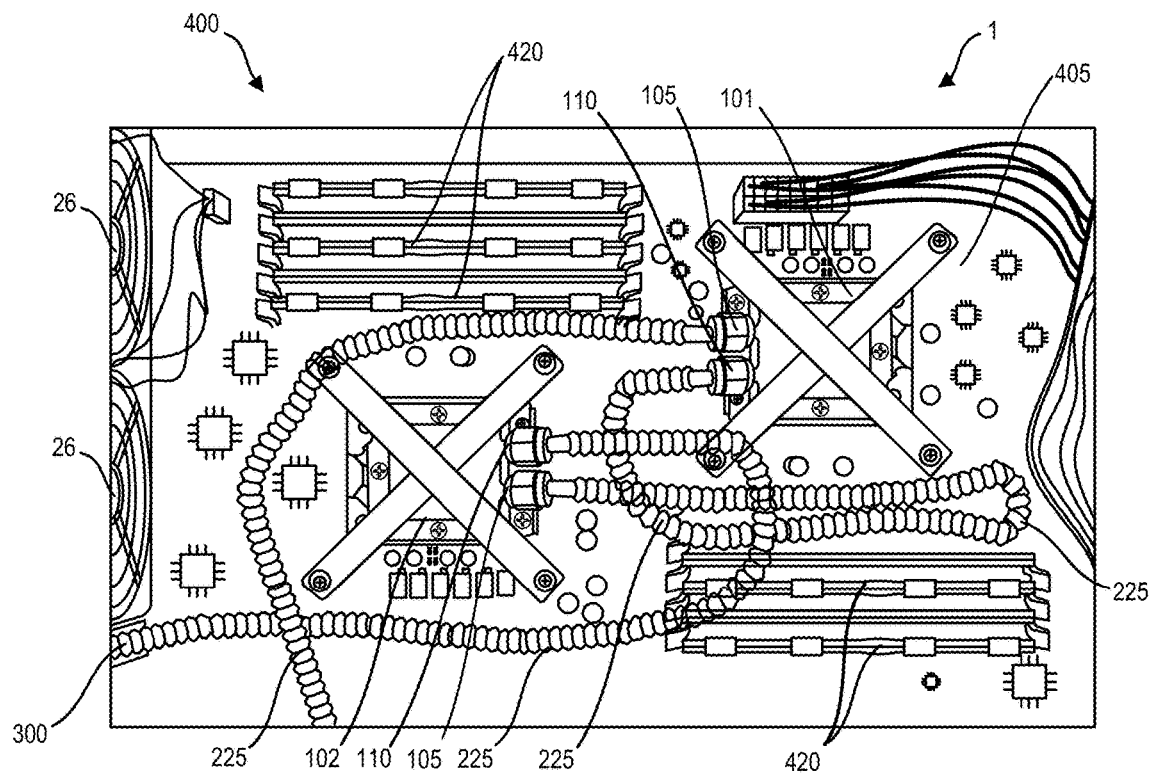

FIG. 6 shows a top view of a server with its lid removed and a portion of a cooling apparatus installed within the server, the cooling apparatus including two heat sink modules mounted on horizontally-oriented microprocessors within the server, the heat sink modules arranged in a series configuration and held down with mounting brackets and fluidly connected with a section of flexible tubing to transport coolant from an outlet port of a first heat sink module to an inlet port of a second heat sink module.

Figure 7:
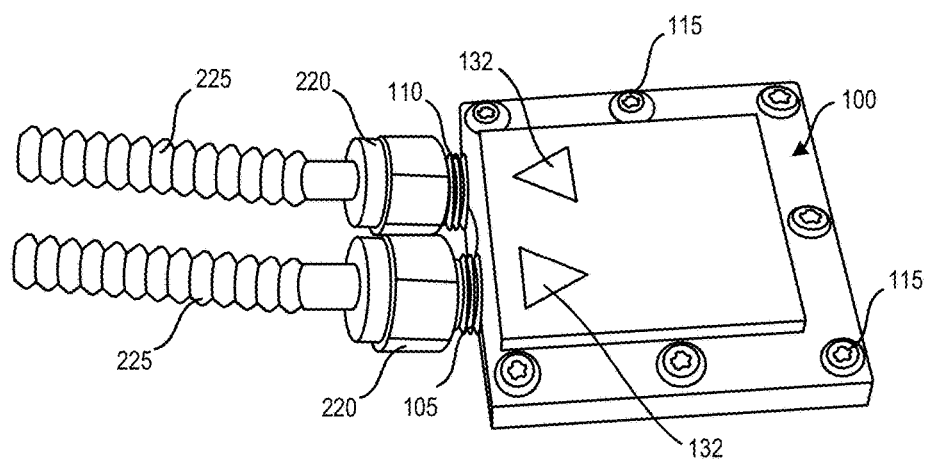

FIG. 7 shows a cooling assembly including a heat sink module, a first section of flexible tubing fluidly connected to an inlet port of the heat sink module, and a second section of flexible tubing fluidly connected to an outlet port of the heat sink module.

Figure 8:
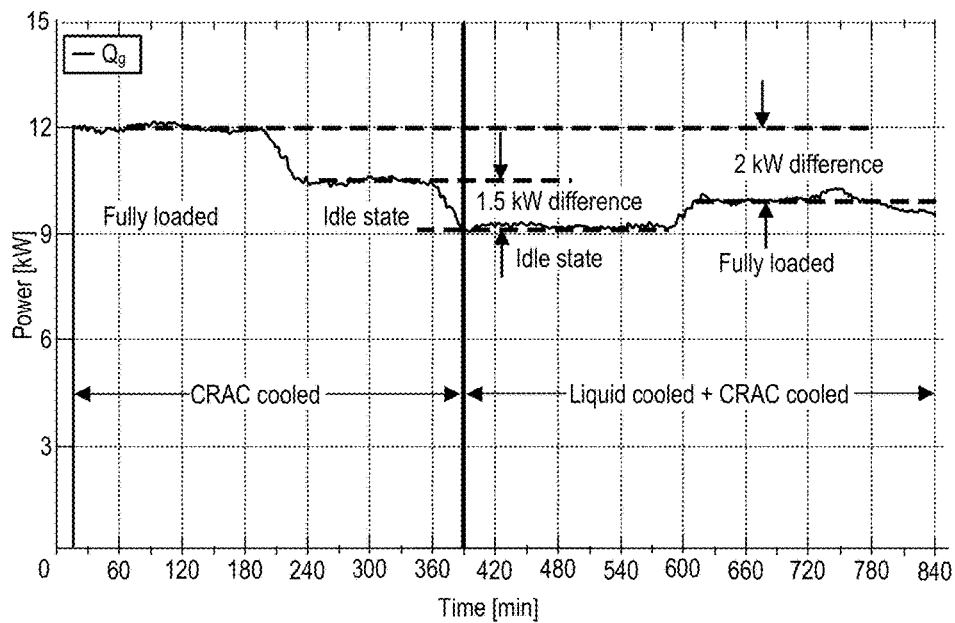

FIG. 8 shows a plot of power consumption versus time for a computer room with forty active dual-processor servers initially cooled by a CRAC and then cooled by the CRAC and a cooling apparatus, where the cooling apparatus provides substantial reductions in power consumption despite being installed on just ten of the forty servers in the computer room.

Figure 1:
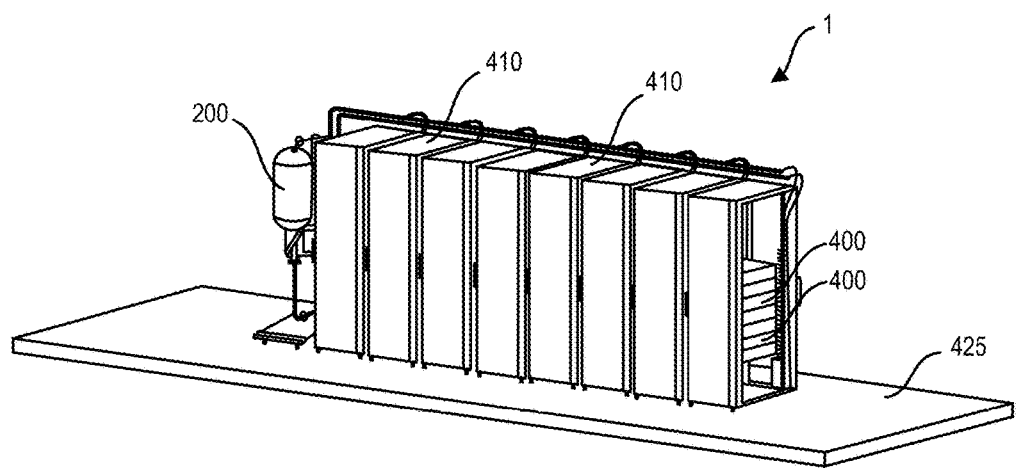
FIG. 1 shows a front perspective view of a cooling apparatus installed on a plurality of servers arranged in eight racks in a data center.
Figure 9:
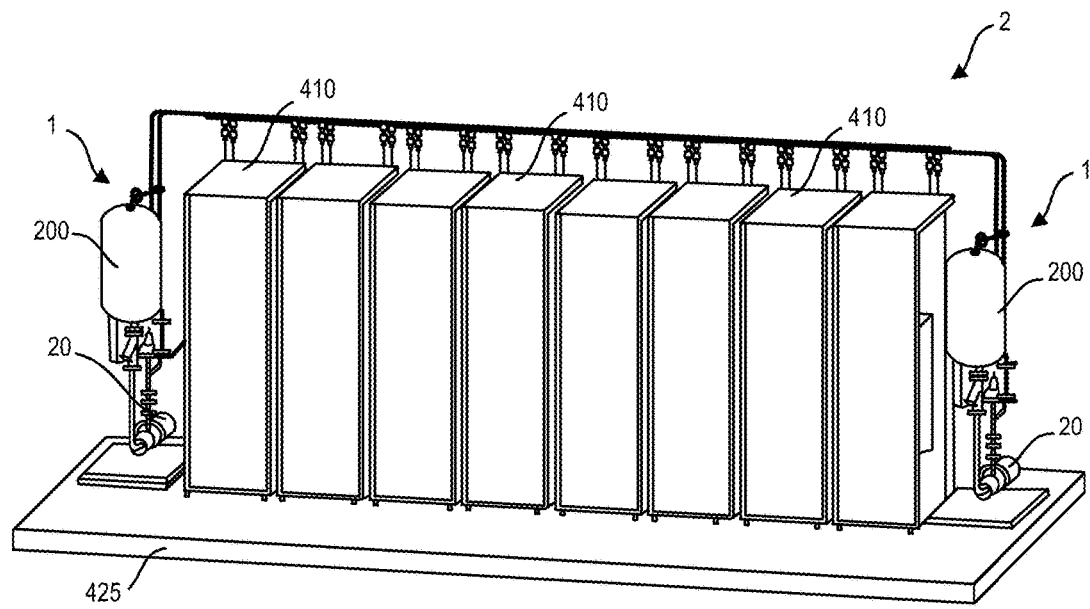

FIG. 9 shows a front perspective view of a redundant cooling apparatus installed on eight racks of servers in a data center where the redundant cooling apparatus includes a first independent cooling system as shown in FIG. 1 and a second independent cooling system as shown in FIG. 1.

Figure 10:
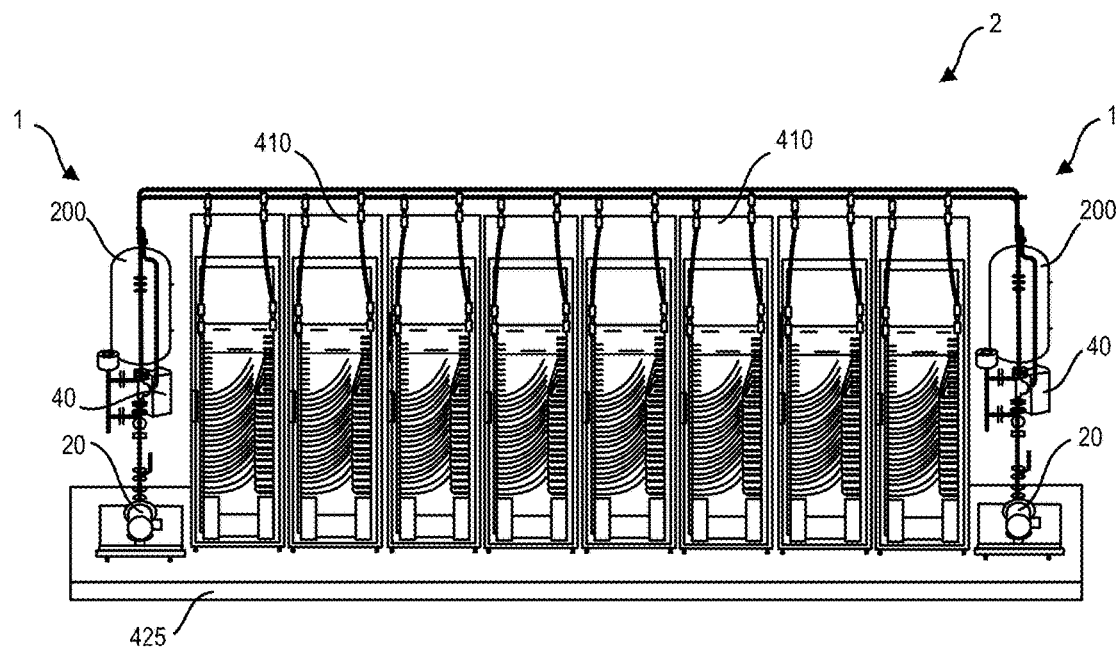

FIG. 10 shows a rear view of the redundant cooling apparatus of FIG. 9.

Figure 11A:
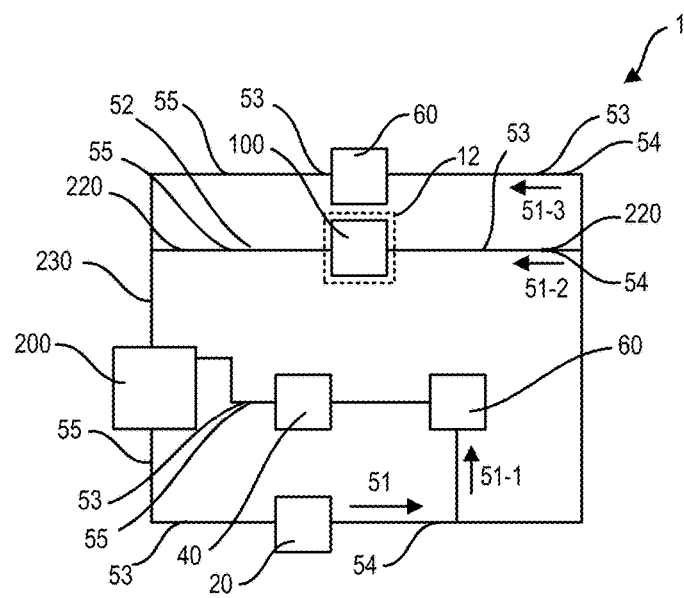

FIG. 11A shows a schematic of a cooling apparatus having one heat sink module mounted on a heat-generating surface and fluidly connected to a primary cooling loop, the cooling apparatus having a first bypass including a first pressure regulator and a heat exchanger and a second bypass including a second pressure regulator.

Figure 11B:
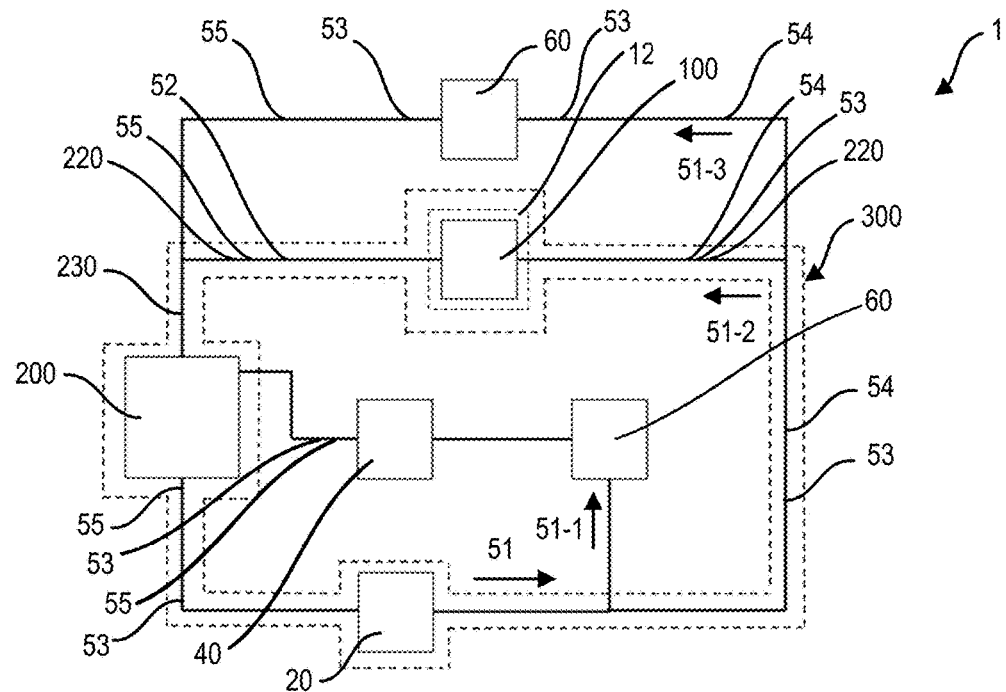

FIG. 11B shows the schematic of FIG. 11A with the primary cooling loop identified by dashed lines.

Figure 11C:
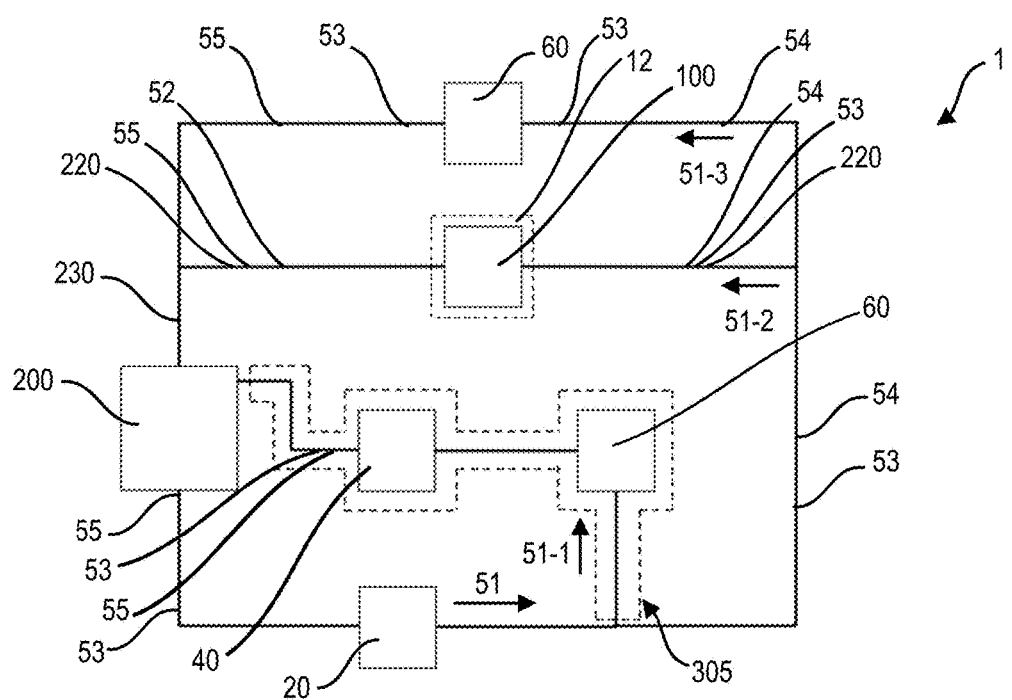

FIG. 11C shows the schematic of FIG. 11A with the first bypass identified by dashed lines.

Figure 11D:
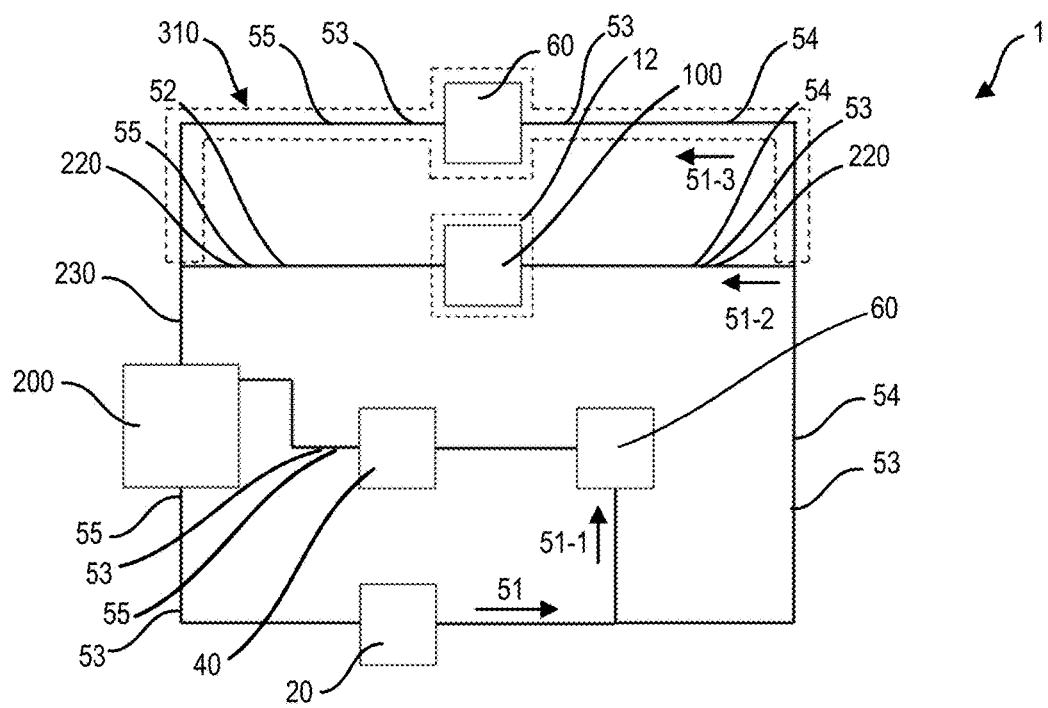

FIG. 11D shows the schematic of FIG. 11A with the second bypass identified by dashed lines.

Figure 12A:
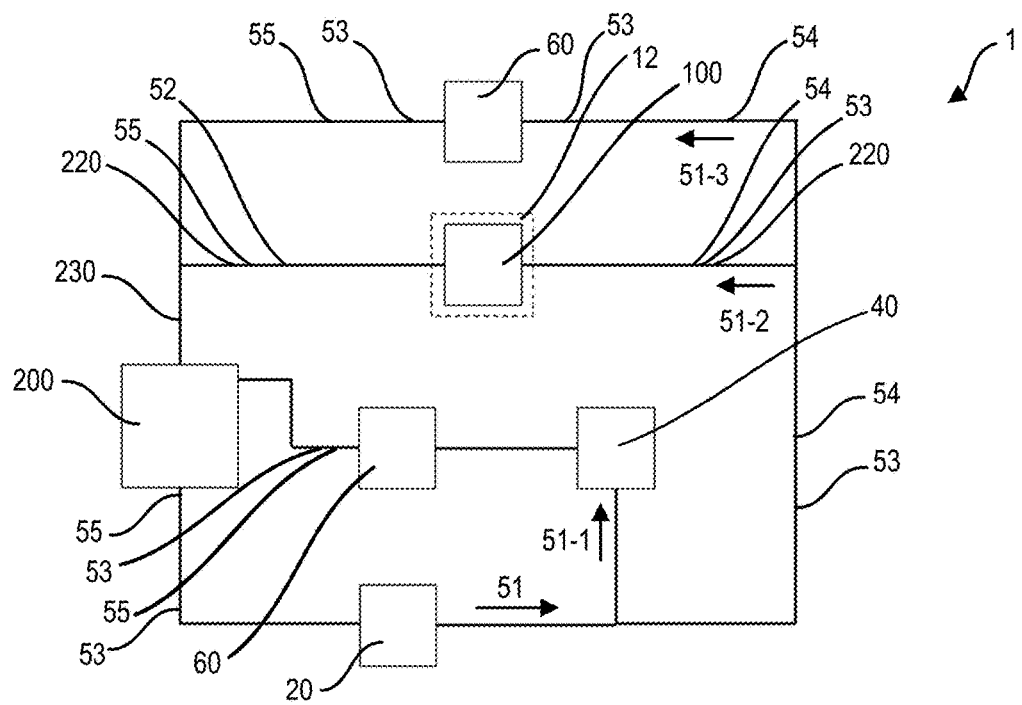

FIG. 12A shows a schematic of a cooling apparatus having one heat sink module mounted on a heat source and a pressure regulator located downstream of a heat exchanger in a first bypass.

Figure 12B:
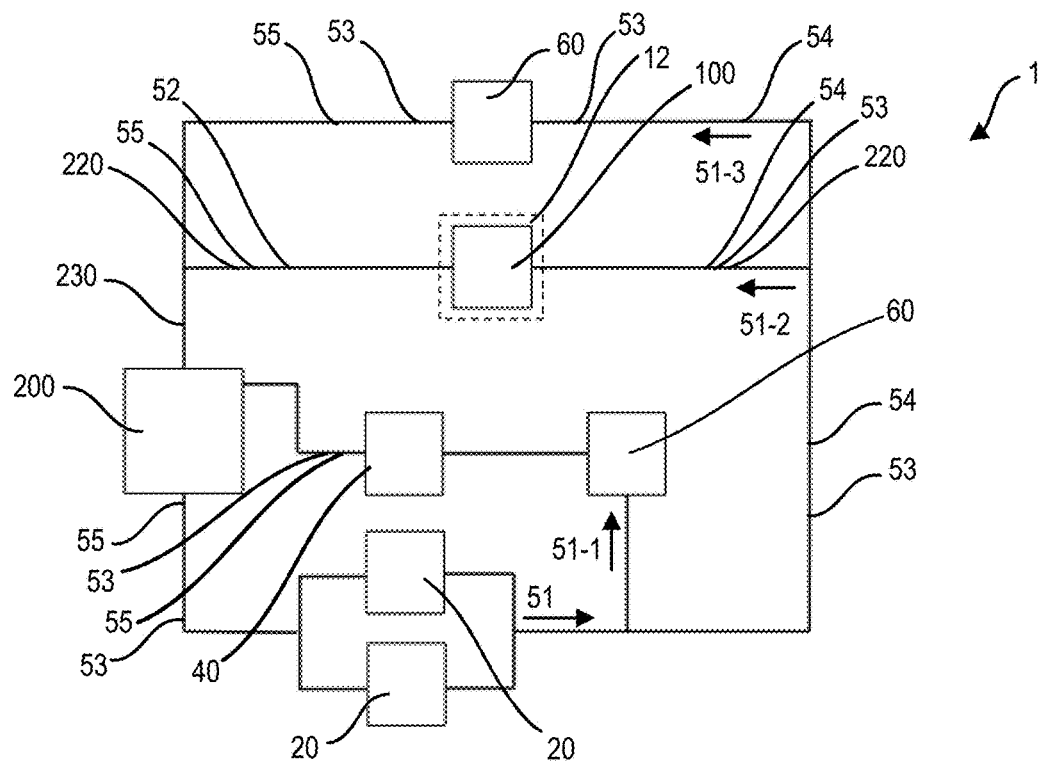

FIG. 12B shows a schematic of a cooling apparatus having two pumps arranged in parallel for redundancy in case one pump fails.

Figure 12C:
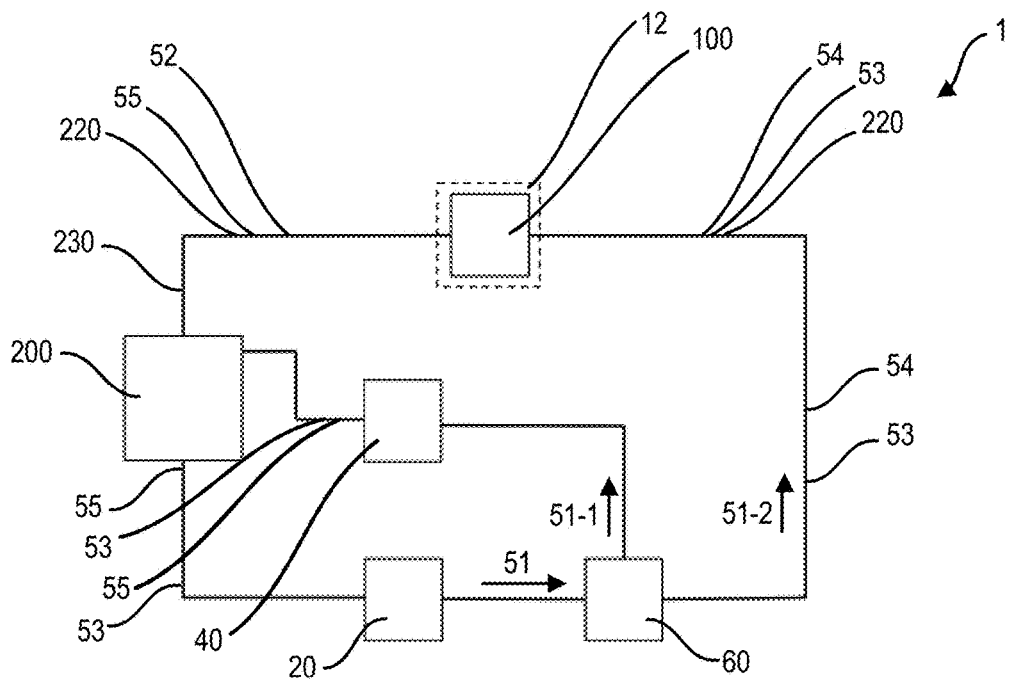

FIG. 12C shows a schematic of a cooling apparatus having a three-way valve at a junction between a primary cooling loop and a bypass.

Figure 12D:
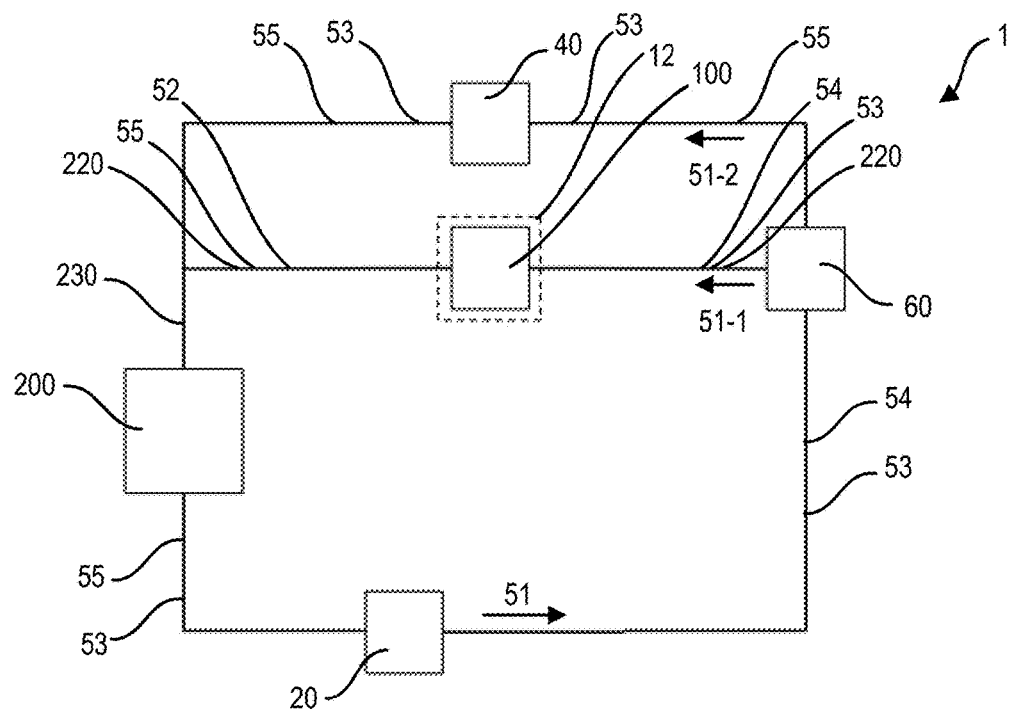

FIG. 12D shows a schematic of a cooling apparatus having a three-way valve at a junction between a primary cooling loop and a bypass, where the bypass includes a heat exchanger.

Figure 12E:
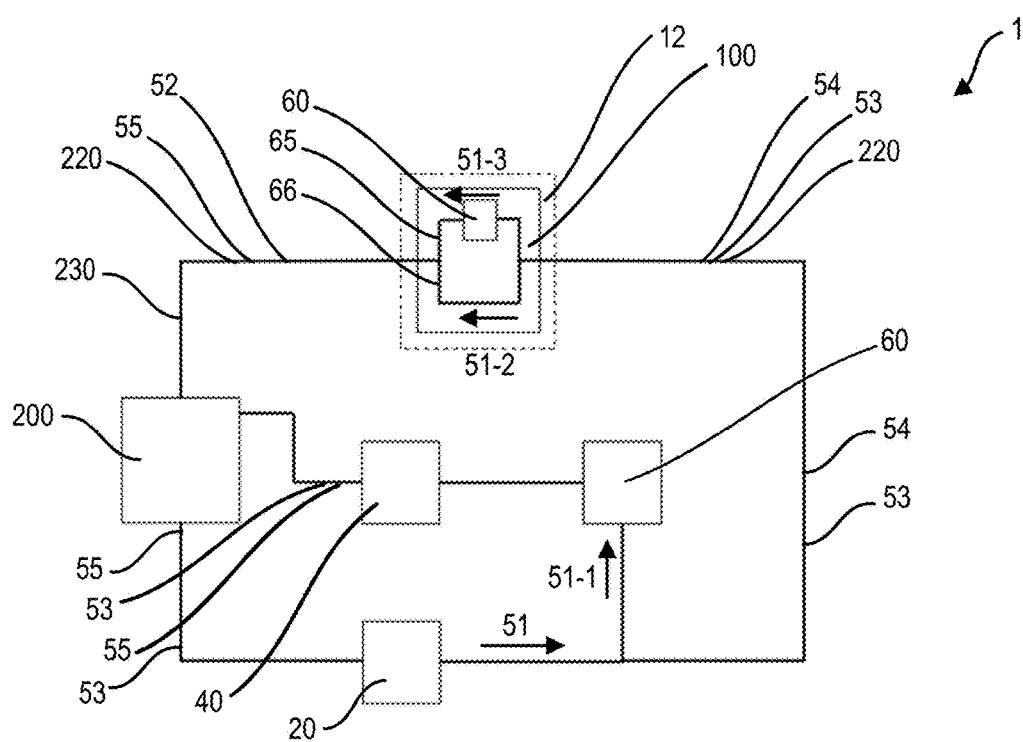

FIG. 12E shows a schematic of a cooling apparatus including a bypass and a primary cooling loop where the primary cooling loop includes a heat sink module with an internal bypass having a pressure regulator.

Figure 12F:
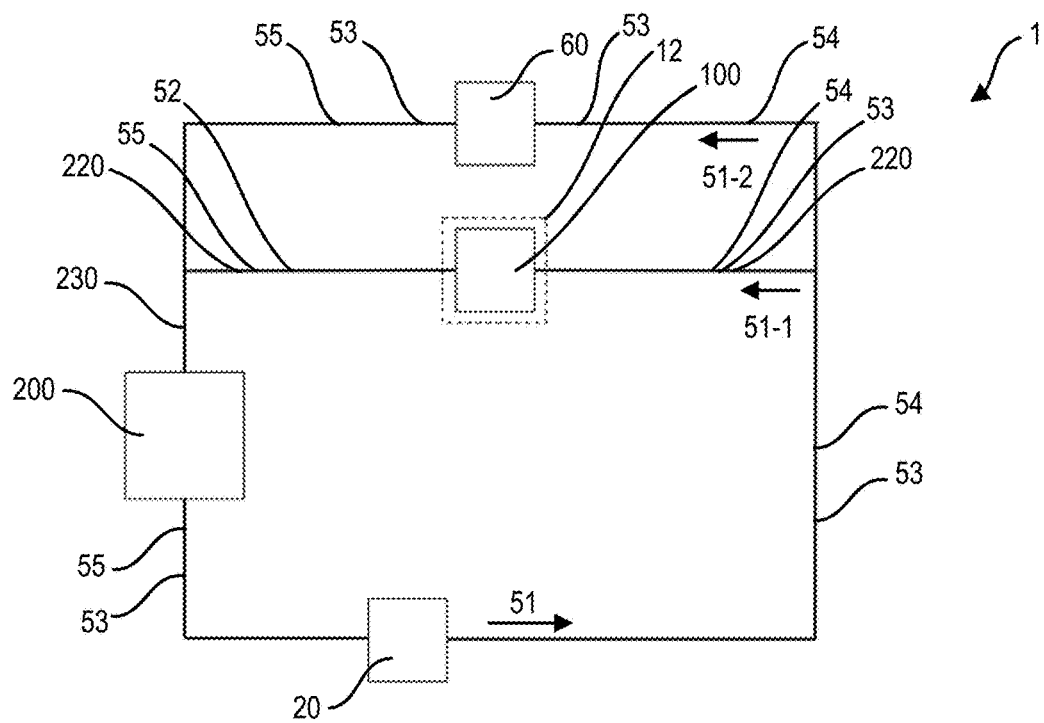

FIG. 12F shows a schematic of a cooling apparatus having a primary cooling loop and a bypass containing a pressure regulator, the primary cooling loop including a reservoir, pump, and heat sink module.

Figure 12G:
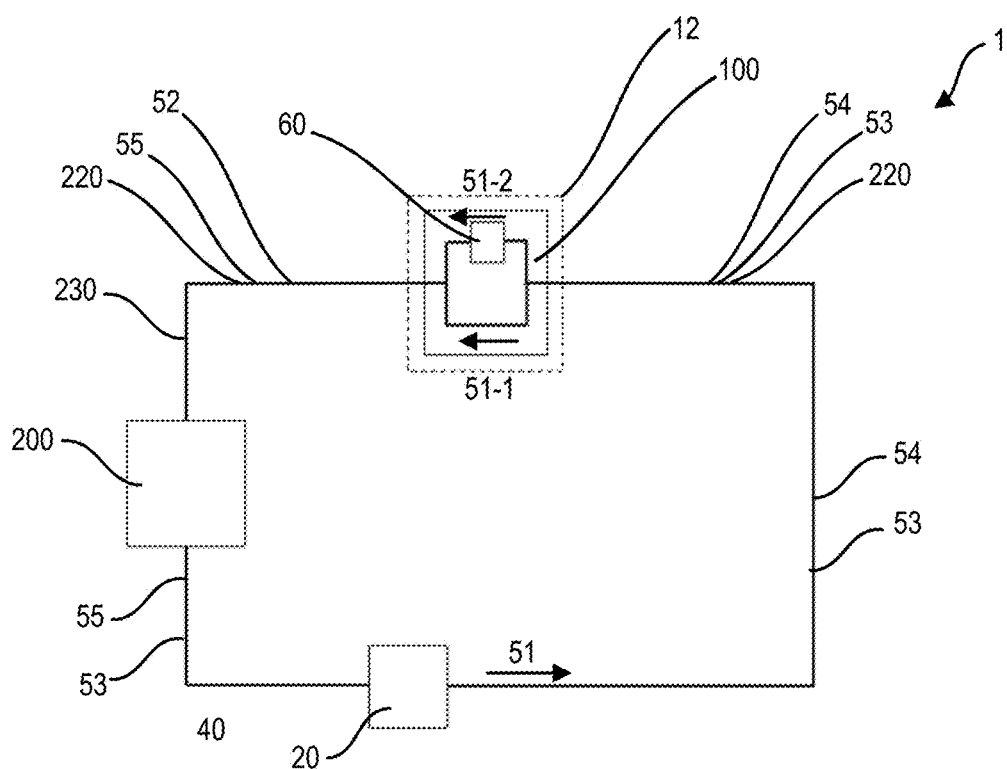

FIG. 12G shows a schematic of a cooling apparatus where a primary cooling loop includes a reservoir, a pump, and a heat sink module with an internal bypass having a pressure regulator.

Figure 12H:
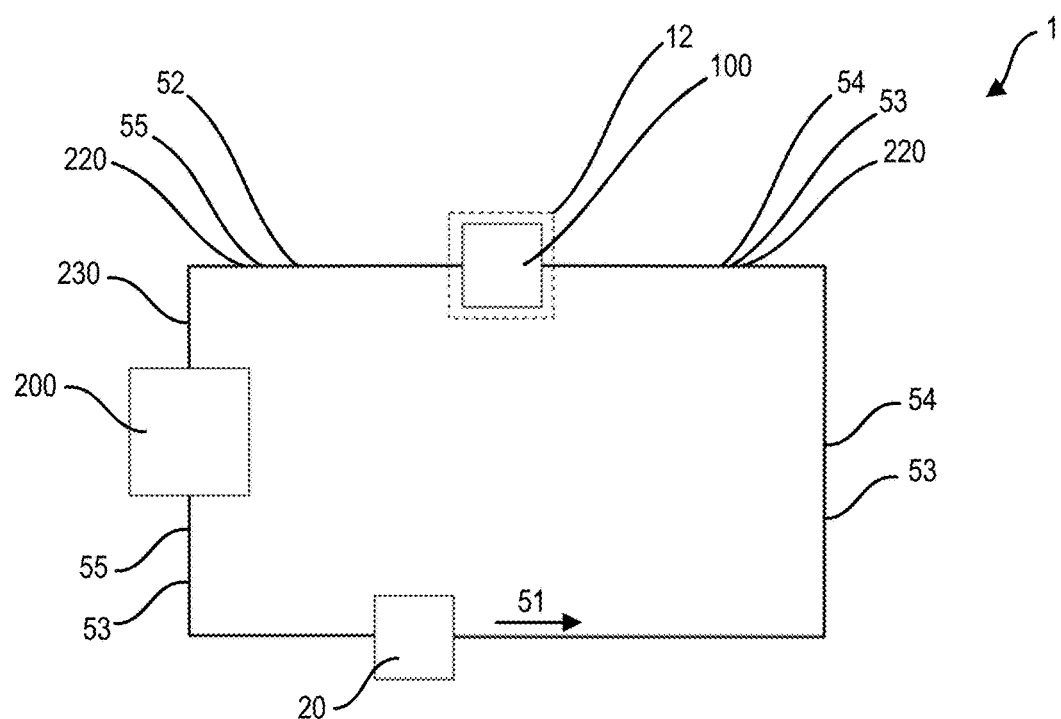

FIG. 12H shows a schematic of a cooling apparatus including a pump, a reservoir, and a heat sink module that is configured to mount on a heat source or be mounted in thermal communication with a heat source.

Figure 12I:
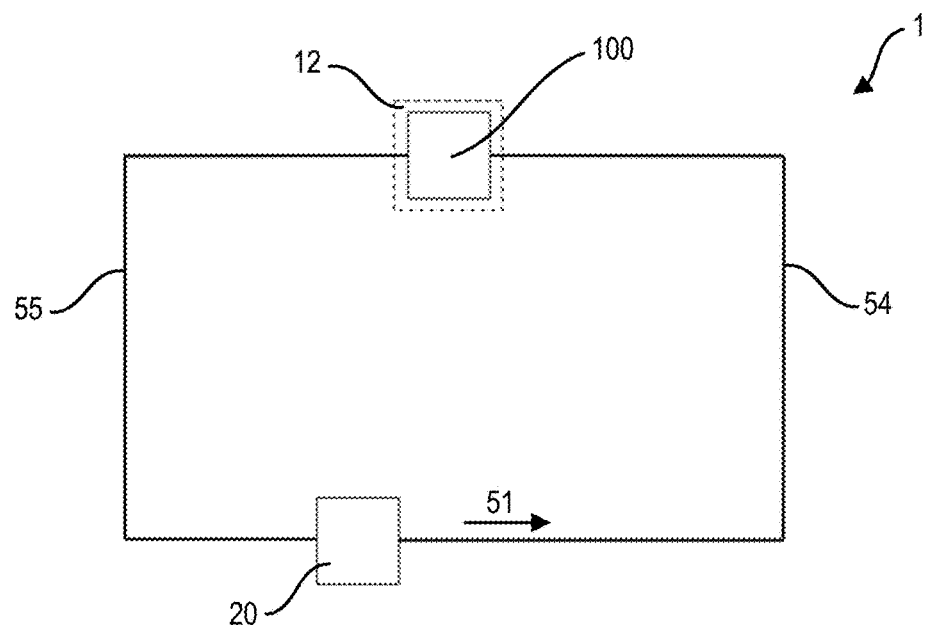

FIG. 12I shows a schematic of a cooling apparatus including a pump and a heat sink module configured to mount on a heat source or be mounted in thermal communication with a heat source.

Figure 12J:
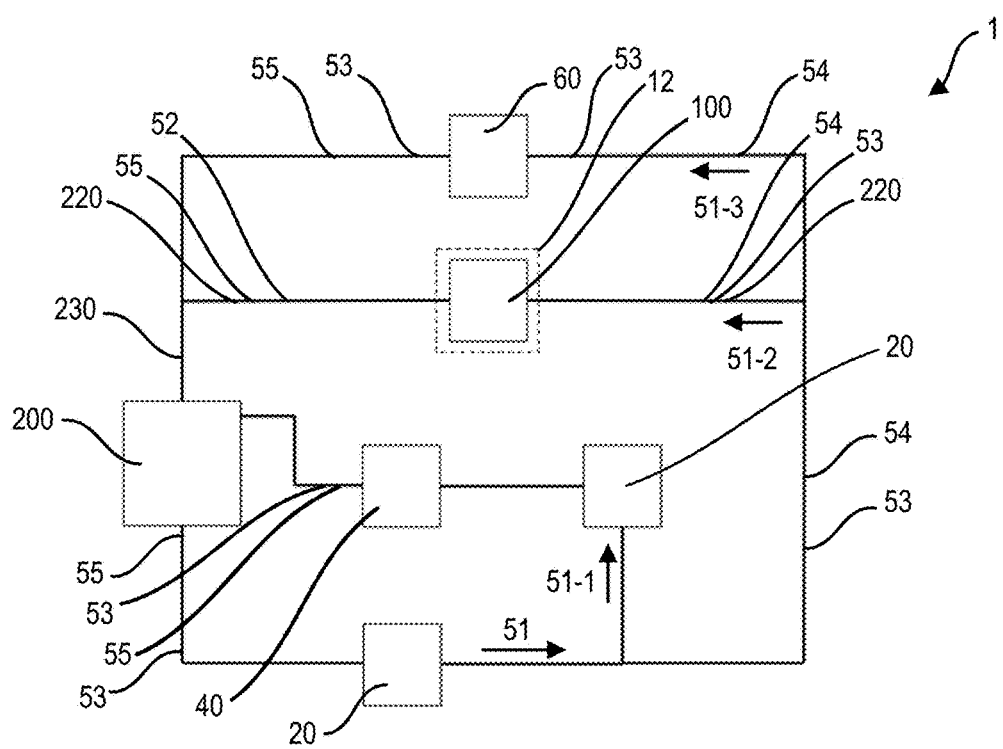

FIG. 12J shows a schematic of a cooling apparatus with a primary cooling loop, a first bypass, and a second bypass, where the primary cooling loop includes a first pump, and the first bypass includes a second pump.

Figure 12K:
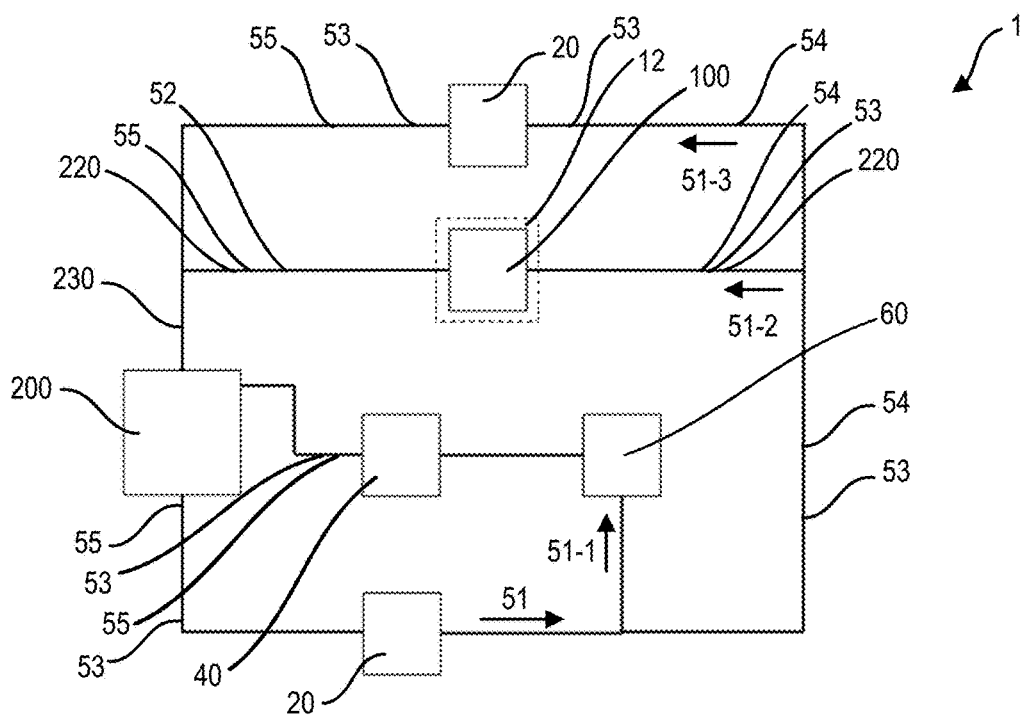

FIG. 12K shows a schematic of a cooling apparatus with a primary cooling loop, a first bypass, and a second bypass, where the primary cooling loop includes a first pump, and the second bypass includes a second pump.

Figure 12L:
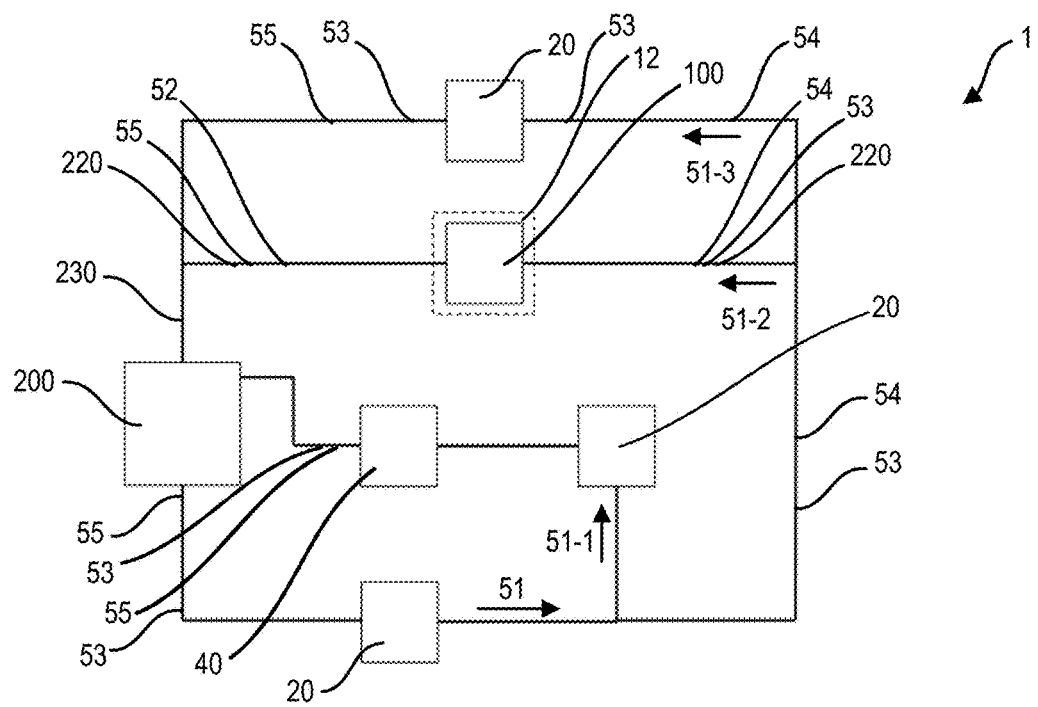

FIG. 12L shows a schematic of a cooling apparatus with a primary cooling loop, a first bypass, and a second bypass, where the primary cooling loop includes a first pump, the first bypass includes a second pump, and the second bypass includes a third pump.

Figure 12M:
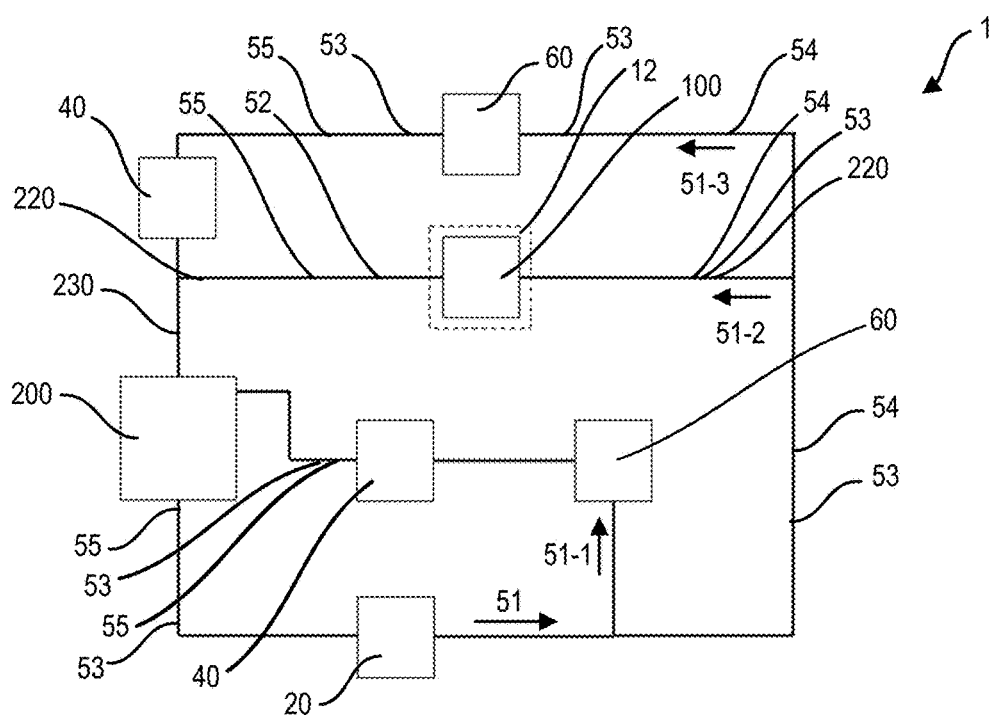

FIG. 12M shows a schematic of a cooling apparatus with a primary cooling loop, a first bypass, and a second bypass, where the first bypass includes a first heat exchanger, and the second bypass includes a second heat exchanger.

Figure 12N:
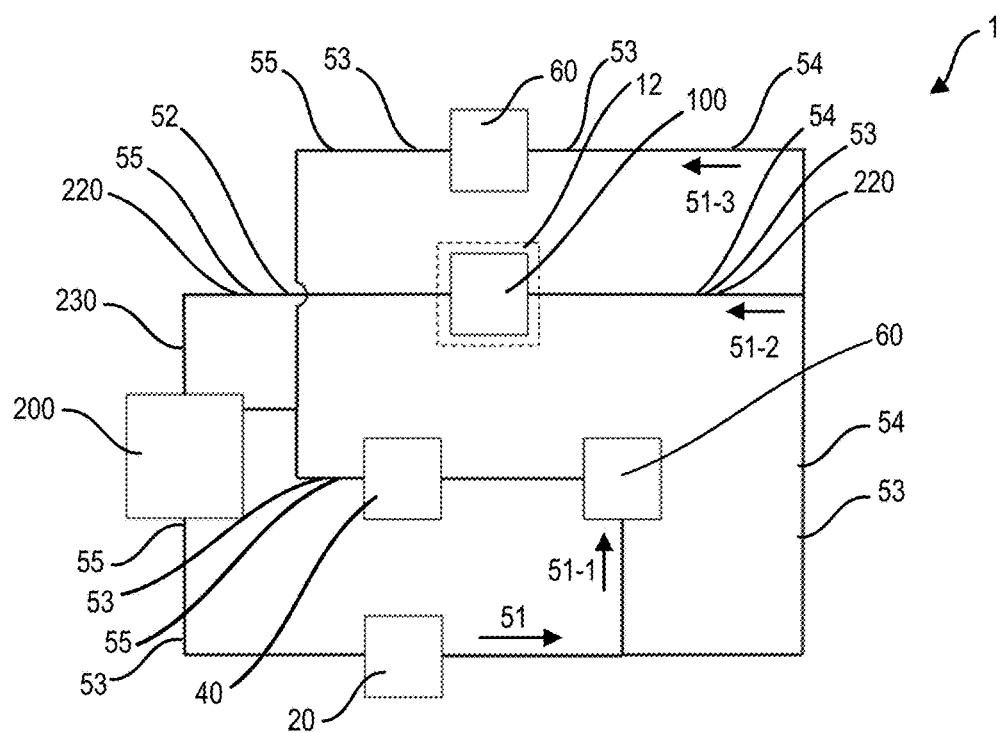

FIG. 12N shows a schematic of a cooling apparatus having a primary cooling loop, a first bypass, and a second bypass, where the first bypass and second bypass merge upstream of a reservoir.

Figure 12O:
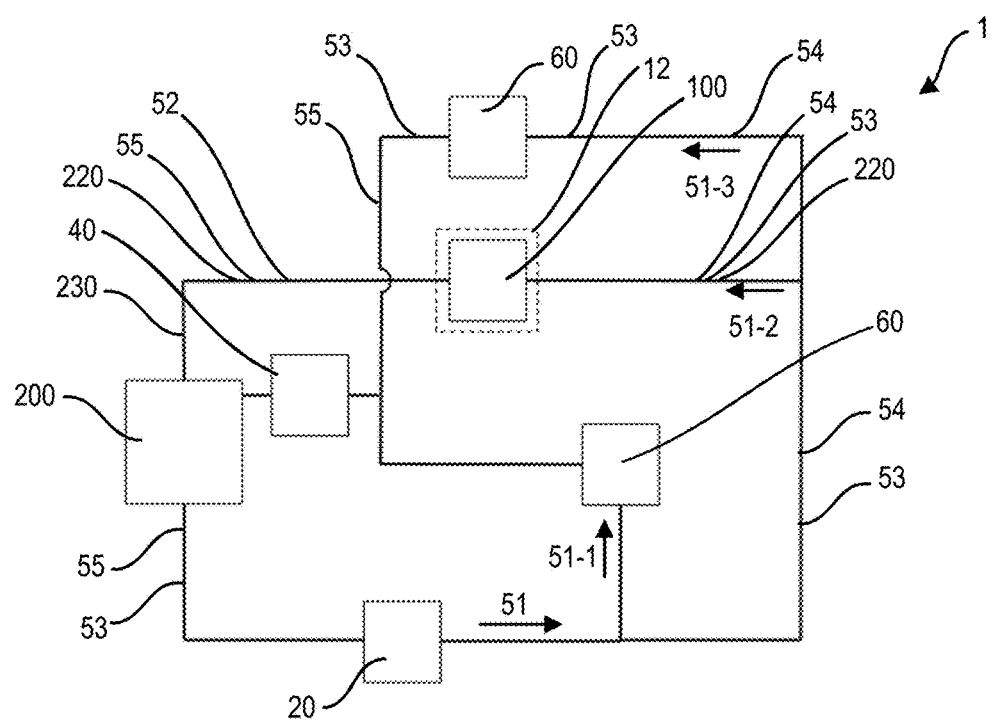

FIG. 12O shows a schematic of a cooling apparatus having a primary cooling loop, a first bypass, and a second bypass, where the first bypass and second bypass merge upstream of a reservoir and upstream of a heat exchanger.

Figure 12P:
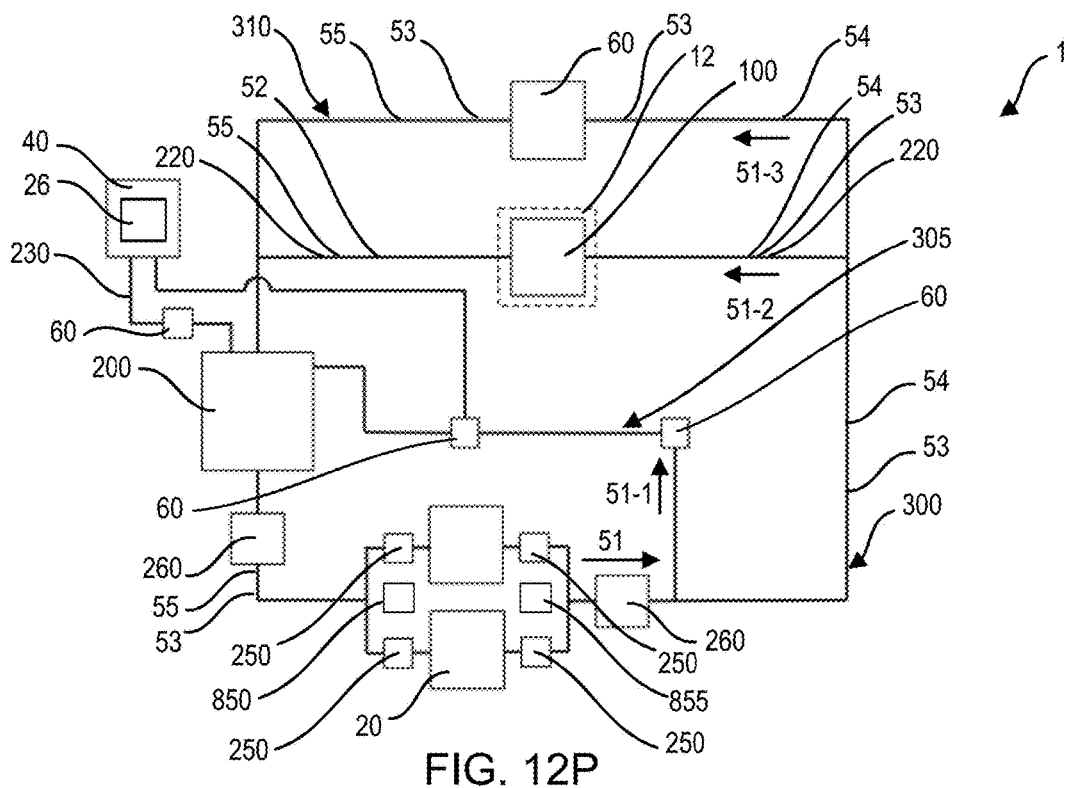

FIG. 12P shows a schematic of a cooling apparatus having a primary cooling loop with redundant parallel pumps, a first bypass, and a second bypass, where the first bypass is fluidly connected to a heat exchanger that can be a rooftop dry cooler.

Figure 12Q:
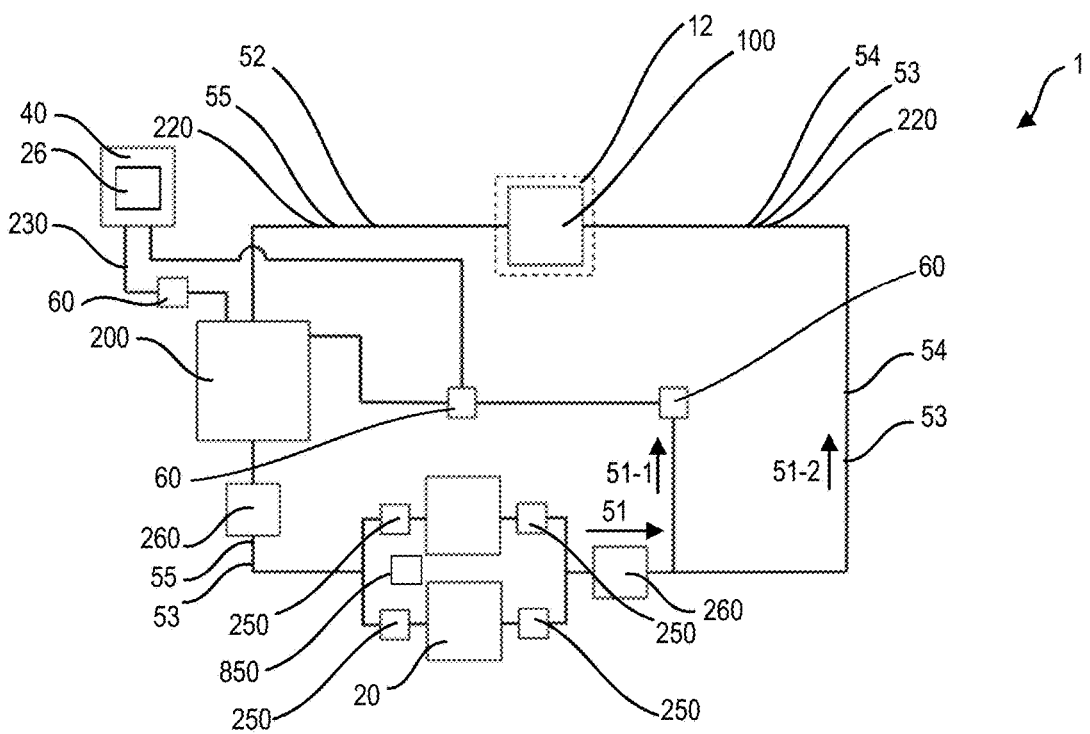

FIG. 12Q shows a schematic of a cooling apparatus having a primary cooling loop and a bypass, where the bypass is connected to a heat exchanger that can be a rooftop dry cooler.

Figure 12R:
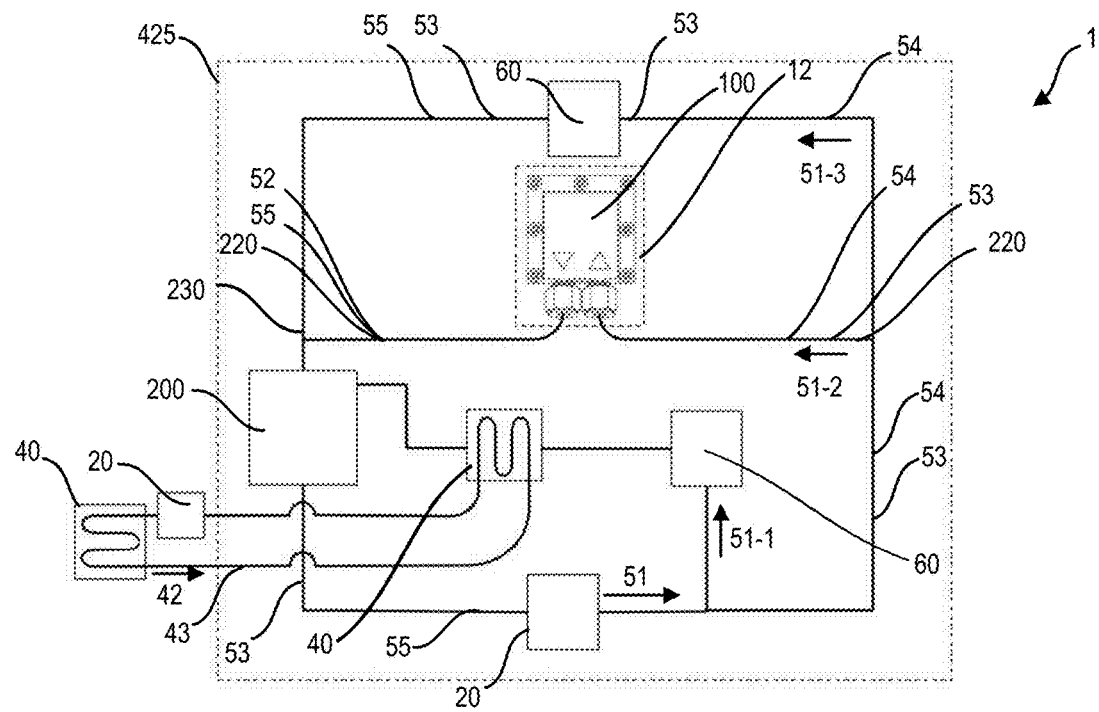

FIG. 12R shows a schematic of a preferred cooling apparatus having a primary cooling loop, a first bypass, and a second bypass, where the first bypass includes a liquid-to-liquid heat exchanger fluidly connected to an external heat exchanger located outside of a room where the cooling apparatus is located, the external heat exchanger being connected to the heat exchanger by an external heat rejection loop having a pump configured to circulate external cooling fluid, such as a water-glycol mixture, through the external heat rejection loop.

Figure 12S:
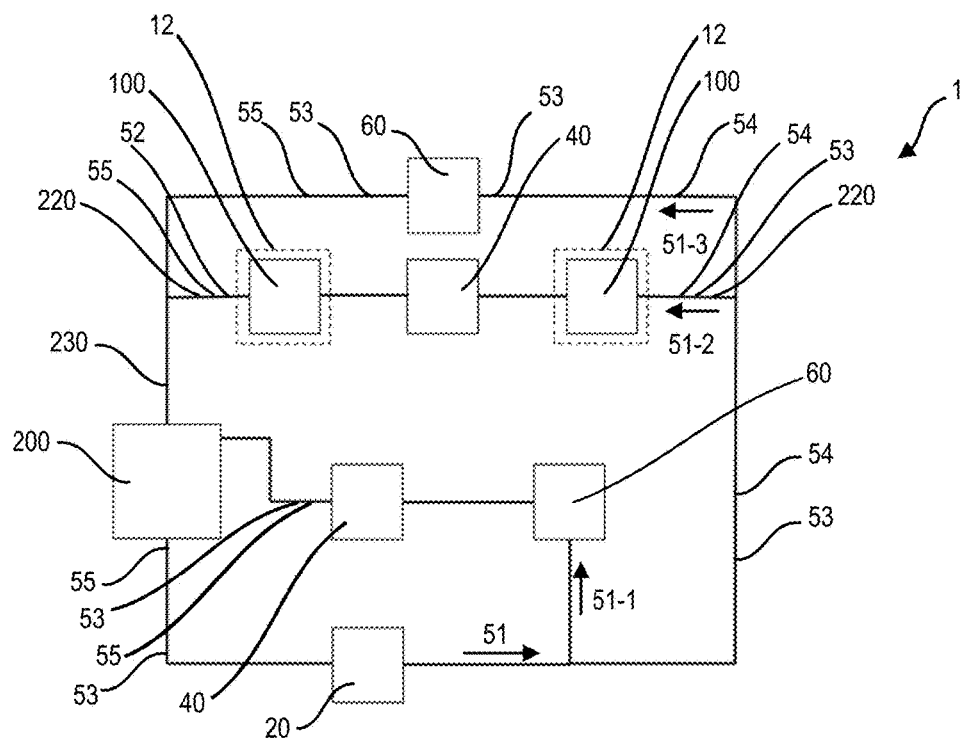

FIG. 12S shows a schematic of a cooling apparatus having a primary cooling loop, a first bypass, and a second bypass, where the first bypass includes a first heat exchanger, and where the primary cooling loop includes two series-connected heat sink modules with a second heat exchanger fluidly connected between the heat sink modules to reduce quality of the flow to avoid formation of slug flow in the primary cooling loop between the heat sink modules.

Figure 12T:
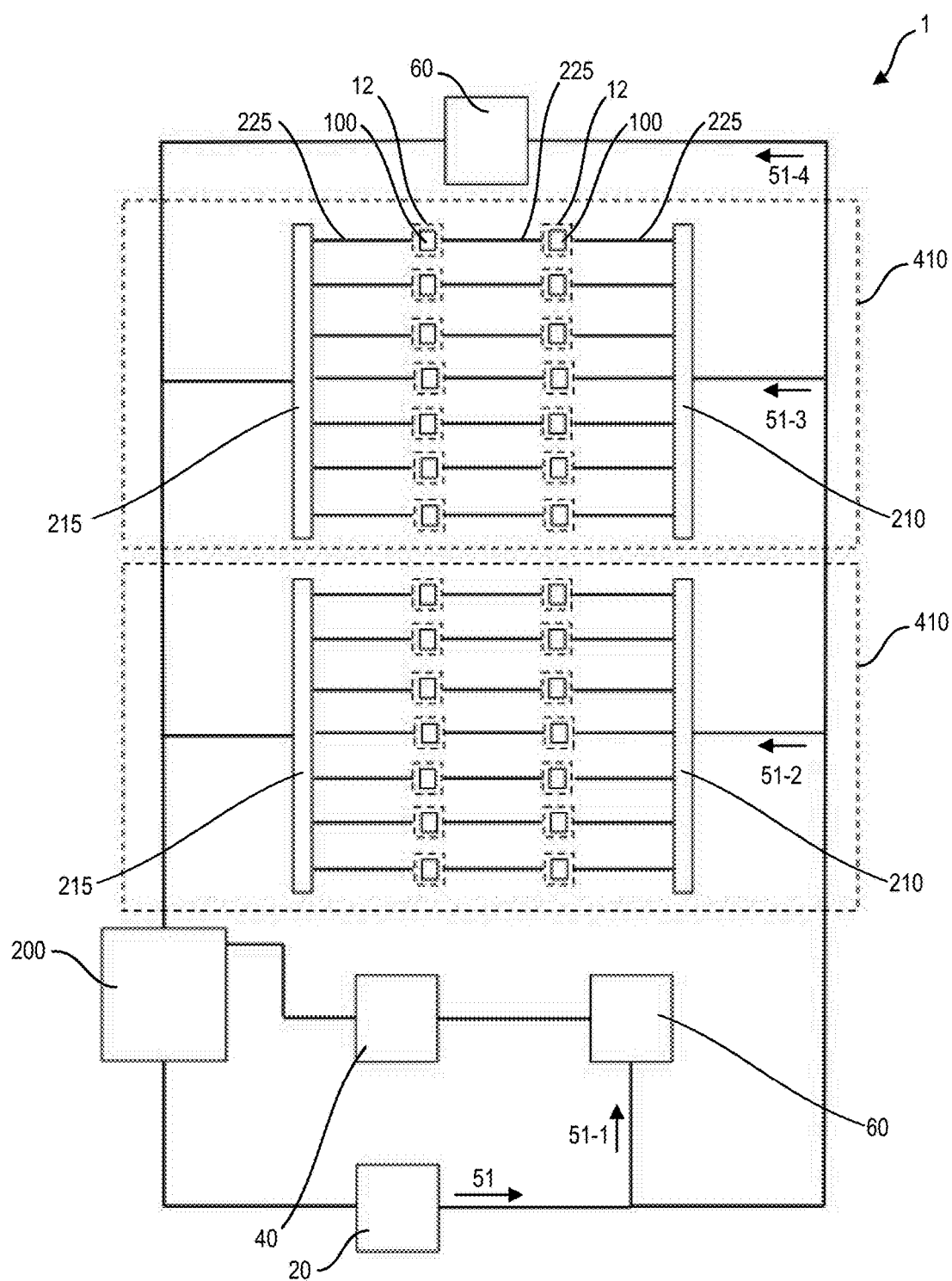

FIG. 12T shows a schematic of a cooling apparatus configured to cool two racks of servers, the cooling apparatus including an inlet manifold and an outlet manifold for each rack of servers, where a plurality of heat sink modules are fluidly connected in series and parallel arrangements between each inlet and outlet manifold to cool microprocessors within the servers.

Figure 13:
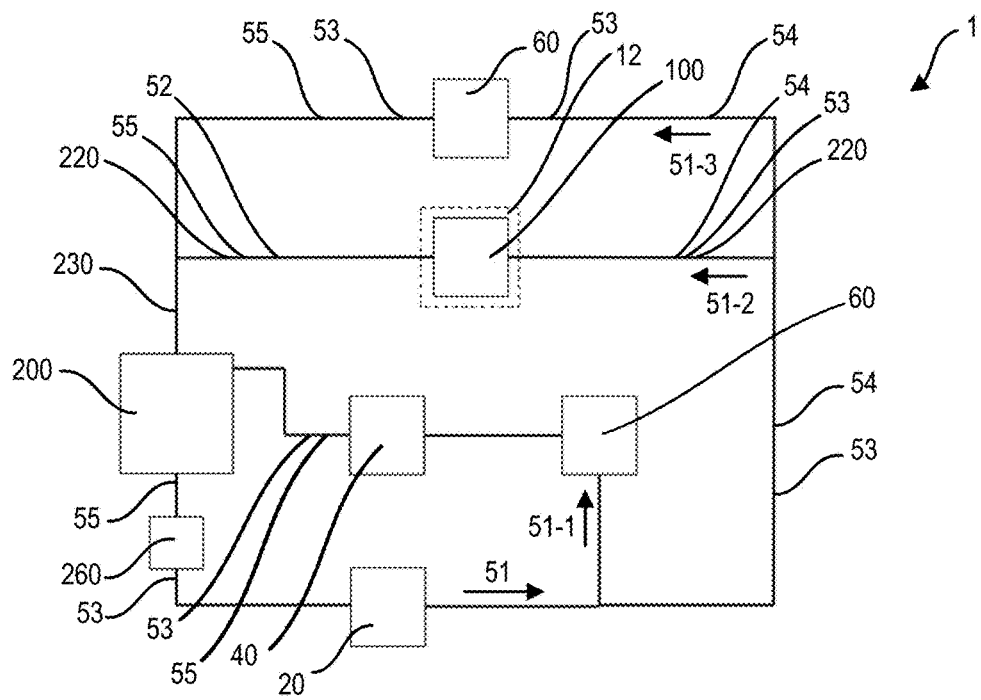

FIG. 13 shows a schematic of a cooling apparatus including a filter located between a reservoir and a pump in a primary cooling loop.

Figure 14A:
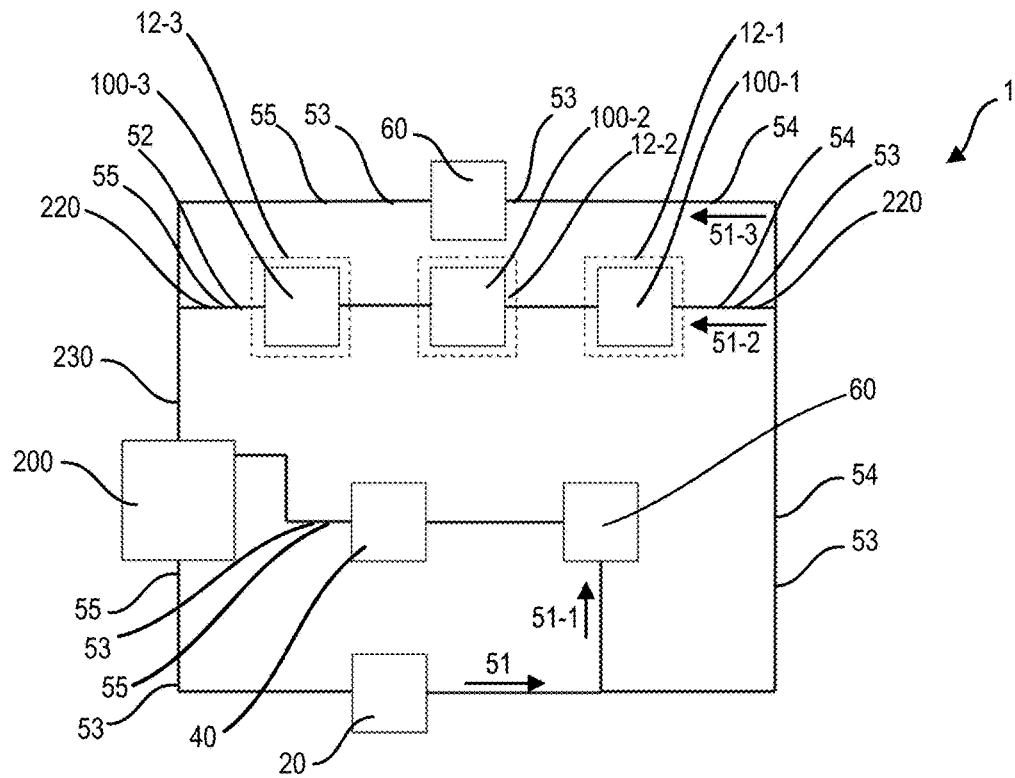

FIG. 14A shows a schematic of a cooling apparatus having three heat sink modules arranged in a series configuration on three surfaces to be cooled.

Figure 14B:
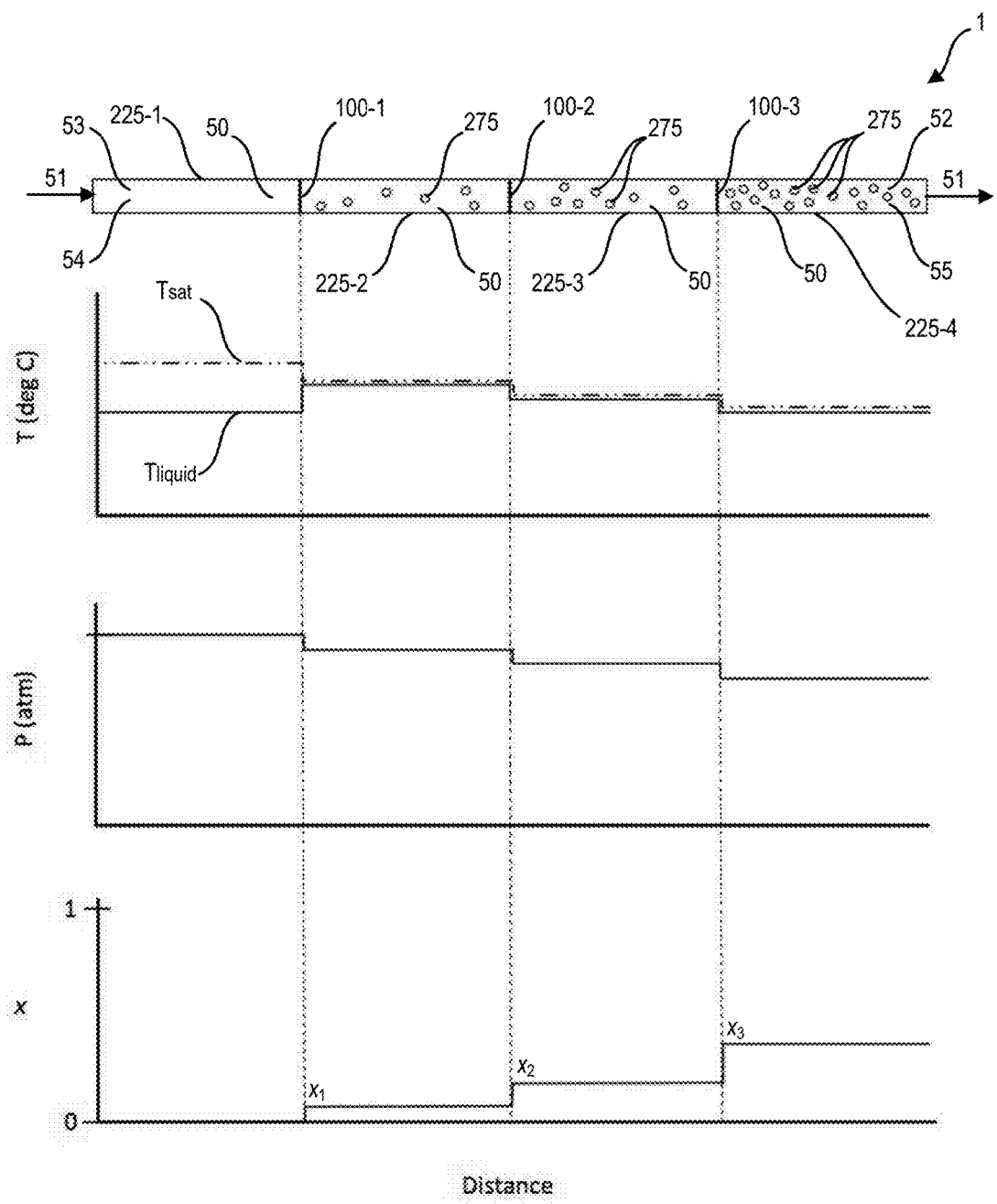
Figure 15:
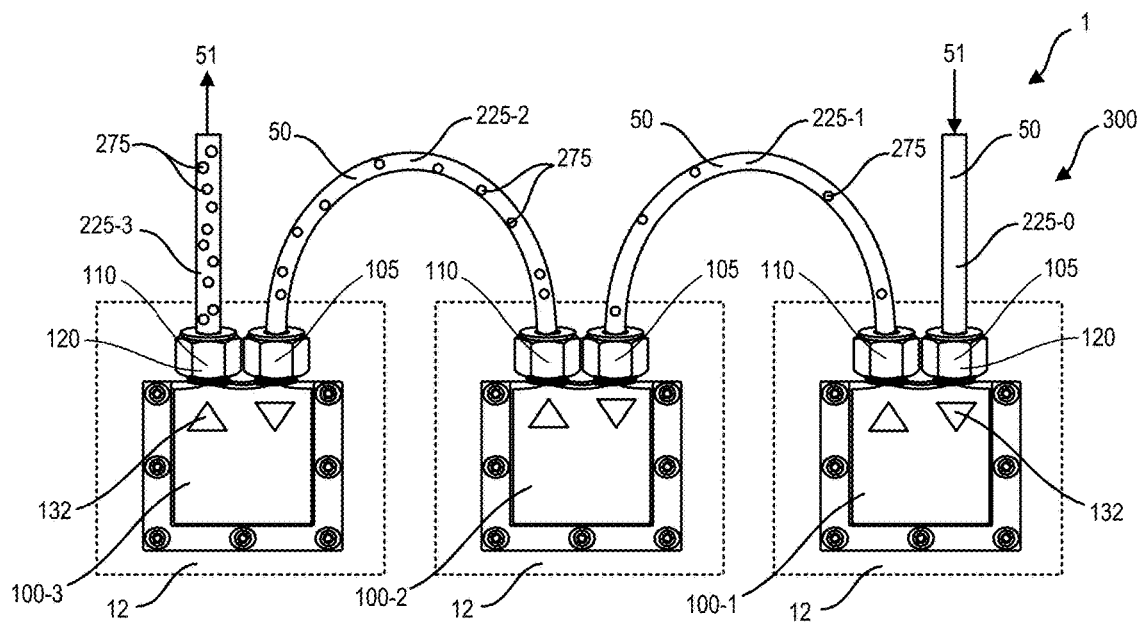

FIG. 14B shows a representation of coolant flowing through three heat sink modules connected in series by lengths of tubing, similar to the configurations shown in FIGS. 14A and 15, and shows corresponding plots of saturation temperature, liquid coolant temperature, pressure, and quality (x) versus distance, where quality increases, pressure decreases, liquid coolant temperature decreases, and $T_{sat}$ decreases through the second and third series-connected heat sink modules.

Figure 14C:
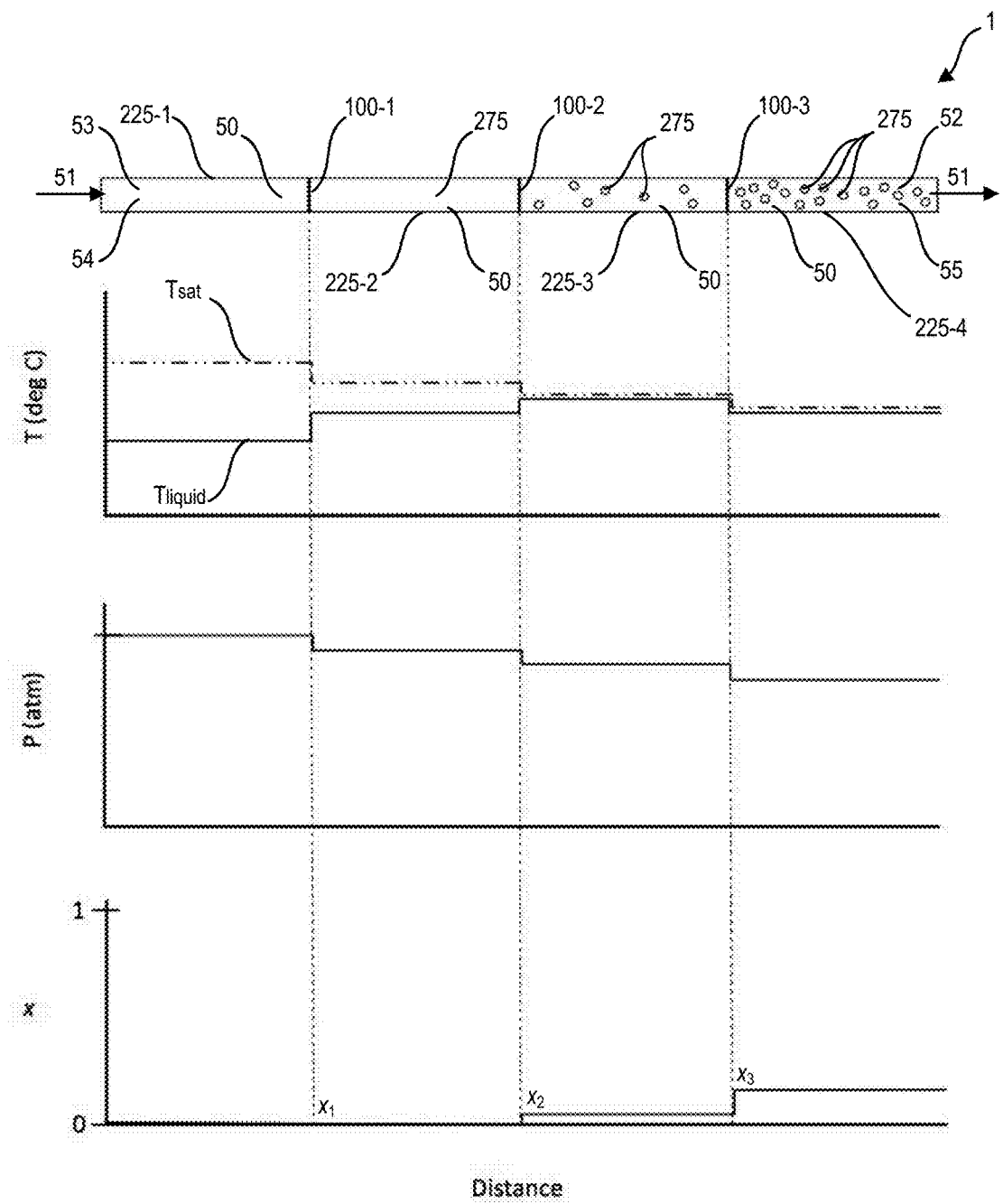

FIG. 14C shows a representation of coolant flowing through three heat sink modules connected in series by lengths of tubing, similar to FIG. 14B, except that the coolant does not reach its saturation temperature until the second heat sink module and is therefore liquid coolant until it transitions to two-phase bubbly flow within the second heat sink module.

FIG. 15 shows a portion of a primary cooling loop of a cooling apparatus, where the cooling loop includes three series-connected heat sink modules mounted on three surfaces to be cooled and connected by sections of flexible tubing where a single-phase liquid coolant is provided to a first heat sink module, and due to heat transfer occurring within the first module, two-phase bubbly flow is transported from the first module to the second module, and due to heat transfer occurring within the second module, higher quality two-phase bubbly flow is transported from the second module to the third module, and due to heat transfer occurring within the third module, even higher quality two-phase bubbly flow is transported out of the third module.

Figure 16:
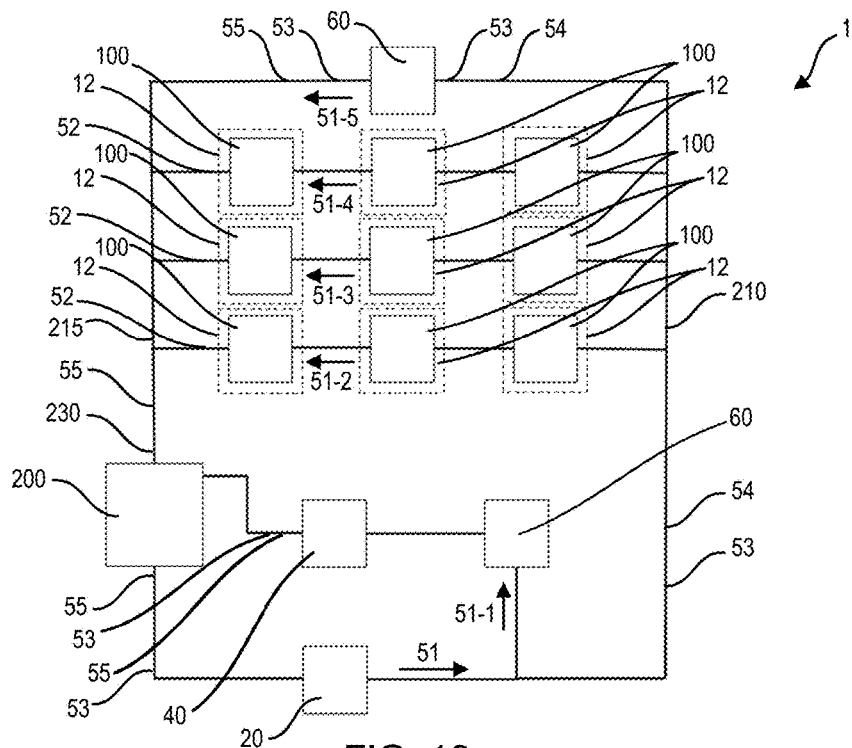

FIG. 16 shows a schematic of a cooling apparatus having a primary cooling loop, a first bypass, and a second bypass, where the primary cooling line includes three parallel cooling lines where each parallel cooling line includes three heat sink modules fluidly connected in series.

Figure 17:
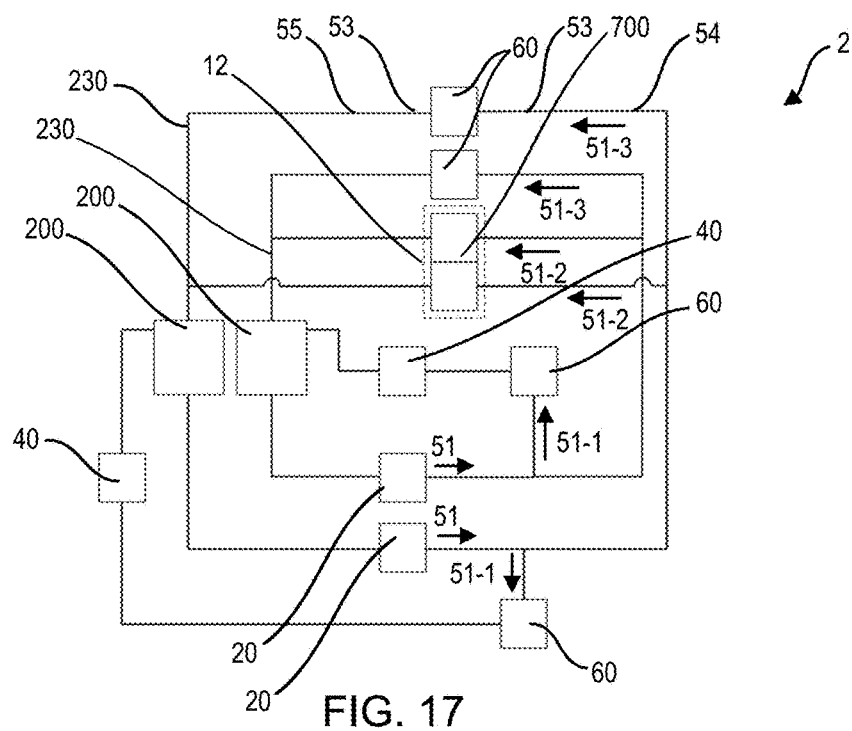

FIG. 17 shows a schematic of a redundant cooling apparatus having a redundant heat sink module mounted on a surface to be cooled, the redundant heat sink module having a first independent coolant pathway fluidly connected to a first independent cooling system and a second independent coolant pathway fluidly connected to a second independent cooling system.

Figure 18:
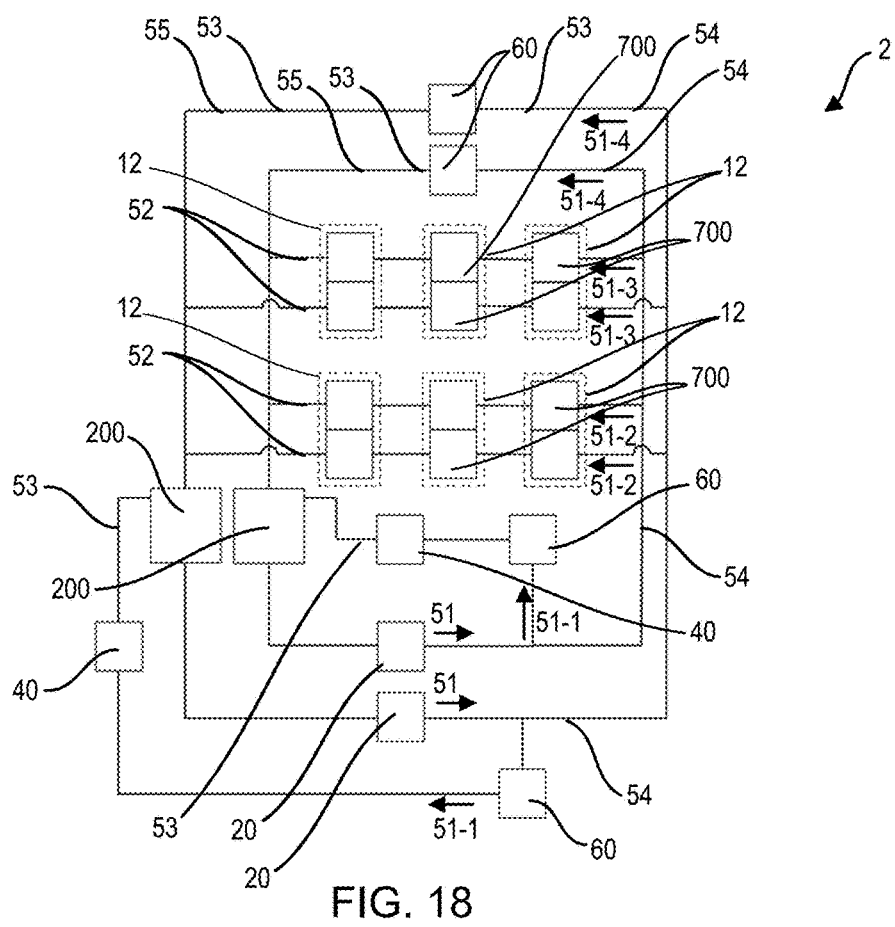

FIG. 18 shows a schematic of a redundant cooling apparatus having a first independent cooling apparatus and a second independent cooling apparatus, where each of the independent cooling apparatuses has two parallel cooling lines where each parallel cooling line is fluidly connected to three redundant heat sink modules arranged in series, where each redundant heat sink module has a first independent coolant pathway fluidly connected to the first independent cooling apparatus and a second independent coolant pathway fluidly connected to the second independent cooling apparatus.

Figure 19:
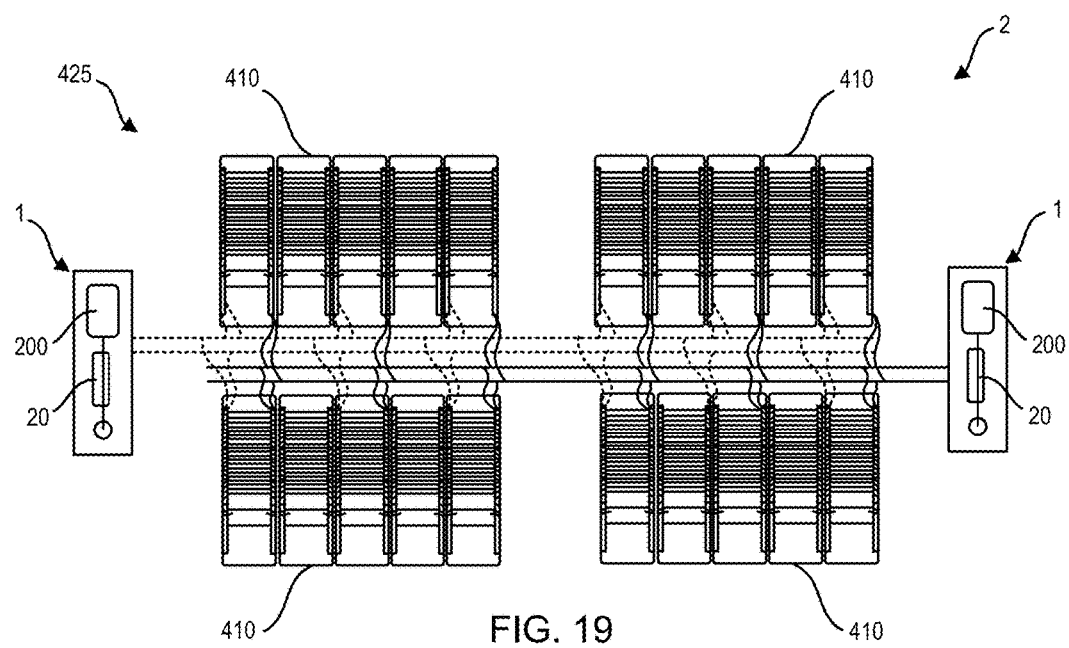

FIG. 19 shows a top view of a redundant cooling apparatus installed in a data center having twenty racks of servers, the redundant cooling system having a first independent cooling apparatus and a second independent cooling apparatus, both connected to heat exchangers located inside of the room where the servers are located.

Figure 20:
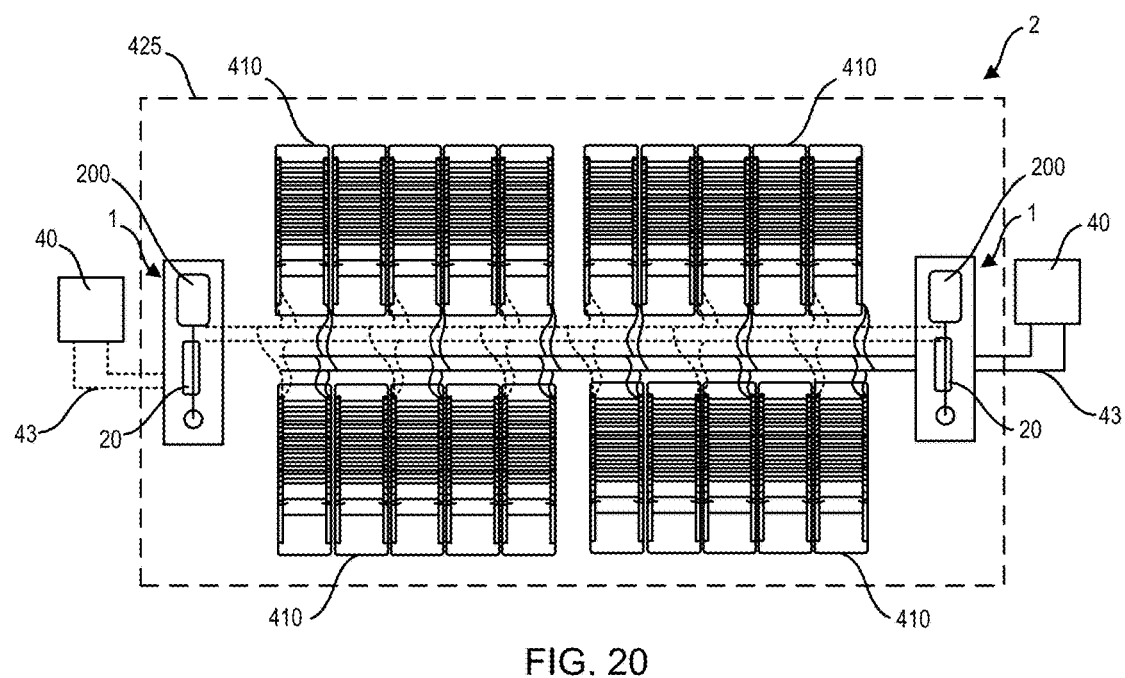

FIG. 20 shows a top view of a redundant cooling apparatus installed in a data center having twenty racks of servers, the redundant cooling system having a first independent cooling apparatus and a second independent cooling apparatus, both connected to heat exchangers located outside of the room where the data center is located.

Figure 21:
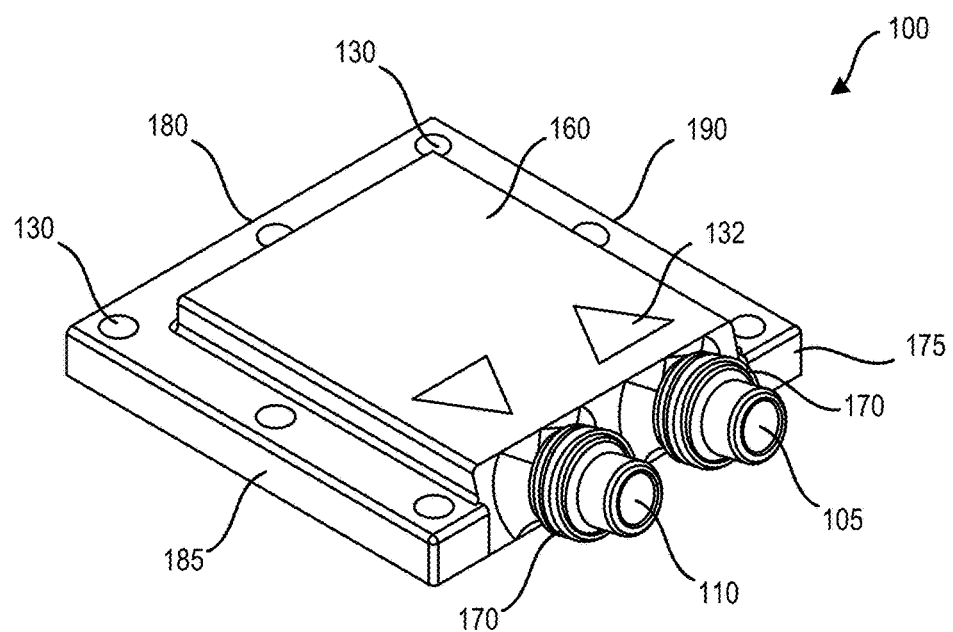

FIG. 21 shows a top perspective view of a compact heat sink module for cooling a heat source.

Figure 22:
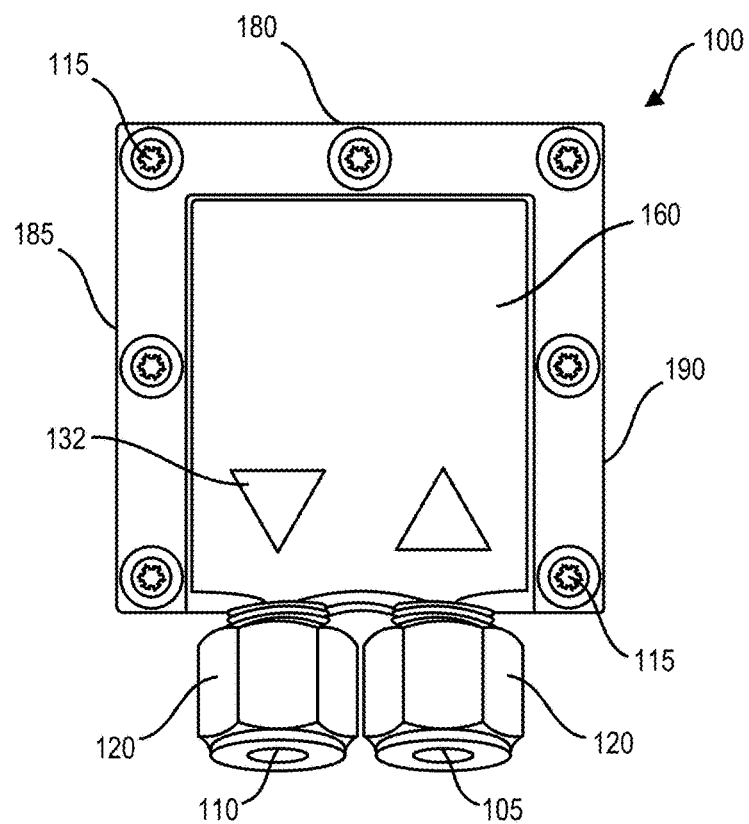

FIG. 22 shows a top view of heat sink module of FIG. 21, the heat sink module including a first compression fitting installed on an inlet port of the heat sink module, a second compression fitting installed on an outlet port of the heat sink module, and a plurality of fasteners arranged near a perimeter of the heat sink module and according to a mounting pattern for mounting the heat sink module to a heat-providing surface.

Figure 23:
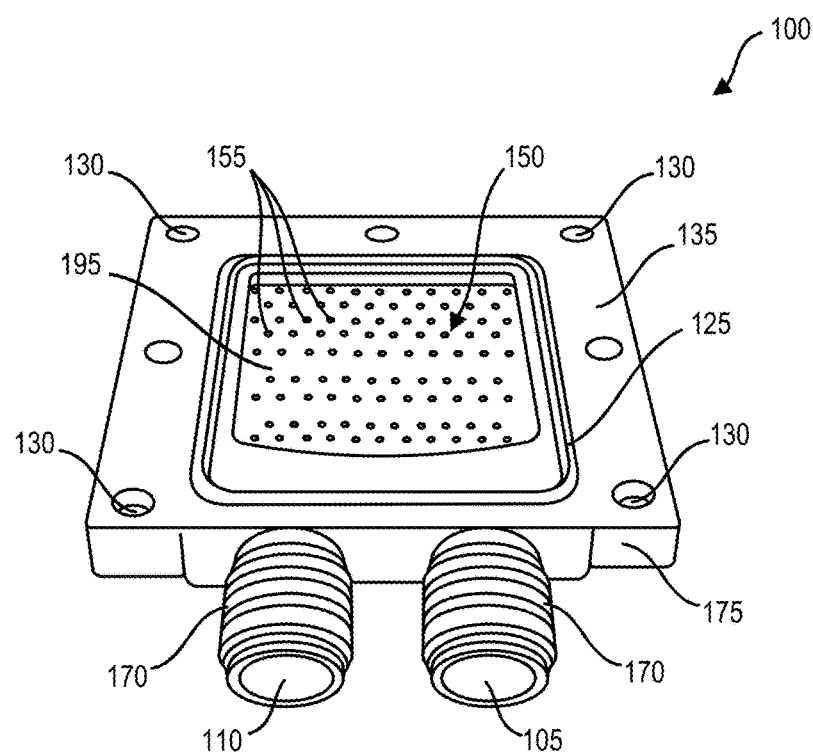

FIG. 23 shows a bottom perspective view of the heat sink module of FIG. 21 showing an inlet port, outlet port, outlet chamber, mounting holes, dividing member, and a plurality of orifices in the dividing member, as well as a sealing member installed within a continuous channel circumscribing the outlet chamber of the heat sink module.

Figure 24:
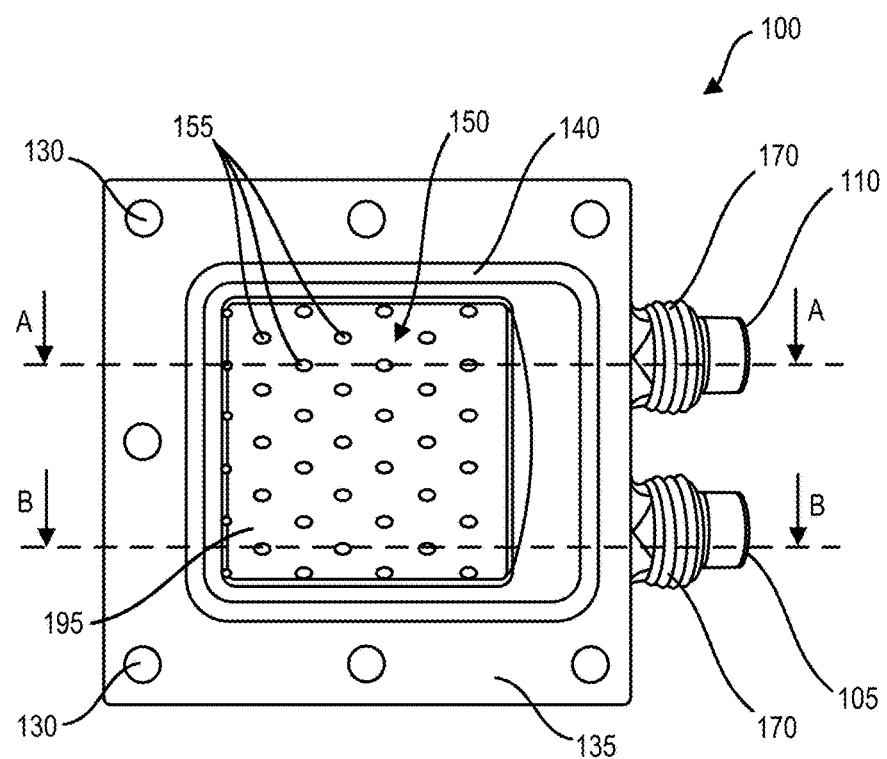

FIG. 24 shows a bottom view of the heat sink module of FIG. 21 showing an array of orifices having staggered columns and staggered rows to prevent flow stagnation regions on a surface to be cooled.

Figure 25:
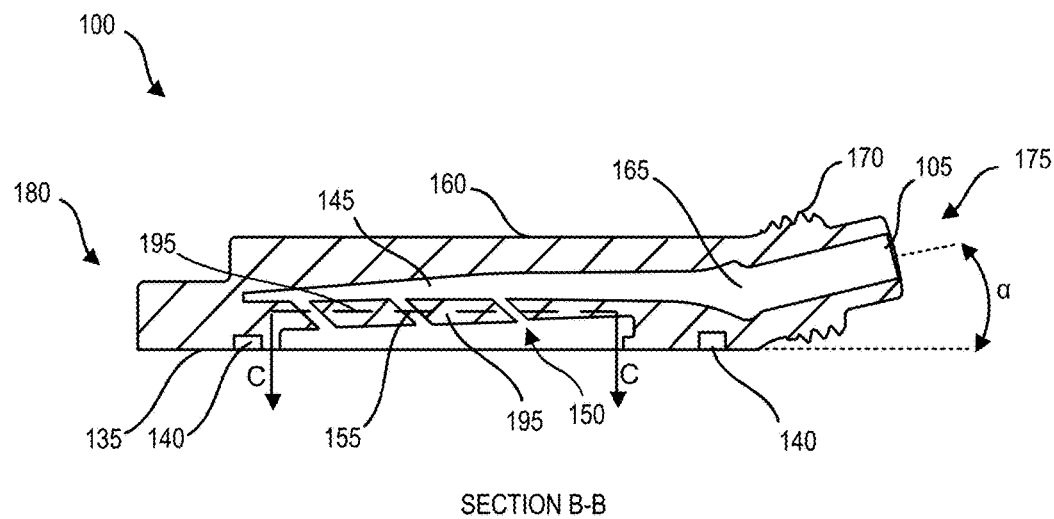

FIG. 25 shows a side cross-sectional view of the heat sink module of FIG. 24 taken along section B-B and showing an inlet port, an inlet passage, an inlet chamber, a plurality of orifices, a dividing member, and an outlet chamber within the heat sink module.

Figure 26:
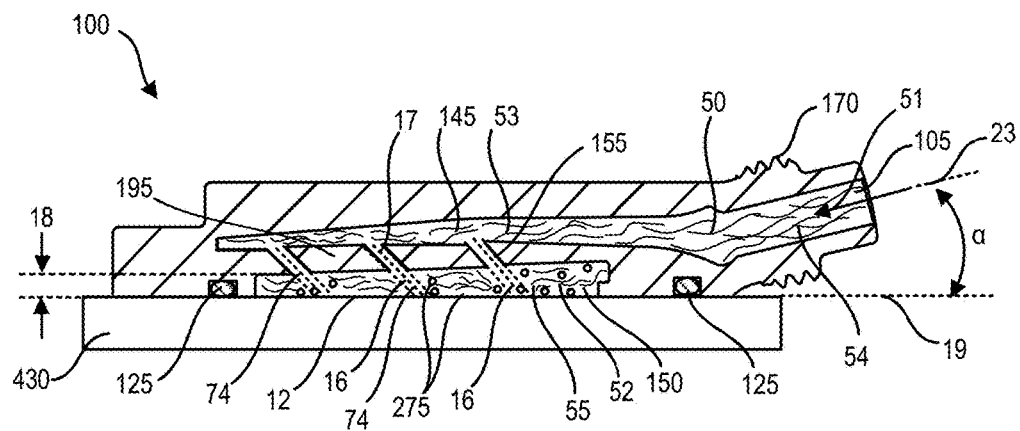

FIG. 26 shows a side cross-sectional view of the heat sink module of FIG. 24 taken along section B-B with the heat sink module mounted on a thermally conductive base member and showing central axes of several orifices, jet heights, and bubble formation within the outlet chamber proximate the surface of the thermally conductive base member where a portion of the liquid coolant changes to vapor.

Figure 27:
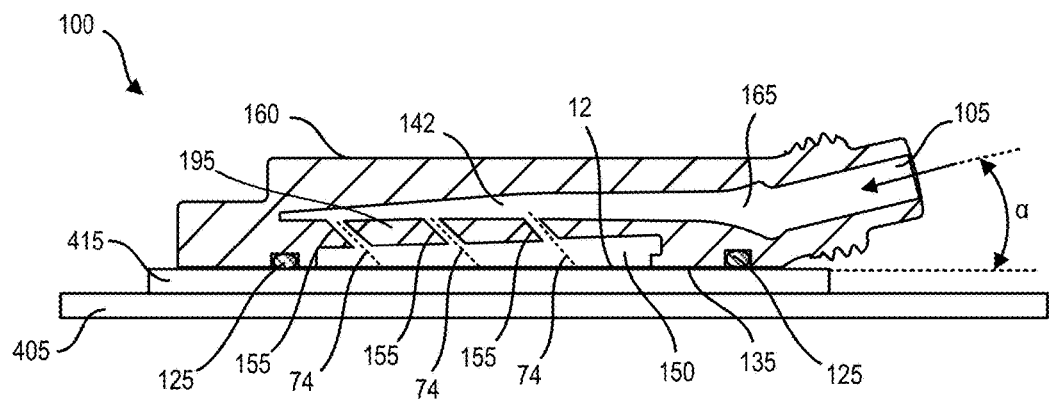

FIG. 27 shows a side cross-sectional view of the heat sink module of FIG. 24 taken along section B-B with the heat sink module mounted directly on a computer processor located on a motherboard and showing central axes of several orifices.

Figure 28:
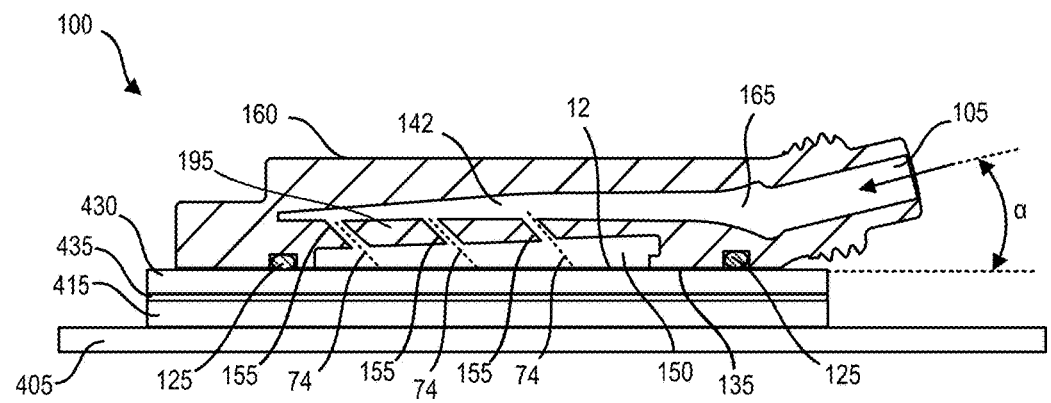

FIG. 28 shows a side cross-sectional view of the heat sink module of FIG. 24 taken along section B-B with the heat sink module mounted on a thermally conductive base member that is bonded to a microprocessor by a layer of thermal interface material, the microprocessor being electrically connected to a motherboard.

Figure 29:
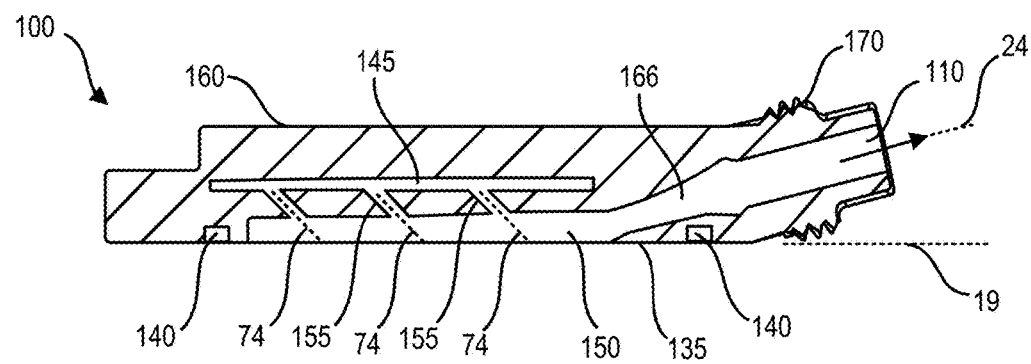

FIG. 29 shows a side cross-sectional view of the heat sink module of FIG. 24 taken along section A-A and showing an outlet port, an outlet passage, an outlet chamber, a dividing member, and a plurality of orifices within the heat sink module.

Figure 30:
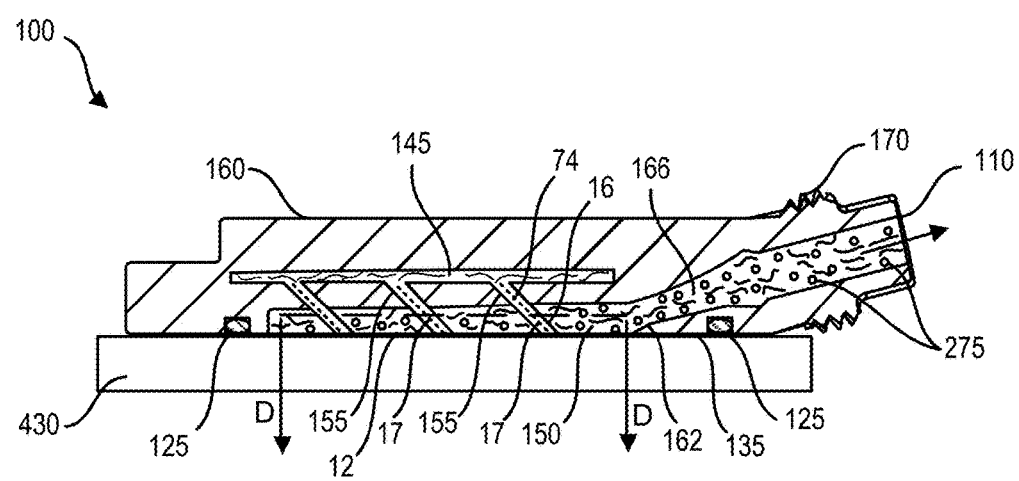

FIG. 30 shows a side cross-sectional view of the heat sink module of FIG. 24 taken along section A-A, with the heat sink module mounted on a thermally conductive base member and sealed by a sealing member, the figure showing bubbles forming within the outlet chamber proximate the heated surface of the conductive base member where a portion of the coolant changes from liquid phase to vapor phase thereby forming two-phase bubbly flow, which exits the heat sink module through the outlet port.

Figure 31:
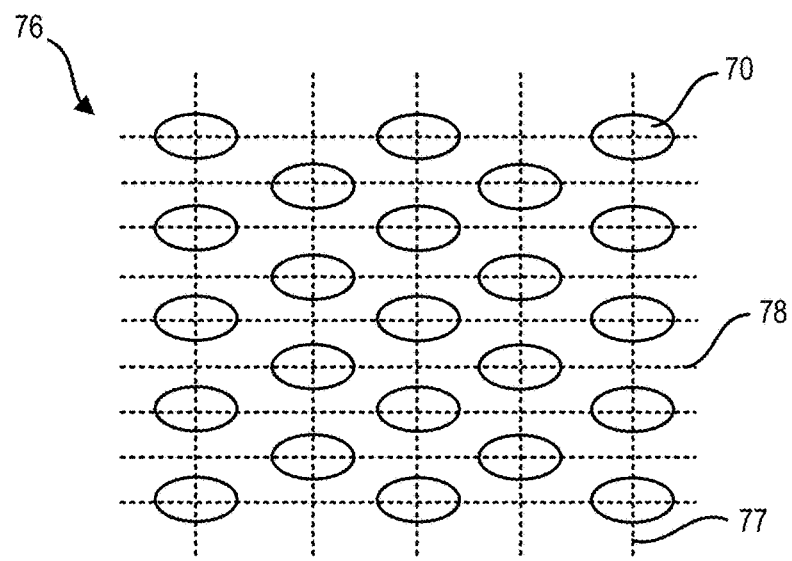

FIG. 31 shows a cross-sectional top view of the heat sink module of FIG. 21 taken along section C-C shown in FIG. 25, the cross-section passing horizontally through the dividing member of the heat sink module to expose an array of orifices within the heat sink module, the orifices in the array being arranged according to staggered columns and staggered rows to prevent flow stagnation regions on a surface to be cooled.

Figure 32:
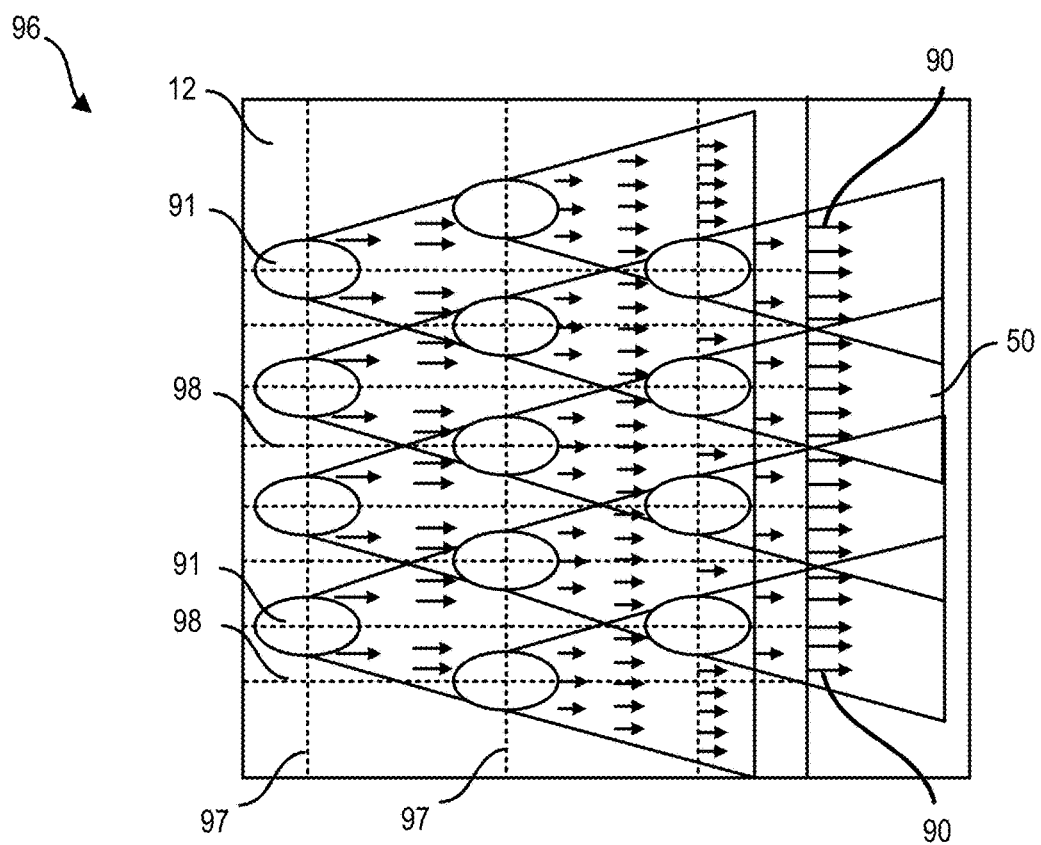

FIG. 32 shows a top view of a surface to be cooled within an outlet chamber of a heat sink module of FIG. 21 taken along section D-D shown in FIG. 30, where an array of jet streams originating from the array of orifices in the heat sink module are impinging non-perpendicularly on the surface to be cooled, thereby creating a directional flow of coolant from left to right across the surface to be cooled, the directional flow filling the outlet chamber and traveling toward an and exiting from an outlet port of the heat sink module.

Figure 33:
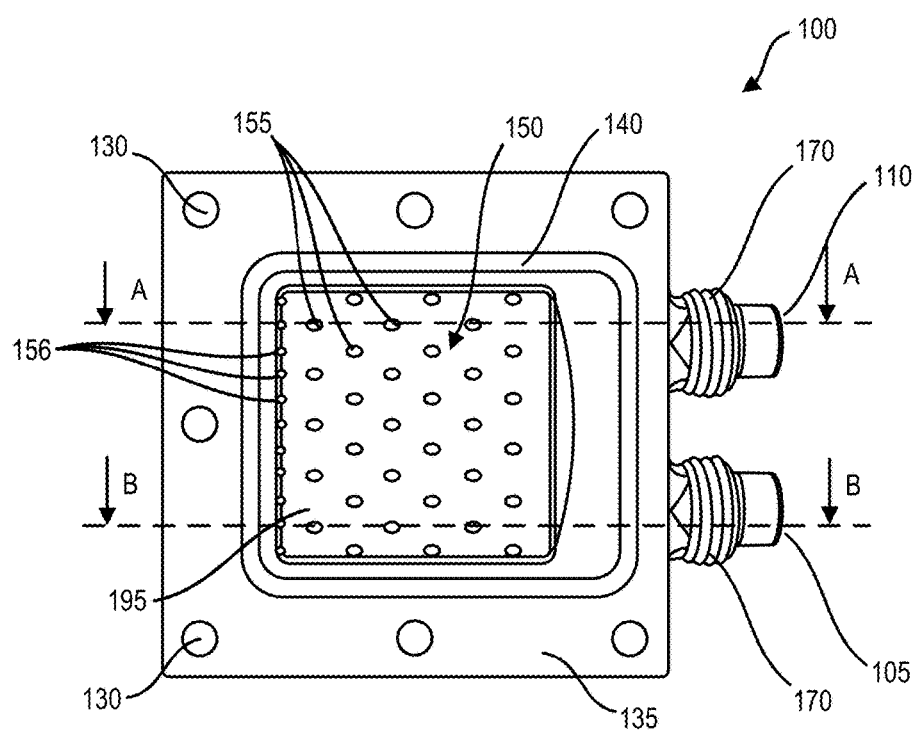

FIG. 33 shows a bottom view of a heat sink module having a first plurality of orifices and a second plurality of orifices, the second plurality of orifices being configured to deliver a plurality of anti-pooling jet streams into the outlet chamber to promote directional flow within the outlet chamber and to prevent pooling on the surface to be cooled.

Figure 34:
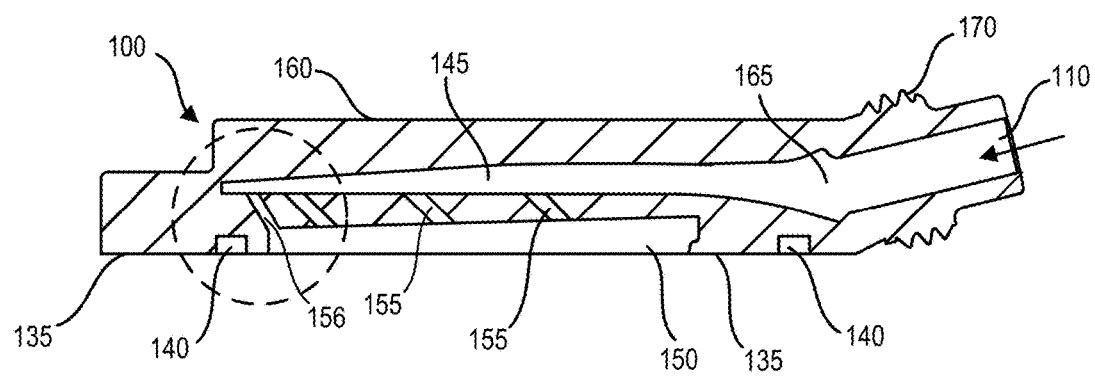

FIG. 34 shows a side cross-sectional view of the heat sink module of FIG. 33 taken along section B-B, the side view showing an inlet port, an inlet passage, an inlet chamber, a plurality of orifices, an outlet chamber, and an anti-pooling orifice within the heat sink module.

Figure 35:
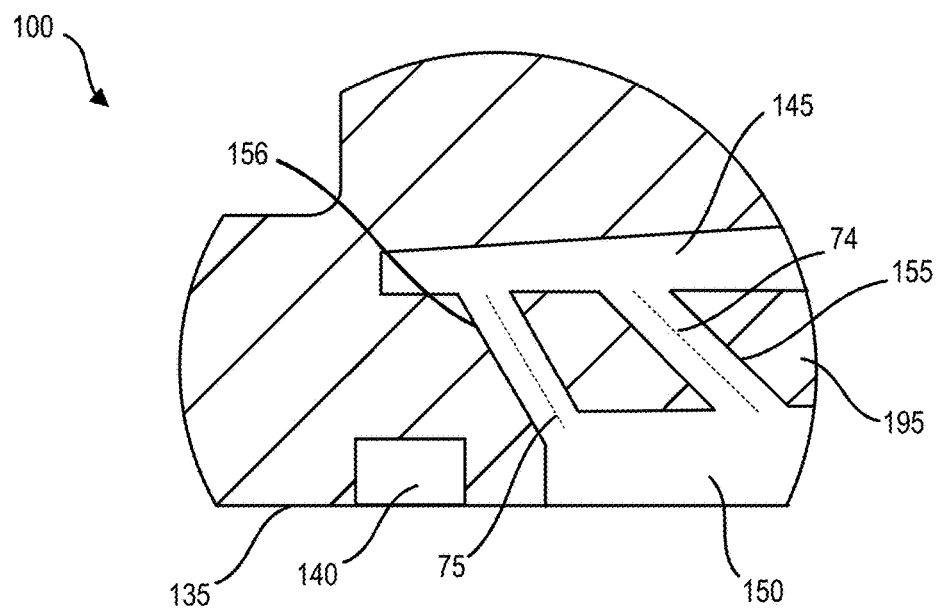

FIG. 35 shows a detailed view of a portion of the heat sink module of FIG. 34 highlighting the anti-pooling orifice that extends from the inlet chamber to a rear wall of the outlet chamber and is configured to deliver an anti-pooling jet stream proximate a rear wall of the outlet chamber to prevent pooling on the surface to be cooled.

Figure 36:
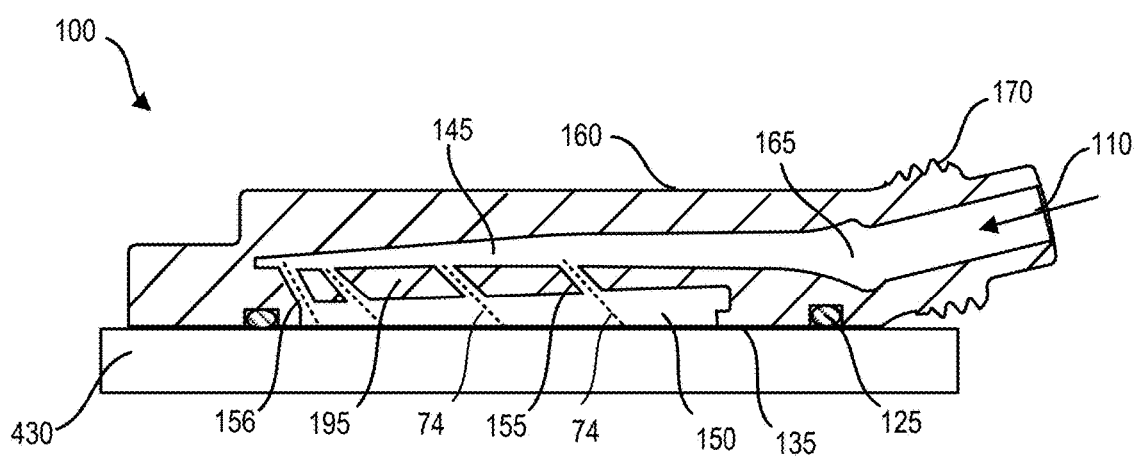

FIG. 36 shows a side cross-sectional view of the heat sink module of FIG. 33 taken along section B-B, with the heat sink module sealed against a thermally conductive base member and showing central axes of a plurality of orifices and an anti-pooling orifice located near a rear wall of the outlet chamber.

Figure 37:
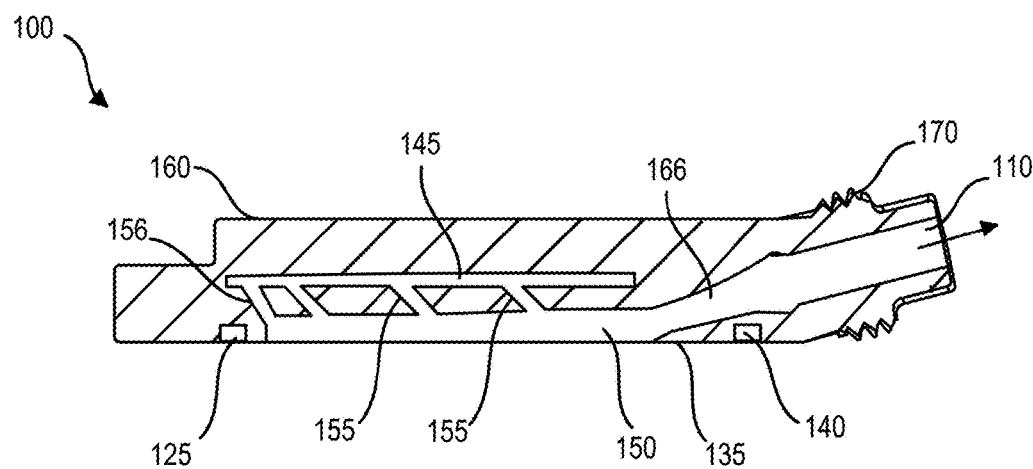

FIG. 37 shows a side cross-sectional view of the heat sink module of FIG. 33 taken along section A-A and showing an outlet port, an outlet passage, an inlet chamber, an outlet chamber, a plurality of orifices, and an anti-pooling orifice.

Figure 38:
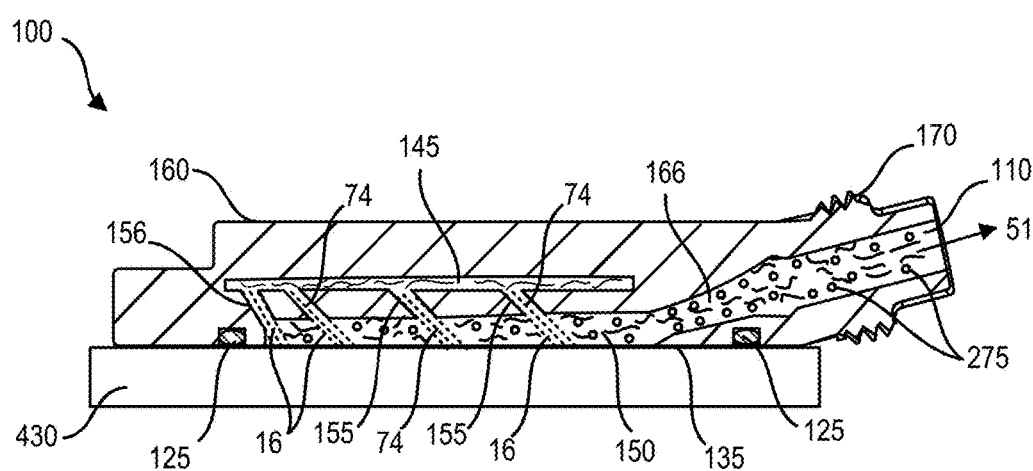

FIG. 38 shows a side cross-sectional view of the heat sink module of FIG. 33 taken along section A-A, with the heat sink module sealed against a thermally conductive base member, the figure showing coolant being introduced to an outlet chamber as a plurality of jet streams of coolant, a portion of liquid coolant changing phase upon absorbing heat from the surface to be cooled thereby forming a directional flow of two-phase bubbly flow that exits the heat sink module through an outlet port.

Figure 39:
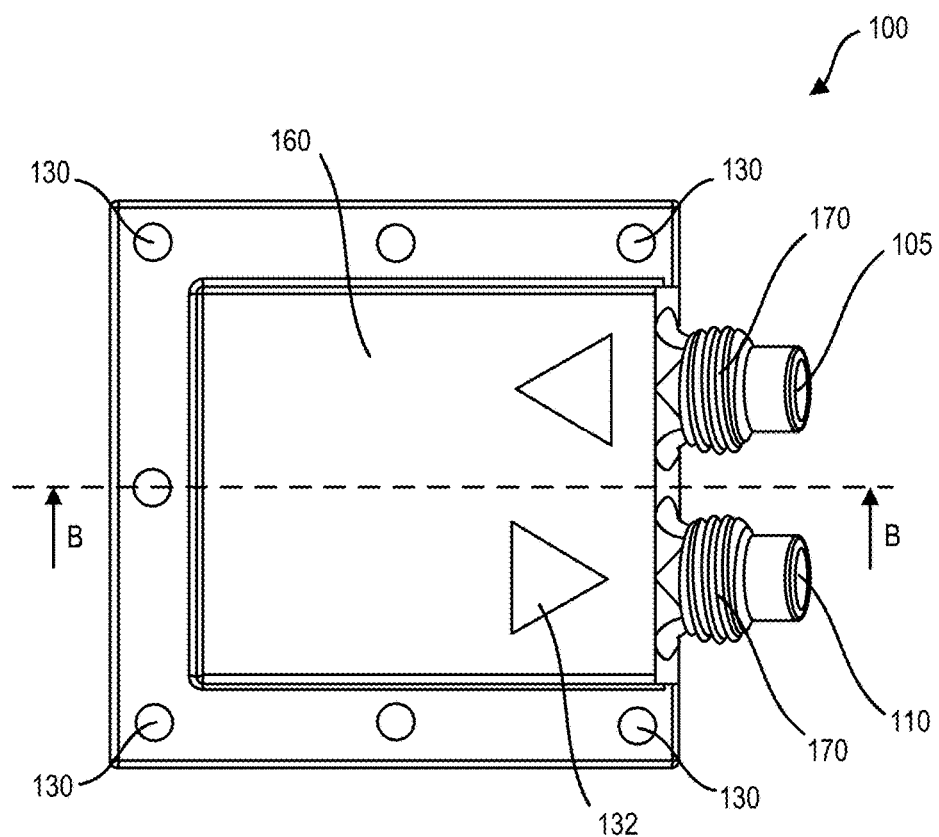

FIG. 39 shows a top view of a heat sink module of FIG. 33.

Figure 40:
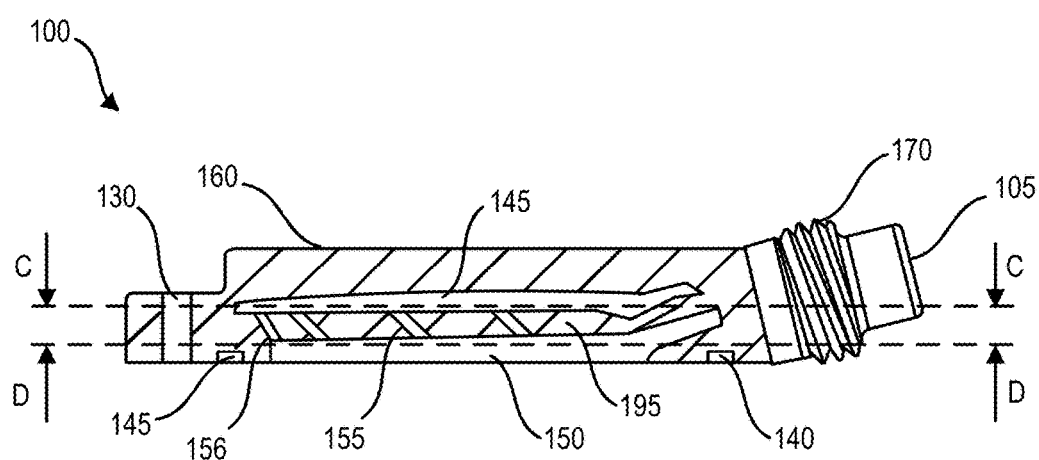

FIG. 40 shows a side cross-sectional view of the heat sink module of FIG. 39 taken along section B-B and showing the location of section C-C passing through an inlet chamber and the location of section D-D passing through an outlet chamber.

Figure 41:
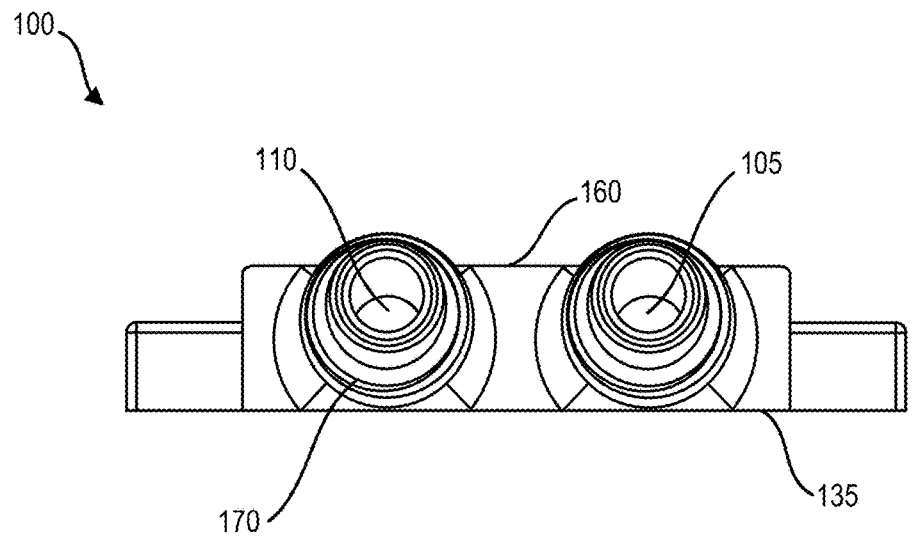

FIG. 41 shows a front view of the heat sink module of FIG. 33 showing an upwardly angled inlet port and an upwardly angle outlet port.

Figure 42:
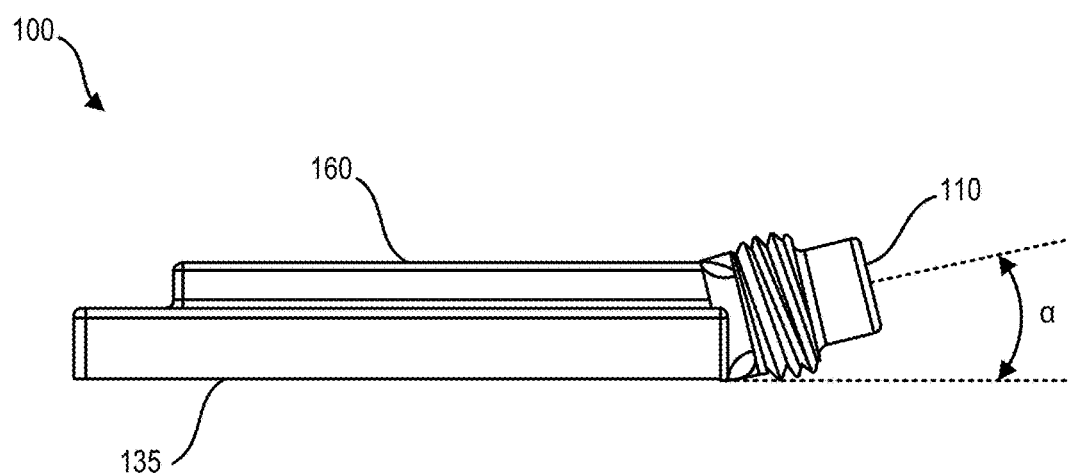

FIG. 42 shows a left side view of the heat sink module of FIG. 33 showing an outlet port and an inlet port arranged at an angle of α with respect to a mounting surface of the heat sink module, the angle configured to permit ease of assembly within a crowded server housing or other constrained installation.

Figure 43:
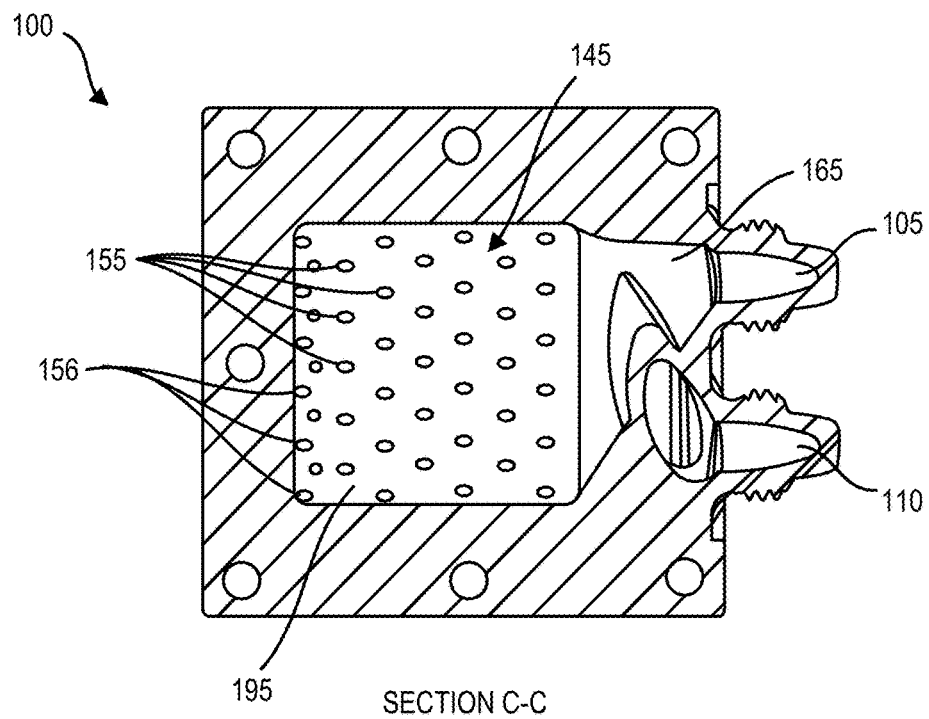

FIG. 43 shows a top cross-sectional view of the heat sink module of FIG. 39 taken along section C-C shown in FIG. 42, the top view showing the inlet port, inlet passage, inlet chamber, top surface of the dividing member, and inlets of the plurality of orifices and plurality of anti-pooling orifices.

Figure 44:
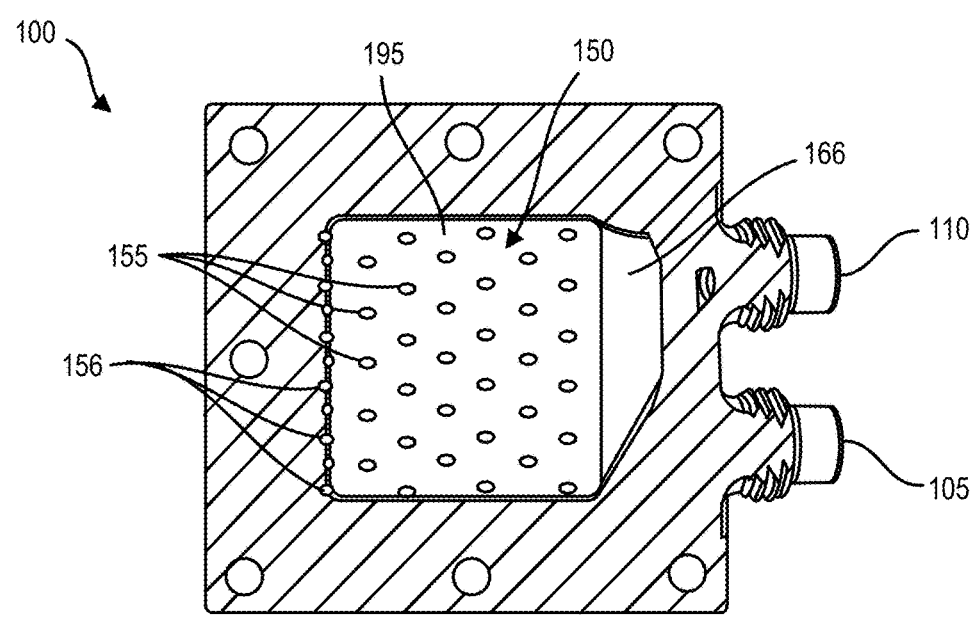

FIG. 44 shows a cross-sectional bottom view of the heat sink module of FIG. 39 taken along section D-D shown in FIG. 42, the bottom view showing the outlet port, outlet passage, outlet chamber, bottom surface of the dividing member, and outlets of the plurality of orifices and plurality of anti-pooling orifices.

Figure 45:
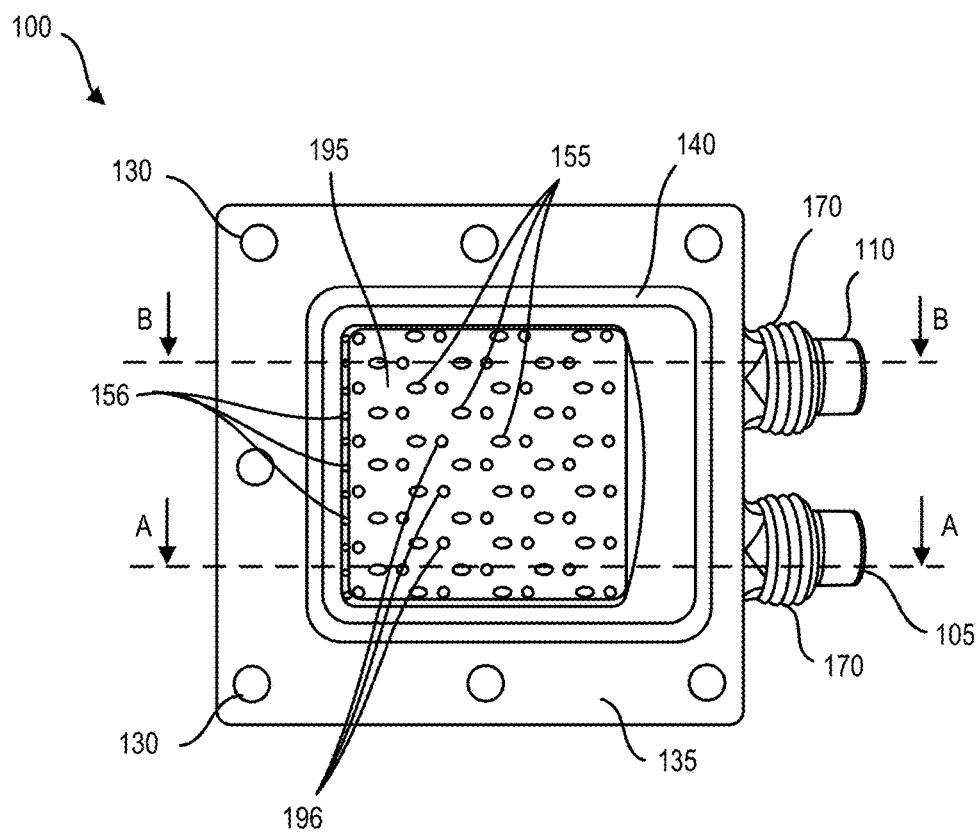

FIG. 45 shows a bottom view of a heat sink module having a plurality of boiling-inducing members extending from the dividing member into the outlet chamber.

Figure 46:
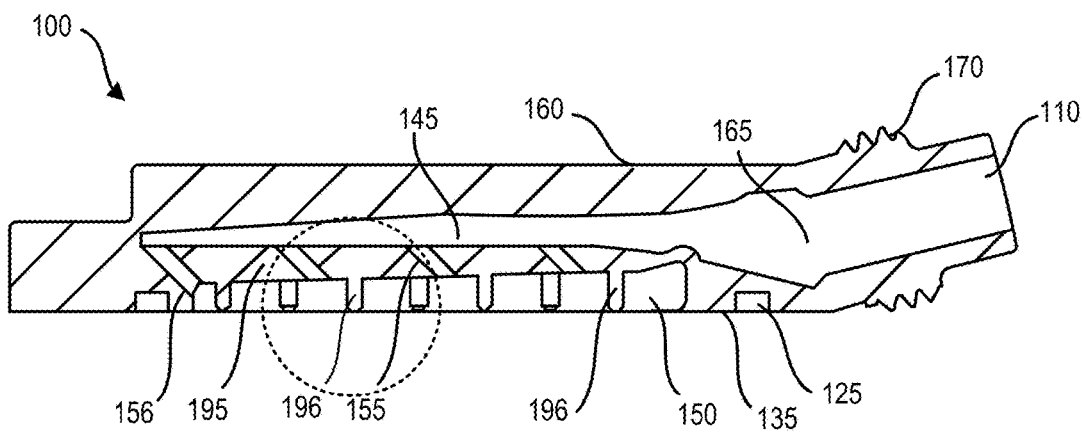

FIG. 46 shows a side cross-sectional view of the heat sink module of FIG. 45 taken along section B-B, the side view showing an inlet port, an inlet passage, an inlet chamber, a plurality of orifices, a dividing member, and a plurality of boiling-inducing members extending from the dividing member into the outlet chamber.

Figure 47:
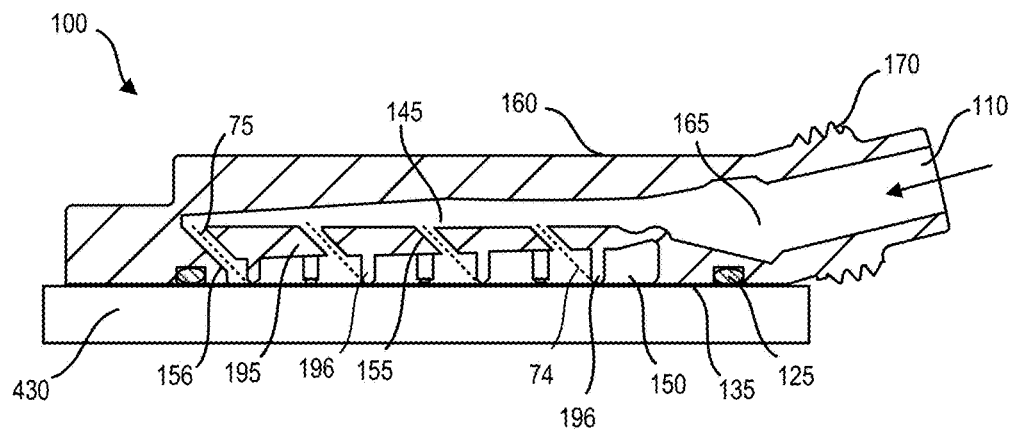

FIG. 47 shows a side cross-sectional view of the heat sink module of FIG. 45 taken along section B-B with the heat sink module mounted on a thermally conductive base member and showing central axes of the plurality of orifices.

Figure 48:
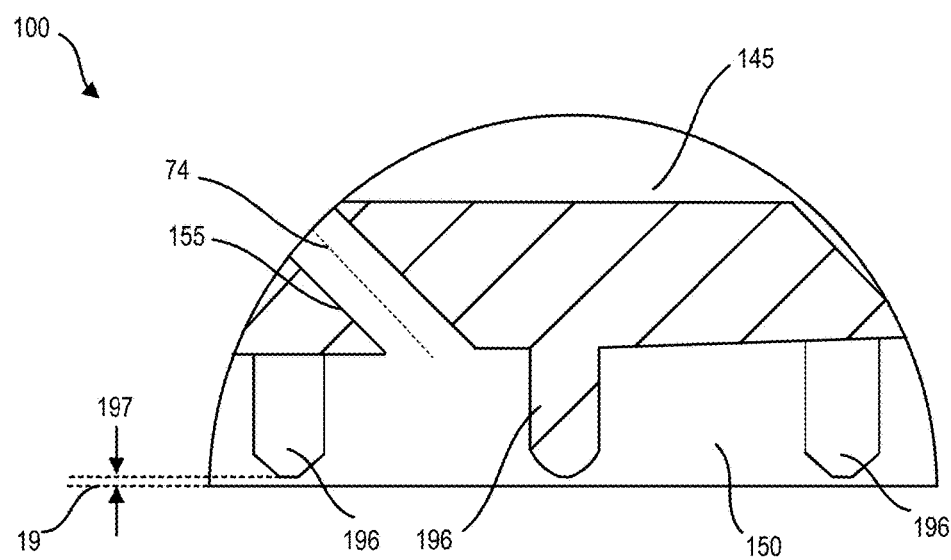

FIG. 48 shows a detailed view of a portion of the heat sink module shown in FIG. 46, the detailed view showing three boiling inducing members extending from a bottom surface of the dividing member into the outlet chamber and an orifice extending from the inlet chamber to the outlet chamber, a flow clearance being provided between a tip of each boiling-inducing member and a surface to be cooled.

Figure 49:
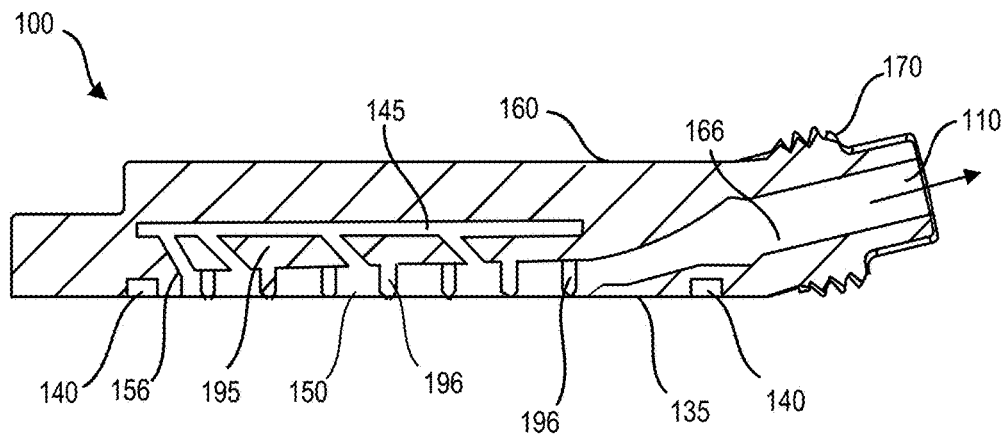

FIG. 49 shows a side cross-sectional view of the heat sink module of FIG. 45 taken along section A-A, the side view showing an outlet port, an outlet passage, an inlet chamber, an outlet chamber, a plurality of orifices, an anti-pooling orifice, a plurality of boiling-inducing members, and a dividing member.

Figure 50:
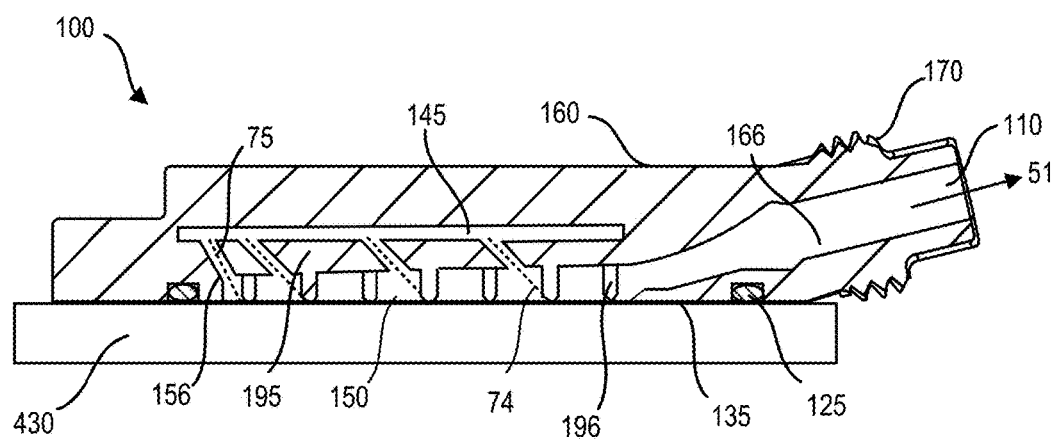

FIG. 50 shows a side cross-sectional view of the heat sink module of FIG. 45 taken along section A-A, the heat sink module being mounted on a thermally conductive base member, the figure showing central axes of the plurality of orifices and an anti-pooling orifice.

Figure 51A:
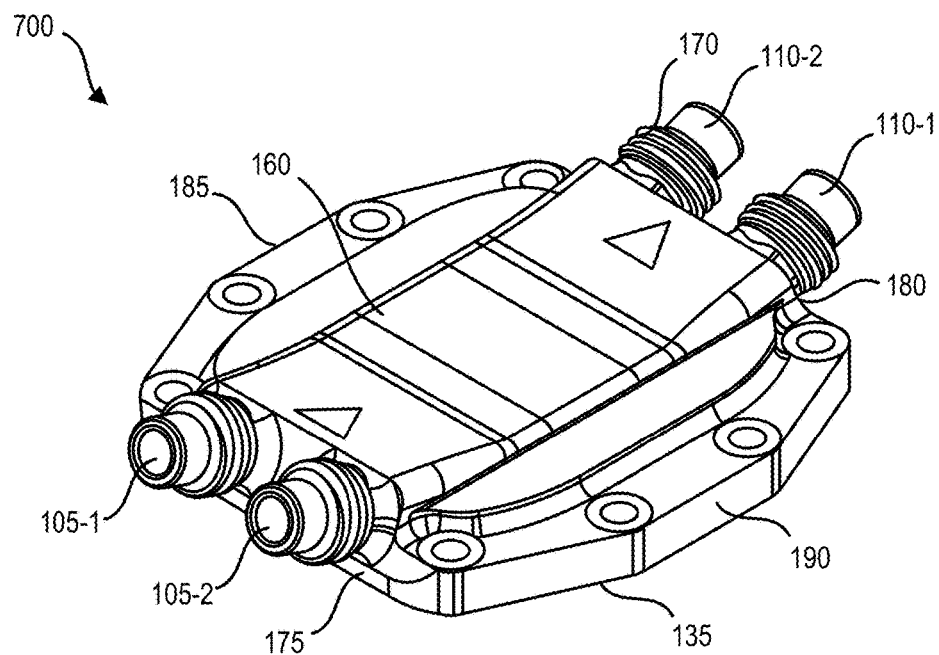

FIG. 51A shows a top perspective view of a redundant heat sink module having a first independent coolant pathway and a second independent coolant pathway.

Figure 51B:
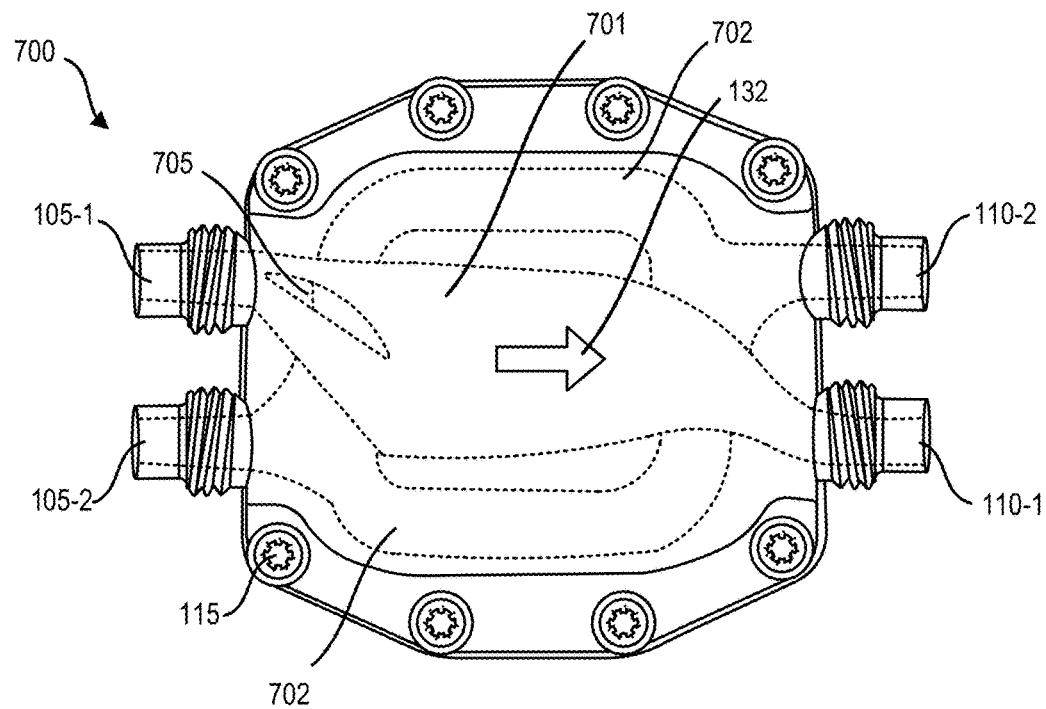

FIG. 51B shows a top view of the redundant heat sink module of FIG. 51A, where the first independent coolant pathway and the second independent coolant pathway are represented by dashed lines, where the first independent coolant pathway passes through a first region near a middle of the module, and where the second independent coolant pathway passes through a second region beyond a perimeter of the first region.

Figure 51C:
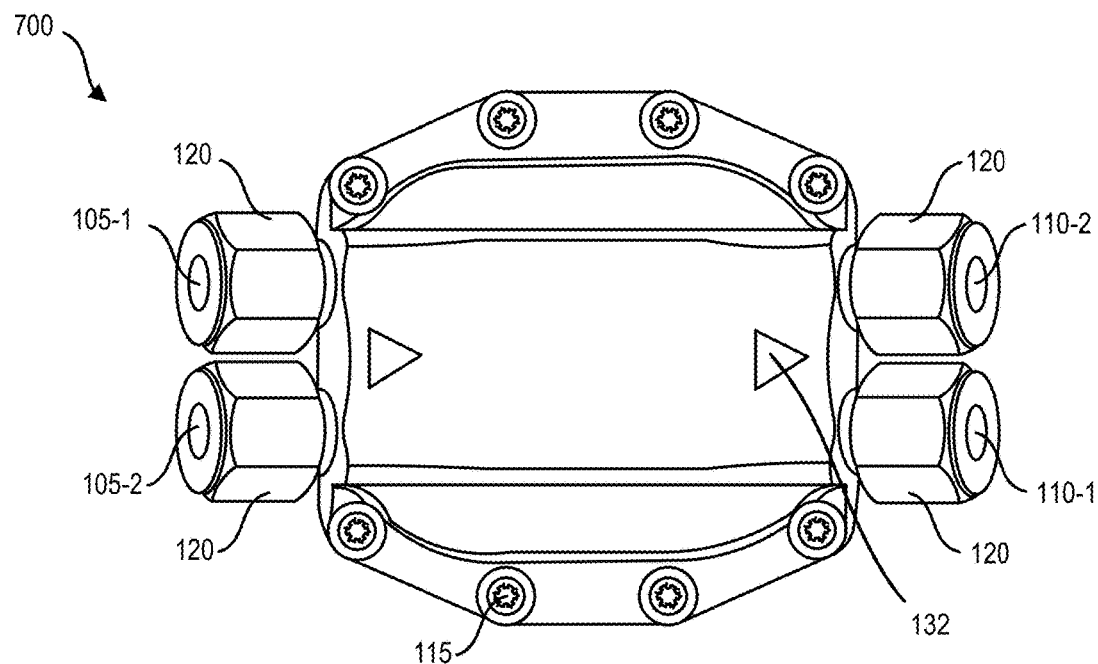

FIG. 51C shows a top view of the redundant heat sink module of FIG. 51A with connectors installed on the inlet and outlet ports.

Figure 51D:
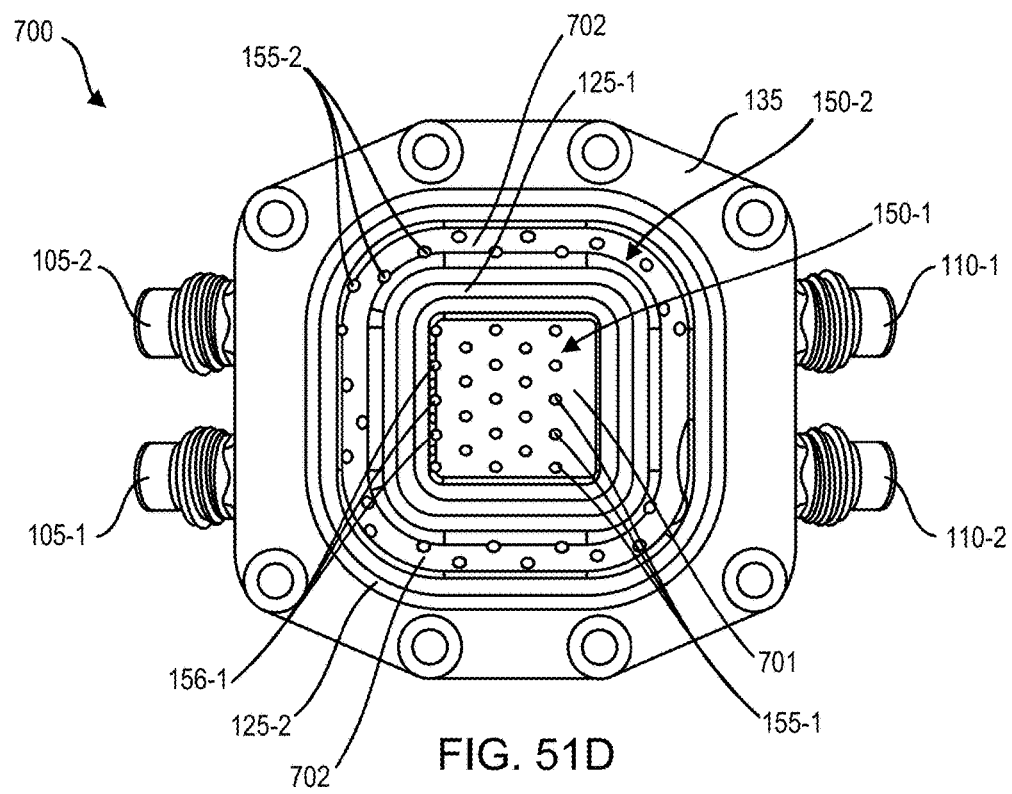

FIG. 51D shows a bottom view of the redundant heat sink module of FIG. 51A, where the first independent coolant pathway includes an array of orifices arranged in a first region located near a middle of the heat sink module, and where the second independent coolant pathway includes an array of orifices arranged in a second region circumscribing the first region, and where a first sealing member is configured to provide a liquid-tight seal between the first and second independent coolant pathways.

Figure 51E:
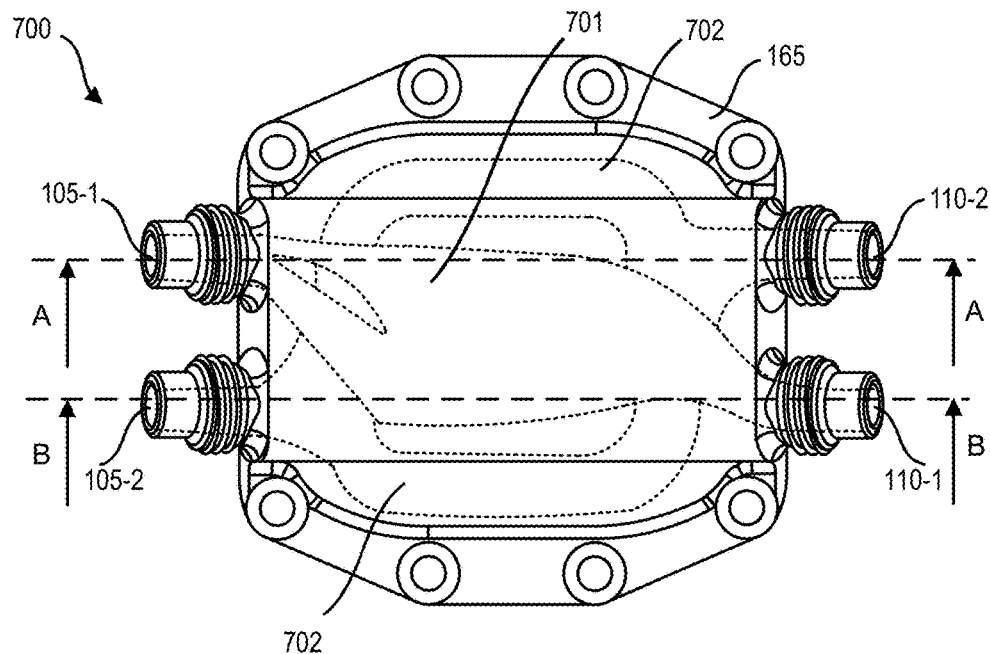

FIG. 51E shows a top view of the heat sink module of FIG. 51A.

Figure 51F:
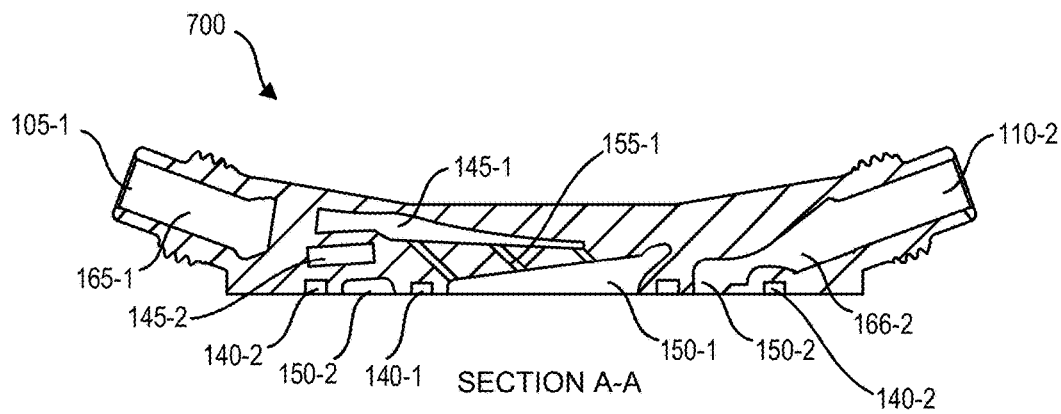

FIG. 51F shows a cross-sectional side view of the redundant heat sink module of FIG. 51A taken along section A-A shown in FIG. 51E, the figure showing a first inlet port, a first inlet passage, a first inlet chamber, a first outlet chamber, a first plurality of orifices, a portion of a second outlet chamber, and a second outlet port.

Figure 51G:
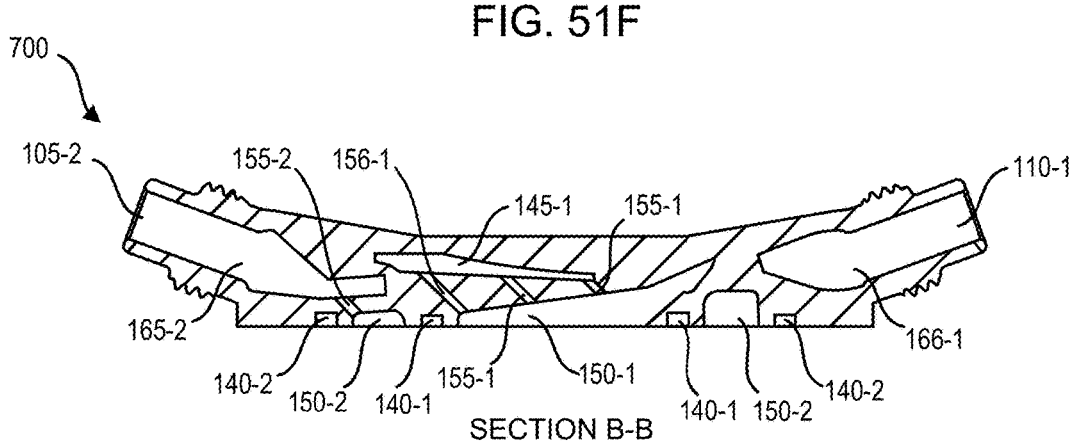

FIG. 51G shows a side cross-sectional side view of the redundant heat sink module of FIG. 51A taken along section B-B shown in FIG. 51E. the figure showing a second inlet port, a second inlet passage, one orifice of a second plurality of orifices, a first plurality of orifices, one of a first plurality of anti-pooling orifices, a first outlet chamber, a portion of a second outlet chamber, and a first outlet port.

Figure 51H:
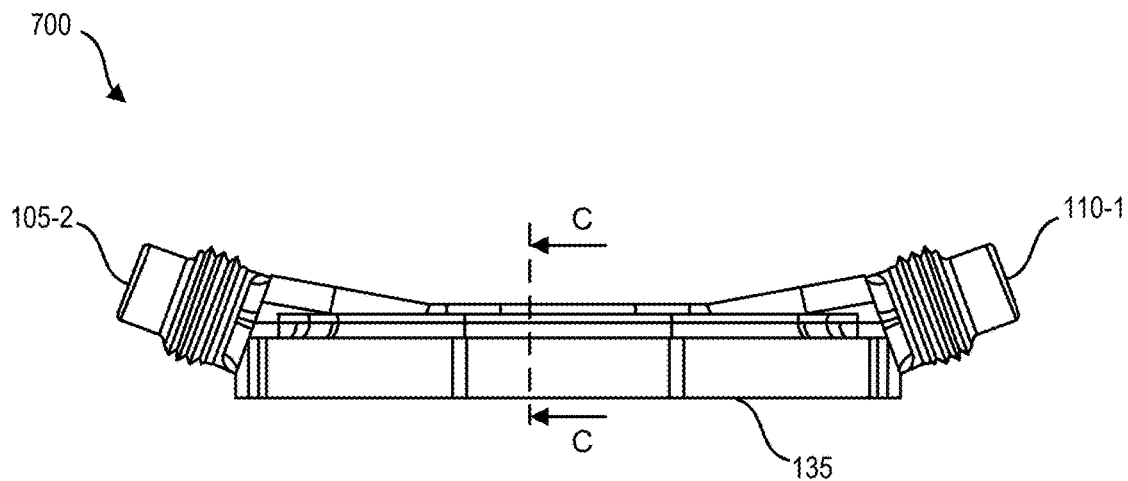

FIG. 51H shows a side view of the redundant heat sink module of FIG. 51A showing upwardly angled ports configured to ease installation in a crowded server housing or other constrained installation.

Figure 51I:
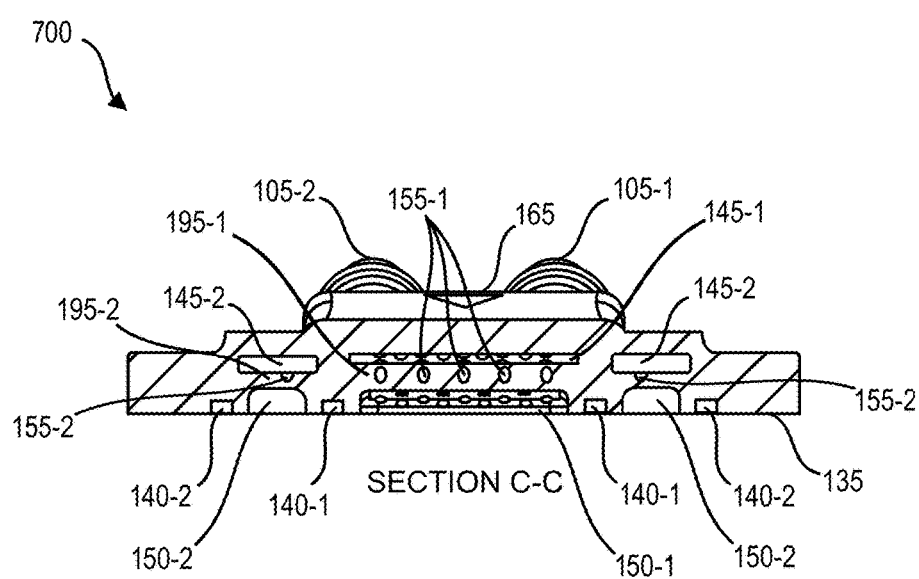

FIG. 51I shows a cross-sectional rear view of the redundant heat sink module of FIG. 51A taken along section C-C shown in FIG. 51H, the figure showing a first inlet chamber, a first outlet chamber, and a first plurality of orifices associated with a first independent coolant pathway and a second inlet chamber, a second outlet chamber, and a second plurality of orifices associated with a second independent coolant pathway.

Figure 51J:
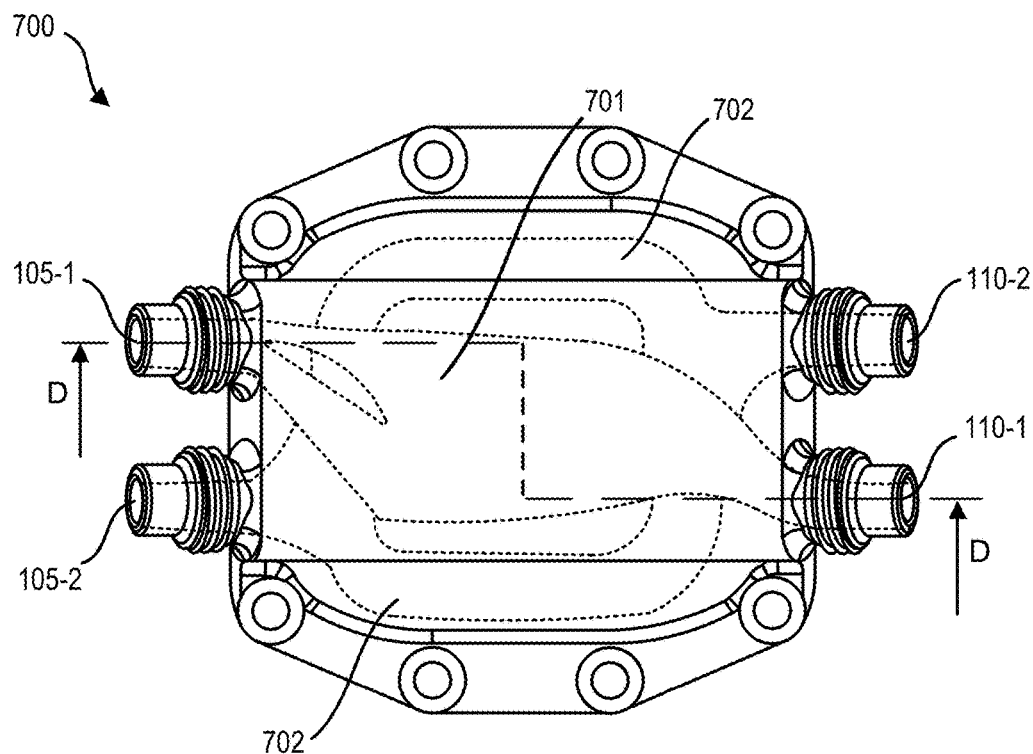

FIG. 51J shows a top view of the redundant heat sink module of FIG. 51A.

Figure 51K:
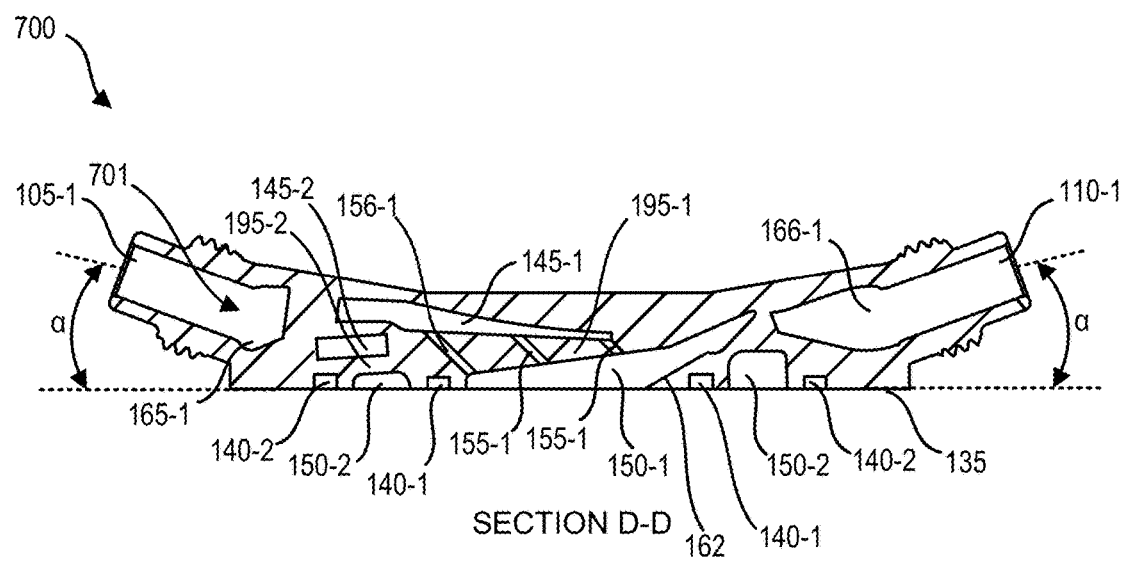

FIG. 51K shows a side cross-sectional view of the redundant heat sink module of FIG. 51A taken along section D-D shown in FIG. 51J, the figure showing a significant portion of the first independent coolant pathway.

Figure 51L:
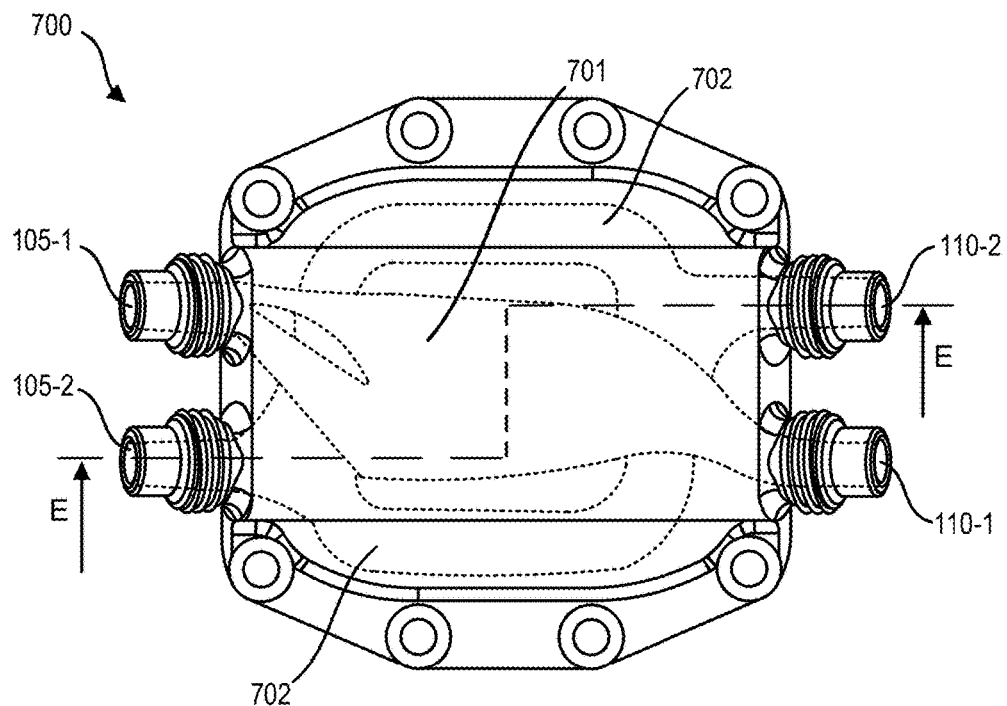

FIG. 51L shows a top view of the redundant heat sink module of FIG. 51A.

Figure 51M:
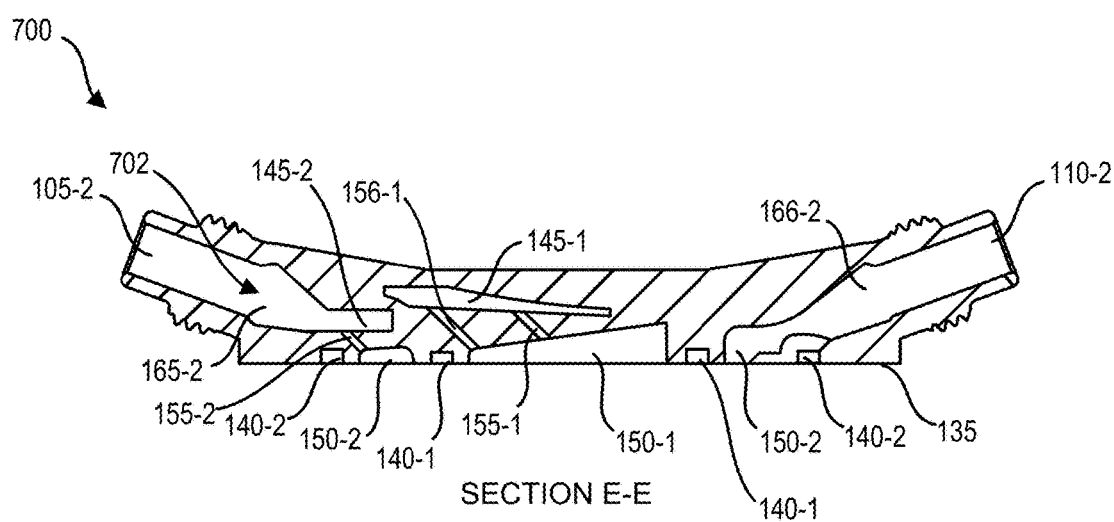

FIG. 51M shows a side cross-section view of the redundant heat sink module of FIG. 51A taken along section E-E of FIG. 51L, the figure showing a significant portion of the second independent coolant pathway.

Figure 51N:
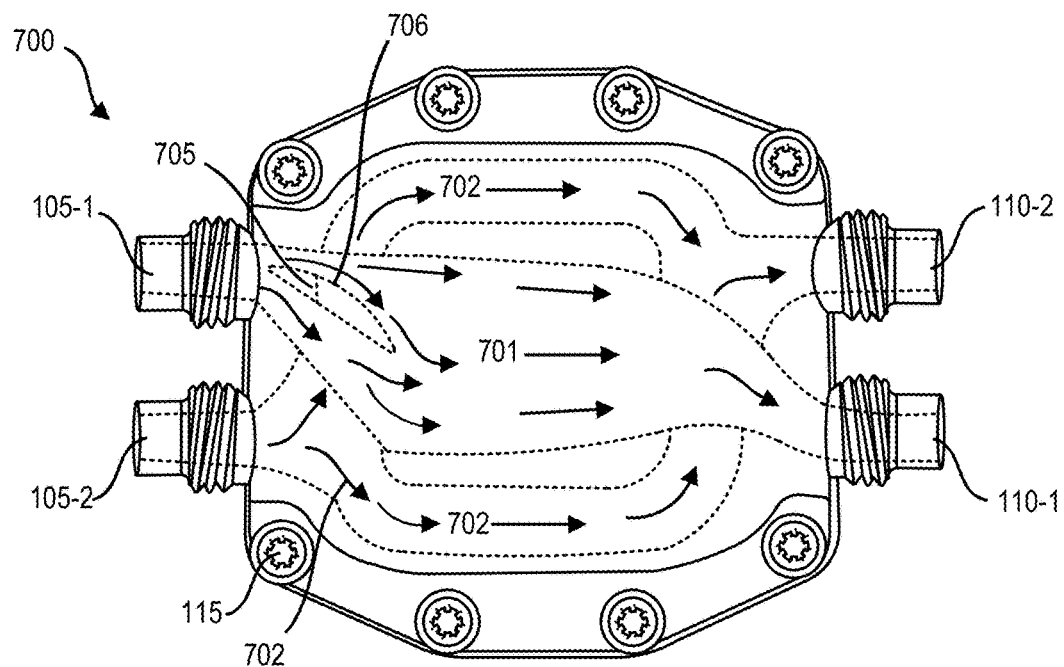

FIG. 51N is a top view of the redundant heat sink module of FIG. 51A and shows flow vectors in a first coolant pathway and flow vectors in a second coolant pathway.

Figure 51O:
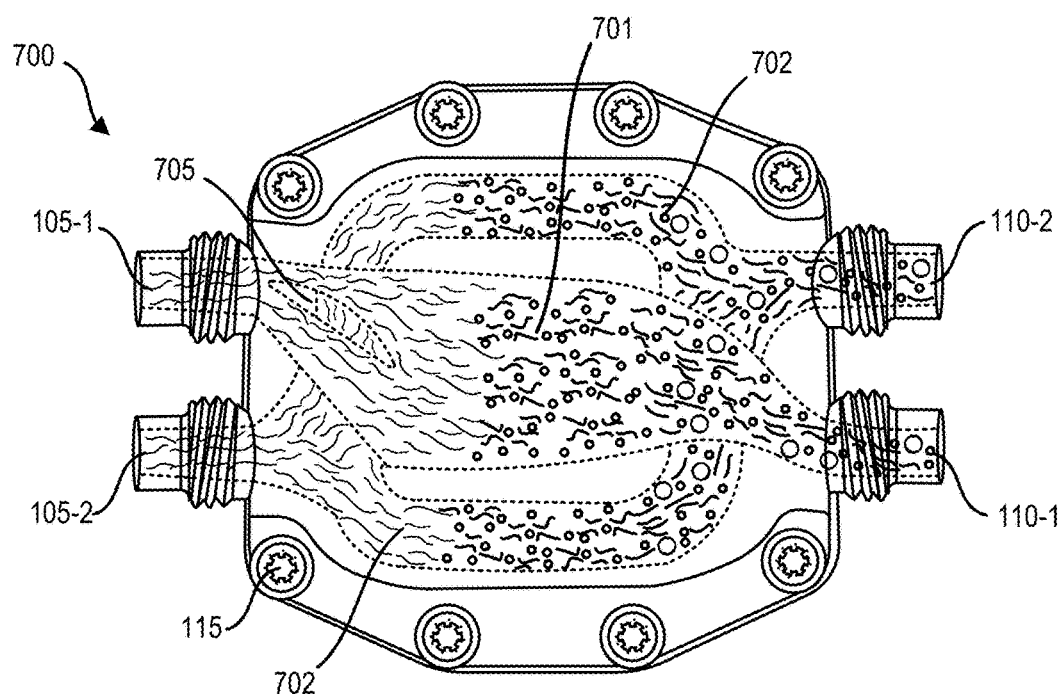

FIG. 51O is a top view of the redundant heat sink module of FIG. 51A and shows a first coolant pathway having a first inlet port and a first outlet port and a second coolant pathway having a second inlet port and a second outlet port, where coolant enters the first inlet port as liquid flow and exits the first outlet port as two-phase bubbly flow, and where coolant enters the second inlet port as liquid flow and exits the second outlet port as two-phase bubbly flow.

Figure 51P:
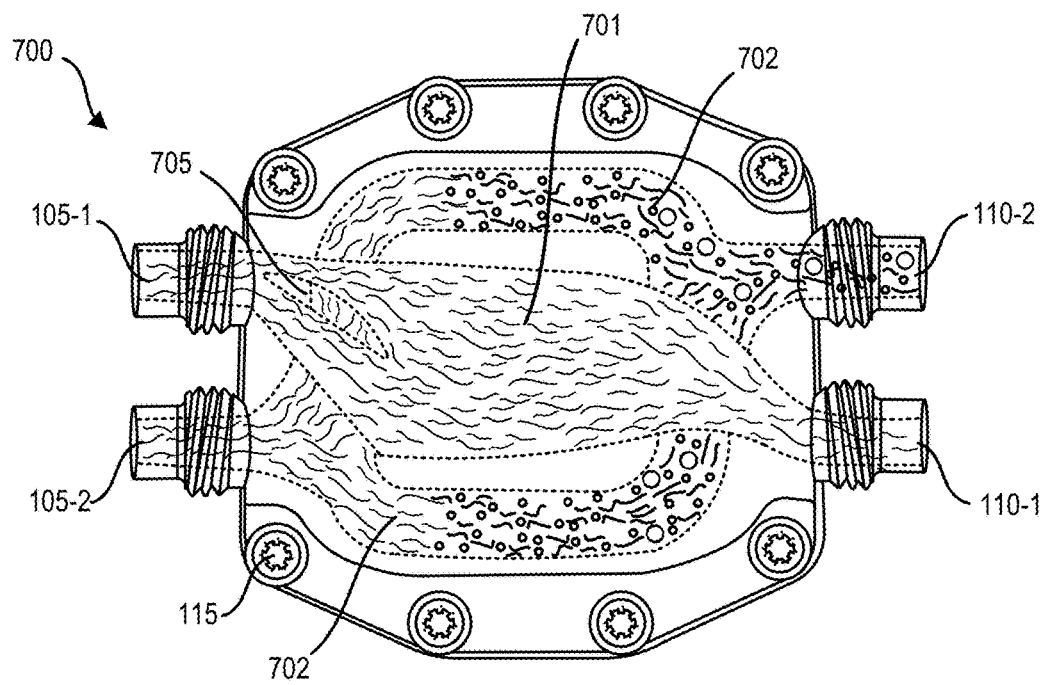

FIG. 51P is a top view of the redundant heat sink module of FIG. 51A and shows a first coolant pathway having a first inlet port and a first outlet port and a second coolant pathway having a second inlet port and a second outlet port, where coolant enters the first inlet port as liquid flow and exits the first outlet port as liquid flow, and where coolant enters the second inlet port as liquid flow and exits the second outlet port as two-phase bubbly flow.

Figure 51Q:
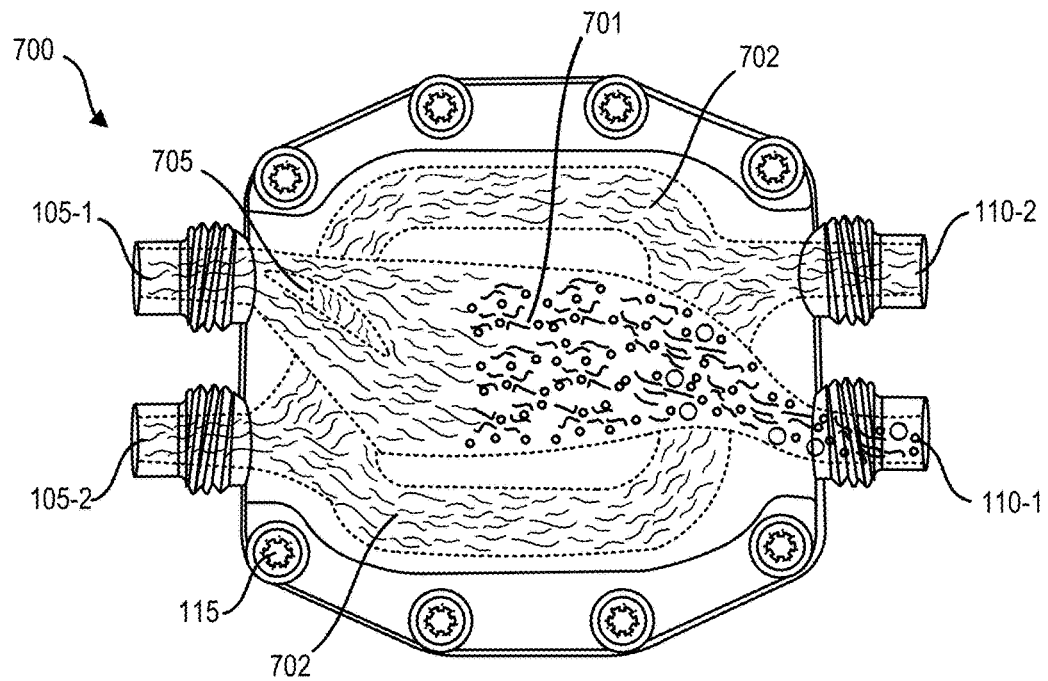

FIG. 51Q is a top view of the redundant heat sink module of FIG. 51A and shows a first coolant pathway having a first inlet port and a first outlet port and a second coolant pathway having a second inlet port and a second outlet port, where coolant enters the first inlet port as liquid flow and exits the first outlet port as two-phase bubbly flow, and where coolant enters the second inlet port as liquid flow and exits the second outlet port as liquid flow.

Figure 52A:
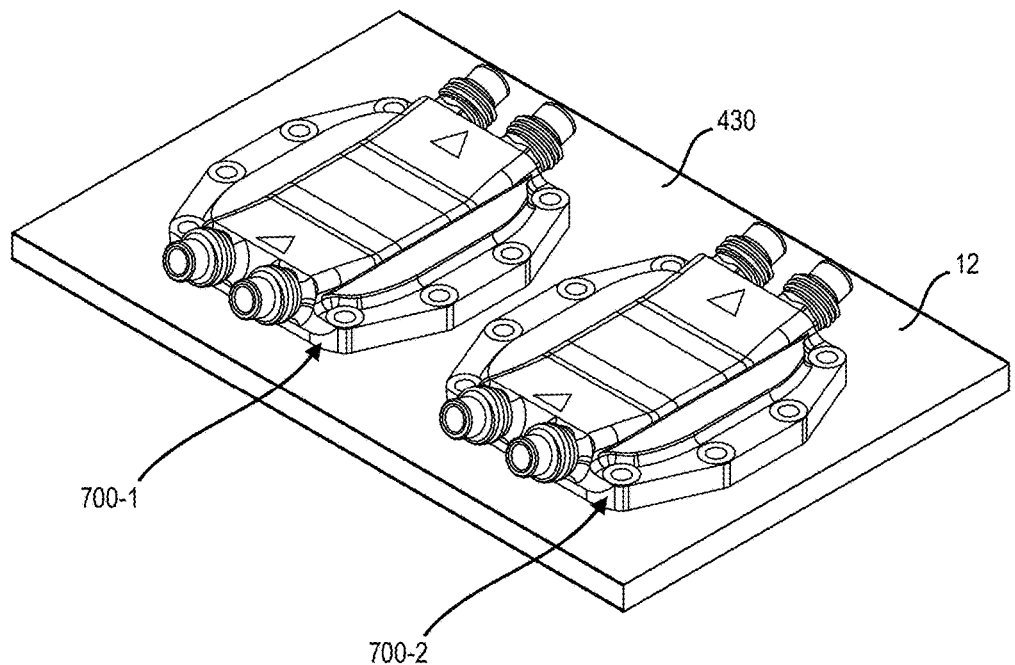

FIG. 52A shows two redundant heat sink modules mounted on a thermally conductive base member, where two sink modules are provided for redundancy and/or increased heat transfer capability.

Figure 52B:
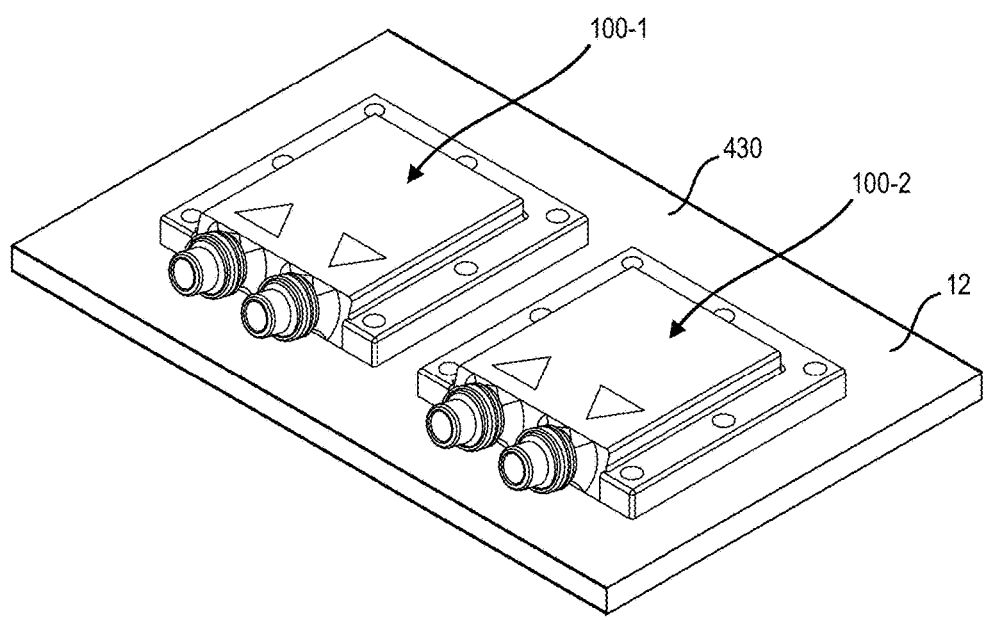

FIG. 52B shows two heat sink modules mounted on a thermally conductive base member, where two sink modules are provided for redundancy and/or increased heat transfer capability.

Figure 53:
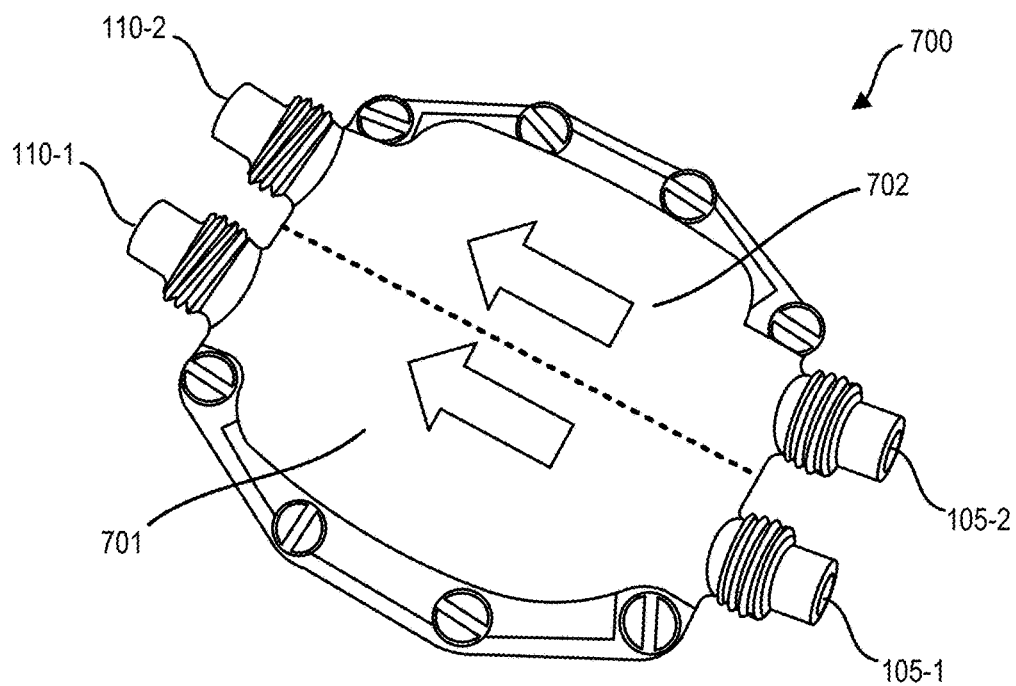

FIG. 53 shows a top perspective view of a redundant heat sink module having side-by-side independent coolant pathways.

Figure 54:
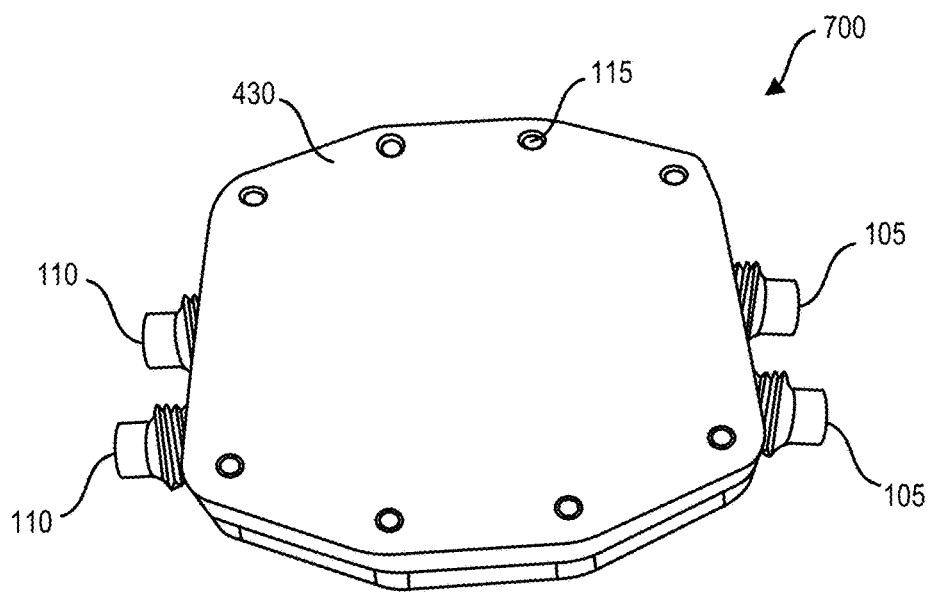

FIG. 54 shows a bottom perspective view of a redundant heat sink module mounted to a planar, thermally conductive base member with fasteners.

Figure 55:
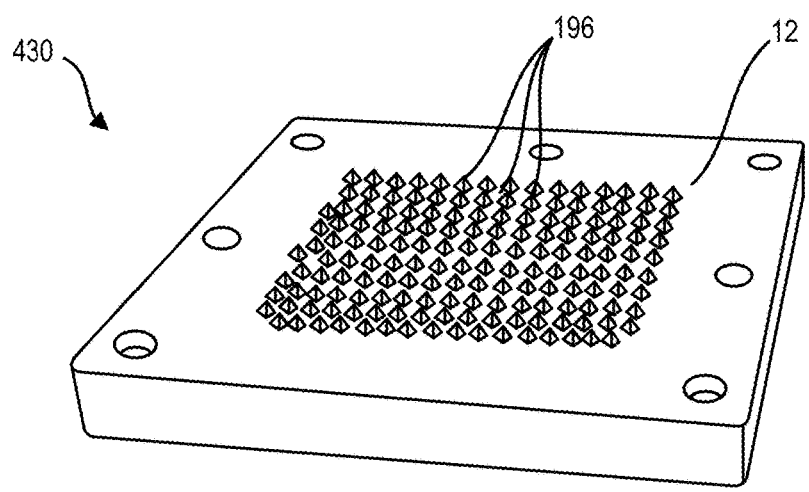

FIG. 55 shows a top perspective view of a thermally conductive base member having a surface to be cooled and an array of boiling-inducing members extending from the surface to be cooled, the array of boiling-inducing members configured to fit within an outlet chamber of a heat sink module when the heat sink module is mounted on the thermally conductive base member.

Figure 56:
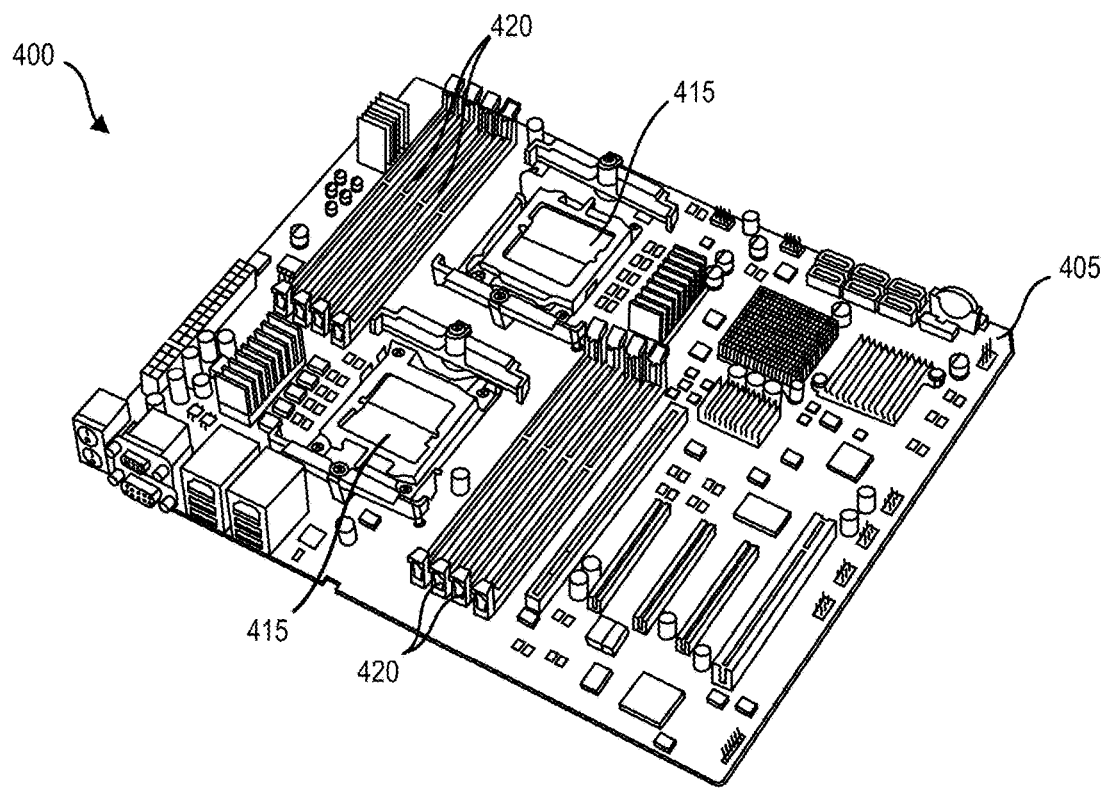

FIG. 56 shows a top perspective view of a motherboard of a server including microprocessors and a plurality of vertically arranged memory modules that are parallel and offset, where a heat sink module can be mounted on top of each microprocessor.

Figure 57:
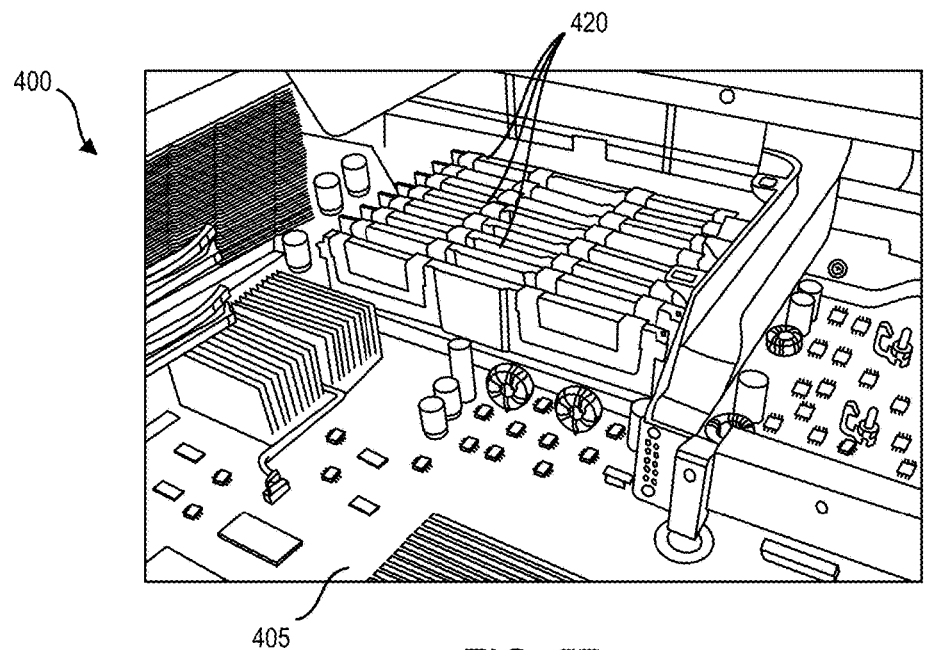

FIG. 57 shows a top perspective view of a server including a plurality of vertically arranged memory modules that are parallel and offset.

Figure 58:
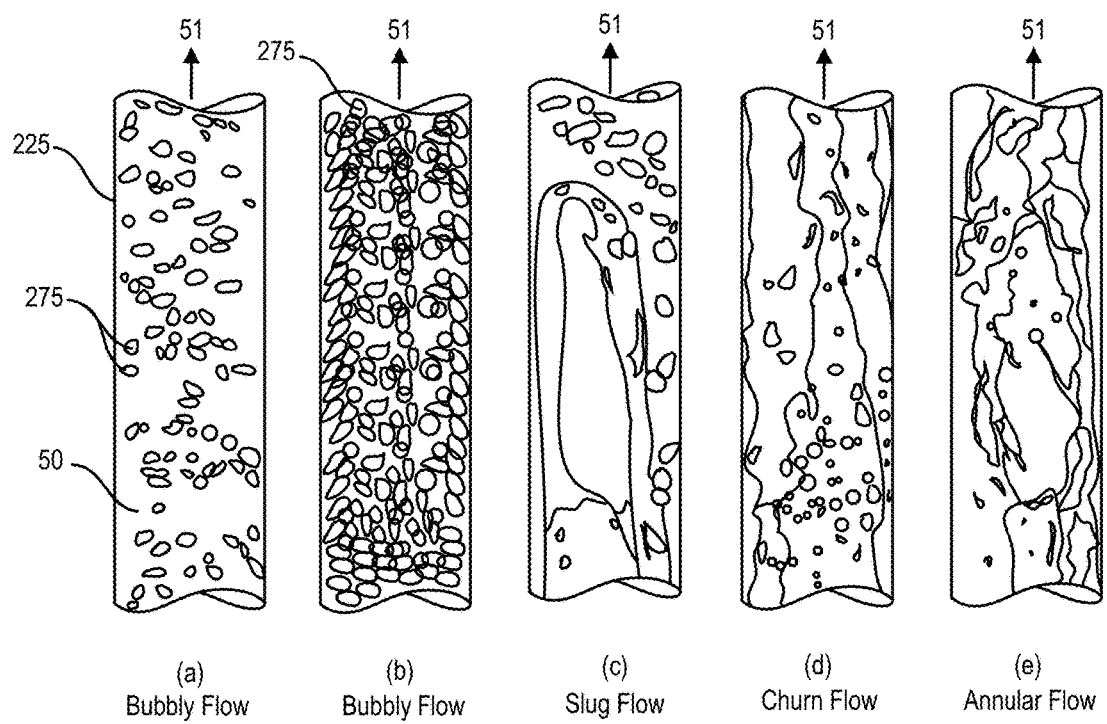

FIG. 58 shows two-phase flow regimes, including (a) bubbly flow with a first number density of bubbles, (b) bubbly flow with a second number density of bubbles that is greater than the first number density of bubbles, (c) slug flow, (d) churn flow, and (e) annular flow.

Figure 59A:
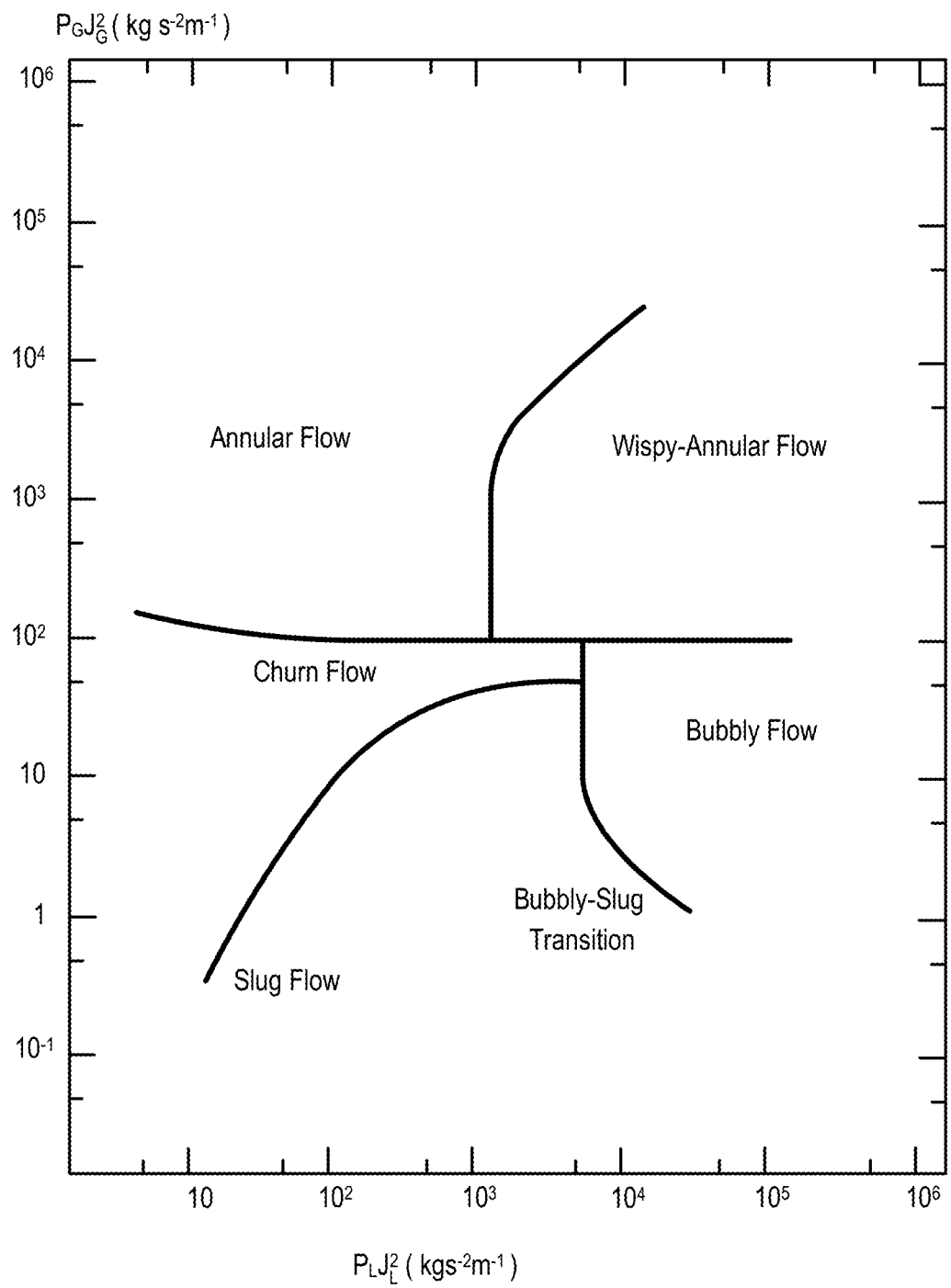

FIG. 59A shows a flow regime map for a steam-water system with $\rho_{liquid}*j_{liquid}^2$ on the x-axis and $\rho_{vapor}*j_{vapor}^2$ on the y-axis.

Figure 59B:
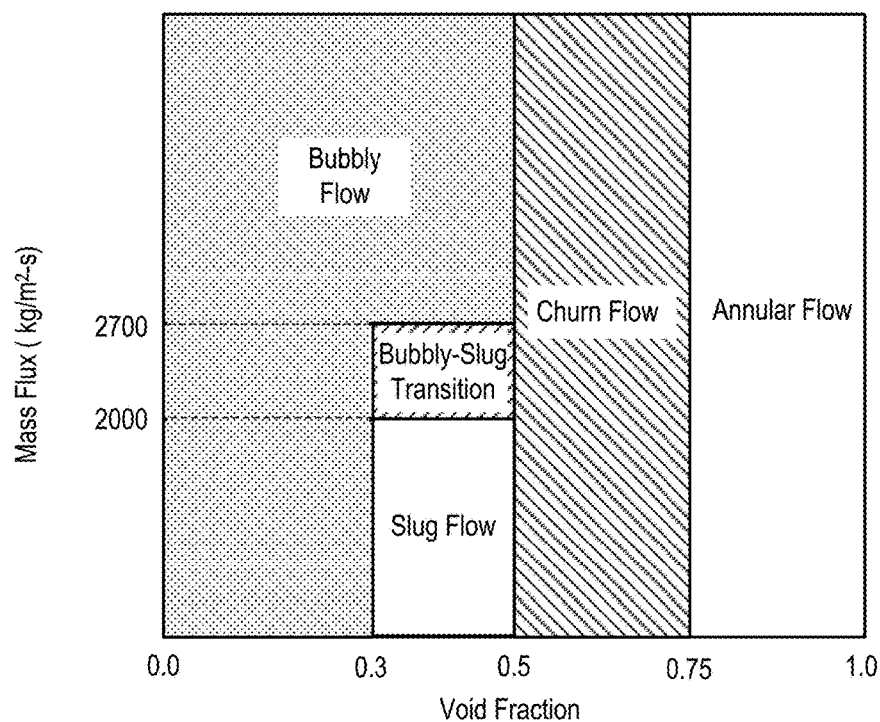

FIG. 59B shows two-phase flow regimes for coolant plotted on void fraction versus mass flux axes.

Figure 60:
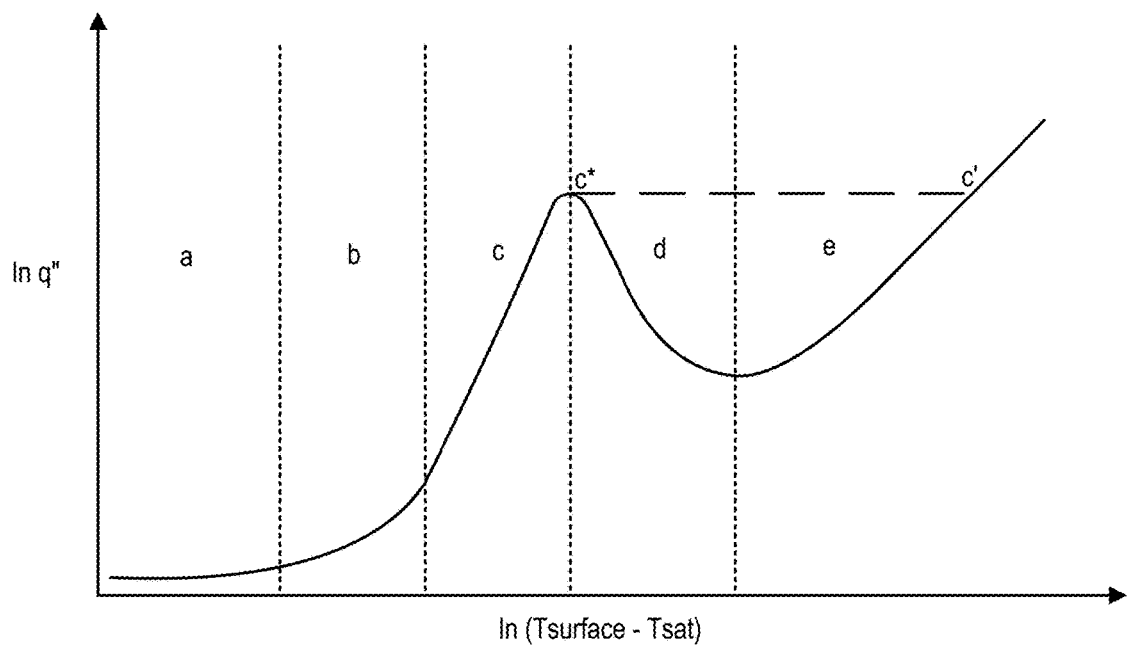

FIG. 60 shows a flow boiling curve for water where heat transfer rate is plotted as a function of excess temperature.

Figure 61:
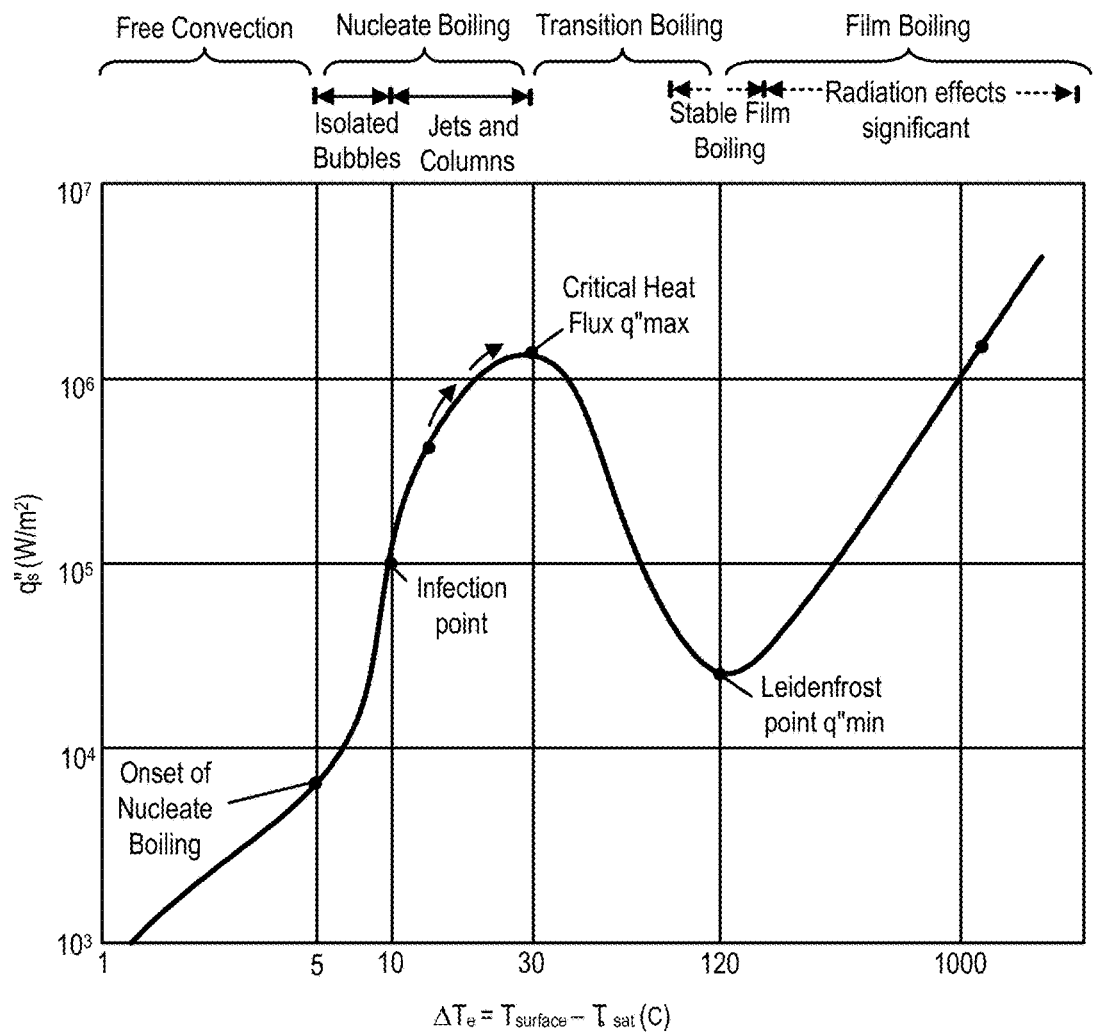

FIG. 61 shows a boiling curve for water at one atmosphere and shows an onset of nucleate boiling, an inflection point, the point of critical heat flux, and the Leidenfrost point.

Figure 62:
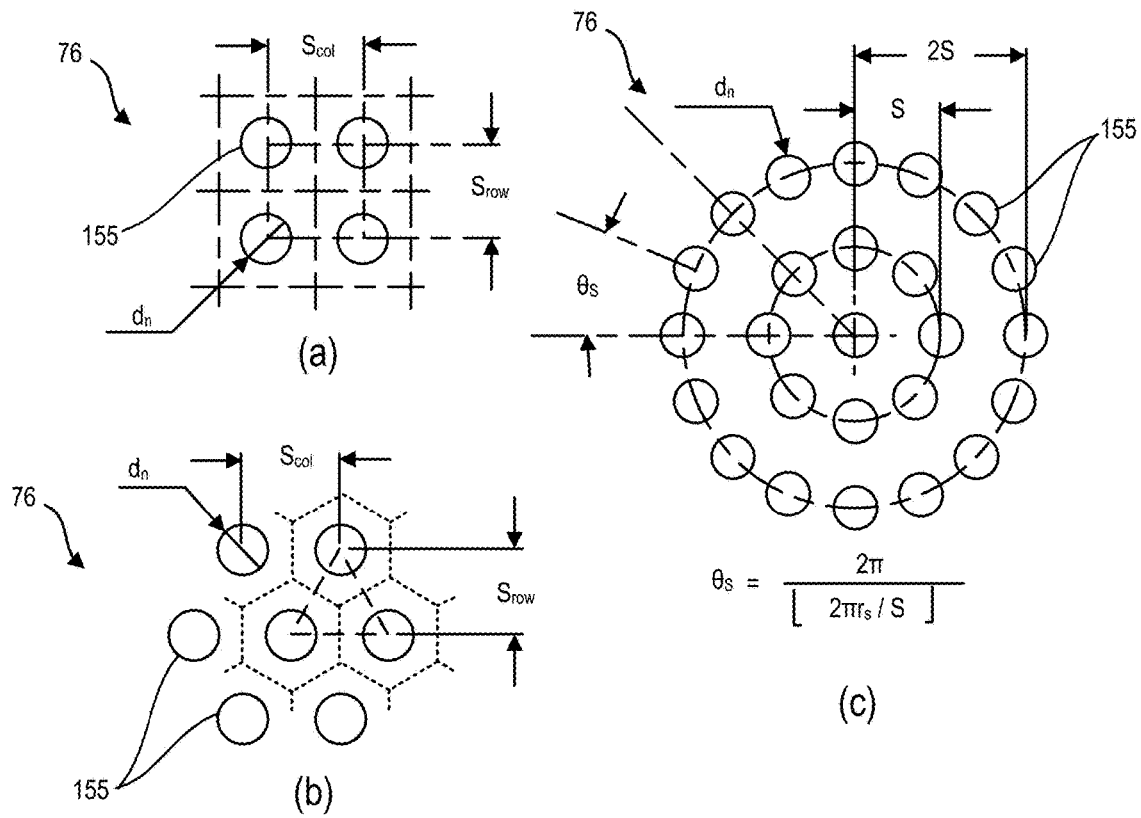

FIG. 62 shows possible orifice configurations for a heat sink module, including (a) a regular rectangular jet array, (b) a regular hexagonal jet array with staggered columns and staggered rows, and (c) a circular jet array.

Figure 63:
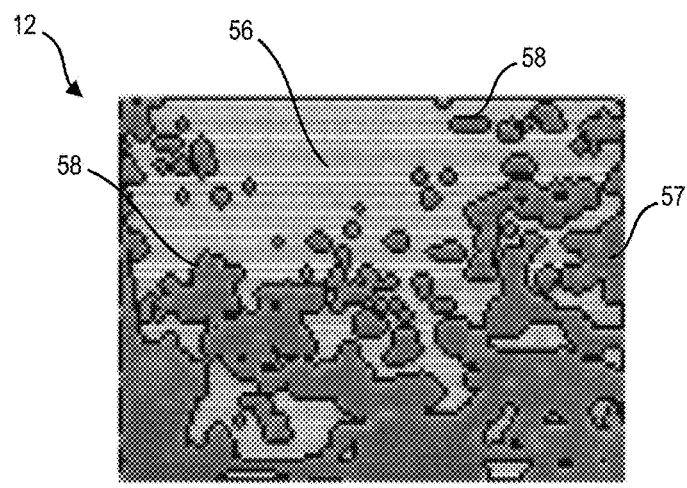

FIG. 63 shows a top view of a heated surface covered by coolant, the coolant having regions of vapor coolant and wetted regions of liquid coolant in contact with the heated surface, where a three-phase contact line length is measured as a sum of all curves where liquid coolant, vapor coolant, and the heated surface are in mutual contact on the heated surface.

Figure 64:
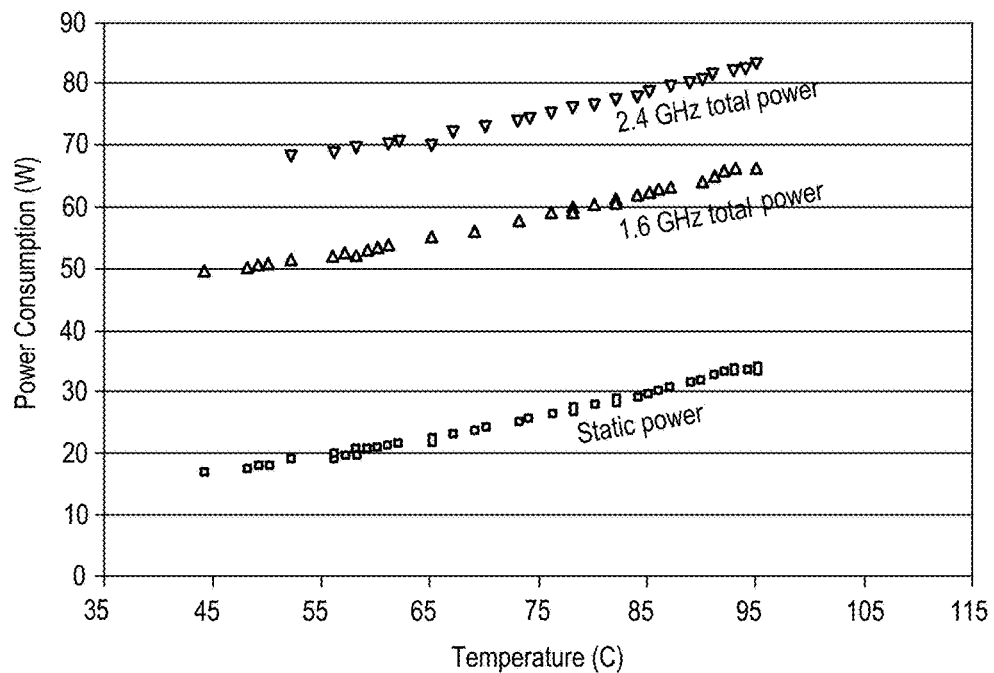

FIG. 64 shows a plot of power consumption versus junction temperature for a processor at a static condition and at dynamic conditions with switching speeds of 1.6 GHz and 2.4 GHz.

Figure 65:
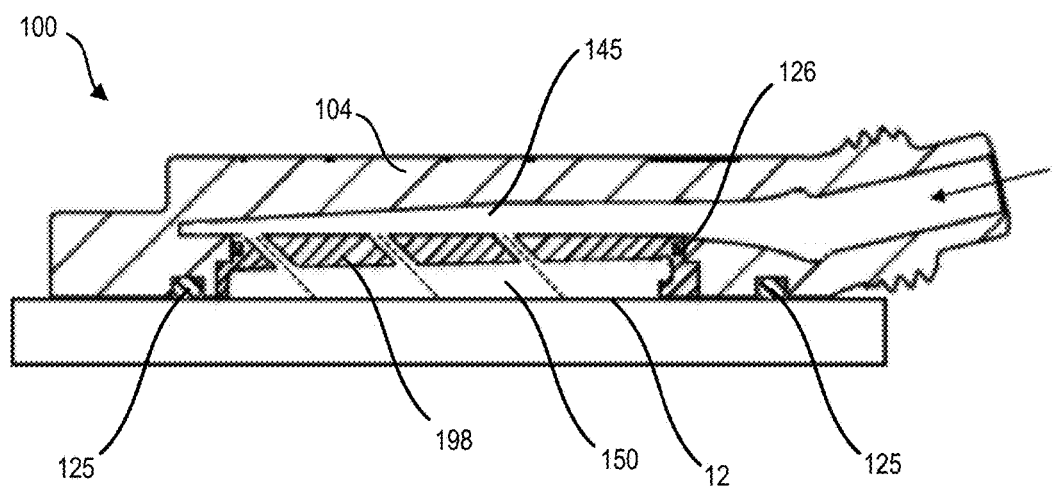

FIG. 65 shows a heat sink module with an insertable orifice plate installed within a module body, where a sealing member is provided between the insertable orifice plate and the module body.

Figure 66:
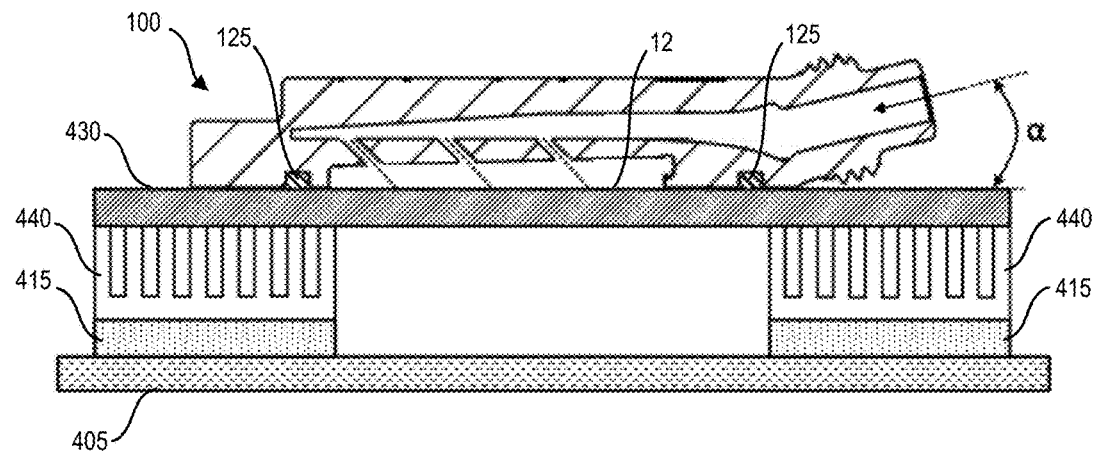

FIG. 66 shows a side cross-sectional view of a motherboard having a first microprocessor, a second microprocessor, a first finned heat sink arranged on top of the first microprocessor, a second finned heat sink arranged on top of the second microprocessor, and a cooling system, where the cooling system includes a heat sink module mounted on a thermally conductive member that extends from the first finned heat sink to the second heat sink module.

Figure 67:
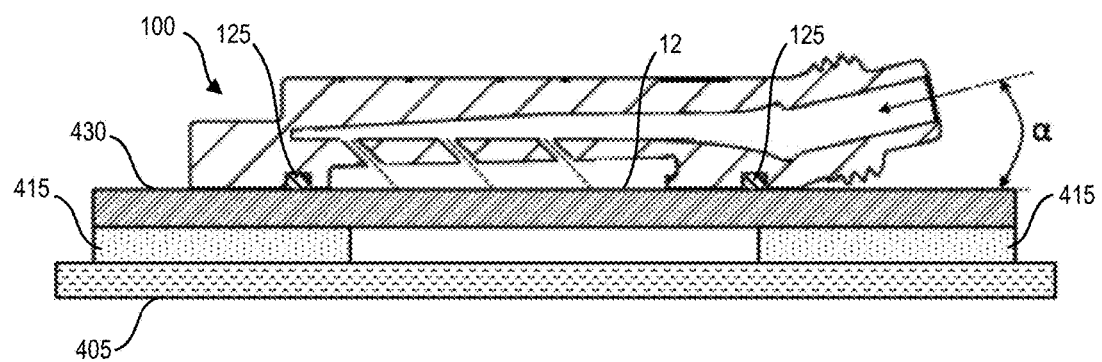

FIG. 67 shows a side cross-sectional view of a motherboard having a first microprocessor, a second microprocessor, and a cooling system, where the cooling system includes a heat sink module mounted on a thermally conductive member that extends from the first microprocessor to the second microprocessor.

Figure 68:
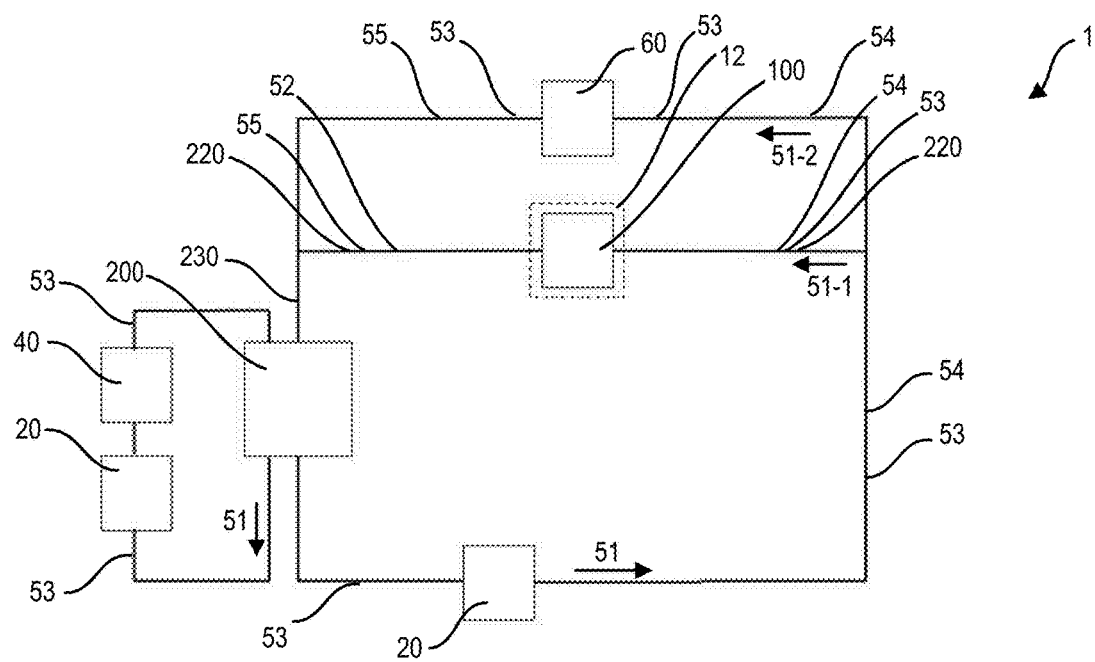

FIG. 68 shows a schematic of a cooling apparatus having a primary cooling loop, a bypass, and an independent heat rejection loop having a pump and a heat exchanger, where the primary cooling loop and the independent heat rejection loop are both fluidly connected to a common reservoir.

Figure 69:
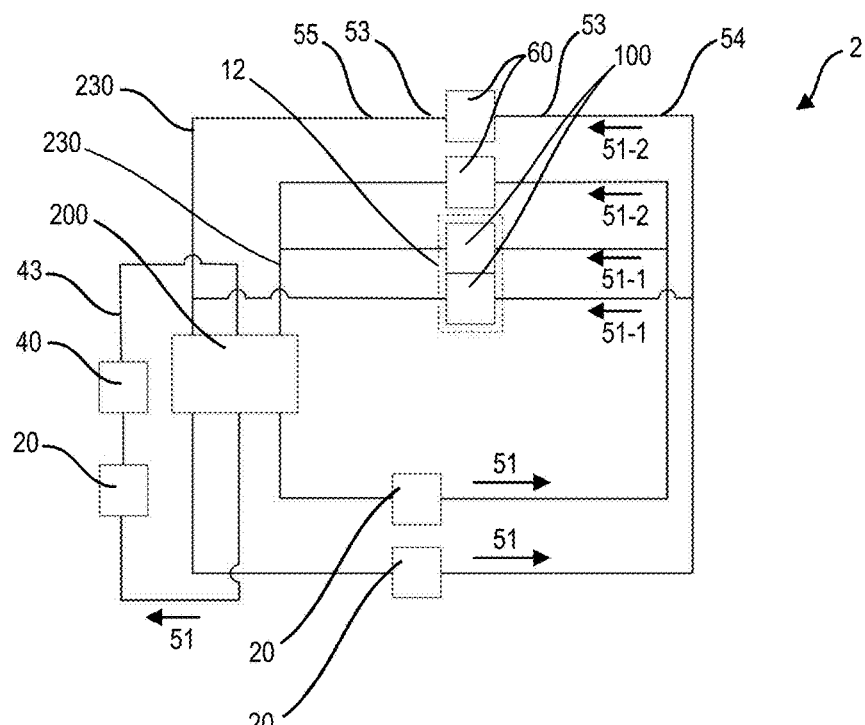

FIG. 69 shows a schematic of a redundant cooling apparatus having a first cooling apparatus, a second cooling apparatus, and a heat rejection loop having a pump and a heat exchanger, where the first cooling apparatus, the second cooling apparatus, and the heat rejection loop are fluidly connected to a common reservoir.

Figure 70:
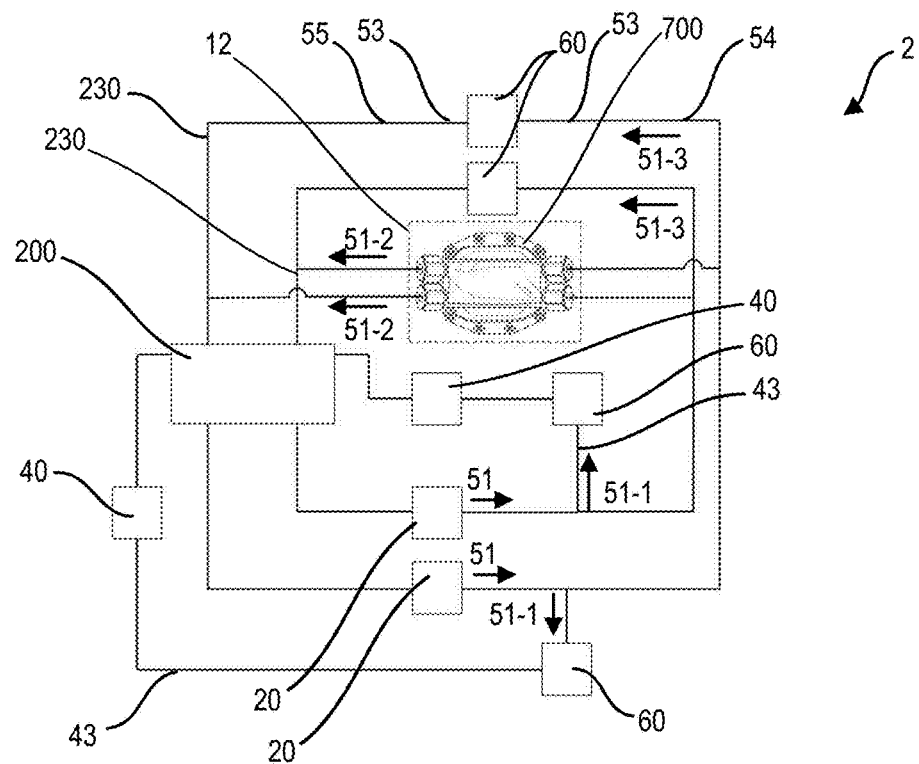

FIG. 70 shows a schematic of a redundant cooling apparatus having a redundant heat sink module mounted on a heat source, the redundant heat sink module fluidly connected to a first cooling apparatus and a second cooling apparatus, the first and second cooling apparatuses sharing a common reservoir.

Figure 71:
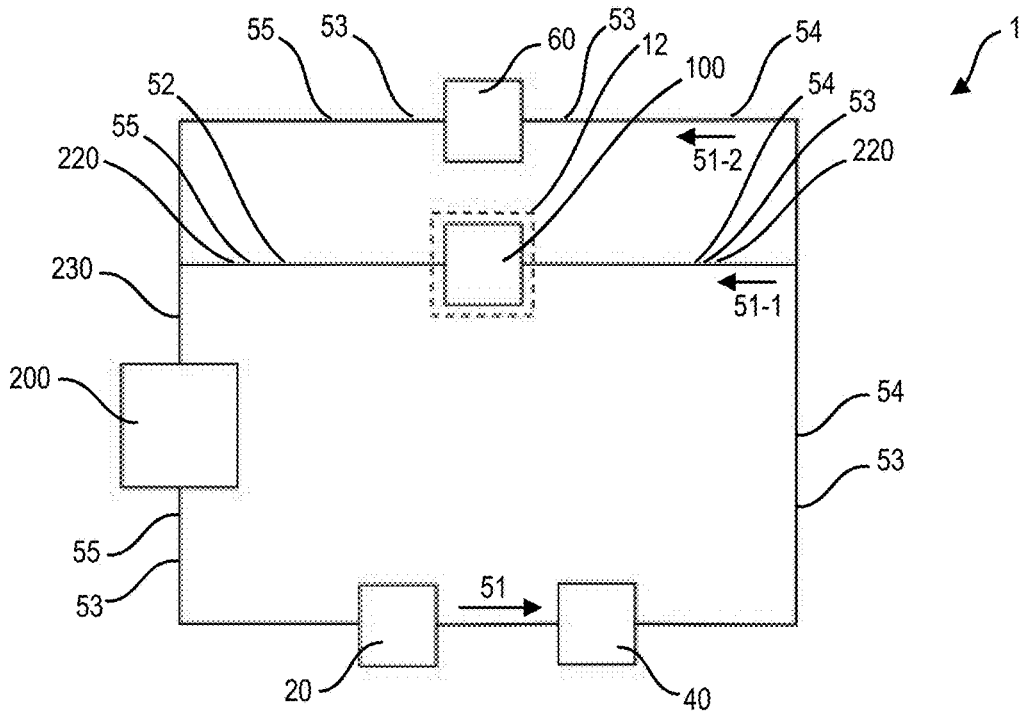

FIG. 71 shows a schematic of a cooling apparatus having a primary cooling loop with a pump, a heat exchanger, a heat sink module mounted on a heat source, a reservoir, and a bypass, the bypass having a pressure regulator configured to control a pressure differential between an inlet port and an outlet port of the heat sink module.

Figure 72:
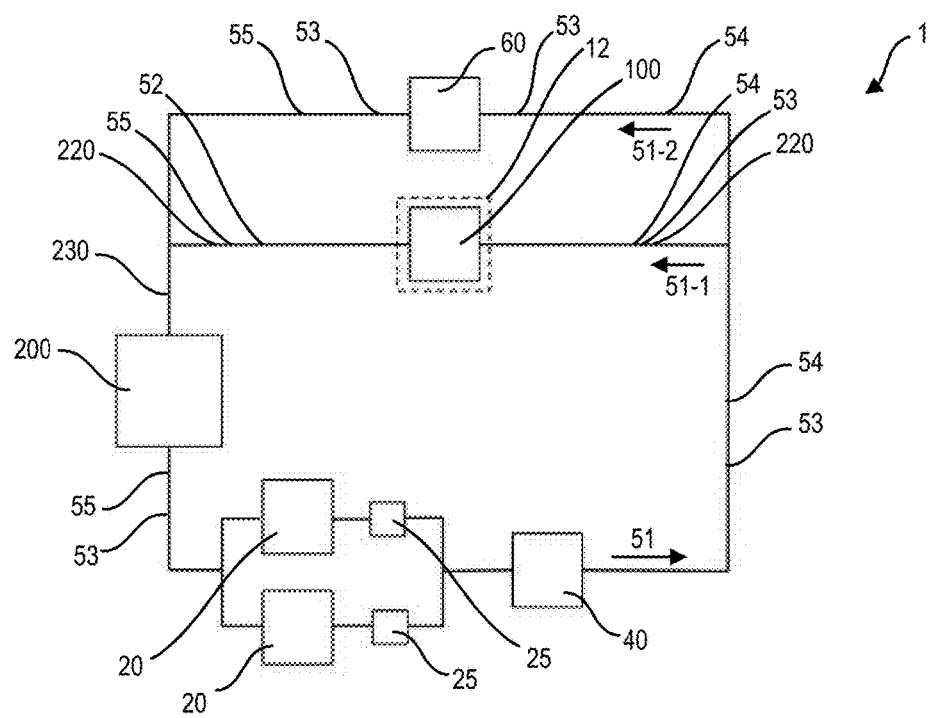

FIG. 72 shows a schematic of a cooling apparatus having a primary cooling loop with redundant, parallel pumps and check valves, a reservoir, a heat exchanger, a heat sink module mounted on a heat source, and a bypass, the bypass having a pressure regulator configured to control a pressure differential between an inlet port and an outlet port of the heat sink module.

Figure 73:
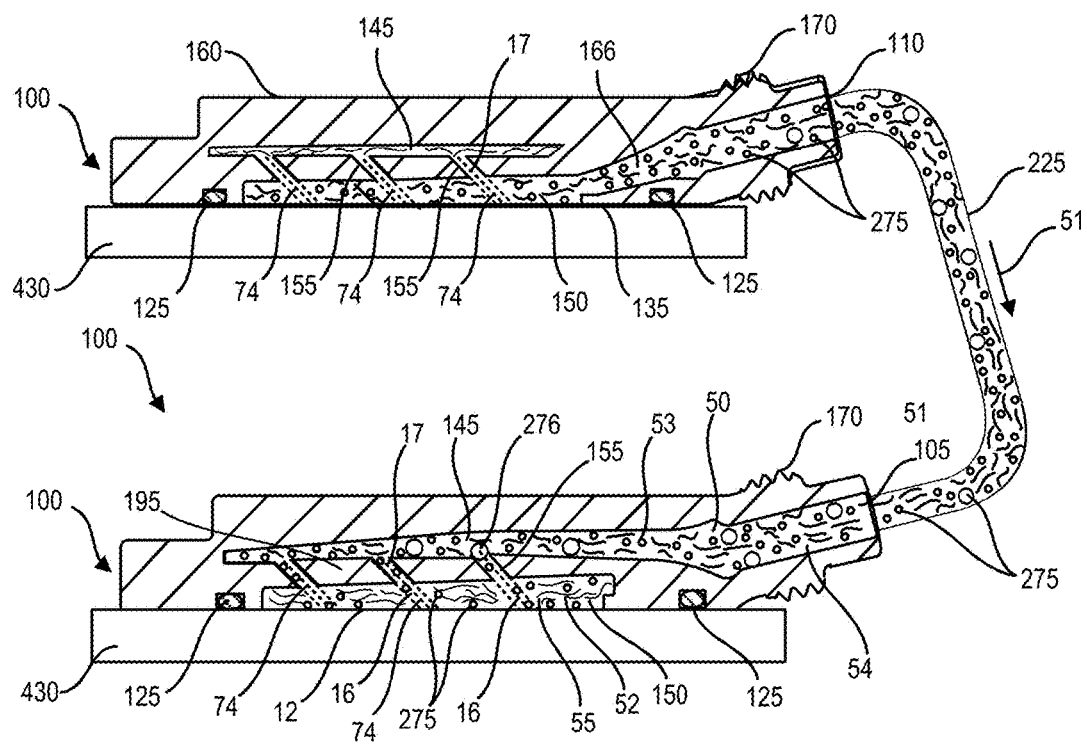

FIG. 73 shows a cross-sectional view of a first heat sink module fluidly connected to a second heat sink module by a section of flexible tubing, where single-phase flow delivered to an inlet chamber of the first heat sink module becomes two-phase bubbly flow within an outlet chamber of the first heat sink module due to heat being transferred from a first surface to be cooled to the flow, where flexible tubing transports the two-phase bubbly flow from an outlet port of the first heat sink module to an inlet port of a second heat sink module, where the two-phase bubbly flow is delivered to an inlet chamber of the second heat sink module and passes as a plurality of jet streams through a plurality of orifices within the second heat sink module, the jet streams configured to impinge against a second surface to be cooled.

Figure 74:
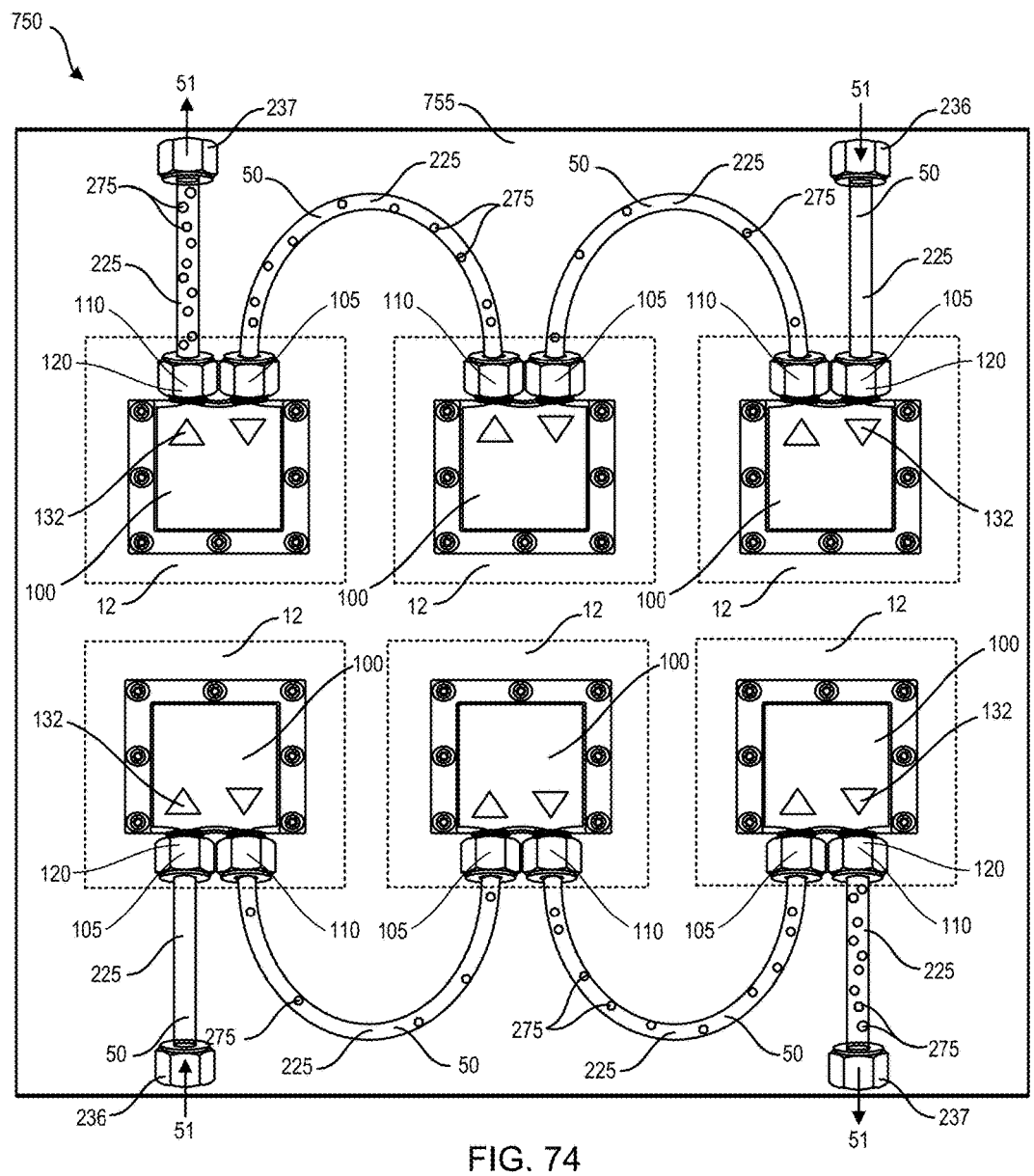

FIG. 74 shows a portable cooling device that includes a plurality of heat sink modules mounted on a portable layer, the portable layer being conformable to a contoured heated surface or rigid and including one or more inlet connections and one or more outlet connections that can be connected to a cooling apparatus that delivers a flow of pressurized coolant to the portable cooling device to permit cooling of the heated surface through latent heating of the coolant within the plurality of heat sink modules.

Figure 75:
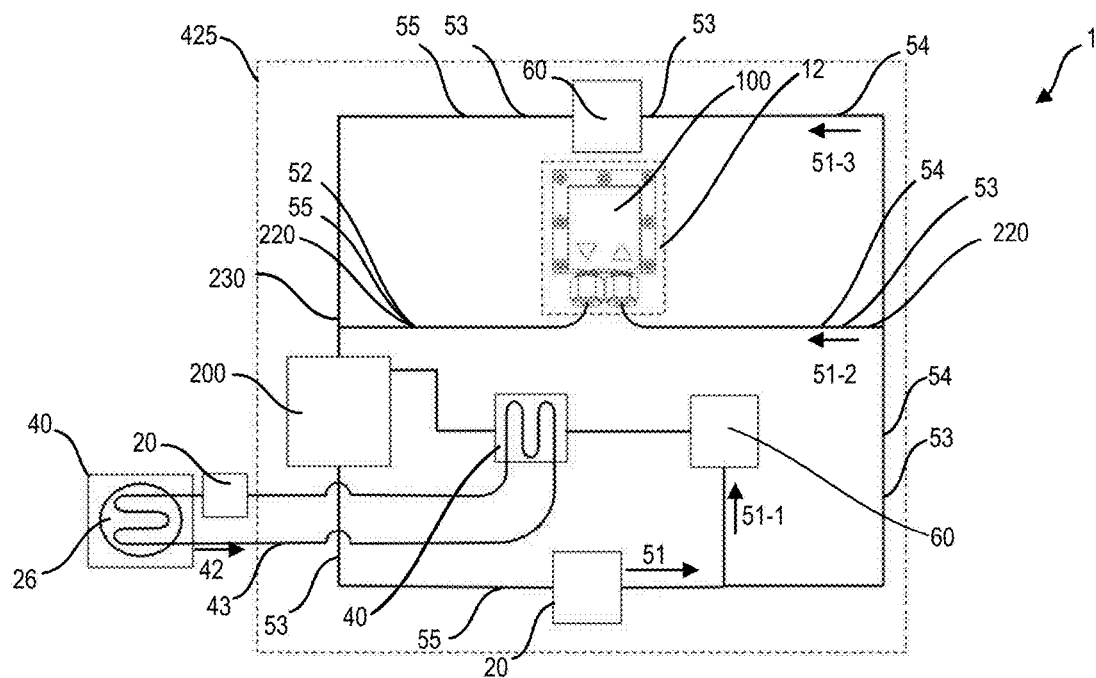

FIG. 75 shows a schematic of a preferred cooling apparatus having a primary cooling loop, a first bypass, and a second bypass, where the first bypass includes a liquid-to-liquid heat exchanger fluidly connected to an external heat exchanger located outside of a room where the cooling apparatus is located, the external heat exchanger being connected to the heat exchanger by an external heat rejection loop having a pump configured to circulate external cooling fluid, such as a water-glycol mixture, through the external heat rejection loop, the external heat exchanger being an air-to-liquid heat exchanger.

Figure 76:
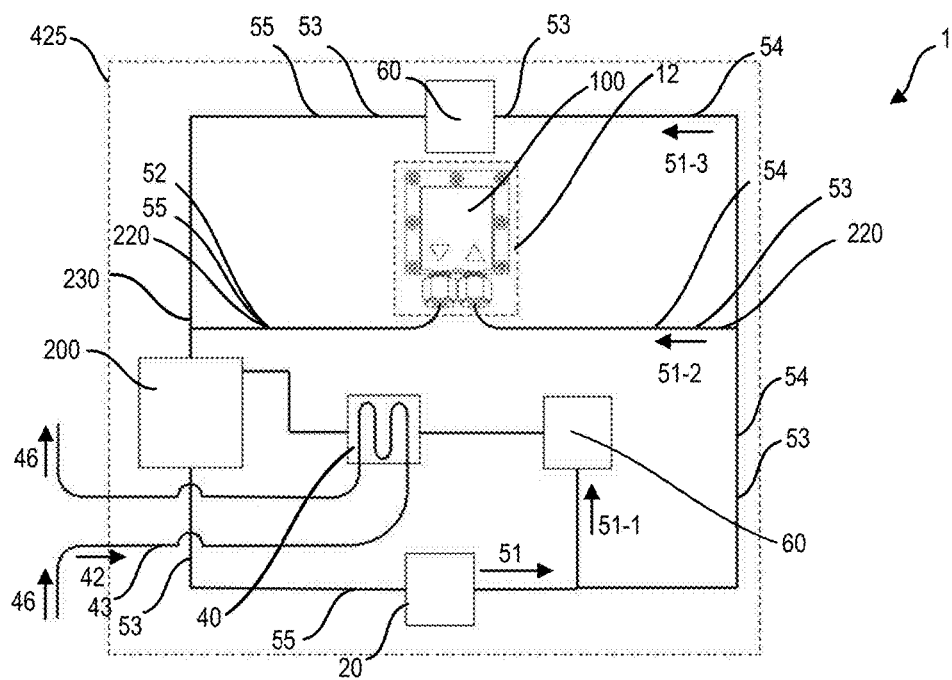

FIG. 76 shows a schematic of a cooling apparatus having a primary cooling loop, a first bypass, and a second bypass, where the first bypass includes a liquid-to-liquid heat exchanger fluidly connected to a heat rejection loop, the heat rejection loop being a supply of chilled water from a building in which the cooling apparatus is installed.

Figure 77:
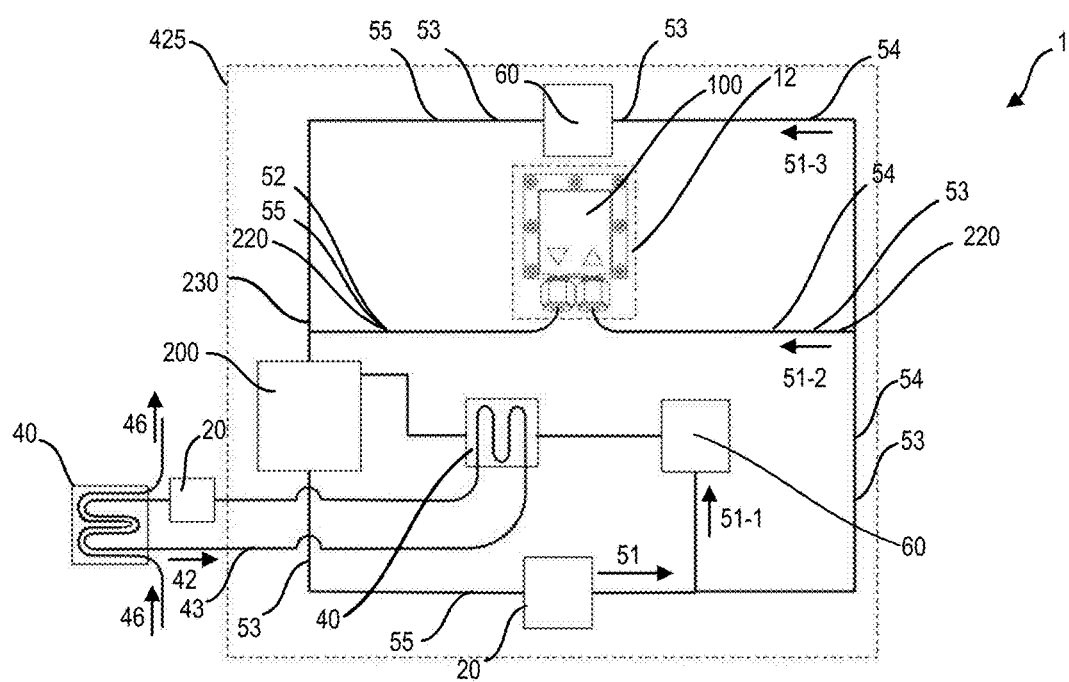

FIG. 77 shows a schematic of a preferred cooling apparatus having a primary cooling loop, a first bypass, and a second bypass, where the first bypass includes a liquid-to-liquid heat exchanger fluidly connected to an external heat exchanger located outside of a room where the cooling apparatus is located, the external heat exchanger being connected to the heat exchanger by an external heat rejection loop having a pump configured to circulate external cooling fluid, such as a water-glycol mixture, through the external heat rejection loop, the external heat exchanger being an liquid-to-liquid heat exchanger being connected to a supply of chilled water from a building in which the cooling apparatus is installed.

DETAILED DESCRIPTION

The cooling apparatuses 1 and methods described herein are suitable for a wide variety of applications, ranging from cooling electrical devices to cooling mechanical devices to cooling chemical reactions and/or processes. Examples of electrical devices that can be effectively cooled with the cooling apparatuses 1 and methods include densely packed servers in data centers, medical imaging devices, solar panels, high-power diode laser arrays, and electric vehicle components (e.g. battery packs, electric motors, and power electronics). Examples of mechanical devices that can be effectively cooled with the cooling apparatuses 1 and methods include turbines, internal combustion engines, turbochargers, after-treatment components, and braking systems. Examples of chemical processes that can be effectively cooled with the cooling apparatuses 1 include condensation processes involving rotary evaporators or reflux distillation condensers.

Compared to competing air or liquid cooling systems, the cooling apparatuses 1 and methods described herein are more efficient, have higher reliability, operate more safely, are less expensive, and have lower operating noise. The cooling apparatuses 1 described herein are suitable for retrofit on existing systems or can be incorporated into new systems. Due to their high efficiency, modularity, flexible connections, small size, and hot-swappability, the cooling apparatuses 1 described herein redefine design constraints that have until now hampered the development of new electronic devices. The cooling apparatuses 1 described herein allow the size of electronic device housings to be significantly reduced while reducing the risk of overheating of critical components and maintaining or even improving device performance. Using the methods described herein, a high-efficiency cooling apparatus 1 for a wide variety of applications can be rapidly designed, optimized, manufactured, and installed. In some examples, additive-manufacturing processes can be used to rapidly manufacture heat sink modules 100 that permit consistent cooling of multiple device surfaces 12, even where heat distributions on those surfaces are non-uniform, such as on multi-core microprocessors.

Due to their small size and flexible connections, the components described herein can be discretely packaged in many existing machines and devices that require efficient and reliable cooling of surfaces that produce high heat fluxes. For example, the cooling apparatuses 1 described herein can be discretely packaged in personal computers or servers to cool microprocessors and memory modules, in vehicles to cool battery packs, electric motors, and power electronics, and in medical imaging devices to cool power supplies and other electronic components.

In data center applications, the cooling apparatuses 1 and methods described herein can provide local, efficient cooling of critical system components and, where the data center 425 is located in an office building, can allow the ambient temperature of the office building to remain at a temperature that is comfortable for human occupants, while still permitting effective cooling of critical system components. Presently, competing air cooling systems use room air within an office building to cool critical system components by employing small fans to blow air across finned surfaces of system components. As the system components (e.g. microprocessors) are more highly utilized, they begin to generate more heat. To provide additional cooling, there are only two options in an air cooling system. First, the mass flow rate of air across the components can be increased to increase the heat transfer rate, or second, the temperature of the room air can be reduced to provide a larger temperature differential between the room air and the component temperature, thereby increasing the heat transfer rate. Initially, fans speeds can be increased to provide higher flow rates of room air, which in turn provides higher heat transfer rates. However, at some point, maximum fan speeds will be attained, at which point the flow rate of room air can no longer be increased. At this point, if critical system components demand additional cooling (e.g. to prevent overheating or failure), the only option in competing air cooling systems is to decrease the temperature of the room air by delivering larger volumetric flow rates of cool air from an air conditioning unit to the room to reduce the room temperature. This approach is highly inefficient and ultimately results in discomfort for human occupants of the office building, since larger volumetric flow rates of cool air eventually cause the air temperature within the building to reach an uncomfortably cool temperature, which can diminish worker productivity.

Two-Phase Flow Capability

In some aspects, the cooling apparatuses 1 described herein can be configured to cool a heat-generating surface 12 by directing jet streams 16 of coolant against the surface 12 and by flowing coolant 50 over the surface 12, as shown in FIGS. 26 and 30. The terms "heat-generating surface," "surface to be cooled," "surface of the device," "heat source," "heated surface," "heat providing surface," "device surface," "component surface," and "heat-producing surface" are used herein to describe any surface 12 of a component or device that is at a temperature above ambient temperature, whether due to heat produced by or within the component or device or due to heat transferred to the component or device from some other component or device that is in thermal communication with the surface 12. Within some components of the cooling apparatus 1, at least a portion of the coolant 50 can undergo a phase change from a liquid to a vapor in response to absorbing heat from the surface 12 of the device. The phase change can result in the coolant 50 transitioning from a single-phase liquid flow to two-phase bubbly flow or from a two-phase bubbly flow having a first number density of vapor bubbles to two-phase bubbly flow having a second number density of vapor bubbles, where the second number density is higher than the first number density. By initiating boiling proximate the surface 12 being cooled, and taking advantage of the highly-effective heat transfer mechanisms associated therewith, the cooling apparatuses 1 and methods described herein can deliver heat transfer rates that far exceed heat transfer rates attainable with traditional liquid cooling or air cooling systems. By providing dramatically increased heat transfer rates, the cooling apparatus 1 described herein is able to cool devices far more efficiently than any other existing cooling apparatus, which translates to significantly lower power consumption by the cooling apparatus 1. Where the cooling apparatus 1 is used in a large scale cooling application, such as a data center, and replaces a conventional air conditioning system, the cooling apparatus can result in significant savings on utility bills for a data center operator.

When a heat-generating surface 12 exceeds the saturation temperature of the coolant 50, boiling of the coolant proximate (i.e. at or near) the heat-generating surface occurs. This can occur whether the bulk fluid temperature of the coolant 50 is at or below its saturation temperature. If the bulk fluid temperature is below the saturation temperature of the coolant 50, boiling is referred to as "local boiling" or "subcooled boiling." If the bulk fluid temperature of the coolant is equal to the saturation temperature, then "bulk boiling" is said to occur. Bubbles formed proximate the heat-generating surface 12 depart the surface 12 and are transported by the bulk fluid, creating a flow of liquid fluid with bubbles distributed therein, known as two-phase bubbly flow. Depending on the degree of subcooling, as the bubbly flow passes through tubing, some or all of the bubbles in the bubbly flow may condense and collapse as mixing of the fluid and bubbles occurs. As bubbles collapse back to liquid, the bulk fluid temperature rises. In saturated or bulk boiling, where the bulk fluid temperature is near the saturation temperature, the bubbles 275 distributed in the fluid may not collapse as the bubbly flow passes through tubing and as mixing of the fluid and bubbles occurs.

Two-phase flow can be described based on a volume fraction of vapor present in the flow, where the volume fraction of vapor in the flow ($\alpha_{vapor}$) plus the volume fraction of liquid ($\alpha_{liquid}$) in the flow is equal to one ($\alpha_{vapor} + \alpha_{liquid} = 1$). The volume fraction of vapor ($\alpha_{vapor}$) is commonly referred to as "void fraction" even though the vapor volume is filled with low density gas and no true voids exist in the flow. The volume fraction within a tube, such as a section of flexible tubing 225 between two series-connected heat sink modules 100, can be calculated using the following equation:

$$\alpha_{vapor} = A_{vapor}/A_x$$

where $A_x$ is the total cross-sectional flow area at point x in the tube, and $A_{vapor}$ is the cross-sectional area occupied by vapor at point x in the tube. The volumetric flux of vapor ($j_{vapor}$) in a flow 51, also known as the "superficial velocity" of the vapor, can be calculated using the following equation:

$$j_{vapor} = (v_{vapor} * A_{vapor})/A_x = \alpha_{vapor} * v_{vapor}$$

where $v_{vapor}$ is the velocity of vapor in the tube. In some instances, the velocity of vapor ($v_{vapor}$) and the velocity of the liquid ($v_{liquid}$) in the flow may not be equal. This inequality in velocities can be described as a slip ratio and calculated using the following equation:

$$S = v_{vapor}/v_{liquid}$$

Where the vapor velocity ($v_{vapor}$) and the liquid velocity ($v_{liquid}$) in the flow are equal, the slip ratio (S) is one. The flow quality is the flow fraction of vapor and is always between zero and one. Flow quality (x) is defined as:

$$X = m_{vapor}/m = m_{vapor}/(m_{vapor} + m_{liquid})$$

where $m_{vapor}$ is the mass flow rate of vapor in the tube, $m_{liquid}$ is the mass flow rate of liquid in the tube, and m is the total mass flow rate in the tube ($m = m_{vapor} + m_{liquid}$). The mass flow rate of liquid is defined as:

$$m_{liquid} = \rho_{liquid} * v_{liquid} * A_{liquid}$$

where $\rho_{liquid}$ is the density of the liquid, and $A_{liquid}$ is the cross-sectional area occupied by liquid at point x in the tube. Similarly, the mass flow rate of vapor is defined as:

$$m_{vapor} = \rho_{vapor} * v_{vapor} * A_{vapor}$$

where $\rho_{vapor}$ is the density of the vapor. The distribution of vapor in a two-phase flow of coolant 50, such as a two-phase flow of coolant within a heat sink module 100 mounted on a heat-generating surface 12, affects both the heat transfer properties and the flow properties of the coolant 50. These properties are discussed in greater detail below.

A number of flow patterns or "flow regimes" have been observed experimentally by viewing flows of two-phase liquid-vapor mixtures passing through transparent tubes. While the number and characteristics of specific flow regimes are somewhat subjective, four principal flow regimes are almost universally accepted. These flow regimes are shown in FIG. 58 and include (1) bubbly flow, (2) slug flow, (3) churn flow, and (4) annular flow. FIG. 58(a) shows bubbly flow having a first number density of bubbles, and FIG. 58(b) shows bubbly flow having a second number density of bubbles where the second number density is greater than the first number density of FIG. 58(a). FIG. 58(c) shows slug flow. FIG. 58(d) shows churn or churn-turbulent flow. FIG. 58(e) shows annular flow. Beyond annular flow, the flow will transition through wispy-annular flow before eventually reaching single-phase vapor flow.

Bubbly flow is generally characterized as individually dispersed bubbles 275 transported in a continuous liquid phase. Slug flow is generally characterized as large bullet-shaped bubbles separated by liquid plugs. Churn flow is generally characterized as vapor flowing in a chaotic manner through liquid, where the vapor is generally concentrated near the center of the tube, and the liquid is displaced toward the wall of the tube. Annular flow is generally characterized as vapor forming a continuous core down the center of the tube and a liquid film flowing along the wall of the tube.

To predict an existence of a particular flow regime, or a transition from one flow regime to another, requires the above-mentioned visually observed flow regimes to be quantified in terms of measurable (or computed) quantities. This is normally accomplished through the use of a flow regime map. An example of a flow regime map is provided in FIG. 59A. The flow regime map shown in FIG. 59A is valid for steam-water systems and shows $\rho_{vapor}*j_{vapor}^2$ on the x-axis and $\rho_{vapor}*j_{vapor}^2$ on the y-axis. A similar flow regime map can created for a dielectric coolant 50, such as a hydrofluorocarbon or hydrofluorether, flowing over a heat-generating surface 12 within a heat sink module 100 or flowing within a flexible section of tubing 225, as described herein.

FIG. 59B shows the four two-phase flow regimes, including bubbly flow, slug flow, churn flow, and annular flow, plotted on void fraction versus mass flux axes. To maintain stability within the cooling apparatus during operation, it can be desirable to maintain either single-phase liquid flow, bubbly flow, or a combination thereof throughout the apparatus. Experimental testing confirmed that bubbly flow does not result in flow instabilities within the cooling apparatus 1. Conversely, the presence of slug, churn, or annular flow can result in flow instabilities and should therefore be avoided. To remain comfortably within the bubbly flow regime, it can be desirable to maintain the coolant below a predetermined void fraction and/or above a predetermined mass flux. The desired predetermined void fraction and predetermined mass flux can depend on several factors, including the configuration of the cooling apparatus 1 (e.g. components and layout), the type of coolant 50 being used, the coolant pressure within the apparatus, and the temperature of the surface to be cooled 12. In some examples, the void fraction of the coolant exiting the heat sink module 100 can be about 0-0.5, 0-0.4, 0-0.3, 0-0.2, or 0-0.1. In some examples, the mass flux of the coolant flowing through a heat sink module 100 can be about 10-2,000, 500-1,000, 750-1,500, 1,000-2, 500, 2,250-2,500, 2,000-2,700, or greater than 2,700 kg/m2-s. As shown in FIG. 59B, as the void fraction increases (e.g. from about 0.3-0.5), the mass flux of the coolant 50 must also increase to avoid transitioning from bubbly flow to slug or churn flow at an outlet of the heat sink module 100 in the flexible tubing 225.

FIG. 60 shows a flow boiling curve where heat transfer rate is plotted as a function of "excess temperature" ($T_e$). Excess temperature is the difference between the actual temperature of the surface to be cooled 12 and the fluid saturation temperature ($T_e=T_{surface}-T_{sat}$). The curve is divided into 5 regions (a, b, c, d, and e), each corresponding to certain heat transfer mechanisms.

In region (a) of FIG. 60, a minimum criterion for boiling is that the temperature of the heat-generating surface 12 exceeds the local saturation temperature of the coolant ($T_{sat}$). In other words, some degree of excess temperature ($T_e$) is required for boiling to occur. In region (a), the excess temperature may be insufficient to support bubble formation and growth. Therefore, heat transfer may occur primarily by single-phase convection in region (a).

In region (b) of FIG. 60, bubbles begin forming at nucleation sites on the heat-generating surface 12. These nucleation sites are generally associated with crevices or pits on the heat-generating surface 12 in which non-dissolved gas or vapor accumulates and results in bubble formation. As the bubbles grow and depart from the surface 12, they carry latent heat away from the surface and produce turbulence and mixing that increases the heat transfer rate. Boiling under these conditions is referred to as nucleate boiling. In region (b), heat transfer is a complicated mixture of single-phase forced convection and nucleate boiling. This region is often called the mixed boiling or "partial nucleate boiling region." As the temperature of the heat-generating surface 12 increases, the percentage of surface area that is subject to nucleate boiling also increases until bubble formation occupies the entire heat-generating surface 12.

In region (c) of FIG. 60, bubble density increases rapidly as the surface temperature increases further beyond the saturation temperature ($T_{sat}$). In this region, heat transfer can be dominated by bubble growth and departure from the surface 12. Formation and departure of these bubbles 275 can transport large amounts of latent heat away from the surface 12 and greatly increase fluid turbulence and mixing in the vicinity of the heat-generating surface 12. As a result, heat transfer can become independent of bulk fluid conditions such as flow velocity and temperature. Heat transfer in this region is know as "fully developed nucleate boiling" and is characterized by a substantial increase in heat transfer rate in response to only moderate increases in surface 12 temperature. However, there is a limit to the maximum rate of heat transfer that is attainable with fully developed nucleate boiling. At some point, the bubble density at the heat generating surface 12 cannot be increased any further. This point is know as the critical heat flux ("CHF") and is denoted as c* in FIG. 60. One theory is that at point c*, the bubble density becomes so high that the bubbles actually impede the flow of liquid back to the surface 12, since bubbles in close proximity tend to coalesce, forming insulating vapor patches that effectively block the liquid coolant from reaching the heat-generating surface 12 and thereby prevent the liquid coolant from extracting latent heat, for example, by undergoing a phase change (i.e. boiling) at the surface 12.

It may be possible to delay the onset of critical heat flux by employing the cooling apparatuses 1 and methods described herein (e.g. heat sink modules capable of providing jet stream 16 impingement) that increase the heat transfer rate from the heated surface 12, thereby allowing the cooling apparatus 1 to safely and effectively cool a heat generating surface 12 that is at a temperature well above the saturation temperature of the coolant (e.g. about 20-30 deg C. above $T_{sat}$) without reaching or exceeding critical heat flux. In some examples, delaying the onset of critical heat flux, and thereby increasing the heat transfer rate of the cooling apparatus 1 to previously unattainable rates, can be achieved by increasing the three-phase contact line 58 length, as described herein (see e.g. FIG. 63 and related description), by using the methods and components (e.g. heat sink modules 100) described herein, which can provide a plurality of jet stream 16 impinging against a heated surface 12 where the jets are positioned at a predetermined jet height 18 away from the heated surface 12. To delay the onset of critical heat flux (and thereby allow the cooling apparatus 1 to operate safely and effectively in region (c) shown in FIG. 60), a mass flow rate 51, jet height 18, orifice 155 diameter, coolant temperature, and coolant pressure can be selected from the ranges described herein to provide a plurality of jet streams 16 that impinge the surface to be cooled 12 and effectively increase the three-phase contact line 58 length proximate the surface to be cooled 12. Although the cooling apparatus 1 can operate extremely well in regions (a) and (b), the efficiency of the cooling apparatus 1 may be highest when operating in region (c).

As the temperature of the surface 12 increases beyond the temperature associated with critical heat flux, the heat transfer rate actually begins to decrease, as shown in region (d) of FIG. 60. Further increases in the surface 12 temperature simply result in a higher percentage of the surface 12 being covered by insulating vapor patches. These insulating vapor patches reduce the area available for liquid to vapor phase change (i.e. boiling). Therefore, despite the surface temperature ($T_{surface}$) continuing to increase, the overall heat transfer rate actually decreases, as shown in region (d) of FIG. 60.

This region is referred to as the partial film or "transition film boiling region." Reaching or exceeding the temperature associated with critical heat flux can be undesirable, since performance can decrease and become unpredictable. Moreover, due to rapid production of vapor proximate the surface to be cooled 12, the two-phase flow in the cooling apparatus 1 can increase in quality and transition from bubbly flow to slug, churn, or annular flow, which can result in undesirable pressure surges within the system due to a volume fraction of vapor exceeding a stable working range. It is therefore desirable to operate in regions (a), (b), or (c), below the onset of critical heat flux at point c*.

In region (e) of FIG. 84, a vapor layer covers the heat-generating surface 12. In this region, heat transfer occurs by conduction and convection through the vapor layer with evaporation occurring at the interface between the vapor layer and the liquid coolant. This region is known as the "stable film boiling region." Similar to region (d), region (e) is not suitable for stable operation of the cooling apparatus 1 due to significant vapor formation resulting in slug, churn, or annular flow.

FIG. 61 shows a flow boiling curve for water at 1 atm, where heat flux is plotted as a function of excess temperature. As noted above, excess temperature is the difference between the actual temperature of the surface to be cooled 12 and the fluid saturation temperature ($T_e = T_{surface} - T_{sat}$). The curve of FIG. 61 shows the onset of nucleate boiling, the point of critical heat flux, and the Leidenfrost point. Between the critical heat flux point and the Leidenfrost point is a transition boiling region where the coolant vaporizes almost immediately on contact with the heated surface 12. The resulting vapor suspends the liquid coolant on a layer of vapor within the outlet chamber 150 and prevents any further direct contact between the liquid coolant and the heated surface 12. Since vapor coolant has a much lower thermal conductivity than liquid coolant, further heat transfer between the heated surface 12 and the liquid coolant is slowed down dramatically, as shown by the downward slope of the plot between CHF and the Leidenfrost point. Beyond the Leidenfrost point, radiation effects become significant, as radiation from the heated surface 12 transfers heat through the vapor layer to the liquid coolant suspended above the vapor layer, and the heat flux again increases.

Experimental Data

FIG. 8 shows a plot of experimental data showing power consumed versus time to cool a computer room 425 having forty active dual-processor servers 400. The left portion of the plot, extending from about 15 to 390 minutes, shows power consumed by a CRAC tasked with cooling the computer room 425. From about 15 to 190 minutes, the servers 400 were fully utilized, and from about 240 to 360 minutes, the servers were at idle state. At about 390 minutes, the cooling apparatus 1 was activated to assist the CRAC with cooling the servers 400. However, the heat sink modules 100 connected to the cooling apparatus 1 were only installed on microprocessors in 25% of the servers (ten of forty servers). Nevertheless, a dramatic reduction in power consumption was recorded. From 390 to 590 minutes, the cooling apparatus 1 conserved about 1.5 kW of power compared to the baseline idle state cooled by the CRAC only, and from about 625 to 840 minutes, the cooling apparatus 1 conserved about 2 kW of power compared to the baseline fully utilized state cooled by the CRAC only. The reduction in power consumption measured in this experiment is expected to scale as more servers in the computer room are connected to the cooling apparatus 1. Consequently, if heat sink modules of the cooling apparatus 1 were installed on microprocessors of all forty servers, reductions in power consumption of about 6 kW (i.e. 55%) and 8 kW (i.e. 67%) compared to the baseline idle and baseline fully utilized states, respectively, are expected. Reductions in power consumption of this magnitude can translate to significant savings in annual operating expenses for computer room and data center operators.

Experimental tests have demonstrated that significantly higher heat transfer rates are achievable with the cooling apparatus 1 than with existing single-phase pumped liquid systems. This higher heat transfer rate can be attributed, at least in part, to establishing conditions in an outlet chamber 150 of the heat sink module 100 that promote boiling of the coolant proximate the surface to be cooled 12. Experimental tests have confirmed that the heat sink module 100 shown in FIG. 21 is capable of dissipating a heat load of about 500 thermal watts, and the redundant heat sink module 700 shown in FIG. 51A is capable of dissipating a heat load of about 800 thermal watts.

During testing, a heat sink module 100 was provided that contained a plurality of orifices 155 configured to provide impinging jets streams 16 of coolant 50 directed against a surface to be cooled 12, as shown in FIG. 26. In a first test, the pressure in the outlet chamber 150 of the heat sink module 100 was set to establish a saturation temperature of about 95° C. for the coolant. In a second test, the pressure in the outlet chamber 150 of the heat sink module 100 was set to establish a saturation temperature of about 74° C. for the coolant. The saturation temperature of about 74° C. was chosen to substantially match the mean temperature of the heated surface (i.e. surface to be cooled 12) in the test. The same flow rate of coolant was used for each test. During the second test, bubbles 275 were generated in the outlet chamber 150 with the coolant having the lower saturation temperature. Such a phase change did not occur in the outlet chamber 150 with coolant having the higher saturation temperature in the first test. Overall, the heat transfer performance increased by 80% with the lower saturation temperature (i.e. the second test) where bubbles were generated compared to the higher saturation temperature (i.e. the first test) where bubbles were not generated.

One benefit of the cooling technology described herein is the ability to efficiently cool local hot spots on a heat-generating device 12 (e.g. hot spots on microprocessors 415). For example, if just one core of a given microprocessor 415 is more heavily utilized than other cores in the same processor, and a plurality of jet streams of coolant are directed at the surface of the microprocessor, more evaporation will occur proximate the hot core, thereby increasing the local heat transfer rate proximate the hot core relative to the cooler cores, and thereby self-regulating to maintain the entire surface 12 of the microprocessor at a more uniform temperature than is possible with purely single-phase cooling systems that are incapable of self-regulating. Because the cooling apparatus 1 is capable of self-regulating to cool local hot spots (e.g. by providing local increases in heat transfer rates through evaporation), the entire cooling system can be operated at lower flow rate and pressure, which conserves energy, and still handle fluctuations in processor temperature caused by variations in utilization. This is in sharp contrast to existing liquid cooling systems that are not capable of self-regulating to cool local hot spots and must therefore be operated at much higher flow rates and pressures to ensure adequate cooling of hot spots, for example, on microprocessors. In other words, existing liquid cooling systems must operate continuously at a setting that is designed to handle a peak heat load to ensure the system is capable of handling the peak heat load if it occurs. As a result, when the microprocessor is not being heavily utilized (which is quite often) existing systems operate at a pressure and flow rate that are considerably above where they would otherwise need to operate to handle a non-peak heat load. This approach needlessly consumes a significant amount of excess energy, and is therefore undesirable.

Coolant

As used herein, the general term "coolant" refers to any fluid capable of undergoing a phase change from liquid to vapor or vice versa at or near the operating temperatures and pressures of the cooling apparatuses 1. The term "coolant" can refer to fluid in liquid phase, vapor phase, or mixtures thereof (e.g. two-phase bubbly flow). A variety of coolants 50 can be selected for use in the cooling apparatus 1 based on cost, level of optimization desired, desired operating pressure, boiling point, and existing safety regulations that govern installation (e.g. such as regulations set forth in ASHRAE Standard 15 relating to permissible quantities of coolant per volume of occupied building space).

Selection of the coolant 50 for the cooling apparatus 1 can be influenced by desired dielectric properties of the coolant, a desired boiling point of the coolant, and compatibility with polymer materials used to manufacture the heat sink module 100 and the flexible tubing 225 of the apparatus 1. For instance, the coolant 50 may be selected to ensure little or no permeability through system components (e.g. heat sink modules and flexible tubing) and no damage to any system components (e.g. to ensure that seals are not damaged or compromised by the coolant).

Water is readily abundant and inexpensive. Although the cooling apparatuses 1 described herein can be configured to operate with water as a coolant, water has certain traits that make it less desirable than other coolant options. For instance, water does not change phase at a low temperature (such as 40-50° C.) without operating at very low pressures, which can be difficult to maintain in a relatively inexpensive cooling apparatus that includes at least some standard fittings and system components (e.g. gear pumps, pressure regulators, valves, and flexible tubing). In addition, water as a coolant requires a number of additives (e.g. corrosion inhibitors and mold inhibitors) and can absorb a range of materials from surfaces of system components it contacts. As water changes phase, these materials can precipitate out of solution, causing fouling or other issues within system components. Fouling is undesirable, since it can reduce system performance by effectively increasing the thermal resistance of certain components that are tasked with expelling heat from the system (e.g. heat exchanger 40) or tasked with absorbing heat into the system from devices being cooled by the system (e.g. copper base plate 430). The above-mentioned challenges can be overcome with appropriate filtration and fittings, which adds cost to the system. However, water is a highly effective heat transfer medium, so where increased heat transfer rates are required, the additional cost and complexity associated with using water as the coolant may be justified.

In some examples, it can be preferable to use a dielectric fluid, such as a hydrofluorocarbon (HFC) or a hydrofluoroether (HFE) instead of water as a coolant 50 in the cooling apparatus 1. Unlike water, dielectric coolants 50 can be used in direct contact with electrical devices, such as CPUs, memory modules, and power inverters without shorting electrical connections of the devices. Therefore, if a leak develops in the cooling apparatus and coolant drips onto an electrical device, there is no risk of damage to the electrical device. In some examples of the cooling apparatus 1, the dielectric coolant 50 can be delivered directly (e.g. by way of one or more jet streams 16) onto one or more surfaces of the electronic device (e.g. one or more surfaces of a microprocessor 415), thereby eliminating the need for commonly-used thermal interface materials (e.g. copper base plates 430 and thermal bonding materials) between the flowing coolant 50 and the electronic device and can thereby eliminate thermal resistances associated with those thermal interface materials, thereby enhancing performance and overall efficiency of the cooling apparatus 1.

Non-limiting examples of dielectric coolants 50 include 1,1,1,3,3-pentafluoropropane (known as R-245fa), hydrofluoroether (HFE), 1-methoxyheptafluoropropane (known as HFE-7000), methoxy-nonafluorobutane (known as HFE-7100). One version of R-245fa is commercially available as GENETRON 245fa from Honeywell International Inc. headquartered in Morristown, N.J. HFE-7000 and HFE-7100 (as well as HFE-7200, HFE-7300, HFE-7500, HFE-7500, and HFE-7600) are commercially available as NOVEC Engineered Fluids from 3M Company headquartered in Mapleton, Minn. FC-40, FC-43, FC-72, FC-84, FC-770, FC-3283, and FC-3284 are commercially available as FLUOROINERT Electronic Liquids also from 3M Company.

GENETRON 245fa is a pentafluoropropane and has a boiling point of 58.8 degrees F. at 1 atm, a molecular weight of 134.0, a critical temperature of 309.3 degrees F., a critical pressure of 529.5 psia, a saturated liquid density of 82.7 lb/ft3 at 86 degrees F., a specific heat of liquid of 0.32 Btu/lb-deg F. at 86 degrees F., and a specific heat of vapor of 0.22 btu/lb-deg F. at 1 atm and 86 degrees F. GENETRON 245fa has a Safety Group Classification of A1 under ANSI/ASHRAE Standard 36-1992.

NOVEC 7000 has a boiling point of 34 degrees C., a molecular weight of 200 g/mol, a critical temperature of 165 degrees C., a critical pressure of 2.48 MPa, a vapor pressure of 65 kPa, a heat of vaporization of 142 kJ/kg, a liquid density of 1400 kg/m3, a specific heat of 1300 J/kg-K, a thermal conductivity of 0.075 W/m-K, and a dielectric strength of about 40 kV for a 0.1 inch gap.

NOVEC 7100 has a boiling point of 61 degrees C., a molecular weight of 250 g/mol, a critical temperature of 195 degrees C., a critical pressure of 2.23 MPa, a vapor pressure of 27 kPa, a heat of vaporization of 112 kJ/kg, a liquid density of 1510 kg/m3, a specific heat of 1183 J/kg-K, a thermal conductivity of 0.069 W/m-K, and a dielectric strength of about 40 kV for a 0.1 inch gap.

Novec 649 Engineered Fluid is also available from 3M Company. It is a fluoroketone fluid ($C_6$-fluoroketone) with a low Global Warming Potential (GWP). It has a boiling point of 49 degrees C., a thermal conductivity of 0.059, a molecular weight of 316 g/mol, a critical temperature of 169 degrees C., a critical pressure of 1.88 MPa, a vapor pressure of 40 kPa, a heat of vaporization of 88 kJ/kg, a liquid density of 1600 kg/m3.

In some examples, the coolant can be a combination of dielectric fluids described above. For instance, the coolant can include a combination of R-245fa and HFE-7000 or a combination of R-245fa and HFE-7100. In one example, the coolant 50 can include about 1-5, 1-10, 5-20, 10-20, 15-30, or 25-50 percent R-245fa by volume with the remainder being HFE-7000. In another example, the coolant 50 can include about 1-5, 1-10, 5-20, 10-20, 15-30, or 25-50 percent R-245fa by volume with the remainder being HFE-7100.

Combining dielectric hydrocarbon fluids to form a coolant mixture for use in the cooling apparatus 1 can be desirable for several reasons. First, certain fluids, such a R-245fa may be regulated in ways that restrict the volume of fluid that can be used in an occupied building, such as an office building. Since R-245fa has been shown to perform well in the cooling apparatus 1, it may be desirable to use as much R-245fa as legally permitted in the cooling apparatus 1, and if additional coolant volume is required, to use an unregulated coolant, such as HFE-7000 or HFE-7100, to increase the total coolant volume within the cooling apparatus 1 to reach the desired coolant volume.

Second, combining dielectric coolants can allow a coolant mixture with a desired boiling point to be formulated. R-245fa has a boiling point of about 15.2 degrees C. at 1 atm, and HFE-7000 has a boiling point of about 34 degrees C. at 1 atm. In some examples, neither of these boiling points may be optimal for use in a particular application. By combining R-245fa and HFE-7000, a coolant mixture can be created that behaves as if its boiling point were somewhere between 15.2 and 34 degrees C., depending on the mixture ratio. The ability to create a coolant mixture with a specific boiling point can be highly desirable for custom tailoring the coolant mixture for a specific application depending on the anticipated operating temperature of the surface to be cooled 12.

Cooling Apparatus

FIG. 1 shows a front perspective view of a cooling apparatus 1 installed on a plurality of racks 410 of servers 400 in a data center or computer room 425. The racks 410 of servers 400 are arranged in a row with a pump 20, reservoir 200, and other system components arranged near the left side of the row of racks 410. One or more tubes extend along the length of the row of racks 410 and fluidly connect servers 400 within each rack 410 to the cooling apparatus 1, thereby allowing heat-generating components 12 (such as microprocessors) within each server to be cooled by the cooling apparatus 1.

In addition to cooling microprocessors in servers, the cooling apparatus can be configured to cool a wide variety of other devices. In some examples, the cooling apparatus 1 can be configured to cool one or more heat-producing surfaces 12 associated with batteries, electric motors, control systems, power electronics, chemistry equipment (e.g. rotary evaporators or reflux distillation condensers), or machines or mechanical devices (e.g. turbines, internal combustion engines, radiators, braking components, turbochargers, engine intake manifolds, plasma cutters, drills, oil and gas exploratory and recovery equipment, water jet cutters, welding systems, or computer numerical control (CNC) mills or lathes).

Figure 2A:
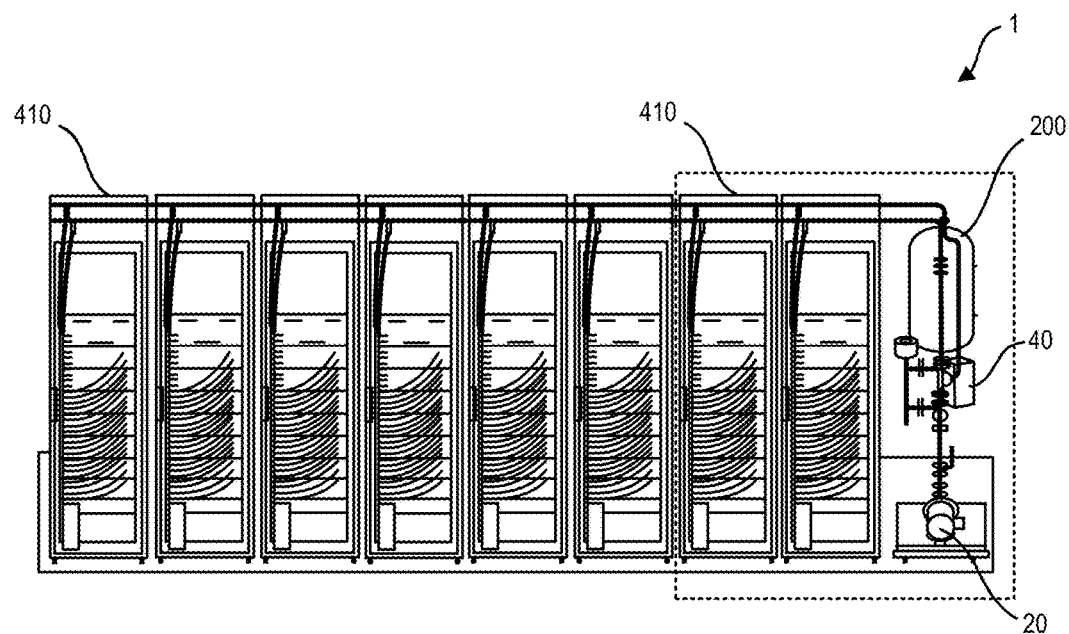
FIG. 2A shows a rear view of the cooling apparatus of FIG. 1.
Figure 2B:
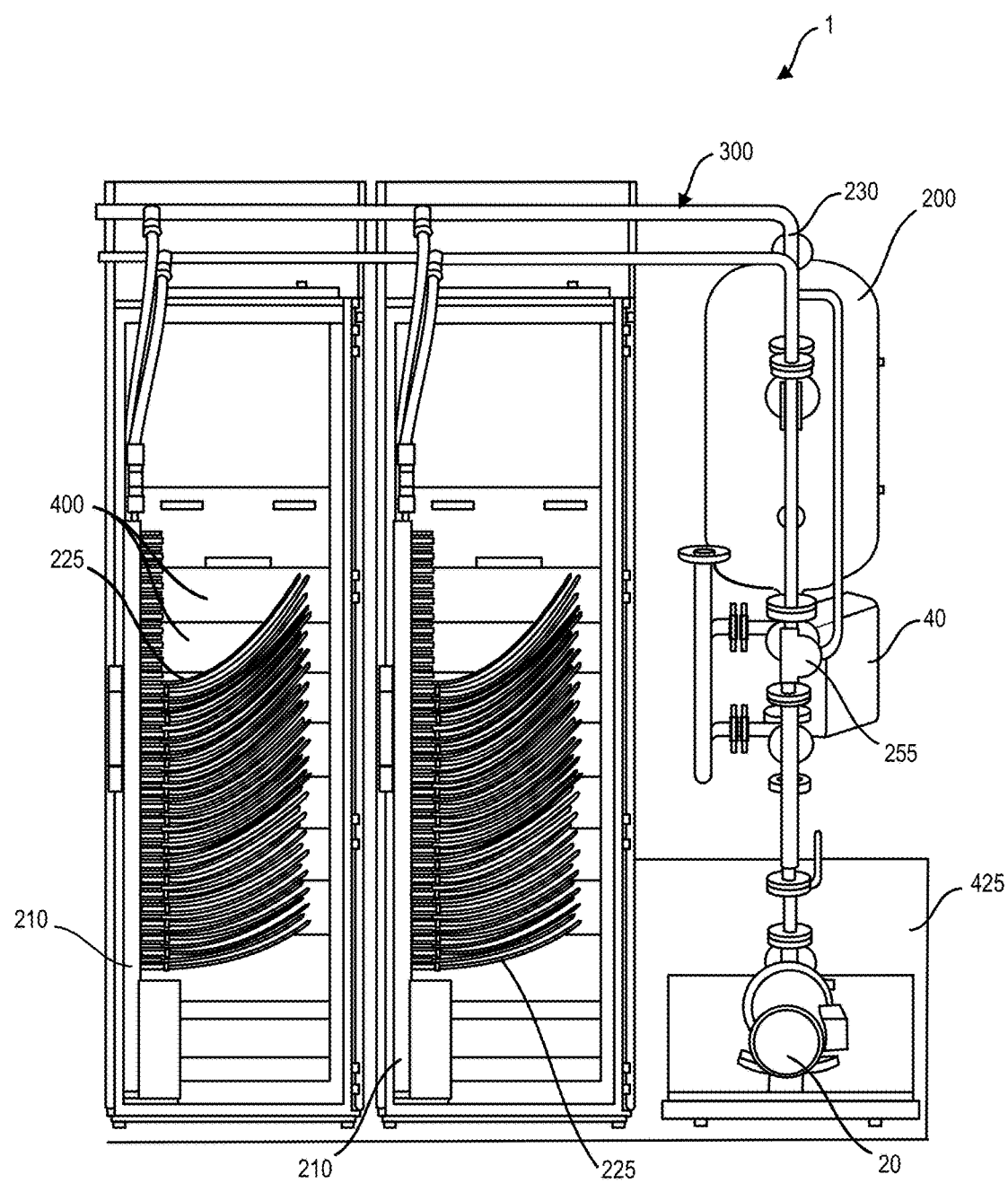
FIG. 2B shows a detailed view of a portion of the cooling apparatus of FIG. 2A, where the pump, reservoir, heat exchanger, manifolds of the primary cooling loop, and sections of flexible tubing connecting parallel cooling lines to the manifolds are visible.

FIG. 2A shows a rear view of the cooling apparatus 1, and FIG. 2B shows a detailed rear view of a right portion of the cooling apparatus shown in FIG. 2A. In this example, the cooling apparatus 1 can include a plurality of components and sub-assemblies fluidly connected to provide a cooling apparatus 1 that is capable of locally cooling one or more heat-producing surfaces 12 (e.g. flat surfaces, curved surfaces, or complex surfaces), such as surfaces associated with CPUs, memory modules, and motherboards located within the server housings.

Figure 3:
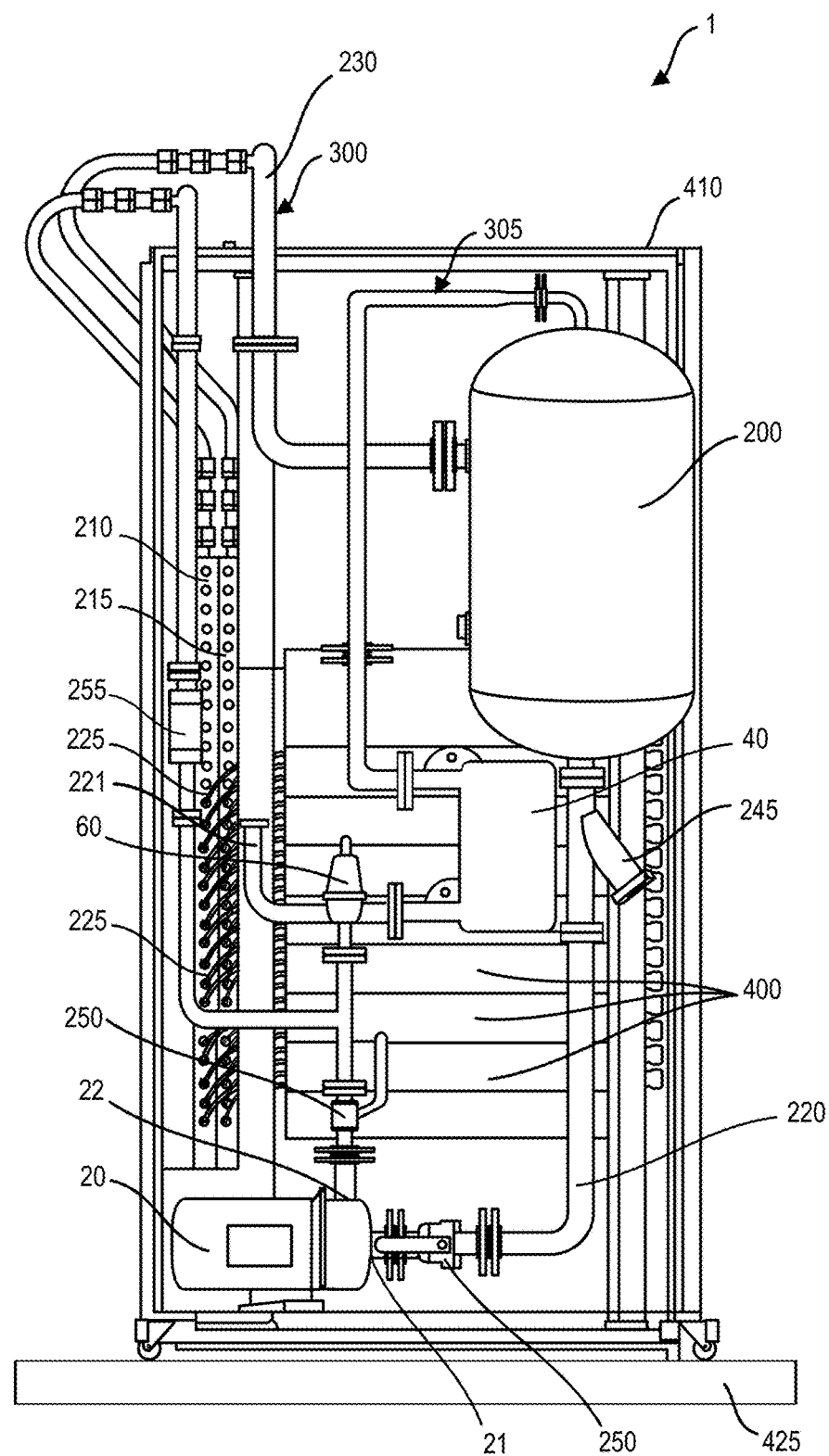
FIG. 3 shows a left side view of the cooling apparatus of FIG. 1, where the pump, reservoir, heat exchanger, pressure regulator, first bypass, a portion of the primary cooling loop, and sections of flexible tubing connecting parallel cooling lines to the inlet and outlet manifolds are visible.

FIG. 3 shows a left side view of the cooling apparatus 1 of FIG. 1. Portions of a primary cooling loop 300 are visible in FIG. 3, including a pump 20, reservoir 200, drain/fill location 245, shut-off valve 250, pressure gauge 255, inlet manifold 210, and return line 230. Portions of a first bypass 305 are also visible in FIG. 3, including a pressure regulator 60 and heat exchanger 40. As shown in FIG. 3, the primary cooling loop 300 and the first bypass 305 can be fluidly connected to the reservoir 200.

FIGS. 11A-14, 16-20, and 68-72 present a variety of configurations for the cooling apparatus 1. Depending on its configuration, the cooling apparatus 1 can include a plurality of fluidly connected components, including one or more pumps 20, one or more reservoirs 200, one or more heat exchangers 40, one or more inlet manifolds 205, one or more outlet manifolds 210, one or more pressure regulators 60, one or more sections of flexible tubing 225, and one or more heat sink modules 100 mounted on, or placed in thermal communication with, one or more surfaces to be cooled 12.

FIG. 11A shows an exemplary schematic of a cooling apparatus 1 having one heat sink module 100 mounted on a heat generating surface 12. The heat-generating surface 12 can be any surface having a temperature above ambient temperature that requires cooling. For instance, the heat-generating surface 12 can be a surface of a mechanical or electrical device, such as a surface of a microprocessor 415. As identified by dashed lines in FIG. 11B, the cooling apparatus 1 can include a primary cooling loop 300 fluidly connecting a pump 20, at least one heat sink module 100, a return line 230, and a reservoir 200. The pump 20 can be configured to draw single-phase liquid coolant from the reservoir 200 and deliver a flow 51 of pressurized single-phase liquid coolant 50 to an inlet port 105 of a heat sink module 100. The heat sink module 100, being mounted on the heat-generating surface 12, can be configured to direct a flow of pressurized coolant 51 at the surface of the heat-generating surface 12 in the form of a plurality of jet streams 16 of coolant impinging the heat-generating surface 12, thereby facilitating heat transfer from the heat-generating surface to the flow of coolant. The return line 230 can be configured to transport the flow of coolant 51, which may include two-phase bubbly flow, from the outlet port 110 of the heat sink module 100 back to the reservoir 200 where it can be mixed with single-phase liquid coolant to promote condensation of vapor bubbles within the two-phase bubbly flow, thereby resulting in transition of the two-phase bubbly flow back to single-phase liquid coolant that can once again be delivered to the pump 20 without risk of cavitation or vapor lock.

As identified by dashed lines in FIG. 11C, the cooling apparatus 1 can include a first bypass 305 including a pressure regulator 60 and a heat exchanger 40. The purpose of the first bypass 305 can be to divert a portion of the flow 51 away from the primary cooling loop 300 and through the heat exchanger 40 where the fluid can be further cooled and returned to the reservoir 200 to assist in condensing vapor in the reservoir by further reducing the bulk fluid temperature of the liquid coolant in the reservoir 200. As a result, when the two-phase bubbly flow is delivered to the reservoir via the return line, it immediately mixes in the reservoir with a large volume of coolant that is well below the saturation temperature of the liquid, thereby promoting condensation of all vapor bubbles entering the reservoir via the return line. The portion of flow 51 that is diverted through the first bypass 305 can be controlled, at least in part, by adjusting the pressure regulator 60 located in the first bypass 305. The amount of flow that is diverted through the first bypass 305 may depend on the reservoir temperature and/or the quality (x) of the flow returning to the reservoir via the return line 230. For example, if the temperature of the fluid in the reservoir 200 increase to a predetermined threshold value (e.g. about 10-15 degrees below the saturation temperature), or if the quality of the flow increases (e.g. to about 0.1-0.3), it can be desirable to increase the amount of flow through the first bypass 305 to remove heat from the liquid using the heat exchanger so that cool liquid coolant can be circulated back to the reservoir 200 to ensure that vapor bubbles 275 rapidly condense within the reservoir 200 and are not permitted to reach the pump 20.

In the schematic shown in FIG. 11A, the heat exchanger 40 is positioned downstream of the pressure regulator 60, but this is not limiting. In other examples, the pressure regulator 60 can be positioned downstream of the heat exchanger 40, as shown in FIG. 12A, where the cooling apparatus 1 has one heat sink module 100 mounted on a heat source 12 and a pressure regulator 60 located downstream of the heat exchanger 40 in the first bypass 305.

As identified by dashed lines in FIG. 11D, the cooling apparatus 1 can include a second bypass 310 including a pressure regulator 60. The second bypass 310 can route a portion of the pressurized single-phase liquid flow around the heat sink module 100 and can be fluidly connect to the primary cooling loop 300 downstream of the heat sink module 100. Depending on the surface temperature of the heat-generating surface 12 and settings of the cooling apparatus (e.g. pressure, flow rate, coolant type, bulk coolant temperature at the module inlet 105, coolant saturation temperature, etc.), the primary cooling loop 300 may be transporting two-phase bubbly flow downstream of the outlet port 110 of the heat sink module 100. To encourage condensing of bubbles 275 within the two-phase bubbly flow before the coolant reaches the reservoir (and thereby reducing the likelihood of vapor being introduced to the pump 20), the second bypass 310 can route single-phase liquid coolant around the heat sink module 100 and deliver the single-phase liquid coolant to the primary cooling loop 300 that is carrying two-phase bubbly flow, effectively mixing the two flows upstream of the reservoir 200. This mixing encourages condensing of all or a portion of the bubbles in the two-phase bubbly flow before the flow is delivered back to the reservoir 200 via the return line 230, thereby further reducing the likelihood that any bubbles 275 will be drawn from the reservoir 200 and fed to the pump, where they could cause unwanted cavitation.

Because the bubbles 275 formed in the two-phase bubbly flow are relatively small and are distributed (i.e. dispersed) throughout the liquid coolant 50, the bubbles are carried through the primary cooling loop 300 by the momentum of the liquid coolant and do not travel vertically within the system due to gravitational effects. Consequently, the cooling apparatus 1 does not require a condenser mounted at a high point in the system to collect and condense vapor bubbles back to liquid, as competing systems do. Since no condenser is required, the cooling apparatus 1 can be much smaller in size and less expensive than competing systems that require a condenser. Also, the heat sink modules 100 and sections of flexible tubing 225 described herein can be installed in any orientation without concerns of vapor lock. To the contrary, in competing systems, the orientation of system components can be critical to ensure that all vapor is transported to a condenser located at a high point in the system by way of gravity to ensure that vapor does not make its way to the pump, where it could result in vapor lock and/or pump cavitation and system failure.

As used herein, "fluid communication" between two or more elements refers to a configuration in which fluid can be communicated between or among the elements and does not preclude the possibility of having a filter, flow meter, temperature or pressure sensor, or other devices disposed between such elements. The elements of the cooling apparatus 1 are preferably configured in a closed fluidic system, as shown in FIG. 11A, thereby permitting containment of the coolant 50 which could otherwise evaporate into the environment.

Pressure Regulator

The pressure regulator 60 can be any suitable type of pressure regulator that is capable of achieving suitable working pressures ranges and flow rates described herein to ensure smooth operation of the cooling apparatus 1. In some examples, the pressure regulator 60 can be a relief valve, such as a Series 69 relief valve manufactured by Aquatrol, Inc. of Elburn, Ill. One suitable Series 69 relief valve has an adjustment range of about 0-15 psi and a maximum flow rate of about 6.9 gallons per minute. This model pressure regulator is suitable for a cooling apparatus 1 configured to cool several racks 410 of servers 400 as shown in FIG. 3. For applications where a larger or smaller cooling apparatus 1 is required, a larger or smaller model pressure regulator can be selected.

As shown in FIG. 11A, the pressure regulator 60 can be located in the second bypass 310 of the cooling apparatus 1 and can be used to control the pressure differential between the inlet port 105 and the outlet port 110 of the heat sink module (i.e. the pressure differential between the high-pressure coolant 54 at the inlet port 105 and the low-pressure coolant 55 at the outlet port 110). Where the cooling apparatus 1 has a plurality of heat sink modules 100 fluidly connected in parallel to the inlet manifold 210 and outlet manifold 215, as shown in FIG. 16, the pressure regulator 60 can be used to control the pressure differential between the inlet manifold and the outlet manifold.

In the cooling apparatus 1 shown in FIG. 11A, by adjusting the pressure regulator 60 located in the second bypass 310, the pressure differential between the inlet port 105 and outlet port 110 can be controlled. In the cooling apparatus 1 shown in FIG. 16, the pressure regulator 60 can be adjusted to provide a pressure differential between the inlet manifold 210 and the outlet manifold 215. In one example, the pressure regulator 60 can be adjusted to provide a pressure differential of about 5-15 or 10-15 psi between the inlet manifold 210 and the outlet manifold 215. For instance, if the high-pressure coolant 54 in the inlet manifold 210 is at a pressure of about 60 psi, the pressure regulator 60 can be adjusted to maintain low-pressure coolant 55 in the outlet manifold 215 at a pressure of about 45-55 or 45-50 psi. In another example, if the high-pressure coolant 54 in the inlet manifold 210 is at a pressure of about 30 psi, the pressure regulator 60 can be adjusted to maintain low-pressure coolant 55 in the outlet manifold 215 at a pressure of about 15-25 or 15-20 psi. In yet another example (where the contents of the cooling apparatus 1 are evacuated using a vacuum pump prior to adding the coolant, such that the resting pressure of the coolant is below atmospheric pressure), if the high-pressure coolant 54 in the inlet manifold 210 is at a pressure of about 15 psi, the pressure regulator 60 can be adjusted to maintain low-pressure coolant 55 in the outlet manifold 215 at a pressure of about 0-10 or 0-5 psi.

The pressure regulator 60 located in the second bypass 310 of the cooling apparatus 1, as shown in FIG. 16, can be adjusted to control the coolant flow rate through the second bypass 310, and by doing so, can simultaneously adjust the coolant flow rate through the heat sink modules 100. For instance, as the pressure differential between the inlet manifold 210 and the outlet manifold 215 shown in FIG. 16 is decreased by adjusting the pressure regulator 60 located in the second bypass 310, a higher percentage of coolant flow 51 will pass through the pressure regulator 60, effectively bypassing the heat sink modules 100 and resulting in a reduced coolant flow rate through the heat sink modules. Conversely, as the pressure differential between the inlet manifold 210 and outlet manifold 215 is increased by adjusting the pressure regulator 60 located in the second bypass 310, a lower percentage of coolant flow 51 will pass through the pressure regulator 60, resulting in an increased coolant flow rate through the heat sink modules 100.

As shown in FIG. 16, the pressure regulator 60 can be arranged in parallel with a plurality of cooling lines. Coolant flow through the pressure regulator 60 and the cooling lines can be similar to the way current flows in a circuit with resistors arranged in parallel. Increasing the flow resistance of the regulator 60 will decrease the flow through the second bypass 310 and increase the flow rate through the cooling lines. Conversely, decreasing the flow resistance of the regulator 60 will increase the flow through the second bypass 310 and decrease the flow rate through the cooling lines.

In some examples, the quality (x) of the two-phase bubbly flow exiting the heat sink module(s) 100 can be monitored with a sensor. When the quality (x) reaches a predetermined threshold value (e.g. about 0.25), the flow resistance of the pressure regulator 60 in the second bypass 310 can be increased to reduce the flow rate through the pressure regulator and increase the flow rate through the heat sink module(s), thereby reducing the quality (x) of the flow exiting the heat sink module(s) to ensure the bubbly-flow does not transition to slug flow or churn flow (see FIG. 59B) within the flexible tubing 225, which could result in flow instability.

Pump

The pump 20 can be any pump capable of generating a positive coolant pressure that forces coolant 50 to circulate through the cooling apparatus 1. In some examples, the pump 20 can generate a positive coolant pressure that forces coolant through the primary cooling loop 300, into an inlet port of a heat sink module 100, and through a plurality of orifices 155 within the heat sink module, thereby transforming the flow of coolant into a plurality of jet streams 16 of coolant that impinge against the surface to be cooled 12, as shown in FIG. 26. In some examples, it can be desirable to select a pump 20 that is capable of pumping single-phase liquid coolant and increasing the pressure of the coolant to about 5-20, 15-30, 25-45, 30-50 40-65, 50-75, 60-85, 75-150, 5-200, 5-150, or 100-200 psi. A desired coolant pressure can depend on the type of coolant selected, the boiling point of that coolant, and the temperature of the surface to be cooled 12.

To allow the cooling apparatus 1 to operate at a relatively low pump outlet pressure, and thereby consume minimal power and allow for the use of lightweight, inexpensive, flexible tubing 225, it can be desirable to select a coolant 50 that has a boiling point that is a predetermined number of degrees below the temperature of the surface to be cooled 12 at the system operating pressure. In some examples, a coolant 50 with a boiling point about 10-20, 15-25, 20-30, 25-35, or 30-40 degrees C. below the temperature of the surface to be cooled 12 can be selected, where the boiling point of the coolant is determined at a pressure coinciding with an inlet pressure at a heat sink module.

When adapting the cooling apparatus 1 to cool microprocessors 415 that operate with junction temperatures of about 50-90 degrees C., it can be desirable to select a dielectric coolant such as HFE-7000 that has a boiling point of about 34 degrees C. at 1 atm. In this arrangement, the pump outlet pressure can be set to about 5-35 or 15-25 psia to achieve suitable operation, and the pressure regulator 60 in the first bypass 305 can be adjusted to divert about half of the flow 51 from the pump outlet 22 through the first bypass 305 and through the heat exchanger 40 to ensure a volume of adequately subcooled coolant in the reservoir 200. When adapting the cooling apparatus 1 to cool power electronic devices that operate at temperatures of about 90-120 degrees C., it can be desirable to select a dielectric coolant such as HFE-7100 that has boiling point of about 61 degrees C. at 1 atm. When adapting the cooling apparatus to cool an electrical device having a temperature of about 70-100 degrees C., it can be desirable to select a dielectric coolant that has a boiling point In either application, the pump outlet pressure and pressure regulators 60 can be adjusted to provide a suitable flow of coolant though the heat sink module 100 whereby a portion of the liquid coolant changes to vapor and a portion of the coolant remains liquid to produce a two-phase bubbly flow having a quality below a predetermined threshold to ensure stability within the cooling apparatus 1.

In some examples, the contents of the cooling apparatus 1 can be evacuated using a vacuum pump prior to adding the coolant 50, thereby resulting in a sub-atmospheric pressure within the cooling apparatus 1. The coolant can then be added to the system from a container that has been degassed and is also at a sub-atmospheric pressure. Once inside the system, the coolant will remain at a sub-atmospheric pressure. When the pump 20 is activated, it can be capable of pumping single-phase liquid coolant and increasing the pressure of the coolant to about 5-20, 10-25, or 15-30 psi at the pump outlet 22. In this example, the coolant 50 can be HFE-7000, and the pump pressure can be set at a suitable value to provide a flow rate of about 0.25-1.5, 0.7-1.3, 0.8-1.2, or 0.9-1.1 liters per minute through each heat sink module 100 in the cooling apparatus 1.

In other examples, the coolant can be HFE-7000, HFE-7100, R-245fa, or a mixture thereof. In some examples, the coolant can be 100% HFE-7000, 100% HFE-7100, or about 60-95, 70-95, or 85-95% HFE-7000 by volume and the remainder can be R-245fa. In any of these examples, the pump pressure can be set at a suitable value to provide a flow rate of about 0.7-1.3, 0.8-1.2, or 0.9-1.1 liters per minute through each heat sink module 100 in the cooling apparatus 1.

In one example, the pump 20 can be a variable speed positive displacement pump, such as a MICROPUMP gear pump by Cole-Parmer of Vernon Hills, Ill. In another example, where the cooling apparatus 1 is designed to cool several racks 410 of servers 400, as shown in FIGS. 1-3, the pump 20 can be a 1.5 HP vertical, multistage, in-line, centrifugal pump, such as a Model No. A96084444P115030745 from Grundfos headquartered in Denmark. In a redundant configuration, as shown in FIGS. 9 and 10, the redundant cooling apparatus 2 can have two Grundfos pumps 20 operating independently.

Although a constant speed pump 20 can be used for simplicity, a variable speed pump can provide greater flexibility for cooling dynamic heat loads, such as microprocessors 415 with varying utilization rates and temperatures, since the variable speed pump can enable the flow 51 of coolant 50 to be adjusted to meet a flow rate required to cool the estimated (e.g. theoretical) or actual (e.g. measured) heat load at the one or more surfaces to be cooled 12, and then adjusted in real-time if the heat load is greater or less than the estimated heat load. More specifically, increasing the flow rate of coolant 50 may be required where the heat load is greater than the estimated heat load to avoid reaching critical heat flux at the surface to be cooled 12. Alternately, decreasing the flow rate of coolant 50 may be required where the heat load is less than the estimated heat load to reduce unnecessary power consumption by the pump 20. The variable speed pump can be controlled by an electronic control system of the cooling apparatus 1.

In some examples, a pressurizer can be used in place of or in addition to the pump 20. The pressurizer can be pressurized by any suitable method or device, such as a pneumatic or hydraulic device that coverts mechanical motion to fluid pressure to provide a volume of pressurized coolant within the pressurizer that is then used to circulate coolant 50 through the cooling apparatus 1.

Reservoir

In the cooling system 1, the pump 20 can be in fluid communication with a coolant reservoir 200. In some examples, the reservoir 200 can be a metal tank, such as a steel or aluminum tank (see, e.g. FIG. 3), or a plastic tank with a suitable pressure rating. In other examples, the reservoir 200 can be any suitable vessel that is capable of receiving a volume of coolant and safely housing the volume of coolant in compliance with any governing regulations. As described herein, with respect to certain embodiments of the cooling apparatus 1, such as embodiments shown in FIGS. 11A-D, the reservoir 200 can be configured to receive a variety of fluid flows, including two-phase bubbly flow via a primary cooling loop 300 and single-phase liquid flow via a first bypass loop 305. However, despite receiving two-phase bubbly flow via the return line 230 of the primary cooling loop 300, the cooling apparatus 1 can be configured to provide exclusively single-phase liquid coolant from a reservoir outlet to an inlet 21 of the pump 20. As vapor bubbles 275 are introduced to the reservoir by bubbly flow from the return line 230, the bubbles 275 tend to migrate to the top of the reservoir 200, and single-phase liquid tends to settle in the lower portion of the reservoir due to gravitational effects. A section of tubing 220, such as rigid or flexible section of tubing, can connect the reservoir 200 to the inlet 21 of the pump 20. In some examples, the section of tubing 220 can connect to a reservoir outlet located along a lower portion of the reservoir 200, and preferably at or near a bottom portion of the reservoir, to ensure that only single-phase liquid coolant, and not two-phase coolant, is drawn from the reservoir and provided to the inlet 21 of the pump 22. Providing only single-phase liquid coolant to the pump 20 can ensure that cavitation within the pump is avoided. Cavitation can occur if two-phase flow is provided to the pump, and is undesirable, since it can damage pump components, resulting in diminished pump capacity or pump failure.

To ensure that only single-phase liquid coolant is provided to the pump 20, and thereby avoiding pump cavitation, the volume of coolant in the reservoir 200 can be selected to be a certain volume ratio of the total volume of coolant in the cooling apparatus 1. Increasing the volume ratio can increase the likelihood that any vapor bubbles 275 within the two-phase bubbly flow being delivered to the reservoir 200 from the one or more heat sink modules 100 will have an opportunity to condense back to liquid before that quantity of coolant is drawn from the reservoir 200 and delivered back to the pump inlet 21 for recirculation through the cooling apparatus 1. The preferred volume ratio can depend on a variety of factors, including, for example, the heat load associated with the surface being cooled 12, the properties of the coolant 50 being used, the flow rate of coolant in the system, the flow quality (x) of coolant being returned to the reservoir 200, the percentage of coolant flow 51 being diverted through the first and second bypasses (305, 310), the operating pressure of the coolant, and the performance of the heat exchanger 40. In some examples, the volume ratio can be about 0.2-0.5, 0.4-1.0, 0.6-1.5, 1.0-2.0, or greater than 2.0. It can be desirable to encourage condensing of any bubbles that may be delivered to the reservoir 200 as two-phase bubbly flow returning from the one or more heat sink modules 100. Experiments have shown that maintaining the reservoir 200 at a fill level of about 30-90%, 40-80%, or 50-70%, (where fill level is defined as the percent volume of the reservoir 200 occupied by liquid coolant 50) results in effective condensing of bubbles 275 that are delivered to the reservoir by the return line 230. A liquid-vapor interface is established at the fill level of the reservoir 200, and this liquid-vapor interface may encourage condensation of the bubbles 275 due to hydrodynamic effects acting on the two-phase bubbly flow as it is delivered to (e.g. poured or sprayed into) the reservoir 200 and passes through the liquid-vapor interface within the reservoir and mixes with the sub-cooled single-phase liquid coolant residing in the reservoir. As shown in FIG. 3, the return line 230 carrying the two-phase bubbly flow can deliver the two-phase bubbly flow near an upper portion of the reservoir 200. In some examples, the delivery point of two-phase bubbly flow to the reservoir 200 can be located above the fill level of the reservoir to ensure the two-phase bubbly flow is delivered into the head space (i.e. vapor region) of the reservoir, such that gravity draws the two-phase bubbly flow downward through the liquid-vapor interface.

In some examples, the reservoir 200 can include a baffle positioned in the head space of the reservoir or partially in the head space and partially below the fill level (i.e. passing through the liquid-vapor interface). The baffle can be configured to encourage condensing of bubbles 275 in two-phase bubbly flow delivered to the reservoir 200. The baffle can span all or a portion of the reservoir 200 and can be positioned horizontally, vertically, or obliquely within the reservoir. The baffle can be made of a thermally conductive material, such as steel, aluminum, or copper. When two-phase bubbly flow 51 is delivered to the reservoir 200, the flow can pass through openings (e.g. a plurality of slots or holes) in the baffle, and heat can transfer from the two-phase bubbly flow to the baffle and, in some cases, to the walls of the reservoir 200 to which the baffle is mounted or in contact with. As heat is transferred away from the two-phase bubbly flow, bubbles 275 within the coolant 50 can condense, either due to decreases in the bulk fluid temperature in the reservoir or due to local decreases in fluid temperature proximate the condensing bubbles. The openings in the baffle can have any suitable shape. Non-limiting examples of baffle opening shapes include triangular, round, oval, rectangular, or hexagonal, or polygonal.

Inlet and Outlet Manifolds

As shown in FIG. 12T, an inlet manifold 210 can receive coolant 50 and can deliver the coolant to one or more portions of flexible tubing 225 that deliver the coolant to one or more heat sink modules 100 fluidly connected between the inlet manifold 210 and an outlet manifold 215. The inlet manifold 210 can have an inner volume that serves as an in-line reservoir for the coolant and effectively dampens pressure pulsations in the flow 51 of coolant that may be transmitted from the pump 20. In some examples, the proper size of the inner volume of the inlet manifold 210 can be determined by the flow rate of coolant 50 through the inlet manifold. For instance, the inner volume of the inlet manifold 210 may be configured to hold a volume of coolant that is greater than or equal to a volume equivalent to at least 5 seconds of coolant flow through the manifold. So for a coolant flow rate of about 1 liter/minute, the inlet manifold 210 can have an inner volume of about 0.083 liters. For smoother operation, and greater damping of pressure pulsations, the inlet manifold 210 can have an inner volume capable of storing at least 10, 15, 20, 60 or more seconds of coolant flow 51. The outlet manifold 215 can be configured to have a similar internal volume as the inlet manifold 210 to provide similar damping of pressure pulsations between the heat sink modules 100 and the return line 230.

FIG. 12T shows a schematic of a cooling apparatus 1 configured to cool two racks 410 of servers 400. The cooling apparatus 1 in FIG. 12T has a similar configuration as the cooling apparatus 1 shown in FIGS. 1-3, but the cooling apparatus 1 in FIG. 12T only shows two server racks 410, whereas the cooling apparatus in FIGS. 1-3 shows eight server racks 410. Also, the cooling apparatus 1 in FIG. 12T shows fewer parallel cooling lines extending between each inlet and outlet manifold (210, 215). Nevertheless, the overall concept is similar. The cooling apparatus 1 in FIG. 12T includes a dedicated inlet manifold 210 and outlet manifold 215 for each server rack 410. This configuration provides a modular cooling system 1 that can be increased in size to accommodate additional server racks 410, for example, as a data center 425 increases its server count. Therefore, the configuration in FIG. 12T can easily be modified to resemble the configuration shown in FIGS. 1-3 by adding six additional server racks 410 and by increasing the number of cooling lines extending between each inlet and outlet manifold (210, 215).

Figure 4:
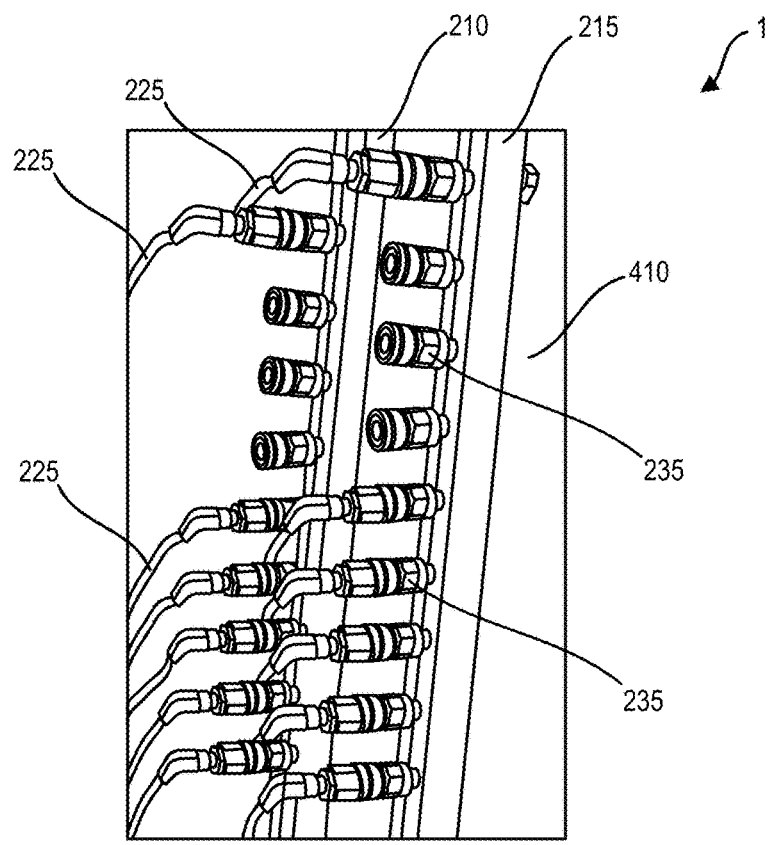
FIG. 4 shows an inlet manifold and an outlet manifold of the cooling apparatus and sections of flexible tubing with quick-connect fittings connecting parallel cooling lines to the inlet and outlet manifolds.

FIG. 4 shows a rear side view of a server rack 410 with an inlet manifold 210 and outlet manifold 215 mounted vertically to the server rack 410. The inlet manifold 210 and the outlet manifold 215 can be fitted with a plurality of fittings 235, such as quick-connect fittings, that permit individual cooling loops 300 to be hot swapped without interrupting coolant flow through other cooling loops 300 of the apparatus 1. As shown in FIG. 4, the inlet and outlet manifolds (210, 215) can each include a plurality of fittings to permit a plurality of cooling lines 300 to be connected to each manifold. In some examples, the inlet and outlet manifolds (210, 215) can include extra, unutilized fittings 235, as shown in FIG. 4, to permit future expansion of the number of servers 400 cooled by the cooling apparatus 1.

Although the inlet and outlet manifolds (210, 215) are shown in a vertical orientation in FIG. 4, this is not limiting. As discussed herein, because the vapor bubbles 275 within the two-phase bubbly flow are effectively dispersed and suspended in the coolant flow and do not seek a high point in the cooling apparatus 1 in response to gravitational effects, the system components (such as the outlet manifold 215) do not need to be vertically oriented to ensure collection of vapor, as competing systems do. Consequently, the outlet manifold 215 can be oriented horizontally or at any other suitable orientation that is preferable for a particular installation in view of space constraints and manifold size.
Flexible Tubing FIG. 5 shows a top perspective view of a server 400 with its lid removed and a portion of a cooling apparatus 1 having a primary cooling loop 300 installed within the server housing. The cooling loop 300 includes two heat sink modules 100 mounted on vertically oriented heat-generating components (e.g. CPUs) within the server 400. The heat sink modules 100 are arranged in a series configuration and are fluidly connected with sections of flexible tubing 225 to transport coolant between neighboring heat sink modules, from an outlet port 105 of the first heat sink module 100 to an inlet port 105 of the second heat sink module. In some examples, others types of tubing can be used, such as smooth tubing 225, as shown in FIG. 4. More specifically, smooth nylon or fluorinated ethylene propylene (FEP) tubing 225 can be used. In some examples, the flexible tubing 225 can be FEP tubing from Cole-Parmer of Vernon Hills, Ill. and can have a maximum temperature rating of about 400 degrees F., an inner diameter of about 0.25-0.375 inches, and a maximum working pressure of about 210 psi. The flexible tubing 225 can be chemically inert, nontoxic, heat resistant, and have a low coefficient of friction. In addition, the flexible tubing 225 may not deteriorate with age.

In some applications, corrugated, flexible tubing 225 can provide certain advantages. For instance, corrugated tubing can resist kinking when routed in space-constrained applications, such as within servers 400 as shown in FIGS. 5 and 6. Flexible, corrugated tubing can be routed in configurations where the tubing contains bends that result in 180-degree directional changes without kinking, as shown in FIG. 6. In some examples, the flexible, corrugated tubing 225 can be corrugated FEP tubing from Cole-Parmer and can have a maximum temperature rating of about 400 degrees F. and a maximum working pressure of about 250 psi.

An advantage of corrugated tubing 225 is that, when transporting two-phase bubbly flow, it may delay the onset of slug flow by causing the breakdown of larger bubbles into smaller bubbles and causing the breakdown of clusters of bubbles due to frictional effects acting on the bubbles as they pass through the corrugated tubing and contact the inner walls of the tubing. Slug flow occurs when one or more large or bullet-shaped bubbles of vapor form within the tubing 225. As shown in FIG. 58, large vapor bubbles within slug flow may be nearly as wide as the inner diameter of the tubing. Slug flow is undesirable, since it can create flow instabilities in the cooling apparatus 1, resulting in surging or chugging within the cooling loops 300, making it difficult to maintain desired pressures in certain components of the cooling system 1, such as the heat sink modules 100, and thereby making it difficult to provide consistent and predictable cooling of a heated surface 12. Slug flow can be combatted by increasing the flow rate through the heat sink modules 100 to reduce flow quality (x) (due to less vapor formation), thereby restoring two-phase bubbly flow, for example, between series-connected heat sink modules 100. In some examples, the cooling apparatus 1 can be configured to detect the onset of slug flow (e.g. using a visual flow detection system) at an outlet port 110 of a heat sink module 100 or at some other point in the cooling loop 300 and to automatically increase the coolant flow rate 51 to restore two-phase bubbly flow at the outlets of the one or more heat sink modules 100.

Another advantage of corrugated tubing 225 is that it can resist collapse when vacuum pressure is applied to an inner volume of the tubing. Vacuum pressure may be applied to the tubing 225 during servicing of the cooling apparatus 1. For example, when draining coolant 50 from the system 1 to allow for repairs or maintenance to be performed, vacuum pressure can be applied to a location (e.g. a drain 245) in the cooling apparatus 1 to draw out coolant 50 from the tubes and components of the apparatus. Portions of the cooling apparatus 1 can then be safely disassembled without having to make other arrangements for containment of the coolant. Removing coolant 50 through the application of vacuum pressure can allow the coolant to be captured in a vessel and reused to fill the apparatus when servicing is complete, thereby reducing servicing costs and waste that would otherwise be associated with discarding and replacing the coolant.

FIG. 6 shows a top view of a server 400 with its lid removed and a portion of a cooling apparatus 1 visible within the server. This example of a server 400 includes a motherboard 405, two microprocessors 415, and two sets of three memory modules 420. The two microprocessors 415 are mounted parallel to the motherboard 405, and the memory modules 420 are mounted perpendicular to the motherboard 405. The cooling apparatus 1 includes two heat sink modules 100 arranged in a series configuration and fluidly connected by flexible sections of flexible tubing 225. The first heat sink module 101 is mounted on a first microprocessor, and the second heat sink module 102 is mounted on a second microprocessor. A first section of flexible tubing 225 delivers coolant the an inlet port 105 of the first heat sink module 101, and a second section of flexible tubing 225 delivers coolant from an outlet port 110 of the first heat sink module 101 to an inlet port 105 of the second heat sink module 102. As, shown, due to its flexibility, the second section of flexible tubing 225 can easily be routed around server components for ease of installation. The flexible tubing 225 can be arranged in a variety of configurations, including serpentine configurations, to allow any two heat sink modules 100 (e.g within a server housing) to be fluidly connected regardless of the orientation or placement of the two heat sink modules.

The heat sink modules 100 can be used within the server 400 to cool electrical components that produce the most heat, such as the microprocessors 415. Other components within the server 400 may also produce heat, but the amount of heat produced may not justify installation of additional heat sink modules 100. Instead, to remove heat generated by other electrical devices within the server 400, one or more fans 26 can be used to expel warm air from the server 400 housing, as shown in FIG. 6. The fans can be configured to draw cool room air into the server housing 400 and to expel warm air from the housing.

In some examples, the length of a section of flexible tubing 225 between series-connected modules can be at least 4, 6, 12, 18, or 24 inches in length. In some applications, increasing the length of the section of tubing 225 can promote condensation of bubbles 275 within the bubbly flow between series-connected heat-sink modules due to heat transfer from the liquid to the tubing 225 and ultimately from the tubing to the ambient air, as well as heat transfer within the coolant from the vapor portion of the flow to the liquid portion of the flow, thereby elevating the bulk fluid temperature as vapor bubbles collapse. In some applications, increasing the length of the second section of flexible, corrugated tubing 225 may promote breaking apart of clusters of bubbles that may form in the two-phase flow, thereby delaying the onset of plug/slug flow and maintaining two-phase bubbly flow.

Coolant Filter

FIG. 13 shows a schematic of a cooling apparatus 1 including a filter 260 located between the reservoir 200 and the pump 20 in the primary cooling loop 300. The filter 260 can trap and prevent debris from entering and damaging the pump 20. Likewise, the filter 260 can trap and prevent debris from passing through the primary cooling loop 300 to the one or more heat sink modules 100, where the debris could potentially clog small orifices 155 in the heat sink modules. The cooling apparatus 1 can include one or more filters 260 placed upstream or downstream of the pump 20, or in any other suitable locations. The filter 260 can be connected inline using quick-connect fittings. The filter 260 can be a disposable filter or a reusable filter. The filter can have a micron rating of about 5, 10, or 20 microns.

In some examples, the heat sink module 100 can include a filter 260 to ensure that no debris is permitted to enter the heat sink module and clog orifices 155 within the heat sink module. The filter 260 can be disposed within the heat sink module (e.g. a removable filter that is inserted within the inlet port 105, inlet passage 165, or inlet chamber 145), or can be attached in-line with the heat sink module 100, such as a filter component that is threaded onto the inlet port and that contains a filtration device. By placing the filter 260 in or immediately upstream of the heat sink module 100, clogging of orifices 155 within the heat sink module can be avoided regardless of where debris originates from in the cooling apparatus 1.

Heat Sink Module

The heat sink module 100 can be configured to mount on a surface to be cooled 12 and provide a plurality of jet streams 16 (e.g. an array of jet streams 16) of coolant that impinge against the surface to be cooled 12 to effectively remove heat from the surface to be cooled. By removing heat from the surface to be cooled 12, the heat sink module 100 can effectively maintain the temperature of the surface to be cooled 12 at a suitable level so that a device associated with the surface to be cooled 12 is able to operate without overheating (i.e. operate below a threshold temperature).

The heat sink module 100 can include a top surface 160 and a bottom surface 135 opposite the top surface. The heat sink module 100 can be uniquely sized and shaped for a particular application. For instance, where the heat sink module 100 is tasked with cooling a square-shaped microprocessor, the heat sink module 100 can have a square perimeter, as shown in FIGS. 21-24. In this example, the heat sink module 100 can be defined by a front side surface 175, a rear side surface 180, a left side surface 185, a right side surface 190, the top surface 160, and the bottom surface 135. In other applications, the perimeter shape of the heat sink module 100 can be round, polygonal, or non-polygonal. In some examples, the heat sink module 100 can have dimensions that allow it to replace a traditional finned heat sink. For instance, the heat sink module 100 can have a footprint of about 91.5×91.5 mm or 50×50 mm. In other examples, the heat sink module can be sized for a specific CPU or GPU. The features of the heat sink module 100 are scalable and can be rapidly manufactured using a 3D printing process.

The heat sink module 100 can have any suitable sealing feature located on the bottom surface 135 to facilitate sealing against the surface to be cooled 12 or against an intermediary surface, such as a surface of a thermally-conductive base member (e.g. a copper plate 430) that is adhere to the surface to be cooled 12. In some examples, the heat sink module 100 can include a channel 140 along its bottom surface 135, as shown in FIG. 24. The channel 140 can be configured to receive a suitable sealing member 125, such as a gasket or O-ring, as shown in FIG. 23. In some examples, the channel 140 can be a continuous channel that circumscribes an outlet chamber 150 of the heat sink module 100, as shown in FIG. 24. In other examples, the heat sink module 100 can include alternate or additional sealing materials, such as a liquid gasket material, a die cut rubber gasket, an adhesive sealant, or a 3-D printed gasket provided on the bottom surface 135 of the heat sink module 100.

Although the bottom surface 135 of the heat sink module shown in FIG. 23 is flat, this is non-limiting. For applications involving a contoured surface to be cooled 12, the bottom surface 135 of the heat sink module 100 can have a corresponding contour that matches the contour of the surface to be cooled 12 and a thereby allows a sealing member 125 disposed therebetween to provide a liquid tight seal. In one example, the bottom surface 135 of the heat sink module can have a contour configured to match an external surface contour of a cylindrical tube or vessel (e.g. a metallic vessel) used in a chemical process, such as a condensation process or cooling wort in a brewing process. The contoured bottom surface 135 of the heat sink module 100 can allow the heat sink module to be form a liquid-tight seal against the tube or vessel and cool an external surface of the tube or vessel that is exposed within the outlet chamber 150 of the heat sink module 100. Where the contents of a large vessel must be cooled rapidly, such as when chilling wort in a brewing process, a plurality of heat sink modules 100 can be arranged on the external surface(s) of the large vessel to remove heat from the vessel rapidly, thereby allowing the cooling apparatus 1 to replace a glycol chiller system in a modern brewery or a counterflow chiller (which uses a significant amount of chilled water) in a more traditional brewery.

The heat sink module 100 can include mounting holes 130 or locating holes, as shown in FIGS. 21 and 23, located near corners of the module and/or along one or more perimeter portions of the module. Fasteners 115 can be inserted through the mounting holes 130, as shown in FIG. 22, and installed into threaded holes associated with a mounting surface to which the heat sink module 100 is mounted, such as a mounting surface of a thermally conductive base member 430 (e.g. a copper base plate) or directly to a mounting surface of an electrical device (e.g. a microprocessor 415 or a motherboard 405). In some examples, screw-type fasteners 115 can be replaced with alternate types of fastening devices that allow for faster installation and/or removal of the heat sink module 100. In one example, the heat sink module 100 can be fastened to a heat source using a buckle mechanism, similar a ski boot buckle, to allow for rapid, tool-less installation. In other examples, the heat sink module 100 can be received by a snap fitting on the surface to be cooled 12, thereby allowing the heat sink module to be installed and uninstalled with ease by hand and without tools.

During installation of the heat sink module 100 on a surface to be cooled 12, one or more fasteners 115 can be inserted through one or more 130 holes in the heat sink module, and the one or more fasteners can engage mounting holes in the surface 12 to permit secure mounting of the heat sink module 100 to the surface 12. As the fasteners 115 are tightened, the heat sink module 100 can be drawn down tightly against the surface to be cooled 12, and the sealing member 125 (e.g. o-ring or gasket) can be compressed between the surface and the channel 140. Upon compression, the sealing member 125 can provide a liquid-tight seal to ensure that coolant 50 does not leak from the outlet chamber 150 during operation of the cooling system 1 as coolant 50 flows from the inlet port 105 to the outlet port 110 of the heat sink module 100.

The heat sink module 100 can include an inlet port 105, as shown in FIG. 21. The inlet port 105 can have internal or external threads 170 that allow a connector 120 to be connected to the inlet port. Any suitable connector 120 can be used to connect the inlet section of flexible tubing 225 to the inlet port 105. In some examples, as shown in FIG. 22, a metal or polymer connector 120 from Swagelock Company of Solon, Ohio can be used to connect the flexible tubing to the inlet port 105. The top surface 160 of the heat sink module 100 can include visual markings 132 to identify a preferred flow direction through the heat sink module to ensure proper routing of tubing to and from the heat sink module 100 to ensure that coolant flow 51 is delivered to the inlet port 105 and exits from the outlet port 110 and is not accidentally reversed.

As shown in FIG. 25, the heat sink module 100 can include an inlet passage 165 that fluidly connects the inlet port 105 to an inlet chamber 145 of the heat sink module. The heat sink module 100 can include a dividing member 195 that separates the inlet chamber 145 from the outlet chamber 150. The dividing member 195 can have a top surface and a bottom surface and can include one or more orifices 155 passing from the top surface to the bottom surface of the dividing member. The orifices 155 permit jet streams 16 of coolant 50 to be emitted from the bottom surface of the dividing member 195 and into the outlet chamber 150 when pressurized coolant 54 is delivered to the inlet chamber 145, as shown in FIG. 26.

As shown in the cross-sectional view of FIG. 25, the inlet chamber 145 can have a geometry that tapers in cross-sectional area from the front side surface 175 of the heat sink module 100 toward the rear side surface 180 of the heat sink module. The tapered cross-sectional area of the inlet chamber 145 can ensure that all orifices 155 receive coolant 50 at a similar pressure. Similarly, the outlet chamber 150 can increase in cross-sectional area in a direction from the rear surface 180 of the heat sink module toward the front surface 175 of the heat sink module 100. The increase in cross-sectional area of the outlet chamber 150 can provide suitable volume for expansion of the coolant that may occur as a portion of the liquid coolant transitions to vapor, as shown in FIG. 30, and exits the outlet port 110 of the heat sink module 100.

The heat sink module 100 can include one or more inlet passages 165 to permit fluid to enter the inlet chamber 145 and one or more outlet passages 166 to permit fluid to exit the outlet chamber 150. In this manner, the heat sink module 100 can be configured to permit fluid to flow through the outlet chamber 150. A dividing member 195 can at least partially separate the inlet chamber 145 from the outlet chamber 150. A plurality of orifices 155 can be formed in the dividing member as shown in FIGS. 24 and 25. The plurality of orifices 155 can be configured to each project a stream 16 of coolant 50 against the surface to be cooled 12. In some examples, the streams 16 of fluid projected against the surface 12 can be jet streams. As used herein, a "jet" or "jet stream" refers to a substantially liquid fluid filament that is projected through a substantially liquid or fluid medium or a mixture thereof. As used herein, a "jet stream" can include a single-phase liquid fluid filament or a two-phase bubbly flow filament. "Jet" or "jet stream" is contrasted with "spray" or "spray stream," where "spray" or "spray stream" refers to a substantially atomized liquid fluid projected through a substantially vapor medium.

The inlet chamber 145 and the outlet chamber 150 can be formed within the heat sink module 100. The heat sink module 100 can be made from any suitable material and manufactured by any suitable manufacturing process. In some examples, the heat sink module 100 can be made of a polymer material and formed through a 3D printing process, such as stereolithography (SLA) using a photo-curable resin. Printers capable of producing heat sink modules as shown in FIGS. 21-54 are available from 3D Systems, Inc. of Rock Hill, S.C. In other examples, a module body can be injection molded to reduce cost and manufacturing time and an insertable orifice plate can be 3-D printed and attached to the module body to complete the heat sink module 100.

The heat sink module 100 can be configured to cool a surface 12 of a heat source. The heat sink module 100 can include an inlet chamber 145 formed within the heat sink module and an outlet chamber 150 formed within the heat sink module. In some examples, the outlet chamber 150 can have an open portion along the bottom side surface 135 of the heat sink module 100, as shown in FIG. 23. The open portion of the outlet chamber 150 can be enclosed by the surface 12 of a heat source when the heat sink module 100 is installed on the surface 12 of the heat source, as shown in FIG. 26. The heat sink module 100 can include a dividing member 195 disposed between the inlet chamber 145 and the outlet chamber 150. The dividing member 195 can include a first plurality of orifices 155 formed in the dividing member. The first plurality of orifices 155 can pass from a top side of the dividing member 195 to a bottom side of the dividing member and can be configured to deliver a plurality of jet streams 16 of coolant 50 into the outlet chamber 150 when pressurized coolant 54 is provided to the inlet chamber 145, as shown in FIG. 26.

The first plurality of orifices 155 can have any suitable diameter that allows the orifices to provide well-formed jets streams 16 of coolant 50 when pressurized coolant 54 is delivered to the inlet chamber 145 of the heat sink module 100. In some examples, the orifices 155 may all have uniform diameters, and in other examples, the orifices may not all have uniform diameters. In either case, the average diameter of the orifices 155 can be about 0.001-0.020, 0.001-0.2, 0.001-0.150, 0.001-0.120, 0.001-0.005, 0.020-0.045, 0.030-0.050 in, or 0.040 in. An orifice 155 diameter of about 0.040 in. can be preferable to ensure that orifice clogging does not occur.

In some examples, to ensure that well-formed jet streams 16 of coolant 50 are provided by the orifices 155, the length of the orifice can be selected based on the diameter of the orifice. For instance, where the first plurality of orifices 155 are defined by a diameter D and an average length L, in some cases L divided by D can be greater than or equal to one, about 1-10, 1-8, 1-6, 1-4, 1-3, or 2. In the configuration shown in FIG. 26, the length of each orifice 155 can be determined based on an angle of the orifice with respect to the surface to be cooled 12 and based on the thickness of the dividing member 195. In some examples the dividing member 195 can have a thickness of about 0.005-0.25, 0.020-0.1, 0.025-0.08, 0.025-0.075, 0.040-0.070, 0.1-0.25, 0.040-0.070, or 0.080 in. The thickness of the dividing member 195 can be selected to provide a desired length for the orifices 155 to ensure columnar jet streams 16 of coolant. The thickness of the dividing member can also be selected to ensure structural integrity of the heat sink module 100 when receiving pressurized coolant 54 in the inlet chamber 145 and to withstand vacuum pressure when coolant 50 is purged from the cooling system 1. To minimize the height of the heat sink module 100 (e.g. to provide greater freedom when dealing with tight packaging constraints), it can be desirable to select a minimal dividing member thickness that still provides well-formed columnar jet streams 16 and adequate structural integrity.

The heat sink module 100 can be made of any suitable material or process (e.g. a three-dimensional printing process) and can have any suitable color or can be colorless. In some examples, it may be desirable to visually inspect the operation of the heat sink module 100 to ensure that boiling is occurring within the heat sink module proximate the surface to be cooled 12. To permit visual inspection, at least a portion of the heat sink module 100 can be made of a transparent or translucent material. In some examples, the transparent or translucent material can form the entire heat sink module 100, and in other examples, the transparent or translucent material can form only a portion of the heat sink module, such as a window into the outlet chamber 150 of the heat sink module or a side wall of the heat sink module. In these examples, the window or side wall can permit boiling coolant within the outlet chamber 150 to be observed when the heat sink module 100 is installed on the surface to be cooled 12.

Orifices within Heat Sink Module

Each orifice 155 within the heat sink module 100 can include a central axis 74, as shown in FIG. 30. The central axis 74 of the orifice 155 may either be angled perpendicularly with respect to the surface to be cooled 12 or angled non-perpendicularly with respect to the surface to be cooled 12, the latter of which is shown in FIG. 30. FIG. 20 shows a cross-sectional view of a heat sink module with orifices 155 arranged at a 45-degree angle with respect to the surface to be cooled 12. If angled non-perpendicularly with respect to the surface to be cooled 12, the central axis 74 of the orifice 155 may define any angle between 0° and 90° with respect to the surface 12, such as about 5°, about 10°, about 15°, about 20°, about 25°, about 30°, about 35°, about 40°, about 45°, about 50°, about 55°, about 60°, about 65°, about 70°, about 75°, about 80° or about 85° or any range therebetween (e.g. 5-15°, 10-20°, 15-25°, 20-30°, 25-35°, 30-40°, 35-45°, 40-50°, 45-55°, 50-60°, 55-65°, 60-70°, 65-75°, 70-80°, or 75-85°). The orifice 155 may comprise any cross-sectional shape when viewed along its central axis 74. Various examples include a circular shape, an oval shape (to generate a fan-shaped jet stream), a polygonal shape, or any other suitable cross-sectional shape.

FIG. 31 shows a top cross-sectional view of the heat sink module of FIG. 21 taken along section C-C shown in FIG. 25. Section C-C passes through the dividing member 195 and exposes the array 76 of orifices 155 within the heat sink module 100. In this example, because the central axes 74 of the plurality of orifices are arranged at a 45-degree angle with respect to the dividing member 195, the orifices appear as ovals in FIG. 31 despite the orifice being cylindrical coolant passageways through the dividing member.

The heat sink module 100 preferably includes an array 76 of orifices 155. The central axes 74 of the orifices 155 in the array 76 may define different angles with respect to the surface to be cooled 12. Alternately, the central axis 74 of each orifice 155 in the array 76 may have the same angle with respect to surface 12, as shown in FIG. 30. In some examples, providing neighboring orifices with central axes 74 with the same angle with respect to the surface to be cooled 12 can be preferable to avoid interaction (i.e. interference) of the jet streams 16 prior to impingement on the surface to be cooled 12. By providing jet streams 16 of coolant that do not interfere with each other prior to impingement, the heat sink module 100 can provide jet streams 16 with sufficient momentum to disrupt vapor formation on the surface to be cooled 12, thereby increasing the three-phase contact line 58 length on the surface to be cooled 12 and allowing higher heat fluxes to be effectively dissipated without reaching critical heat flux (see, e.g. FIG. 63).

The array 76 of orifices 155 may be arranged in any configuration suitable for cooling the surface to be cooled 12. FIG. 62 shows possible orifice 155 configurations including (a) a regular rectangular jet array 76, (b) a regular hexagonal jet array 76, and (c) a circular jet array 76. In the regular hexagonal array 76, shown in FIGS. 23, 31 and 62(b), the arrays 76 can be organized into staggered columns 77 and rows 78. The staggering of orifices 155 in the array 76 is such that a given orifice 155 in a given column 77 and row 78 does not have a corresponding orifice in a neighboring row 78 in the given column 77 or a corresponding orifice 155 in a neighboring column 77 in the given row 78. If the orifices 155 are configured to induce a substantially same direction of flow 90 along the surface to be cooled 12 (as shown in FIGS. 30 and 32), the columns 77 and the rows 78 are preferably oriented substantially parallel and perpendicular, respectively, to the substantially same direction of flow 90. Arrays of orifices 155 in non-staggered arrangements can be used in other examples of the heat sink module 100.

The orifice 155 can be configured to project a jet stream 16 having any of a variety of shapes and any of a variety of trajectories. With regard to shape, the stream 16 is preferably a symmetrical stream. As used herein, "symmetrical stream," refers to a jet stream 16 that is symmetrical in cross section. Examples of symmetrical streams include linear streams, fan-shaped streams, and conical streams. Linear streams have a substantially constant cross section along their length. Conical streams have a round cross section that increases along their length. Fan-shaped streams have a cross section along their length with a first cross-sectional axis being significantly longer than a second, perpendicular cross-sectional axis. In some versions of the conical jet streams 16, at least one and possibly both of the cross-sectional axes increase in length along the length of the stream. With regard to trajectory, the jet stream 16 preferably comprises a central axis 17. For the purposes herein, the "central axis 17 of the stream 16" is the line formed by center points of a series of transverse planes taken along the length of the stream 16, where each transverse plane is oriented to overlap with the smallest possible surface area of the stream 16, and each center point is the point on the transverse plane that is equidistant from opposing edges of the stream 16 along the transverse plane. In preferred versions, the orifice 155 projects a jet stream 16 having a central axis 17 that is substantially collinear with the central axis 74 of the orifice 155. However, the orifice 155 may also project a stream 16 having a central axis 17 that is angled with respect to the central axis 74 of the orifice 155. The angle of the central axis 17 of the stream 16 with respect to the central axis 74 of the orifice 155 may be any angle between 0° and 90°, such as about 1°, about 2°, about 3°, about 4°, about 5°, about 7°, about 10°, about 15°, about 20°, about 25°, about 30°, about 35°, about 40°, about 45°, about 50°, about 55°, about 60°, about 65°, about 70°, about 75°, or about 80° or any range therebetween. In such versions, the orifice 155 preferably projects a jet stream 16 where at least one portion of the jet stream 16 is projected along the central axis 74 of the orifice 155. However, the orifice 155 may also project a jet stream 16 where no portions of the jet stream 16 are projected along the central axis 74 of the orifices 155.

Similarly, the orifice 155 may be configured to project a jet stream 16 that impinges on the surface 12 at any of a variety of angles. In some versions, the orifice 155 projects a stream 16 at the surface 12 such that the entire stream (in the case of a linear stream), or at least the central axis 17 of the stream 16 (in the case of conical or fan-shaped streams), impinges perpendicularly on the surface 12 (i.e., at a 90° angle with respect to the surface). Perpendicular impingement upon a surface 12 induces radial flow of coolant 50 from contact points along the surface 12. While arrays 96 of perpendicularly impinging streams 16 are suitable for some applications, they are not optimal in efficiency. This is because opposing coolant flow from neighboring contact points interacts to form stagnant regions. Heat transfer performance in these stagnant regions can fall to nearly zero, which in high heat flux applications (e.g. cooling high performance microprocessors or power electronics) can pose risks associated with critical heat flux.

In a preferred examples shown in FIGS. 30 and 32, the orifices 155 are configured to project jet streams 16 of coolant that impinge the surface to be cooled 12 such that at least the central axis 17 of each jet stream 16, and more preferably the entire jet stream 16, impinges non-perpendicularly on the surface to be cooled 12 (i.e. at an angle other than 90° with respect to the surface), as shown in FIGS. 30-32. As a non-limiting example, the central axis 17 of the jet stream 16 may impinge on the surface 12 at any angle between 0° and 90°, such as about 1°, about 2°, about 3°, about 4°, about 5°, about 7°, about 10°, about 15°, about 20°, about 25°, about 30°, about 35°, about 40°, about 45°, about 50°, about 55°, about 60°, about 65°, about 70°, about 75°, or about 80° or any range there between.

FIG. 32 depicts a top view of a surface 12 on which jet streams 16 of an array 76 of jet streams impinges non-perpendicularly on the surface 12. The non-perpendicular impingement creates a flow pattern 90 to the right in which all the coolant 50 flows along the surface 12 in substantially the same direction 90. In some versions of patterns flowing in substantially the same direction 90, flow of coolant 50 at each portion of the surface 12 has a common directional vector component along a plane defined by the surface to be cooled 12. In other versions, coolant 50 at no two points on the surface 12 flows in opposite directions. In yet other versions, coolant 50 at no two points on the surface 12 flows in opposite directions or flows in perpendicular directions. Flowing coolant 50 in the substantially same direction eliminates stagnant regions on the surface being cooled 12, which helps avoid the onset of critical heat flux.

The plurality of orifices 155 in the array 76 are preferably configured to provide impinging jet streams 16 of coolant on the surface 12 in an array 96 of contact points 91 (i.e. where each contact point 91 is a jet stream 16 impingement location on the surface to be cooled 12) having staggered columns 97 and rows 98, as shown in FIG. 32. The staggering is such that a given contact point 91 in a given column 97 and row 98 does not have a corresponding contact point 91 in a neighboring column 97 in the given row 98 or a corresponding contact point 91 in a neighboring row 98 in the given column 97. If the coolant 50 is induced to flow across the surface 12 in substantially the same direction 90, as shown in FIG. 32, either the columns 97 or the rows 98 are preferably oriented substantially perpendicularly to the substantially same direction 90 of flow. Arrays 96 of contact points 91 arranged in this manner permit coolant 50 emanating from each contact point 91 in a given column 97 or row 98 to flow substantially between contact points 91 in a neighboring column 97 or row 98, respectively, as shown in FIG. 32. The heat sink module 100 shown in FIGS. 21 and 30 provides even, consistent flow of coolant 50 over the surface to be cooled 12, without formation of stagnation regions, and thereby encourages bubble 275 generation and evaporation, which dramatically increases the heat transfer rate from the surface to be cooled 12.

The heat sink module 100 can include an array 76 of orifices 155 with each orifice 155 having a central axis 74 angled non-perpendicularly with respect to the surface 12, where each orifice 155 projects a jet stream 16 of coolant 50 having a central axis 17 collinear with the central axis 74 of the orifice 155. In some examples, all the orifices 155 can have central axes 74 oriented at about the same angle and can project jet streams 16 of coolant having about the same trajectory and shape and can impinge against the surface 12 at about the same angle of impingement.

The array 76 of orifices 155 can be provided within the heat sink module 100 as illustrated and described with respect to FIGS. 23-31. The plurality of jet streams 16 emitted from the plurality of orifices 155 can promote bubble generation and evaporation at the surface to be cooled 12, thereby achieving higher heat transfer performance than conventional single-phase liquid cooling systems. Other implementations may promote bubble 275 generation using structures within the orifices 155, such as structures that encourage cavitation or degassing of non-condensable gasses absorbed in the liquid. Similarly boiling-inducing members 196 can be included in the heat sink module 100, as shown in FIGS. 45-50, or can be included on the surface to be cooled 12, as shown in FIG. 55.

Jet Streams with Entrained Bubbles

In some examples, it can be desirable provide jet streams 16 that contain entrained bubbles 275 to seed nucleation sites on the surface to be cooled 12. Seeding nucleation sites on the surface to be cooled 12 can promote vapor formation and can increase a heat transfer rate from the surface to be cooled 12 to the coolant 50. FIG. 73 shows a first heat sink module 100 fluidly connected to a second heat sink module 100. A section of flexible tubing 225 transports coolant from an outlet port 110 of the first heat sink module 100 to an inlet port 105 of the second heat sink module 100. Within the first heat sink module 100, a plurality of jet streams 16 of coolant are shown impinging a first surface to be cooled 12. Due to heat transferring from the first surface to be cooled 12 to the coolant 50 within in the outlet chamber 150 of the first heat sink module 100, vapor bubbles 275 form in the coolant 50. The bubbles 275 can be dispersed within the liquid coolant as it exits the outlet port 110 of the heat sink module 100. As the coolant 50 flows within the tubing 225 toward the inlet port 105 of the second heat sink module, some of the bubbles 275 may coalesce and form larger bubbles. The small and large bubbles 275 can be transported to an inlet chamber 145 of the second heat sink module. The small bubbles may be sufficiently small to travel through the orifices 155 and become entrained in a jet stream that impinges against the surface to be cooled. When the small bubbles impinge the surface to be cooled 12, they may seed nucleation sites on the surface to be cooled 12 and promote vapor formation, which can provide higher heat transfer rates. In some examples, as shown in FIG. 73, the larger bubbles 276 may be too large to pass through the orifices 155. But pressure and flow forces may draw the larger bubbles 276 toward the orifices 155, where upon contacting the orifice inlets, the larger bubbles 276 break into smaller bubbles that can pass through the orifices 155 and be entrained in the jet streams 16. In this way, the size of the orifice 155 determines the maximum bubble size that will be entrained in the jet stream 16 and will impinge the surface to be cooled 12. To provide jet streams 16 with entrained bubbles 275 that provide desirable seeding of nucleation sites on the surface to be cooled 12, the orifice 155 diameters within the heat sink module 100 can be about 0.001-0.020, 0.001-0.2, 0.001-0.150, 0.001-0.120, 0.001-0.005, or 0.030-0.050 in.

Anti-Pooling Orifices

Pooling of coolant 50 within the outlet chamber 150 of the heat sink module 100 is undesirable, since it can create stagnation regions or other undesirable flow patterns that result in non-uniform cooling of the surface to be cooled 12, which can lead to critical heat flux issues. To avoid pooling of coolant 50 in the outlet chamber 150, the heat sink module 100 can include a second plurality of orifices 156 extending from the inlet chamber 145 to a rear wall (or proximate the rear wall) of the outlet chamber 150, as shown in FIGS. 33-38. The second plurality of orifices 156 can be configured to deliver a plurality of anti-pooling jet streams 16 of coolant to a rear portion of the outlet chamber 150 when pressurized coolant 54 is provided to the inlet chamber 145. As shown in FIG. 33, the second plurality of orifices 156 can be arranged in a column along the rear wall of the outlet chamber 150 thereby preventing coolant from pooling near the rear wall of the outlet chamber 150.

FIG. 35 shows a detailed view of one anti-pooling orifice 156 taken from the cross-sectional view of FIG. 34. The anti-pooling orifice 156 can be configured to deliver an anti-pooling jet stream 16 of coolant to a rear region of the outlet chamber 150 to prevent coolant from pooling or stagnating near the rear wall of the outlet chamber 150. The central axes 75 of the anti-pooling orifice 156 can be arranged at an angle of about 0-90, 40-80, 50-70, or 60 degrees respect to the surface to be cooled 12. In some examples, the central axes 75 of the anti-pooling orifice 156 can be at a larger angle than the central axes 74 of the plurality of orifices 155, as shown in FIG. 35. This arrangement can prevent interaction of the anti-pooling jet stream with a neighboring jet stream 16 prior to impingement on the surface to be cooled 12, thereby decreasing the likelihood of stagnation points on the surface to be cooled 12 near the rear wall of the outlet chamber 150.

Boiling-Inducing Features

As described above, achieving boiling of coolant 50 proximate the surface to be cooled 12 can dramatically increase the heat transfer rate and overall performance of the cooling apparatus 1. To encourage boiling of coolant 50 within the outlet chamber 150, the heat sink module 100 can include one or more boiling-inducing members 196 extending from the bottom surface of the dividing member 195 toward the surface to be cooled 12, as shown in FIG. 46. The one or more boiling-inducing members 196 can be slender members extending from the bottom surface of the dividing member 195. In some examples, the one or more boiling-inducing members 196 can be configured to contact the surface to be cooled 12. In other examples, the one or more boiling-inducing members 196 can be configured to extend toward the surface to be cooled but not contact the surface to be cooled. Rather, a clearance can be provided between the one or more boiling-inducing members 196 and the surface to be cooled 196, such that coolant 50 can flow between the surface to be cooled 12 and the tips of the boiling-inducing members, thereby ensuring that no hot spots or stagnation regions are created on the surface to be cooled 12. The clearance distance can be any suitable distance, and in some examples can be 0.001-0.0125, 0.001-0.05, 0.001-0.02, 0.001-0.01, or 0.005-0.010 in.

Angled Inlet and Outlet Ports

The inlet port 105 and outlet port 110 of the heat sink module 100 can be angled to provide ease of installation in a wide variety of applications. For instance, when installing the heat sink module 100 on a microprocessor 415 that is mounted on a motherboard 405, as shown in FIG. 27, if the inlet port 105 of the heat sink module is arranged at an angle (a) that is greater than zero, a clearance distance is provided between a bottom surface of the inlet port 105 and the microprocessor 415 and motherboard 405. This clearance distance can allow a connector 120, such as a compression fitting, to be easily installed (e.g. threaded) on the inlet port 105) without interfering with or contacting the microprocessor or motherboard. In addition, angling the port upwards at a moderate angle reduces the likelihood that the heat sink module 100 (and flexible tubing 225 connected to the inlet port 105) will interfere with any motherboard devices (e.g. capacitors, resistors, inductors), while still maintaining a compact height that allows the heat sink module 100 to be used between two expansion cards. In the example shown in FIG. 21, a height measured from the bottom surface 135 to the top surface 160 of the heat sink module 100 can be about 0.36 inches, and a height measured from the bottom surface 135 to the highest surface of the angled inlet and outlet ports (105, 110) can be about 0.42 inches. As shown in FIGS. 5, 6, 56, and 57, free space can be limited on a motherboard 405 and in a server 400, and experimental installations have shown that angled inlet and outlet ports (105, 110) and compact external dimensions can be very helpful in making heat sink modules 100 fit in tight spaces where competing heat sinks are unable to fit.

The heat sink module 100 can include an inlet port 105 that is fluidly connected to the inlet chamber 145 by an inlet passage 165. The heat sink module 100 can include a bottom plane 19 associated with the bottom surface 135, as shown in FIG. 26. The inlet port 105 can be defined by a central axis 23. The central axis 23 of the inlet port 105 can be non-parallel and non-perpendicular to the bottom plane 19 of the heat sink module 100. For instance, the central axis 23 of the inlet port 105 can define an angle of about 10-80, 20-70, 30-60, or 40-50 degrees with respect to the bottom plane 19 of the heat sink module 100.

The heat sink module 100 can include an outlet port 110 that is fluidly connected to the outlet chamber 150 by an outlet passage 166. The outlet port 110 can be defined by a central axis 24, as shown in FIG. 29. The central axis 24 of the outlet port 110 can be non-parallel and non-perpendicular to the bottom plane 19 of the heat sink module 100. For instance, the central axis 24 of the outlet port 110 can define an angle of about 10-80, 20-70, 30-60, or 40-50 degrees with respect to the bottom plane 19 of the heat sink module 100.

Insertable Orifice Plate

In some instances, the heat sink module 100 can include two or more components that are assembled to construct the heat sink module. Since the plurality of orifices 155 disposed in the dividing member 195 can be the most intricate and costly portion of the heat sink module 100 to manufacture (due to the relatively small diameters of the orifices 155 requiring a tighter tolerance manufacturing process than the rest of the module), it may be desirable to manufacture an orifice plate 198 (e.g. that includes a dividing member 195 and a plurality of orifices 155) separately from the rest of the heat sink module (i.e. the module body 104) and subsequently assemble the module body 104 and the orifice plate 198. FIG. 65 shows an insertable orifice plate 198 attached to a module body 104 to form heat sink module 100.

In some examples, the orifice plate 198 can be manufactured by a first manufacturing method and the module body 104 can be manufactured by a second manufacturing method where the second manufacturing method is, for example, a lower cost and/or lower precision manufacturing method than the first manufacturing method. In some examples, the orifice plate 198 can be manufactured using a 3-D printing process, and the module body 104 can be manufactured by an injection molding process. In other examples, the orifice plate 198 can be manufactured by an injection molding process, a casting process, or a machining or drilling process, and the module body 104 can be manufactured by any other suitable process.

FIG. 65 shows a heat sink module 100 with a module body 104 and an insertable orifice plate 198 installed therein. The insertable orifice plate 198 can be attached to the heat sink module 100 by any suitable method of assembly (e.g. fasteners, press fit, or snap fit). As shown in FIG. 65, the insertable orifice plate 198 can be pressed into the body 104 of the heat sink module 100 and can include a sealing member 126 that is configured to form a liquid-tight seal between the inlet chamber 145 and the outlet chamber 150. In some examples, the insertable orifice plate 198 can be removable, and in other examples the insertable orifice plate 198 may not be easily removable once installed in the body of the heat sink module 100. The plurality of orifice 155 in the orifice plate 198 can be optimized to cool a certain device, such as a certain brand and model of microprocessor 415 having a particular non-uniform heat distribution. When the microprocessor 415, motherboard 405, or entire server 400 is upgraded to a newer model, a first insertable orifice plate 198 in the heat sink module 100 can be replaced by a second insertable orifice plate 198 that has been optimized to cool the newer model processor that will replace the older one. Consequently, instead of needing to replace the entire heat sink module 100, only the insertable orifice plate 198 needs to be replaced to ensure adequate cooling of the newer model processor. This approach can significantly reduce costs associated with upgrading servers 400 in data centers 425. It can also significantly reduce the cost of optimizing the cooling apparatus 1 when replacing servers 400 in a datacenter 425, since the original cooling apparatus 1, including the pump 20, manifolds (210, 215), heat exchangers 40, flexible tubing 225, and fittings 235, can continue to be used.

A heat sink module 100 can be configured to cool a heat source, such as a surface 12 of a heat source. The heat sink module 100 can include an inlet chamber 145 formed within the heat sink module. The heat sink module 100 can include an insertable orifice plate 198 and a module body 104, as shown in FIG. 65, where the insertable orifice plate is configured to attach within the module body 104. The insertable orifice plate 198 can separate the inlet chamber 145 from an outlet chamber 150. The insertable orifice plate 198 can include a first plurality of orifices 155 passing from a top side of the insertable orifice plate 198 to a bottom side of the insertable orifice plate 198. The first plurality of orifices 155 can be configured to deliver a plurality of jet streams 16 of coolant 50 into the outlet chamber 150 when pressurized coolant 54 is provided to the inlet chamber 145 of the heat sink module 100. The outlet chamber 150 can have an open portion proximate a bottom surface of the heat sink module 100, and the open portion can be configured to be enclosed by a surface 12 of a heat source when the heat sink module is installed on the surface of the heat source. In this example, the first plurality of orifices 155 can have an average diameter of about 0.001-0.020, 0.001-0.2, 0.001-0.150, 0.001-0.120, 0.001-0.005, or 0.030-0.050 in. The insertable orifice plate 198 can have a thickness of about 0.005-0.25, 0.020-0.1, 0.025-0.08, 0.025-0.075, 0.040-0.070, 0.1-0.25, or 0.040-0.070 in.

Jet Height

The heat sink module 100 can have a bottom plane 19 associated with the bottom surface 135 of the heat sink module, as shown in FIG. 26. The distance between the bottom plane 19 of the heat sink module and the bottom side of the insertable orifice plate 198 (i.e. where orifice 155 outlets are located) defines a "jet height" 18, which can be an important factor affecting heat transfer rates attainable from the surface to be cooled 12 in response to impinging jets 16 of coolant 50 being delivered from the plurality of orifices 155. In some examples, the distance between the orifice 155 outlets and the surface to be cooled 12 can be about 0.01-0.75, 0.05-0.5, 0.05-0.25, 0.020-0.25, 0.03-0.125, 0.04-0.08, or about 0.050 in. In some examples, the jet height 18 can define the height of the outlet chamber 150 of the heat sink module 100.

As shown in FIG. 26, the outlet chamber 150 can have a tapered profile that permits for expansion of the coolant 50 as the coolant flows towards the outlet port 110 and as the quality (x) of the coolant increases in response to vapor formation proximate the surface to be cooled 12. To provide this tapered volume, the bottom surface of the dividing member may be arranged at an angle with respect to the surface to be cooled. Consequently, a jet height 18 of a first orifice 155 located near a front side of the heat sink module 100 may be less than a jet height 18 of a second orifice 155 located near a rear side of the heat sink module. In these examples, a non-uniform jet height 18 may be defined as falling within a suitable range, such as about 0.01-0.75, 0.05-0.5, 0.05-0.25, 0.020-0.25, 0.03-0.125, or 0.04-0.08 in. In other examples, an average jet height can be calculated based on the non-uniform jet height values, and the average jet height can be about 0.01-0.75, 0.05-0.5, 0.05-0.25, 0.020-0.25, 0.03-0.125, or 0.04-0.08 in.

In some examples, the distance between the bottom surface of the insertable orifice plate 198 (or dividing member 195) and the bottom surface 135 of the heat sink module 100 can define the jet height 18. The jet height (H) can be selected based on the average diameter ($d_n$) of the plurality of orifices 155. The relationship between the jet height 18 and the average diameter of the plurality of orifices 155 can be expressed as a ratio ($H/d_n$). Examples of suitable values for $H/d_n$ can be about 0.25-30, 0.25-10, 5-20, 15-25, or 20-30 for the heat sink module 100 described herein.

Jet Spacing

The orifices 155 within the heat sink module 100 can have any suitable configuration forming an array 76. FIGS. 62(a), (b), and (c) show configurations of orifices 155 having a rectangular jet array, a hexagonal jet array, and a circular jet array, respectively. Spacing (S) of the orifices 155 can be selected based on the average diameter ($d_n$) of the plurality of orifices 155. As shown in FIG. 62(b), for a hexagonal jet array 76, spacing between jets from left to right (i.e. in a streamwise direction for oblique jet impingement as shown in FIG. 32) is identified as $S_{col}$, and spacing between jets from top to bottom (i.e. cross-stream direction for oblique impingement as shown in FIG. 32) is identified as $S_{row}$. Where $S_{col}$ is set equal to S, and $S_{row}$ is set equal to ($2_{col}/\sqrt{3}$), a relationship between jet spacing S and the average diameter of the plurality of orifices 155 can be expressed as $S/d_n$. Suitable values for $S/d_n$ can be about 1.8-330, 1.8-50, 25-125, 100-200, 150-250, 200-300, or 275-330 for the rectangular, hexagonal, and circular jet arrays 76 shown in FIGS. 62(a), (b), and (c), respectively.

Jet Stream Momentum Flux

In some examples, coolant pressure, coolant temperature, coolant mass, and/or orifice diameter can be selected to provide a jet stream 16 with sufficient momentum flux to penetrate through the coolant 50 in the outlet chamber 150 and to impinge the surface to be cooled 12, as shown in FIG. 26. By impinging the surface to be cooled 12, the jet stream 16 can disrupt vapor bubbles or pockets forming on the surface to be cooled 12, thereby increasing the length of the three-phase contact line 58 (see, e.g. FIG. 63) and thereby increasing the heat transfer rate from the surface to be cooled 12 to the coolant 50 and delaying the onset of critical heat flux.

To provide desirable heat transfer from the surface to be cooled 12, experimental testing demonstrated that jet stream 16 momentum flux should be at least 23 kg/m-$s^2$ when using R245fa as the coolant 50 and should be at least 24 kg/m-$s^2$ when using HFE-7000 as the coolant 50. Suitable values of jet stream 16 momentum flux from each orifice include 24-220, 98-390, 220-611, 390-880, 611-1200, 880-1566, and greater than 1566 kg/m-$s^2$. Although a high jet stream 16 momentum flux can be desirable to increase heat transfer rates, reducing the jet stream momentum flux can be desirable to reduce power consumption by the pump 20, and thereby increase efficiency of the cooling apparatus 1. Experimental tests showed that jet stream 16 momentum fluxes of about 95-880, 220-615, and about 390 kg/m-$s^2$ produced a desirable balance of high heat transfer rates and low power consumption by the pump 20.

Internal Threads on Inlet and Outlet Ports

In some examples, corrugated, flexible tubing 225 can be used to fluidly connect heat sink modules 100 to the cooling apparatus. The corrugated, flexible tubing 225 can include spiral corrugations extending along the length of the tubing 225, similar to course threads on a screw. To facilitate fast connection of a section of flexible tubing 225 to the heat sink module 100, corresponding corrugation-mating features can be provided on the interior surfaces of the inlet and outlet ports (105, 110) of the heat sink module. The corresponding corrugation-mating features can be molded into the inlet and outlet ports (105, 110) thereby serving as internal threads. As a result, fluidly connecting a section of flexible corrugated tubing 225 to a port (105 or 110) of the heat sink module 100 can be as simple as threading the section of tubing 225 into the port. In some examples the diameter of the port (105, 110) can taper inward, thereby ensuring a liquid-tight fit as the section of tubing 225 is threaded into the port. To further ensure a liquid-tight seal, a thread sealant, such as a Teflon tape or a spreadable thread sealant can be provided between the interior surface of the port (105, 110) and the outer surface of the section of flexible tubing 225. In other examples, an adhesive, such as epoxy, can be provided between the interior surface of the port (105, 110) and the outer surface of the section of flexible tubing 225 to further ensure a liquid-tight seal and to prevent inadvertent disconnection of the section of tubing from the port.

Non-Threaded Connections

To speed installation of the heat sink module 100, for example, into a server 400, the threaded ports 105, 110 of the heat sink module 100 can be replaced with non-threaded ports. In one example, the non-threaded ports can be quick-connect ports are configured to mate with a corresponding quick connect coupler, such as a corresponding quick connect coupler attached to a section of flexible tubing 225. In this example, the quick-connect features of the quick-connect ports can be manufactured using a 3D printer. In another example, the non-threaded ports can be configured to receive smooth, flexible tubing 225 within in inner diameter of each port or over an outer diameter of each port. An epoxy or other suitable adhesive can be used to bond the flexible tubing 225 to the port (105, 110) of the heat sink module 100 to form a connector-less fluid coupling.

Leakproof Coating

The heat sink module 100 can be manufactured from a plastic material through, for example, an injection molding process or an additive manufacturing process. Depending of the properties of the plastic material used to manufacture the heat sink module 100, and the type of coolant 50 used with the cooling apparatus 1 (and the molecular size of the coolant), leakage of coolant through the walls of the heat sink module 100 may occur. To avoid leakage, the heat sink module 100 can be coated with a leakproof coating. In some examples, the leakproof coating can be a metalized coating, such as a nickel coating deposited on an outer surface of the heat sink module 100 or along the inner surfaces of the heat sink module (e.g. inner surfaces of the inlet and outlet ports, inlet and outlet passages, and inlet and outlet chambers). The leakproof coating can be made of a suitable material and can have a suitable thickness to ensure that coolant does not migrate through the walls of the heat sink module 100 and into the environment. The leakproof coating can be applied to surfaces of the heat sink module 100 by any suitable application method, such as arc or flame spray coating, electroplating, physical vapor deposition, or chemical vapor deposition.

Internal Bypass in Heat Sink Module

To promote condensing of two-phase bubbly flow upstream of the reservoir 200, and thereby reduce the likelihood of vapor being drawn into the pump 20 from the reservoir, the heat sink module 100 can include an internal bypass that routes a portion of the coolant 50 flow delivered to the inlet port 105 of the module around the heated surface 12. The internal bypass can be formed within the heat sink module 100. For instance, the internal bypass can be a, injection molded, cast, or 3D printed internal bypass formed within the heat sink module 100 and configured to transport coolant from the inlet port 105 to the outlet port 110 without bringing the fluid in contact with the surface to be cooled 12. The coolant that flows through the internal bypass can remain single-phase liquid coolant that is below the saturation temperature of the coolant. Near the outlet port 110 of the heat sink module 100, the single-phase liquid coolant that is diverted through the internal bypass can be mixed with two-phase bubbly flow (i.e. two-phase bubbly flow generated by jet stream impingement against the surface to be cooled 12) that was not diverted. Mixing of the single-phase liquid coolant with the two-phase bubbly flow can result in condensation and collapse of vapor bubbles 275 within the mixed flow 50, thereby reducing the void fraction of the coolant 50 flow delivered to the reservoir 200 and, in turn, reducing the likelihood of vapor bubbles being delivered to the pump 20.

In some examples, as shown in FIG. 12E, the internal bypass 65 in the heat sink module can include a pressure regulator 60. The pressure regulator 60 can be disposed at least partially within the internal bypass 65 and can serve to restrict flow through the internal bypass 65, thereby controlling the proportion of coolant flow through the internal bypass, and as a result, the proportion of coolant flow through the plurality of orifices 155 along a standard flow path 66 through the heat sink module. The internal pressure regulator 60 can be an active or passive regulator. In some examples, the pressure regulator can be a thermostatic valve that increases flow through the internal bypass 65 as the temperature of the coolant increases or decreases. In other examples, the pressure regulator 60 can be computer controlled pressure regulator where flow is adjusted based on a temperature and/or a pressure of the coolant upstream or downstream of the heat sink module 100. In other examples, the pressure regulator 60 can be a simple flow constriction (e.g. a physical neck) in the internal bypass that effectively restricts flow by providing flow resistance.

Flow-Guiding Lip

The heat sink module 100 can include a flow-guiding lip 162, as shown in FIG. 30. The flow-guiding lip 162 can guide a directional flow 51 of coolant from the outlet chamber 150 to the outlet passage 166. Preferably, the flow-guiding lip 162 can have an angle of less than about 45 or less than about 30 degrees with respect to the surface to be cooled 12 to avoid creating a flow restriction or stagnation region proximate the exit of the outlet chamber 150. By avoiding formation of a stagnation region, the flow-guiding lip 162 can prevent onset of critical heat flux near the exit of the outlet chamber 150.

Cooling Assembly

FIG. 7 shows a cooling assembly including a heat sink module 100 fluidly connected to two sections of flexible tubing 225. The heat sink module 100 has an inlet port 105 and an outlet port 110. One end of the first section of flexible tubing 225 is fluidly connected to the inlet port 105 by a first connector 120, and one end of the second section of flexible tubing 225 is fluidly connected to the outlet port 110 by a second connector 120. In some examples, the connectors 120 can be liquid-tight fittings, such as compression fittings. The cooling assembly can be used to cool any heat generating surface associated with a device, such as an electrical or mechanical device.

Series-Connected Heat Sink Modules

FIG. 14A shows a schematic of a cooling apparatus 1 having three heat sink modules 100 arranged in a series configuration on three surfaces to be cooled 12. As shown by way of example in FIG. 15, the three heat sink modules 100 can be fluidly connected with tubing, such as flexible tubing 225. The three surfaces to be cooled 12 can be three separate surfaces to be cooled or can be three different locations on the same surface to be cooled 12.

FIG. 15 shows a portion of a primary cooling loop 300 of a cooling apparatus 1 where the cooling loop 300 includes three series-connected heat sink modules 100 mounted on three heat-providing surfaces 12 (see, e.g. FIG. 14A). The heat sink module 100 can be connected by sections of flexible tubing 225. A single-phase liquid coolant 50 can be provided to a first heat sink module 100 by a section of tubing 225-0, and due to heat transfer occurring within the first heat sink module 100-1 (i.e. heat being transferred from the first heat-generating surface 12 to the flow of coolant), two-phase bubbly flow can be generated and transported in a first section of flexible tubing 225-1 extending from the first heat sink module 100-1 to the second heat sink module 100-2. The two-phase bubbly flow contains a plurality of bubbles 275 having a first number density. Due to heat transfer occurring within the second heat sink module 100-2 (i.e. heat being transferred from the second heat-generating surface 12 to the flow of coolant), higher quality (x) two-phase bubbly flow can be generated and transported from the second module 100-2 to the third heat sink module 100-3 through a second section of flexible tubing 225-2. In the second section of flexible tubing 225, the two-phase bubbly flow contains a plurality of bubbles 275 having a second number density, where the second number density is higher than the first number density. Due to heat transfer occurring within the third heat sink module 100 (i.e. heat being transferred from the third heat-generating surface 12 to the flow of coolant), even higher quality (x) two-phase bubbly flow can be generated and transported out of the third heat sink module 100-3 through a third section of tubing 225-3. In the third section of tubing 225-3, the two-phase bubbly flow contains a plurality of bubbles 275 having a third number density, where the third number density is higher than the second number density.

FIG. 14B shows a representation of coolant flowing through three heat sink modules (100-1, 100-2, 100-3) connected in series by four lengths of tubing (225-1, 225-2,

225-3, 225-4), similar to the configurations shown in FIGS. 14A and 15. FIG. 14B also shows corresponding plots of saturation temperature ($T_{sat}$), liquid coolant temperature ($T_{liquid}$), pressure (P), and quality (x) of the coolant versus distance along a flow path through the series-connected heat sink modules. In the example, a flow 51 of single-phase liquid coolant 50 enters the first heat sink module 100-1 through a first section of tubing 225-1 at a temperature that is slightly below the saturation temperature of the liquid coolant 50. Within the first heat sink module 100-1, the single-phase liquid coolant 50 is projected against a first surface to be cooled 12-1 by way of a plurality of jet streams 16 of coolant. A first portion of the liquid coolant 50 changes phase and becomes vapor bubbles 275 dispersed in the liquid coolant 50, thereby producing two-phase bubbly flow having a first quality ($x_1$). The two-phase bubbly flow having the first quality is transported from the first heat sink module 100-1 to a second heat sink module 100-2 by a second section of tubing 225-2. Within the second heat sink module 100-2, the two-phase bubbly flow having a first quality is projected against a second surface to be cooled 12-2 by way of a plurality of jet streams 16 of coolant. A second portion of the liquid coolant 50 changes phase and becomes vapor bubbles 275 dispersed in the liquid coolant 50, thereby producing two-phase bubbly flow having a second quality ($x_2$) that is greater than the first quality (i.e. $x_2 > x_1$). The two-phase bubbly flow having the second quality is transported from the second heat sink module 100-2 to a third heat sink module 100-3 by a third section of tubing 225-3. Within the third heat sink module 100-3, the two-phase bubbly flow having a second quality is projected against a third surface to be cooled 12-3 by way of a plurality of jet streams 16 of coolant. A third portion of the liquid coolant 50 changes phase and becomes vapor bubbles 275 dispersed in the liquid coolant 50, thereby producing two-phase bubbly flow having a third quality ($x_3$) that is greater than the second quality (i.e. $x_3 > x_2$). As shown in FIG. 14B, along the distance of the flow path, quality of the coolant increases, pressure decreases, liquid coolant temperature ($T_{liquid}$) decreases, and $T_{sat}$ decreases through successive series-connected heat sink modules.

Through each successive heat sink module 100, the flow of coolant 51 experiences a pressure drop, as shown in FIG. 14B. In some examples, the pressure drop across each heat sink module 100 can be about 0.5-5.0, 0.5-3, 1-3, or 1.5 psi. The pressure drop across each heat sink module 100 causes a corresponding decrease in saturation temperature (Tsat) of the coolant. Accordingly, the temperature of the liquid coolant component of the two-phase bubbly flow also decreases in response to decreasing saturation temperature at each pressure drop at each module. Consequently, the third heat sink module 100-3 receives two-phase bubbly flow containing liquid coolant 50 that is cooler than liquid coolant 50 in the two-phase bubbly flow received by the second heat sink module 100-2. As a result of this phenomenon, the cooling apparatus 1 is able to maintain the third surface to be cooled 12-3 at a temperature below the temperature of a second surface to be cooled 12-2 when the second and third surfaces to be cooled have equal heat fluxes. Because of this behavior, additional series connected heat sink modules 100 can be added to the series configuration. In some examples four, six, or eight or more heat sink modules 100 can be connected in series with each successive module receiving two-phase bubbly flow containing liquid coolant 50 that is slightly cooler than the liquid coolant received by the previous module connected in series. The only limitation on the number of series-connected modules that can be used a threshold quality (x) value, which if exceeded, could result in unstable flow. However, if the cooling system 1 is on the verge of exceeding the threshold quality (x) value, the coolant flow rate can be increased to decrease the flow quality.

HFE-7000 can be used as coolant 50 in the cooling apparatus 1. HFE-7000 has a boiling temperature of about 34 degrees Celsius at a pressure of 1 atm. In the example shown in FIGS. 14A, 14B, and 15, HFE-7000 can be introduced to the series configuration as single-phase liquid coolant at a pressure of about 1 atmosphere and a temperature slightly below 34 degrees Celsius. A flow rate of about 0.1-10, 0.2-5, 0.3-2.5, 0.6-1.2, or 0.8-1.1 liters per minute of single-phase coolant can be provided. As the coolant flows through the first, second, and third heat sink modules, the coolant may experience a total pressure drop of about 5-10, 8-12, or 10-15 psi. At each heat sink module, the coolant may experience a pressure drop of about 0.5-5.0, 0.5-3, 1-3, or 1.5 psi. As shown in FIG. 14B, a drop in saturation temperature accompanies each pressure drop, and a drop in liquid temperature follows each decrease in saturation temperature. Consequently, the temperature of the liquid component 50 of the two-phase bubbly flow continues to decrease through the series connection and exits the third heat sink module 100-3 at a temperature below 34 degrees Celsius, where the temperature depends on pressure and quality of the exiting flow 51. In this example, through the first heat sink module 100-1, heat transfer occurs via sensible and latent heating of the coolant, and through the second and third heat sink modules (100-2, 100-3), heat transfer occurs primarily by latent heating of the coolant.

In competing pumped liquid cooling systems, such as those that use pumped single-phase water as a coolant, the coolant becomes progressively warmer (due to sensible heating) as it passes through each successive series-connected heat sink module. For this reason, competing single-phase cooling systems typically cannot support more than two series connected heat sink modules, because the coolant temperature at the outlet of the second heat sink module is too hot to properly cool a third heat sink module. Where competing pumped liquid cooling systems include multiple series-connected heat sink modules, the cooling system is unable to maintain sensitive devices, such as microprocessors, at uniform temperatures, and the last device in series may experience sub-optimal performance or premature failure in response to operating at elevated temperatures.

FIG. 14C shows a representation of coolant flowing through three heat sink modules (100-1, 100-2, 100-3) connected in series by lengths of tubing (225-1, 225-2, 225-3, 225-4), similar to FIG. 14B, except that the coolant does not reach its saturation temperature until the second heat sink module 100-2. Consequently, single-phase liquid coolant 50 flows through the first heat sink module 100-1 (where no vapor is formed) and travels to the second heat-sink module 100-2 at an elevated temperature due to sensible heating. Within the second heat sink-module 100-2, a pressure drop occurs, as does a corresponding drop in saturation temperature. Heat transfer from the second surface to be cooled 12-2 to the single-phase liquid coolant 50 causes a portion of the coolant to vaporize. Consequently, heat transfer within the second heat sink module 100-2 can be a combination of latent heating and sensible heating. Two-phase bubbly flow can then be transported from the second heat sink module 100-2 to the third heat sink module 100-3 in a third section of tubing 225-3. Within the third heat sink module 100-3, since the temperature of the liquid component 50 of the coolant is at or nearly at its saturation temperature, heat transfer may occur primarily by latent heating, as evidenced by an increase in quality (x), as shown in FIG. 14C.

The method shown in FIG. 14C can be less efficient than the method shown in FIG. 14B, since it does not employ latent heating within the first heat sink module 100-1 and may therefore require higher flow rates and more pump work to adequately cool the first surface to be cooled 12-1. However, the method in FIG. 14C can be easier to achieve and maintain, since the temperature of the incoming single-phase liquid coolant 50 does not need to be controlled as carefully as the method shown in FIG. 14B (e.g. with respect to providing a temperature that is slightly below the saturation temperature). In some examples, an operating method can alternate between the methods shown in FIGS. 14B and 14C depending on the temperature of the incoming single-phase coolant 50. For instance, where the system is undergoing transient operation, due to changing heat loads or changing chiller loop conditions, the operating method can alternate from the method shown in FIG. 14B to the method shown in FIG. 14C for safety until the transient condition subsides. Once the transient condition is over, the microcontroller 850 of the cooling apparatus 1 can begin to ramp up the temperature of the incoming single-phase liquid coolant 50 to a temperature that is slightly below its saturation temperature. By employing this control strategy, the cooling system 1 can avoid instabilities caused by excess vapor formation during transient conditions. One strategy for decreasing the temperature of the incoming single-phase liquid coolant 50 can include increasing the flow rate through the heat exchanger 40 to reduce the temperature of the coolant in the reservoir 200, which is then delivered to the series-configuration by the pump 20.

Parallel-Connected Heat Sink Modules

FIG. 16 shows a schematic of a cooling apparatus 1 having a primary cooling loop 300 that includes three parallel cooling lines where each parallel cooling line includes three heat sink modules 100 fluidly connected in series. The cooling apparatus shown in FIG. 16 can be configured to cool nine independent heat-generating surfaces 12, such as nine microprocessors 415. Other variations of the cooling apparatus 1 shown in FIG. 16 can include more than three parallel cooling lines, and each cooling line can include more than three series-connected modules 100.

As shown in the schematic of FIG. 16, additional heat sink modules 100 can be added to the cooling apparatus 1 in parallel cooling loops 300 that they are serviced by, for example, the same pump 20, reservoir 200, and heat exchanger 40. Alternatively, as shown in FIG. 17, the cooling apparatus 1 can include additional reservoirs 200, pumps 20, and/or heat exchangers 40 in parallel for the purpose of redundancy and reliability. As used herein, an additional component "in parallel" refers to a component in fluid communication with the other components in a manner that bypasses only components of the same type without bypassing different types of components. An example of an additional component added in parallel is shown with the additional heat sink modules 100 in FIG. 16, where three parallel cooling loops 300 are provided that each are serviced by the same reservoir 200 and pump 20.

Single Heat Sink Module for Multiple Heat Sources

To reduce installation costs, it can be desirable to cool more than one heat source 12 using a single heat sink module 100. Example installations are shown in FIGS. 66 and 67. FIG. 66 shows an example of an existing server 400 with a heat sink module retrofitted thereon. The server 400 includes a motherboard 405, two microprocessors 415 mounted on the motherboard, and a finned heat sink 440 mounted on each microprocessor 415. Rather than spend time and effort removing the finned heat sink modules 440 already installed on the microprocessors 415, instead, a thermally conductive base member 430 can be placed in thermal contact with both finned heat sinks 440, as shown in FIG. 66. The thermally conductive base member 430 can extend from a first finned heat sink 440 to a second finned heat sink 440. A heat sink module 100 can be mounted on a surface 12 of the thermally conductive base member 430. By directing a plurality of jet streams 16 of coolant at the surface to be cooled 12 of the thermally conductive base member 430, the configuration shown in FIG. 66 can cool two microprocessors simultaneously at a lower cost than installing two heat sink modules and without having to uninstall any factory-installed components of the server (e.g. the finned heat sinks 440). By not uninstalling factory-installed hardware, this cooling method can avoid potentially voiding a factory warranty on the server 400 or computer.

FIG. 67 shows an arrangement where a thermally conductive base member 430 extends from a first microprocessor 415 to a second microprocessor 415 mounted on a motherboard 405. A heat sink module 100 can be mounted on a surface 12 of the thermally conductive base member 430. By directing a plurality of jet streams 16 of coolant at the surface to be cooled 12 of the thermally conductive base member 430, the configuration shown in FIG. 67 can cool two microprocessors 415 simultaneously at a lower cost than using two heat sink modules. To ensure even cooling of each microprocessor, it can be desirable for the thermally conductive base member 430 to make contact with an entire, or substantially the entire, top surface of each microprocessor, as shown in FIG. 67.

Surface to be Cooled

The surface to be cooled 12 can be exposed within the outlet chamber 150 of the heat sink module 100, such that the jet streams 16 of coolant 50 impinge directly on the surface to be cooled 12 without thermal interference materials disposed between the surface 12 and the coolant 50. As used herein, "surface to be cooled" refers to any electronic or other device having a surface that generates heat and requires cooling. Non-limiting, exemplary surfaces to be cooled 12 include microprocessors 415, microelectronic circuit chips in supercomputers, power electronics, mechanical components, process containers, or any electronic circuits or devices requiring cooling, such as diode laser packages. The surface to be cooled 12 can be exposed within the outlet chamber 150 of the heat sink module 100 by constructing the outlet chamber to include the surface 12 within the chamber 150 or by constructing the outlet chamber such that the surface to be cooled 12 serves as a bounding wall of the outlet chamber 150, as shown in FIG. 26. In some examples, the heat sink module 100 can form an enclosure, such as a sealed liquid-tight enclosure, against the surface to be cooled 12 using one or more sealing members (e.g. o-rings, gaskets, or adhesives).

In some examples of the cooling apparatus 1, coolant 50 can be delivered to a heat sink module 100 that is mounted directly on a surface to be cooled, such as a surface of a microprocessor 415 that is electrically connected to a motherboard 405, as shown in FIG. 27. In other examples, the heat sink module 100 can be mounted on a thermally conductive intermediary object, such as a thermally conductive base member 430, as shown in FIG. 26. The assembly of the heat sink module 100 and the thermally conductive base member 430 can then be mounted on a heat source, such as a microprocessor 415 electrically connected to a motherboard 405, as show in FIG. 28. A layer of thermal interface material (e.g. solder thermal interface material or polymer thermal interface material) can be applied between a top surface of the heat source (e.g. microprocessor) and a bottom surface of the thermally conductive base member 430. The thermally conductive base member 430 can be made of a material with a high thermal conductivity, such as copper, silver, gold, aluminum, or tungsten.

The thermally conductive member 430 can be placed in thermal communication with an electronic device, or other type of device, that has a surface 12 that generates heat and requires cooling, such as a microprocessor 415, microelectronic circuit chip in a supercomputer, or any other electronic circuit or device requiring cooling, such as diode laser packages.

Three-Phase Contact Line Length

FIG. 63 shows a top view of a heated surface 12 covered by coolant 50, where the coolant has regions of vapor coolant 56 and wetted regions of liquid coolant 57 in contact with the heated surface 12. The dark areas in FIG. 63 show the vapor coolant regions 56, and the light areas show the liquid coolant regions 57. A length of a three-phase contact line 58 is measured as a sum of all curves where liquid coolant 57, vapor coolant 56, and the solid heated surface 12 are in mutual contact on the heated surface 12. The three-phase contact line 58 length can be determined using suitable image processing techniques.

The heat transfer rate from the surface to be cooled 12 to the coolant 50 has been shown to strongly correlate with the length of the three-phase contact line 58 on the surface to be cooled 12. Consequently, increasing the length of the three-phase contact line 58 can be desirable when attempting to increase the heat transfer rate from the surface to be cooled. Increasing the heat transfer rate is desirable, since it increases the efficiency of the cooling apparatus 1 and allows higher heat flux surfaces to be cooled by the cooling apparatus.

By providing jet streams 16 of coolant that impinge the surface to be cooled 12 from a suitable jet height 18, the heat sink modules 100 described herein effectively increase the length of the three-phase contact line 58. Consequently, the heat sink modules 100 described herein provide much higher heat transfer rates than competing cooling systems. By selecting orifice 155 diameters, jet heights 18, coolant pressures, and orifice orientations from the ranges provided herein, the heat sink module 100 can provide jet streams 16 with sufficient momentum to disrupt vapor formation on the surface to be cooled 12, thereby increasing the length of the three-phase contact line 58 on the surface to be cooled 12 and thereby allowing higher heat fluxes to be effectively dissipated without reaching critical heat flux.

Redundant Cooling Apparatus

In some examples, it can be desirable to have a fully redundant cooling apparatus 2 where each heat-generating surface 12 is cooled by at least two completely independent cooling apparatuses 1. In the event of failure of a first independent cooling apparatus 1, a second independent cooling apparatus 1 can be configured to provide sufficient cooling capacity to adequately cool the heat-generating surface 12 and thereby avoid any downtime or reduction in performance when the heat-generating surface 12 is, for example, a microprocessor 415 or other critical system component. In a fully redundant cooling apparatus 2, the heat-generating component 12 can be adequately cooled by a first cooling apparatus 1 (and can continue to operate normally) while repairs are made on a failed component within a second cooling apparatus 1 of the redundant cooling apparatus 2.

FIG. 9 shows a front perspective view of a fully redundant cooling apparatus 2 installed on eight racks 410 of servers 400 in a data center 425. The redundant cooling apparatus 2 includes a first independent cooling apparatus 1 and a second independent cooling apparatus, each similar to the cooling apparatus 1 described with respect to FIGS. 1-3. FIG. 10 shows a rear view of the redundant cooling apparatus 2 of FIG. 9. In FIGS. 9 and 10, the redundant cooling apparatus 2 has a first pump 20, a first reservoir 200, a first set of inlet and outlet manifolds, and a first heat exchanger 40 associated with the first independent cooling apparatus 1. Likewise, the redundant cooling apparatus 2 has a second pump, a second reservoir, a second set of inlet and outlet manifolds, and a second heat exchanger 40 associated with the second independent cooling apparatus 1.

In some examples, the first and second cooling apparatuses 1 may not be fully independent and may share components that have a very low likelihood of failure, such as a common reservoir 200 and/or a common heat exchanger 40. FIGS. 69 and 70 shows schematics of redundant cooling apparatuses 2 that have a common reservoir 200. Such an arrangement may be useful where a redundant cooling apparatus 2 is desired but where safety regulations restrict the volume of coolant that can be used in a confined space. The configuration shown in FIGS. 69 and 70 may also reduce system cost by reducing the total number of components and by reducing the volume of coolant used.

FIG. 17 shows a schematic of a redundant cooling apparatus 2 having a redundant heat sink module 700 mounted on a heat source 12. The redundant heat sink module 700 is connected to two a first independent cooling apparatus 1 and a second independent cooling apparatus 1. The first independent cooling apparatus includes a primary cooling loop 300, a first bypass, and a second bypass 310. Similarly, the second independent cooling apparatus includes a primary cooling loop 300, a first bypass 305, and second bypass 310. As a result of this configuration, failure of a single component in the first independent cooling apparatus 1 will not disrupt operation of the second independent cooling apparatus 1. The redundant cooling apparatus 2 is configured to provide adequate cooling of the surface to be cooled 12 even if the first or second independent cooling apparatus 1 fails.

Although the redundant cooling apparatus 2 shown in FIG. 17 incorporates two cooling apparatuses 1 like the one presented in FIG. 11A, this is not limiting. Any of the non-redundant cooling apparatuses 1 presented in FIGS. 11A, 12A-12T, 13, 14A, and 16 can be used, in any combination, to provide a redundant cooling apparatus 2 to cool one or more heat generating surfaces 12.

In any of the schematics described herein or shown in the accompanying figures, each redundant heat sink module 700 can be a combination of two heat sink modules 100 of the type shown in FIG. 21, or a redundant heat sink module 700 with integrated independent coolant pathways, as shown in FIGS. 51A-51M. Therefore, the redundant heat sink module(s) 700 in FIGS. 17 and 18 can be exchanged for two heat sink modules 100 of the type shown in FIG. 21. In some examples, two non-redundant heat sink modules 100 can be mounted to a thermally conductive base member 430 to provide a redundant heat sink assembly, as shown in FIG. 52B.

FIG. 18 shows a schematic of a redundant cooling apparatus 2 that is more complex than the schematic shown in FIG. 17. The redundant cooling apparatus 2 in FIG. 18 includes a first independent cooling apparatus 1 and a second independent cooling apparatus 1. Each independent cooling apparatus 1 includes two parallel cooling lines where each parallel cooling line is fluidly connected to three redundant heat sink modules 700 arranged in a series configuration. As a result, the redundant cooling apparatus 2 shown in FIG. 17 is capable of redundantly cooling six surfaces to be cooled 12. The redundant cooling apparatus 2 is scalable, and additional parallel and series connected heat sink modules 700 can be added to cool additional surfaces 12.

FIG. 19 shows a top view of a redundant cooling apparatus 2 installed in a data center or computer room 425 having twenty racks 410 of servers 400. Each independent cooling apparatus 1 of the redundant cooling apparatus 2 can be fluidly connected to a heat exchanger 40 located inside of the room 425 where the servers are located. In some examples, the heat exchanger 40 can reject heat into the room 425, and a CRAC can be used to remove the rejected heat from the room.

FIG. 20 shows a top view of a redundant cooling apparatus 2 installed in a data center or computer room 425 having twenty racks 410 of servers 400. Each independent cooling apparatus 1 of the redundant cooling apparatus 2 can be fluidly connected to any suitable external heat exchanger 40 located outside of the room 425 where the servers are located. Each independent cooling apparatus 1 can be fluidly connected to the external heat exchanger 40 by an external heat rejection loop 43 that circulates an external cooling fluid, such as water or a water-glycol mixture. In some examples the heat exchanger 40 can be connected to a chilled water system of a building where the room 425 is located. In other examples, the heat exchanger 40 can be an air-to-liquid dry cooler or a liquid-to-liquid heat exchanger located outside of the room 425 (e.g. located outside of the building).

As noted above, FIGS. 69 and 70 shows schematics of redundant cooling apparatuses 2 having a first and second cooling apparatus where the first and second cooling apparatuses are not fully independent, since they share a common reservoir. In FIG. 69, the first and second cooling apparatuses 1 also share a common heat rejection loop 43. The heat rejection loop 43 is fluidly connected to the common reservoir 200 and includes a pump 20 and a heat exchanger 40. The pump 20 is configured to circulate a flow 51 of coolant from the reservoir 200 through the heat exchanger 40, where heat is removed from the flow of coolant, thereby reducing the temperature of the flow of coolant. The heat exchanger can be located outside of a room 425 where the redundant cooling apparatus 2 is installed so that heat rejected from the flow of coolant is not discharged back into the room 425. For instance, the heat exchanger 40 can be located on a rooftop of a building where the redundant cooling apparatus 2 is installed.

In FIG. 70, the first and second cooling apparatuses 1 share a common reservoir 200, but have separate heat rejection loops 43, also known as second bypasses 310. Each heat rejection loop 43 includes a pressure regulator 60 and a heat exchanger 40. In some examples, each pressure regulator 60 can be adjusted (manually or automatically) to allow about 30-60 or 45-55% of the flow 51 leaving each pump 20 to circulate through each heat rejection loop 43. This configuration can ensure that the coolant stored in the reservoir 200 remains sufficiently sub-cooled to allow for rapid condensing of any vapor delivered to the reservoir form a first or second return line 230 carrying bubbly flow. By rapidly condensing vapor within the reservoir 200 through direct interaction with a relatively large volume of sub-cooled liquid, the redundant cooling apparatus 2 prevents vapor from being delivered from the reservoir 200 outlets to either pump.

Redundant Heat Sink Module

FIG. 51A shows a top perspective view of a redundant heat sink module 700. The heat sink module 700 can be defined by a front side surface 175, a rear side surface 180, a left side surface 185, a right side surface 190, a top surface 160, and a bottom surface 135. FIG. 51B shows a top view of the redundant heat sink module of FIG. 51A, where a first independent coolant pathway 701 and the second independent coolant pathway 702 are represented by dashed lines. In the example shown in FIG. 51B, the first independent coolant pathway 701 passes through a first region near a middle of the redundant heat sink module 700, and the second independent coolant pathway 702 passes through a second region outside of the perimeter of the first region. The first and second independent coolant pathways (701, 702) can be completely independent, meaning that no amount (or no substantial amount) of coolant 51 is transferred from the first independent coolant pathway 701 to the second independent coolant pathway 702 or vice versa. The first independent coolant pathway can extend from a first inlet port 105-1 to a first outlet port 110-1 of the redundant heat sink module 700. Similarly, a second independent coolant pathway 702 can extend from a second inlet port 105-2 to a second outlet port 110-2 of the redundant heat sink module 700.

The first independent coolant pathway 701 can include a first inlet passage 165-1 extending from the first inlet port 105-1 to a first inlet chamber 145-1, as shown in FIG. 51F, which shows a cross-sectional view of FIG. 51 E taken along section A-A. The first inlet chamber 145-1 can have a tapered geometry to provide an even distribution of coolant to the plurality of orifices 155-1. For a redundant heat sink module 700 configured to cool a microprocessor 415, the first inlet chamber 145-1 can taper from a maximum height of about 0.040-0.120 in. to a minimum height of about 0.020-0.040 in. The first inlet chamber 145-1 can have a width of about 0.75-1.5 in. and a length of about 0.75-1.5 in. The volume of the first inlet chamber 145-1 can be about 0.01-0.02, 0.01-0.05, 0.04-0.08, 0.07-0.15, 0.1-0.2, 0.15-0.25, 0.2-0.4, 0.3-0.5 in$^3$, or preferably about 0.15 in$^3$. The first outlet chamber 150-1 can be slightly larger than the first inlet chamber 145-1 to accommodate expansion of a portion of the coolant 50 as it changes phase from liquid to vapor. For example, the first outlet chamber 15 can have a volume of about 0.02-0.05, 0.04-0.08, 0.07-0.15, 0.1-0.2, 0.15-0.25, 0.2-0.4, 0.3-0.5, 0.4-0.75 in$^3$, or preferably about 0.25 in$^3$. Although the first inlet and outlet chambers (145-1, 150-1) can be made larger, the dimensions provided above provide a high-performing, compact heat sink module 700.

As shown in the top view of the FIG. 51E, the second independent coolant pathway 702 is bifurcated and circumscribes the first independent coolant pathway 701. Consequently, the second inlet chamber 145-2 and the second outlet chamber 150-2 are also bifurcated, as shown in FIG. 51I. Despite having a different geometry than the first inlet chamber 145-1, the bifurcated second inlet chamber 145-2 can have about the same total volume as the first inlet chamber 145-1. For example, the volume of the first inlet chamber 145-1 can be about 0.01-0.02, 0.01-0.05, 0.04-0.08, 0.07-0.15, 0.1-0.2, 0.15-0.25, 0.2-0.4, 0.3-0.5 in$^3$, or preferably about 0.15 in$^3$. Likewise, despite having a different geometry than the first outlet chamber 150-1, the bifurcated second outlet chamber 150-2 can have about the same total volume as the first outlet chamber 150-1. For example, the volume of the second outlet chamber 150-2 can be about 0.02-0.05, 0.04-0.08, 0.07-0.15, 0.1-0.2, 0.15-0.25, 0.2-0.4, 0.3-0.5, 0.4-0.75 in$^3$, or preferably about 0.25 in$^3$.

As shown in FIG. 51F, a first plurality of orifices 155-1 can extend from the first inlet chamber 145-1 to a first outlet chamber 150-1 and can be configured to provide a plurality of jet streams 16 of coolant into the first outlet chamber 150-1 when pressurized coolant is provided to the first inlet chamber 145-1. A first outlet passage 166-1 can extend from the first outlet chamber 150-1 to the first outlet port 110-1, as shown in FIG. 51G, which is a cross-sectional view of FIG. 51E taken along section B-B.

A first plurality of anti-pooling orifices 156-1 can extend from the first inlet chamber 145-1 to a location proximate a rear wall of the first outlet chamber 150-1 and can be configured to provide a plurality of jet streams 16 of coolant proximate a rear wall of the first outlet chamber 150-1 when pressurized coolant is provided to the first inlet chamber 145-1. The anti-pooling jet streams 16 can be configured to impinge the surface to be cooled 12 at an angle near the rear wall and to prevent pooling of coolant near a rear wall of the first outlet chamber 150-1 by promoting directional flow away from the rear wall. By preventing pooling, the anti-pooling jet streams can prevent the onset of critical heat flux near the rear wall of the first outlet chamber 150-1, thereby increasing a maximum thermal load the heat sink module is capable of safely dissipating.

The second independent coolant pathway 702 can include a second inlet passage 165-2 extending from the second inlet port 105-2 to a second inlet chamber 145-2, as shown in FIG. 51G. A second plurality of orifices 155-2 can extend from the second inlet chamber 145-2 to a second outlet chamber 150-2 and can be configured to provide a plurality of jet streams 16 of coolant into the second outlet chamber 150-2 when pressurized coolant is provided to the second inlet chamber 145-2. A second outlet passage 166-2 can extend from the second outlet chamber 150-2 to the second outlet port 110-2, as shown in FIG. 51 F. A second plurality of anti-pooling orifices 156-2 can extend from the second inlet chamber 145-2 to a location proximate a rear wall of the second outlet chamber 150-2 and can be configured to provide a plurality of jet streams 16 of coolant proximate the rear wall of the second outlet chamber 150-2 when pressurized coolant is provided to the second inlet chamber 145-2.

FIG. 51D shows a bottom view of the redundant heat sink module 700 of FIG. 51A. The first independent coolant pathway 701 includes an array of orifices 155 arranged in a first region located near a middle portion of the module 700. The second independent coolant pathway 702 includes an array of orifices 155 arranged in a second region located beyond (e.g. outside of or circumscribing) the perimeter of the first region. In other examples, the first region can be located near a first half of the module 700 and the second region can be located near a second half of the module 700, as shown in the side-by-side coolant pathway example of FIG. 53.

The first outlet chamber 150-1 of the redundant heat sink module 700 can have an open portion that can be enclosed by a surface to be cooled 12 when the redundant heat sink module 700 is installed on the surface to be cooled 12. Similarly, the second outlet chamber 150-2 of the redundant heat sink module 700 can have an open portion that can be enclosed by a surface to be cooled 12 when the redundant heat sink module 700 is installed on the surface to be cooled 12.

To facilitate sealing against the surface to be cooled 12, the redundant heat sink module 700 can include a first sealing member 125-1 and a second sealing member 125-2, as shown in FIG. 51D. The first sealing member 125-1 (e.g. o-ring, gasket, sealant) can be disposed within a first channel 140-1 formed in a bottom surface 135 of the redundant heat sink module 700. The first channel 140-1 can circumscribe the first outlet chamber 150-1, and the first sealing member 125-1 can be compressed between the first channel 140-1 and the surface to be cooled 12 to provide a liquid-tight seal therebetween. The redundant heat sink module 700 can include a second sealing member 125-2, as shown in FIG. 51D. The second sealing member 125-2 (e.g. o-ring, gasket, sealant) can be disposed within a second channel 140-2 formed in the bottom surface 135 of the redundant heat sink module 700. The second channel 140-2 can circumscribe the second outlet chamber 150-2, and the second sealing member 125-2 can be compressed between the second channel 140-2 and the surface to be cooled 12 to provide a liquid-tight seal therebetween. In this example the first sealing member 125-1 can provide a liquid-tight seal between the first outlet chamber 150-1 and the second outlet chamber 150-2. The first sealing member 125-1 can bound an inner perimeter of the second outlet chamber 150-2, and the second sealing member 125-2 can bound an outer perimeter of the second outlet chamber 150-2.

FIG. 51I shows a cross-sectional view of the redundant heat sink module 700 taken along section C-C shown in FIG. 51H. FIG. 51I shows relative positioning of a first inlet chamber 145-1, a first outlet chamber 150-1, a bifurcated second inlet chamber 145-2, and a bifurcated second outlet chamber 150-2. A first dividing member 195-1 separates the first inlet chamber 145-1 from the first outlet chamber 150-1. The first plurality of orifices 155-1 extend from the first inlet chamber 145-1 to the first outlet chamber 150-1 and through the first dividing member 195-1. Similarly, the second inlet chamber 145-2 is separated from the second outlet chamber 150-2 by a second dividing member 195-2. The second plurality of orifices 155-2 extend from the second inlet chamber 145-2 to the second outlet chamber 150-2 and through the second dividing member 195-2. The thickness of the first and second dividing members (195-1, 195-2) can be selected to ensure that the orifices have sufficient L/D ratios and that the heat sink module 700 is structurally sound (i.e. capable of handling a flow 51 of pressurized coolant).

FIG. 51K shows a side cross-sectional view of the redundant heat sink module 700 of FIG. 51J taken along section D-D. The nonlinear sectional view exposes a substantial portion of the first independent coolant pathway 701, including the first inlet port 105-1, first inlet passage 165-1, first inlet chamber 145-1, the first plurality of orifices 155-1, the first anti-pooling orifice 156-1, the first outlet chamber 150-1, the first outlet passage 166-1, and the first outlet port 110-1. The apparent blockages between the first inlet passage 165-1 and the first inlet chamber 145-1 and between the first outlet chamber 150-1 and the first outlet passage 166-1 are simply artifacts of the location of section D-D. No such blockages exist in the first coolant pathway 701. The first coolant pathway 701 is designed to be free flowing such that only a small pressure drop (e.g. about 1.5 psi) is observed between the first inlet port 105-1 and the first outlet port 110-1 when pressurized coolant is delivered to the first coolant pathway 701.

As shown in FIG. 51K, the first inlet chamber 145-1 can have a tapered geometry that ensures substantially similar flow through each orifice 155. The first outlet chamber 150-1 can have an expanding geometry that allows for expansion of the coolant as a portion of the coolant changes phase from a liquid to a vapor as heat is transferred from the surface to be cooled 12 to the flow of coolant 50. The redundant heat sink module 700 can include a flow-guiding lip 162, as shown in FIG. 51K. The flow-guiding lip 162 can guide the directional flow 51 from the outlet chamber 150-1 to the outlet passage 166-1. Preferably, the flow-guiding lip can have an angle of less than about 45 degrees with respect to the surface to be cooled 12 to avoid creating a flow restriction or stagnation region proximate the exit of the outlet chamber 150-1.

FIG. 51M shows a side cross-section view of the redundant heat sink module 700 of FIG. 51L taken along section E-E. The nonlinear sectional view exposes a substantial portion of the second independent coolant pathway 702, including the second inlet port 105-2, second inlet passage 165-2, second inlet chamber 145-2, the second plurality of orifices 155-2, the second anti-pooling orifice 156-2, the second outlet chamber 150-2, the second outlet passage 166-2, and the second outlet port 110-2.

The apparent discontinuity between the second outlet chamber 150-2 on the left and the second outlet chamber 150-2 on the right is simply an artifact of the location of section E-E. No such discontinuity exists in the second coolant pathway 702. The second coolant pathway 702 is designed to be free flowing such that only a small pressure drop (e.g. about 1.5 psi) is observed between the second inlet port 105-2 and the second outlet port 110-2 when pressurized coolant is delivered to the second coolant pathway 702.

FIG. 51 N shows flow vectors associated with the first coolant pathway 701 and flow vectors associated with the second coolant pathway 702. To provide an even flow distribution across the inlets of the plurality of orifices 155-1 in the first inlet chamber 145-1, the first coolant pathway 701 can include a flow diverter 706, as shown in FIG. 51N. The flow diverter 706 can have a shape similar to an airfoil with a curved surface 706. As a result of fluid dynamics, the curved surface 706 causes incoming coolant to flow in close proximity to the curvature of the curved surface 706, similar to the way air flow follows the curvature of a wing. Without the flow diverter 706, the incoming flow would hug a left perimeter of the first coolant pathway 701 and potentially starve orifices 155 located near a center or right perimeter of the array of orifices.

FIG. 51O is a top view of the redundant heat sink module 700. The first coolant pathway 701 has a first inlet port 105-1 and a first outlet port 110-1, and the second coolant pathway 702 has a second inlet port 105-2 and a second outlet port 110-2. In some examples, coolant can enter the first inlet port 105-1 as liquid flow and exit the first outlet port 110-1 as two-phase bubbly flow. Likewise, coolant can enter the second inlet port 105-2 as liquid flow and exit the second outlet port 110-2 as two-phase bubbly flow.

When cooling a heated surface 12 that experiences rapid increases in heat flux, such as an electric motor of an electric vehicle, it can be desirable to configure the redundant cooling apparatus 2 to manage transient heat loads without experiencing critical heat flux. In one example, the redundant heat sink module 700 can be operated as shown in FIG. 51Q. In this example, during normal operation, when the heated surface is producing a moderate heat flux, a first coolant pathway 701 can be operated so that two-phase bubbly flow is formed therein, and a second coolant pathway 702 can be operated so that little or no vapor is formed therein. If the heat load increases rapidly, it will cause phase change within the second coolant pathway 702, which will provide additional cooling capacity for the increased heat load. Achieving parallel flows of bubbly flow and liquid flow can be achieved in several possible ways. Where both coolant pathways are transporting the same type of coolant (e.g. HFE-7000), the flow rate of coolant 50 in the second cooling pathway 702 can be increased until no vapor forms therein. Due to its higher flow rate, the second cooling pathway 702 will have greater cooling capacity than the first coolant pathway 701, and will be able to safely manage rapid increases in heat flux and thereby avoid onset of critical heat flux. In this example, the pressure of the flow 51 of coolant in the second coolant pathway 702 can be set higher than the pressure of the flow of coolant in the first coolant pathway 701 to provide a higher saturation temperature in the second coolant pathway 702 than in the first coolant pathway 701. In another example, the first coolant pathway 701 can transport a first coolant having a first boiling point, and the second coolant pathway 702 can transport a second coolant having a second boiling point, where the second boiling point is higher than the first boiling point. In one specific example, the first coolant can be HFE-7000 with a boiling point of 34 degrees C. at one atmosphere, and the second coolant can be HFE-7100 with a boiling point of 61 degrees C. at one atmosphere. The flow rate and/or pressure of the second coolant can be increased to provide excess cooling capacity in the second coolant pathway to safely manage rapid increases in heat flux and thereby avoid onset of critical heat flux.

FIG. 51P shows a top view of the redundant heat sink module similar to FIG. 51Q, except that the first coolant pathway 701 is transporting a flow of liquid coolant, and the second coolant pathway 702 is transporting two-phase bubbly flow. For heat sources that have non-uniform heat distributions, such as multi-core processors, it can be desirable to select a configuration where the coolant pathway with excess cooling capacity (i.e. the coolant pathway that is transporting a flow of liquid coolant) is situated over the portion of the heat source that is likely to experience a rapid increase in heat flux.

Dimensions, volumes, and/or ratios associated with orifices (155, 156), chambers (145, 150), ports (105, 110), passages (165, 166), jet heights 18, boiling inducing members 196, and dividing members 195 described herein with respect to the non-redundant heat sink modules 100 also apply to corresponding features of the redundant heat sink modules 700. Coolant pressures and flow rates described herein with respect to non-redundant heat sink modules 100 also apply to each independent coolant pathway (701, 702) in the redundant heat sink modules 700.

Portable Servicing Unit

A portable servicing unit can be provided to aid in draining the cooling apparatus 1, for example, when servicing or repairing the cooling apparatus. The portable servicing unit can include a vacuum pump. The portable servicing unit can include a hose, such as a flexible hose, having a first end a second end. A first end of the hose can be configured to fluidly connect to an inlet of the vacuum pump of the portable servicing unit. A second end of the hose can be configured to fluidly connect to a connection point (e.g. a drain 245) of the cooling apparatus 1 through, for example, a threaded fitting or a quick-connect fitting. The portable machine can include a portable reservoir fluidly connected to an outlet of the vacuum pump. When connected to the cooling apparatus 1 and activated, the vacuum pump of the portable servicing unit can apply vacuum pressure to the cooling apparatus 1 by way of the hose, which results in coolant flowing from the cooling apparatus, through the hose and vacuum pump, and into the portable reservoir.

When servicing is complete, fluid from the portable reservoir can be pumped back into the cooling system or transported to an appropriate disposal or recycling facility. In some examples, the portable servicing unit can include one or more thermoelectric heaters. The thermoelectric heaters can be placed in thermal communication with components of the cooling apparatus 1, and by transferring heat to coolant within the apparatus, the thermoelectric heaters can promote evacuation of fluid from the apparatus through a drain 245 or other access point in the apparatus.

3D Printing

One or more components of the cooling apparatus 1 can be manufactured by a three-dimensional printing process. The heat sink module 100, redundant heat sink module 700, or portions of either heat sink module, such as an insertable orifice plate 198 or module body 104, can be manufactured by a three-dimensional printing process. One example of a suitable 3D printer is a Form 1+ SLA 3D Printer from Formlabs Inc. of Somerville, Mass.

In some examples, a three-dimensional manufacturing process can be used to create tubing 225 used to fluidly connect a first heat sink module 100 to a second heat sink module, such as the section of tubing shown in FIG. 73. In some examples, a three-dimensional printing process can be used to form a combined heat sink module 100 and section of tubing 225 to eliminate connectors 120 and potential leak points. In some examples, a three-dimensional printing process can be used to form two heat sink modules 100 fluidly connected by a section of tubing 225, similar to the configuration shown in FIG. 73. This approach can eliminate potential leak points that would typically exist, for example, at threaded connections where fittings attach a section of tubing 225 to an inlet or outlet port (105, 110) of the heat sink modules. This approach can also reduce installation time and avoid installation errors.

In some examples, components of the cooling apparatus 1 can be formed by a stereolithography process that involves forming layers of material curable in response to synergistic stimulation adjacent to previously formed layers of material and successively curing the layers of material by exposing the layers of material to a pattern of synergistic stimulation corresponding to successive cross-sections of the heat sink module. The material curable in response to synergistic stimulation can be a liquid photopolymer.

Coolant Temperature, Pressure, and Flow Rate

In some examples, it can be desirable to maintain coolant surrounding a surface to be cooled 12 at a pressure that results in the saturation temperature of the coolant being slightly above the temperature of jet streams of coolant being projected at the surface to be cooled 12. As used herein, "maintain" can mean holding at a relatively constant value over a period of time. "Coolant surrounding a surface" refers to a steady state volume of coolant immediately surrounding and in contact with the surface to be cooled 12, excluding jet streams 16 of coolant projected directly at the surface to be cooled 12. "Saturation temperature" is used herein as is it is commonly used in the art. The saturation temperature is the temperature for a given pressure at which a liquid is in equilibrium with its vapor phase. If the pressure in a system remains constant (i.e. isobaric), a liquid at saturation temperature evaporates into its vapor phase as additional thermal energy (i.e. heat) is applied. Similarly, if the pressure in a system remains constant, a vapor at saturation temperature condenses into its liquid phase as thermal energy is removed. The saturation temperature can be increased by increasing the pressure in the system. Conversely, the saturation temperature can be decreased by decreasing the pressure in the system. In specific versions of the invention, a saturation temperature "slightly above" the temperature of jet streams 16 of coolant projected at the surface to be cooled 12 refers to a saturation temperature of about 0.5° C., about 1° C., about 3° C., about 5° C., about 7° C., about 10° C., about 15° C., about 20° C., or about 30° C. above the temperature of coolant 50 projected against the surface. Establishing a saturation temperature of coolant 50 surrounding a surface 12 slightly above the temperature of the jet stream 16 of coolant projected at the surface provides for at least a portion of the coolant projected at the surface to heat and evaporate after contacting the surface, thereby greatly increasing the heat transfer rate and efficiency of the cooling apparatus 1.

The appropriate pressure at which to maintain the coolant to achieve the preferred saturation temperatures can be determined theoretically by rearranging the following Clausius-Clapeyron equation to solve for $P_O$:

$$T_B = \left( \frac{R \ln(P_0)}{\Delta H_{mp}} + \frac{1}{T_0} \right)^{-1}$$

where:
$T_B$=normal boiling point, K
R=ideal gas constant, 8.3145 J·K$^{-1}$ mol$^{-1}$
$P_O$=vapor pressure at a given temperature, atm
$\Delta H_{vap}$=heat of vaporization of the coolant, J/mol
$T_O$=given temperature, K
Ln=that natural logarithm to the base e.

In the above equation, the given temperature ($T_O$) is the temperature of coolant 50 in contact with, and heated by, the surface to be cooled 12. The normal boiling point ($T_B$) is the boiling point of the coolant at a pressure of one (1) atmosphere. The heat of vaporization ($\Delta H_{vap}$) is the amount of energy required to convert or vaporize a given quantity of a saturated liquid (i.e., a liquid at its boiling point) into a vapor. As an alternative to determining the appropriate pressure theoretically, the appropriate pressure can be determined empirically by adjusting the pressure and detecting evaporation or bubble generation at a surface to be cooled 12, as shown in FIG. 30. Bubble generation can be visually detected with a human eye when transparent components, such as a transparent heat sink module 100 or transparent flexible tubing 225, is used to construct the cooling apparatus 1. In some examples, the heat sink module 100 or the flexible tubing 225 can be transparent throughout, and in other examples, at least a portion of the heat sink module 100 or flexible tubing 225 can be transparent to provide a transparent window portion that permits a system operator or electronic eye to visually detect the presence of bubbles 275 within the coolant 50 flow and to make system adjustments based on that visual detection. For instance, if no bubbles 275 are visually detected exiting the outlet chamber 150 of the heat sink module 100, the coolant flow rate can be reduced by reducing the pump 20 speed, thereby reducing energy consumed by the pump 20 and reducing overall energy consumption and operating cost. Conversely, if slug or churn flow is detected (see, e.g. FIGS. 58 and 59B), the coolant flow rate 51 can be increased to eliminate the presence of those unwanted flow regimes and restore the system to two-phase bubbly flow.

During operation of the cooling apparatus 1, coolant 50 can be flowed into an outlet chamber 150 of the heat sink module 100. The surface to be cooled 12 can be exposed within the outlet chamber 150 or, as shown in FIG. 30, the surface to be cooled 12 can serve as a bounding surface of the outlet chamber 150 when the heat sink module 100 is installed on the surface to be cooled 12. The coolant 50 can be introduced to the outlet chamber 150 at a predetermined pressure that promotes a phase change upon the liquid coolant 50 contacting, and being heated by, the surface to be cooled 12. One example of such a cooling apparatus 1 for performing various cooling methods described herein is shown in FIG. 11A. The cooling apparatus 1 can include a heat sink module 100, as shown in FIGS. 26 and 30. The heat sink module 100 can include an outlet chamber 150 with a surface 12 to be cooled exposed within the outlet chamber 150. The pump 20, as shown in FIG. 11A, can provide coolant 50 at a predetermined pressure to an inlet 21 of the heat sink module 100.

The cooling apparatus 1 as described above and as shown in FIG. 11A can include several steady-state zones comprising either liquid flow or two-phase bubbly flow. The nature of the coolant 50 in each zone can depend on the temperature and pressure of the coolant in each zone. In the example in FIG. 11A, a zone comprising high-temperature coolant 52 includes the coolant 50 surrounding the surface to be cooled 12 within the outlet chamber 150 (excluding the jet streams 16 of coolant 50 projected into the outlet chamber 150 through the orifices 155 of the heat sink module 100) of the heat sink module 100 and extends downstream to the heat exchanger 40 (see FIG. 11A for direction of flow 51). Portions of the high-temperature coolant 52 within the outlet chamber 150 are preferably at a temperature approximately equal to or above the saturation temperature. A zone of low-temperature coolant 53 extends from downstream of the reservoir 200 to at least the inlet port 105 of the first heat sink module 100 and includes the jet streams 16 of coolant 50 injected into the outlet chamber 150 of the first heat sink module 100. The low-temperature coolant 53 is preferably at a temperature slightly below the saturation temperature of the coolant 50 surrounding the surface 12, wherein "slightly below" can include 0.5-1, 0.5-3, 1-3, 1-5, 3-7, 5-10, 7-10, 7-15, 10-15, 15-20, 15-30, about 0.5, about 1, about 3, about 5, about 7, about 10, about 15, about 20, or about 30° C. or more below the saturation temperature of coolant 50 surrounding the surface to be cooled 12. Heat transfer from the surface to be cooled 12 to the coolant 50 with the outlet chamber 150 of the heat sink module 100 serves to transition the low-temperature coolant 53 to high-temperature coolant 52. In some examples, the surface to be cooled 12 heats a portion of the coolant 50 contacting the surface 12 to its saturation temperature, thereby promoting evaporation and formation of two-phase bubbly flow, which exits the heat sink module through the outlet port 110.

A zone of low-pressure coolant 55 includes the coolant 50 surrounding the surface to be cooled 12 within the outlet chamber 150 (which excludes the jet streams 16 of coolant 50 projecting into the outlet chamber 150 through the orifices 155 of the heat sink module) and extends downstream to an inlet 21 of the pump 20. The low-pressure coolant 55 is preferably at a pressure that promotes evaporation of coolant 50 when heated at the surface 12. Therefore, the pressure of the low-pressure coolant 55 preferably determines a saturation temperature to be about equal to the temperature of the high-temperature coolant 52. A zone of high-pressure coolant 54 includes a portion downstream of the pump outlet 22 and extends to at least the inlet port 105 of the first heat sink module 100. The high-pressure coolant 54 is preferably at a pressure suitable for generating jet streams 16 of coolant that are capable of penetrating liquid present in the outlet chamber 150 and impinging the surface to be cooled 12. In some examples, the pump 20 can provide high-pressure coolant 54 at a pressure of about 1-20, 10-30, 25-50, 40-60, or 50-75, 60-80, or 75-100 psi. In other examples, the pump 20 can provide high-pressure coolant 54 at a pressure of about 85-120, 100-140, 130-160, 150-175, 160-185, 175-200, or greater than 200 psi.

The pump 20 serves to transition low-pressure coolant 55 to high-pressure coolant 54 as the coolant passes from the pump inlet 21 to the pump outlet 22. In some examples, the pump 20 can provide high-pressure coolant 54 at a pressure that is about 10-20, 15-30, 20-40, 30-45, or 40-60 psi or greater above the pressure of the low-pressure coolant 55. The high-pressure coolant 54 in the cooling apparatus 1 applies a positive pressure against the plurality of orifices 155 in the heat sink module 100, and the plurality of orifices 155 serve to transition the high-pressure coolant 54 to low-pressure coolant 55, as the coolant 50 equilibrates to the pressure of the low-pressure coolant 55 after passing through the plurality of orifices as jet streams 16 and mixing with the coolant in the outlet chamber 150 of the heat sink module 100.

With the apparatus 1 described above, a flow rate is set by the pump 20 to handle the expected heat load produced by the surface to be cooled 12. A specific pressure for the low-pressure coolant 55 is set and maintained by one or more pumps 20 and by one or more pressure regulators 60, as shown in the various schematics presented in FIGS. 11A-14, 16-18, and 68-72 to establish a saturation temperature for the coolant 50 surrounding the surface to be cooled 12 to be slightly above the saturation temperature of the low-temperature coolant 53. Relatively high-pressure 54 low-temperature 53 coolant 50 is projected as jet streams 16 from the plurality of orifices 155 against the surface to be cooled 12, whereby the coolant 50 undergoes a pressure drop upon equilibrating with fluid present in the outlet chamber 150 and a portion of the fluid may heat to its saturation temperature upon contacting the surface 12 and absorbing heat from the surface. A portion of the heated coolant 50 undergoes a phase transition at the surface to be cooled 12, which causes highly efficient cooling of the surface 12. Downstream of the heat sink module 100, the relatively low-pressure 55, high-temperature 52 coolant flow is then mixed with low-pressure 55, low-temperature 54 coolant from the second bypass 310 to promote condensing of vapor bubbles 275 within the low-pressure 55, high temperature 52 coolant by cooling it below its saturation temperature, which produces a flow of low-pressure 55, low-temperature 53 coolant in the return line 230 that returns the coolant 50 to the reservoir 200. Upon being drawn form the lower portion of the reservoir 200 to the pump inlet 21, the low-pressure 55, low-temperature 53 coolant is then transitioned to high-pressure 54, low-temperature 53 coolant as it passes through the pump 20. The high-pressure 54, low-temperature 53 coolant is then circulated back to the inlet port 105 of the first heat sink module 100 and the above-described process is repeated.

Cooling System Preparation and Operation

In some applications, it can be desirable to fill the cooling apparatus 1 with a dielectric coolant 50 that is at a pressure below atmospheric pressure (e.g. less than about 14.7 psi). For example, when cooling microprocessors 415, it can be desirable fill the cooling apparatus 1 with HFE-7000 (or a coolant mixture containing HFE-7000 and, for example, R-245fa) that is at a pressure below atmospheric pressure to reduce the boiling point of the dielectric fluid. To accomplish this, the portable servicing unit (or other vacuum source) can be used to apply a vacuum to the cooling apparatus 1 to purge the contents of the cooling apparatus. Upon reducing the pressure within the cooling apparatus 1 to about 0-3, 0-5, 1-5, 4-8, 5-10, or 8-14.5 psi, the dielectric coolant 50 can be added to the cooling apparatus 1. In some examples, operation of the pump 20 may only increase the pressure of the dielectric coolant about 1-15, 5-20, or 10-25 psi above the baseline sub-atmospheric pressure. Consequently, the operating pressure of the high pressure coolant 54 within the cooling apparatus 1 may be about equal to atmospheric pressure (e.g. about 8-14, 10-16, 12-18, or 14-20 psi), thereby ensuring that that saturation temperature of the dielectric coolant remains low enough to ensure that boiling can be achieved when jet streams 16 of coolant impinge the surface to be cooled 12 associated with a microprocessor 415. Providing high-pressure coolant 54 at a pressure near atmospheric pressure has other added benefits. First, low pressure tubing 225 can be used, which is lightweight, flexible, and low cost. Second, because of the minimal pressure difference between the high-pressure coolant 54 and the surrounding atmosphere, fluid leakage from fittings and other joints of the cooling apparatus 1 may be less likely.

Temperature Conditioning of Coolant

The cooling apparatus 1 can include any suitable heat exchanger 40 configured to promote heat rejection from the flow 51 of coolant to effectively sub-cool the coolant. By enabling heat rejection from the coolant 50, the heat exchanger 40 can ensure the reservoir 200 maintains a volume of subcooled liquid that can be safely supplied to the pump 20 without risk of vapor lock or instability. Any heat exchanger 40 capable of reducing the temperature of the coolant 50 below its saturation temperature is acceptable. The heat exchanger 40 can be any suitable air-to-liquid heat exchanger or liquid-to-liquid heat exchanger. Non-limiting types of suitable heat exchangers include shell-and-tube, fin-and-tube, micro-channel, plate, adiabatic-wheel, plate-fin, pillow-plate, fluid, dynamic-scraped-surface, phase-change, direct contact, and spiral type heat exchangers. The heat exchanger 40 can operate using parallel flow, counter flow, or a combination thereof. In one example, a liquid-to-liquid heat exchanger 40 can be a Standard Xchange Brazepak brazed plate heat exchanger from Xylem, Inc. of Rye Brook, N.Y.

A first liquid-to-liquid heat exchanger 40 can be connected to an external heat rejection loop 43, as shown in FIG. 77. The external heat rejection loop 43 can carry a flow of external cooling fluid 42, such as water or a water-glycol mixture. A second pump 20 can circulate the flow of external cooling fluid 42 through the heat rejection loop 43. As the flow of external cooling fluid 42 is circulated through the first liquid-to-liquid heat exchanger 40, heat can be transferred from the flow 51 of dielectric coolant 50 to the flow of external cooling fluid 42, thereby subcooling the flow 51 of dielectric coolant 50 in the first bypass 305 and heating the flow of external cooling fluid 42. The heated external cooling fluid 42 is then circulated through a second liquid-to-liquid heat exchanger 40 located outside of the room 425 where the cooling apparatus 1 is installed. The second liquid-to-liquid heat exchanger 40 can be connected to a flow of chilled water 46, such as a chilled water supply from a building. As the heated external cooling fluid 42 circulates through the second liquid-to-liquid heat exchanger 40, heat is transferred from the flow of external cooling fluid 42 to the flow of chilled water, thereby completing heat rejection from the cooling apparatus 1 to the flow of chilled water by way of the heat rejection loop 43.

A cooling apparatus 1 as shown in FIG. 77 can use HFE-7000 as a coolant 50, a water-glycol mixture as an external cooling fluid 42, and a flow of chilled water 46 from a building supply line as a third heat exchange medium in the second liquid-to-liquid heat exchanger 40. In one example, during operation, the subcooled liquid coolant 50 can be about 25-30 degrees C. and about 10-20 psia at an inlet of the first liquid-to-liquid heat exchanger 40 and about 20-25 degrees C. at an outlet of the first liquid-to-liquid heat exchanger. The liquid in the reservoir 200, which can be a subcooled liquid with an average temperature of about 25-30 degrees C. The flow of external cooling fluid 42 can be about 10-15 degrees C. at an inlet of the first liquid-to-liquid heat exchanger and about 15-20 degrees C. at an outlet of the first liquid-to-liquid heat exchanger. The flow of chilled water 46 can be about 4-7 degrees C. at an inlet of the second liquid-to-liquid heat exchanger 40 and about 9-12 degrees C. at an outlet of the second liquid-to-liquid heat exchanger. The flow of external cooling fluid 42 can be about 15-20 degrees at an inlet of the second liquid-to-liquid heat exchanger and about 10-15 degrees at an outlet of the second liquid-to-liquid heat exchanger. These values are provided as an example of one suitable operating condition and are non-limiting. The temperatures can vary as flow rates, pressures, and heat loads change or when different coolants 50, external cooling fluids 42, heat rejection loop 43 configurations, or system configuration are used.

In another example, a liquid-to-liquid heat exchanger 40 can be connected to an external heat rejection loop 43, as shown in FIG. 75. The external heat rejection loop 43 can carry a flow of external cooling fluid 42, such as water or a water-glycol mixture. A second pump 20 can circulate the flow of external cooling fluid 42 through the heat rejection loop 43. As the flow of external cooling fluid 42 is circulated through the first liquid-to-liquid heat exchanger 40, heat can be transferred from the flow 51 of dielectric coolant 50 to the flow of external cooling fluid 42, thereby subcooling the flow 51 of dielectric coolant 50 in the first bypass 305 and heating the flow of external cooling fluid 42. The heated external cooling fluid 42 is then circulated through an air-to-liquid heat exchanger 40 located outside of the room 425 where the cooling apparatus 1 is installed. The air-to-liquid heat exchanger 40 can be a radiator or a dry cooler having one or more fans 26 configured to provide airflow across a structure of the heat exchanger. As the heated external cooling fluid 42 circulates through the air-to-liquid heat exchanger 40, heat is transferred from the flow of external cooling fluid 42 to the flow of air, thereby completing heat rejection from the cooling apparatus 1 to the air by way of the heat rejection loop 43.

In some examples, the heat exchanger 40 can be a liquid-to-liquid heat exchanger 40 that is directly connected to a flow of external cooling fluid 42, such as chilled water from a building supply line, as shown in FIG. 76. This configuration can allow heat rejected from the cooling apparatus 1 to be removed from the room 425 where the cooling apparatus 1 is installed and transferred directly to a flow of chilled water 46 instead of being rejected into the room air or through an intermediate heat rejection loop 43, as shown in FIG. 77. In this example, care should be taken to regulate the flow rate of chilled water through the heat exchanger 40 to avoid cooling the dielectric coolant 50 to a temperature at or below its dew point.

In any of the cooling apparatuses 1 described herein, the flow rate of coolant 50 through the heat exchanger 40 can be monitored and controlled to avoid reducing the temperature of the low-temperature 53 coolant to or below the dew point of ambient air in the room 425 where the surface to be cooled 12 is located. Reaching or dropping below the dew point of the ambient air is undesirable, since it can cause condensation to form on an outer surface of the flexible tubing 225 or other components of the cooling apparatus 1. If this occurs, water droplets can form on and fall from the outer surface of the tubing 225 onto sensitive electrical components within the server 400, such as the microprocessor 415 or memory modules 420, which is undesirable. Consequently, the low-temperature 53 coolant should be maintained at a temperature above the dew point of ambient air in the room 425 to ensure that condensation will not form on any components of the cooling apparatus 1 that are in close proximity to sensitive electrical devices being cooled.

In some examples, if the low-temperature 53 coolant is cooled below the dew point of ambient air in the room by the heat exchanger 40, a preheater can be provided in line with, or upstream of, the line (e.g. flexible tubing 225) that transports coolant 50 flow into the server 400 housing and into the heat sink module 100. The preheater can be used to heat the flow of coolant 51 to bring the coolant temperature above its dew point temperature, thereby avoiding potential complications caused by condensation forming on the lines within the server housing. In some examples, the preheater can be configured to operate only when needed, such as when the temperature of the low-temperature coolant drops below its dew point.

The temperature of the low-temperature coolant 52 can be monitored with one or more temperature sensors positioned in the cooling lines, and data from the sensors can be input to the controller. For instance, a first temperature sensor can be positioned upstream of the preheater, and a second temperature sensor can be positioned downstream of the preheater. When the first temperature sensor detects a coolant temperature that is below the dew point of ambient air in the room 425, the controller can be configured to activate the preheater to heat the low-temperature coolant 52 to bring the temperature of the low-temperature coolant above the dew point of the ambient air in the room 425. In some examples, the rate of heat addition can be ramped up gradually, and once the temperature detected by the second temperature sensor is above the dew point of the ambient air, the controller can be configured to stop ramping the rate of heat addition and instead hold the heat addition constant. The controller can continue instructing the preheater to heat the low-temperature coolant 52 until preheating is no longer needed. For instance, the controller can continue instructing the preheater to heat the low-temperature coolant 52 until the temperature detected by the first temperature sensor is above the dew point of the ambient air.

Although the preheating process described above includes measuring the temperature of the low-temperature coolant 52 directly, in other examples the surface temperature of the outer surface of the tubing (e.g. 225) can be measured instead of measuring the coolant temperature directly. For instance, temperature sensors can be affixed directly to the outer surface of the tubing (e.g. 225) upstream and downstream of the preheater. In some instances, this approach can permit faster installation of the temperature sensors and can reduce the number of potential leak points in the cooling apparatus 1. In other examples, a contactless temperature-sensing device, such as an infrared temperature sensor, can be used to detect the temperature of the coolant or the temperature of the tubing 225 transporting the coolant.

To ensure the temperature of the low temperature coolant 52 remains above the dew point temperature of the ambient air, the flow rate through the heat exchanger 40 can be decreased and/or the fan speed of a fan 26 mounted on the heat exchanger 40 can be reduced to lower the heat rejection rate from the heat exchanger 40 if a low temperature threshold is detected in the low-temperature coolant. This step can be taken instead of, or in conjunction with, using the preheater to avoid dew formation on any components of the cooling apparatus 1.

In some examples, the heat exchanger 40 can be upstream of the pressure regulator 60 in the first bypass 305 (see, e.g. FIG. 12A) and in other examples, the heat exchanger 40 can be downstream of the pressure regulator 60 in the first bypass 305 (see, e.g. FIG. 11A). "Downstream" and "upstream" are used herein in relation to the direction of flow 51 of coolant 50 within the cooling apparatus 1. In other examples, the heat exchanger 40 can be located in the second bypass 310 or in the primary cooling loop 300.

The cooling apparatuses (1, 2) shown in FIGS. 11A-11D, 12A-12Q, 12S, 13, 14A, 16-18, and 68-72 may show heat exchangers 40 that appear to be stand-alone heat exchangers. However, in each of these examples, the heat exchanger 40 can be connected to an external heat rejection loop 43 that circulates a flow of external cooling fluid 42, such as water or a water-glycol mixture. The external heat rejection loop 43 can be fluidly connected to the heat exchanger 40 of the cooling apparatus (1, 2) and can be configured to transfer heat from the dielectric coolant 50 and reject that heat to air or a fluid outside the room 425 where the cooling system 1 is installed. This allows the cooling apparatus 1 to avoid rejecting the heat into the room where the cooling apparatus is installed, which would increase the temperature of the room air and place a higher load on the room air conditioner. In each example, the external heat rejection loop 43 can be any suitable heat rejection loop 43, such as the heat rejection loops shown in FIGS. 12R and 75-77. The external heat rejection loop 43 can include any suitable external heat exchanger 40, such as a liquid-to-liquid heat exchanger 40 as shown in FIG. 77 or an air-to-liquid heat exchanger 40 as shown in FIG. 75. Alternately, the heat rejection loop 43 may not include an external heat exchanger, such as in FIG. 76, where a supply of chilled water from a building is connected directly to the heat exchanger 40 of the cooling apparatus 1.

Cooling Apparatus with Rooftop Dry Cooler

FIG. 12P shows a schematic of a cooling apparatus 1 having a primary cooling loop 300, a first bypass 305, and a second bypass 310, where the first bypass 305 is connected to a heat exchanger 40 that can be a rooftop dry cooler. The cooling apparatus 1 can include an electronic control system 850 having a microcontroller that receives inputs from sensors regarding flow rate, pressure, and temperature and determines heat removed (W), rate of heat removed (kW-h over time), and pump 20 power consumption. The cooling apparatus 1 can include two pumps 20 arranged in a parallel configuration for redundancy. Shut-off valves 250 can be provided near each pump inlet 21 and outlet 22, thereby allowing for hot-swapping of a failed pump 20. The shut-off valves 250 can be electronically controlled by the electronic control system 850 or manually controlled, depending on the complexity of the cooling apparatus 1. Where the shut-off valves 250 are electronically controlled, a motor fail-safe 855 (see, e.g. FIG. 12P) can be provided to monitor the status of the pumps 20, and in case of pump failure, can deactivate the failed pump and activate the non-failed pump to ensure continued flow of coolant through the primary cooling loop 300 to the surface to be cooled 12. In some examples, the cooling apparatus 1 can include a strainer 260 downstream of the pumps 20 and a filter 260 upstream of the pumps 20. In some examples, the pressure regulator 60 located between the heat exchanger 40 and the reservoir 200 can be a back-pressure valve, such as a liquid relief valve manufactured by Kunkle Valve and available from Pentair, Ltd. of Minneapolis, Minn. In some examples, the pressure regulator 60 positioned in the first bypass 305 can be a back pressure valve, such as a liquid relief valve manufactured by Cash Valve, also available from Pentair, Ltd.

Electronic Control System

The cooling apparatus 1 can include an electronic control system 850, as shown in FIG. 12Q, to enhance performance and reduce power consumption of the cooling apparatus 1. In some examples, the electronic control system 850 can include a microcontroller. The microcontroller can be electrically connected to one or more system components, such as a heat exchanger fan 26, a pressure regulator 60, a shut-off valve, or a pump 20, and can be configured to dynamically adjust settings of the one or more components within the cooling apparatus 1 during operation of the cooing apparatus to enhance performance and/or reduce overall power consumption. In one example, the microcontroller can be electrically connected to a variable speed drive for the pump 20, as described in U.S. Patent Publication No. 2006/0196627 to Shedd et al., which is hereby incorporated by reference in its entirety. The microcontroller and the variable speed drive can allow the pump 20 to operate at a lower power when the thermal load decreases. For instance, the operating pressure at the pump outlet 22 can be decreased when the thermal load falls, thereby decreasing the flow rate through the cooling apparatus 1 and the heat sink modules 100 fluidly connected thereto. The ability to operate the variable speed drive at a lower power conserves energy, and is therefore desirable. Where the cooling apparatus 1 includes independent redundant cooling loops, the electronic control system 850 can be configured to operate a first cooling loop while a second cooling loop is on standby. In some examples, the electronic control system 850 can be configured to activate the second cooling loop only if the first cooling loop experiences a malfunction or is otherwise unable to effectively cool the surface to be cooled 12. In this way, the redundant cooling apparatus 1 can reduce power consumption by about 50% compared to a redundant cooling apparatus where both cooling loops operate continuously.

When a redundant cooling apparatus is provided, the apparatus may run for long periods of time (e.g. years) without experiencing any malfunctions or component failures. Consequently, during these long periods of time, only one cooling loop will be needed and the other cooling loop will remain on standby. To ensure that each cooling loop remains functional and ready to operate when needed, the electronic control system 850 can alternate between operating the first cooling loop and the second cooling loop when only one cooling loop is needed. For instance, the control system can be configured to activate the first cooling loop for a certain period of time (e.g. a number of hours or days) while the second cooling loop remains on standby. Once the certain period of time has passed, the electronic control system 850 can then activate the second cooling loop, and once the second cooling loop is operating as desired, can place the first cooling loop on standby. Cycling between operating the first cooling loop and operating the second cooling loop can extend the life of certain system components within each loop (e.g. pump seals) and can increase the likelihood that the standby loop is ready for operation if the other cooling loop experiences a malfunction. Cycling between the first and second cooling loops can also ensure that operating time is equally distributed between the two cooling loops, thereby potentially increasing the overall useful life of the redundant cooling apparatus 1.

The cooling apparatus 1 can include one or more sensors that deliver data to the electronic control system 850 to allow a malfunction within the cooling apparatus 1 to be detected and communicated to an operator. The cooling apparatus can include one or more temperature sensors, pressure sensors, visual flow sensors, flow quality sensors, vibration sensors, smoke detectors, flow rate sensors, fluorocarbon detectors, or leak detectors that deliver data to the electronic control system 850. Each sensor can be electrically connected or wirelessly connected to the electronic control system 850. Upon detection of a malfunction within the cooling apparatus 1, the electronic control system 850 can be configured to notify a system operator, for example, with a visual or audible alarm. The electronic control system 850 can be configured to send an electronic message (e.g. an email or text message) to a system operator to alert the operator of the malfunction. The electronic message can include specific details associated with the malfunction, including data recorded from the one or more sensors connected to the electronic control system 850. The electronic message can also include a part number associated with the component that has likely failed to permit the operator to immediately determine if the part exists in local inventory, and if not, to order a replacement part from a vendor as soon as possible. The electronic message, and any data relating to the malfunction, can be stored in a computer readable medium and/or transmitted to the system manufacturer for quality control, warranty, and/or recall purposes.

Portable Cooling Device

FIG. 74 shows a portable cooling device 750 that includes a plurality of heat sink modules 100 mounted on a portable layer 755. In some examples, the portable layer 755 can be a rigid material, such as metal, carbon fiber composite, or plastic. In other examples, the portable layer 755 can be a conformable material, such as fabric, foam, or an insulating blanket. The portable layer 755 can be contoured to correspond to any heated surface 12. The plurality of heat sink modules (100, 700) can be attached to the portable layer 755 by any suitable method of adhesion. The heat sink modules (100, 700) can be fluidly connected in series and/or parallel configurations. The portable cooling device 750 can include one or more inlet connections 236 and one or more outlet connections 237 that can be connected to a cooling apparatus 1 that delivers a flow of pressurized coolant 50 to the portable cooling device 750 to permit cooling of the heated surface 12 through sensible and latent heating of the coolant within the plurality of heat sink modules. In some examples, each heat sink module can be mounted on a thermally conductive base member 430. Where the portable layer 755 is made from an insulated blanket or other insulating member, the portable cooling device 750 can be wrapped around a vessel to cool the vessel and its contents. In this example, the portable layer 755 can include suitable fastening devices (e.g. snaps, ties, zippers, Velcro, or magnets) to allow the portable cooling device to be removably attachable to the vessel.

Heat Pipe

In some examples, a heat pipe can be used as the thermally conductive base member 430. The heat pipe can include a sealed casing and a wick, a vapor cavity, and a working fluid within the sealed casing. In some examples, the working fluid can be R134a. During a thermal cycle of the heat pipe, the working fluid evaporates to vapor as it absorbs thermal energy (e.g. from a microprocessor 415 in a server 400). The vapor then migrates along the vapor cavity from a first end of the heat pipe toward a second end of the heat pipe, where the second end is at a lower temperature than the first end. As the vapor migrates toward the second end of the heat pipe, it cools and condenses back to fluid, which is absorbed by the wick. The fluid in the wick then flows back to the first end of the heat pipe due to gravity or capillary action. The thermal cycle then repeats itself.

In some cooling applications, size, shape, or environmental constraints may prevent a heat sink module 100 from being placed directly on a component or device that requires cooling. In these examples, a heat pipe can be used to transfer heat from the component or device to the heat sink module 100 located at a distance from the component or device. For instance, a first portion of the heat pipe can be placed in thermal communication with a heat-providing surface, and the heat sink module 100 can be placed in thermal communication with a second portion of the heat pipe, where the second portion is a distance from the first portion. This approach can allow the heat sink module 100 to efficiently absorb heat from the heat-providing surface without being in direct contact or near the heat-providing surface.

By using one or more heat pipes, a single heat sink module (100, 700) can be used to cool two or more heat sources. In one example, a server 400 can have two microprocessors 415. A first heat pipe can have a first end in thermal communication with a first microprocessor 415 and a second end in thermal communication with a copper base plate 430. A second heat pipe can have a first end in thermal communication with a second microprocessor 415 and a second end in thermal communication with the same copper base plate 430. A heat sink module (100, 700) can be mounted on a surface to be cooled 12 of the copper base plate 430. By circulating a flow of coolant 50 through the heat sink module, and causing jet streams 16 of coolant to impinge the surface to be cooled of the copper base plate 430, the coolant 50 can effectively absorb heat originating from the microprocessors 415 that was transferred through the heat pipes to the thermally conductive base member 430.

The heat pipe can be any suitable heat pipe, such as a heat pipe available from Advanced Cooling Technologies, Inc. located in Lancaster, Pa.

Examples of Heat Sink Modules

In one example, a heat sink module 100 for cooling a heat providing surface 12 can include an inlet chamber formed 145 within the heat sink module and an outlet chamber 150 formed within the heat sink module. The outlet chamber 150 can have an open portion, such as an open surface. The open portion can be enclosed by the heat providing surface 12 to form a sealed chamber when the heat sink module 100 is installed on the heat providing surface 12, as shown in FIG. 26. The heat sink module 100 can include a dividing member 195 disposed between the inlet chamber 145 and the outlet chamber 150. The dividing member 195 can include a first plurality of orifices 155 formed in the dividing member. The first plurality of orifices 155 can extend from a top surface of the dividing member 195 to a bottom surface of the dividing member 195. The first plurality of orifices 155 can be configured to deliver a plurality of jet streams 16 of coolant 50 into the outlet chamber 150 and against the heat-providing surface 12 when the heat sink module 100 is installed on the heat providing surface 12 and when pressurized coolant 50 is delivered to the inlet chamber 145.

A distance between the bottom surface of the dividing member 195 and the heat providing surface 12 can define a jet height 18 of the plurality of orifices 155 when the heat sink module 100 is installed on the heat providing surface 12. The jet height 18 can be about 0.01-0.75, 0.05-0.5, 0.05-0.25, 0.020-0.25, 0.03-0.125, or 0.04-0.08 in.

The first plurality of orifices 155 can have an average diameter of about 0.001-0.020, 0.001-0.2, 0.001-0.150, 0.001-0.120, 0.001-0.005, or 0.030-0.050 in. The first plurality of orifices 155 can have an average diameter of D and an average length of L, and L divided by D can be greater than or equal to one or about 1-10, 1-8, 1-6, 1-4, or 1-3.

The dividing member can have a thickness of about 0.005-0.25, 0.020-0.1, 0.025-0.08, 0.025-0.075, 0.040-0.070, 0.1-0.25, or 0.040-0.070 in. Each orifice of the first plurality of orifices 155 can have a central axis, and the central axes of the first plurality of orifices 155 can be arranged at an angle of about 20-80, 30-60, 40-50, or 45 degrees with respect to the surface to be cooled 12.

The first plurality of orifices 155 can be arranged in an array 76, and the array can be organized into staggered columns 77 and staggered rows 78, as shown in FIG. 31, such that a given orifice 155 in a given column 77 and a given row 78 does not have a corresponding orifice 155 in a neighboring row 78 in the given column 77 or a corresponding orifice in a neighboring column 77 in the given row 78.

The heat sink module 100 can include a second plurality of orifices 156 extending from the inlet chamber 145 to a rear wall of the outlet chamber 150, as shown in FIG. 38. The second plurality of orifices 156 can be configured to deliver a plurality of anti-pooling jet streams of coolant 16 to a rear portion of the outlet chamber 150 when pressurized coolant is provided to the inlet chamber 145. Each orifice of the second plurality of orifices comprises a central axis, wherein the central axes of the second plurality of orifices are arranged at an angle of about 40-80, 50-70, or 60 degrees with respect to the surface to be cooled. The second plurality of orifices 156 can be arranged in a column along the rear wall of the outlet chamber 150.

The heat sink module 100 can include one or more boiling-inducing members 196 extending from the bottom side of the dividing member 195 toward the heat providing surface, wherein the one or more boiling-inducing members 196 are slender members extending from the bottom surface of the dividing member 195. In one example, the one or more boiling-inducing members 196 can be configured to contact the heat providing surface 12. In another example, the one or more boiling-inducing members 196 can be configured to extend toward the heat providing surface 12, but not contact the heat providing surface 12. Instead, a clearance distance can be provided between the ends of the one or more boiling-inducing members 196 and heat providing surface. The clearance distance can be about 0.001-0.0125, 0.001-0.05, 0.001-0.02, 0.001-0.01, or 0.005-0.010 in.

The inlet chamber 145 of the heat sink module 100 can decrease in cross-sectional area in a direction from a front surface 175 of the heat sink module toward a rear surface 180 of the heat sink module, as shown in FIG. 26. The outlet chamber 150 of the heat sink module 100 can increase in cross-sectional area in a direction from a front surface 170 of the heat sink module toward a rear surface 180 of the heat sink module.

The heat sink module 100 can include an inlet port 105 and an inlet passage 165 fluidly connecting the inlet port 105 to the inlet chamber 145. The heat sink module 100 can include an outlet port 110 an outlet passage 166 fluidly connecting the outlet chamber 150 to the outlet port 110. The heat sink module 100 can include a bottom surface 135 and a bottom plane 19 associated with the bottom surface, as shown in FIG. 26. The inlet port 105 can have a central axis 23 that defines an angle (a) of about 10-80, 20-70, 30-60, or 40-50 degrees with respect to the bottom plane 19 of the heat sink module 100. Similarly, the outlet port 110 can have a central axis that defines an angle of about 10-80, 20-70, 30-60, or 40-50 degrees with respect to the bottom plane of the heat sink module.

An additive manufacturing process, such as stereolithography, can be used to manufacture the heat sink module 100. The stereolithography process can include forming layers of material curable in response to synergistic stimulation adjacent to previously formed layers of material and successively curing the layers of material by exposing the layers of material to a pattern of synergistic stimulation corresponding to successive cross-sections of the heat sink module. The material curable in response to synergistic stimulation can be a liquid photopolymer.

Examples of Redundant Heat Sink Modules

In one example, a redundant heat sink module 700 can be configured to transfer heat away from a surface to be cooled 12. The redundant heat sink module 700 can include a first independent coolant pathway 701 and a second independent coolant pathway 701. The first independent coolant pathway 701 can be formed within the redundant heat sink module 700 and can include a first inlet chamber 145-1, a first outlet chamber 150-1, and a first plurality of orifices 155-1 extending from the first inlet chamber 145-1 to the first outlet chamber 150-1. The first plurality of orifices 155-1 can be configured to provide a first plurality of impinging jet streams 16 of coolant 50 against a first region of a surface to be cooled 12 when the redundant heat sink module 700 is mounted on the surface to be cooled 12 and when pressurized coolant is provided to the first inlet chamber 145-1. The second independent coolant pathway 702 can be formed within the redundant heat sink module 700 and can include a second inlet chamber 145-2, a second outlet chamber 150-2, and a second plurality of orifices 155-2 extending from the second inlet chamber 145-2 to the second outlet chamber 150-2. The second plurality of orifices 155-2 can be configured to provide a second plurality of impinging jet streams 16 of coolant against a second region of the surface to be cooled 12 when the redundant heat sink module 700 is mounted on the surface to be cooled 12 and when pressurized coolant is provided to the second inlet chamber 145-2.

The first plurality of orifices 155-1 can have an average jet height 18 of about 0.01-0.75, 0.05-0.5, 0.05-0.25, 0.020-0.25, 0.03-0.125, or 0.04-0.08 in. The first plurality of orifices 155-1 can have an average diameter of D and an average length of L, and L divided by D can be greater than or equal to one or about 1-10, 1-8, 1-6, 1-4, or 1-3. The first plurality of orifices 155-1 have an average diameter of about 0.001-0.020, 0.001-0.2, 0.001-0.150, 0.001-0.120, 0.001-0.005, 0.020-0.045, 0.030-0.050 in, or 0.040 in.

The first inlet chamber 145-1 can decrease in cross-sectional area in a direction of flow 90, and the first outlet chamber 150-1 can increase in cross-sectional area in the direction of flow 90. The second outlet chamber 150-2 can circumscribe or be adjacent to the first outlet chamber 150-1. The first independent coolant pathway 701 can include a hydrofoil 705 located upstream of the first inlet chamber 145-1. The hydrofoil 705 can have a curved surface 706 that interacts with the flow of coolant to assist in providing an even distribution of coolant to the first plurality of orifices, as shown in FIG. 51N. The redundant heat sink module 700 can include a flow-guiding lip 162 proximate an exit of the first outlet chamber, as shown in FIG. 51K. A surface of the flow-guiding lip 162 can have an angle of less than about 45 degrees with respect to a bottom plane of the redundant heat sink module 700.

In another example, a redundant apparatus for cooling a heat source (e.g. a microprocessor 415) can include a thermally conductive base member 430, a redundant heat sink module 700 mounted on the thermally conductive base member 430, and one or more sealing members (125-1, 125-2) disposed between the redundant heat sink module 700 and the thermally conductive base member 430. The thermally conductive base member 430 can be placed in thermal communication with a heat source, such as a microprocessor 415 or a power electronic device. The thermally conductive base member 430 can include a surface to be cooled 12. The redundant heat sink module 700 can include a first independent coolant pathway 701 formed within the redundant heat sink module 700. The first independent coolant pathway 701 can include a first inlet chamber 145-1, a first outlet chamber 150-1, and a first plurality of orifices 155-1 configured to provide a first plurality of impinging jet streams 16 of coolant 50 against a first region of the surface to be cooled 12 when pressurized coolant is provided to the first inlet chamber 145-1. The redundant heat sink module 700 can include a second independent coolant pathway 702 formed within the redundant heat sink module 700. The second independent coolant pathway 702 can include a second inlet chamber 145-2, a second outlet chamber 150-2, and a second plurality of orifices 155-2 configured to provide a second plurality of impinging jet streams 16 of coolant against a second region of the surface to be cooled 12 when pressurized coolant is provided to the second outlet chamber 150-2. The one or more sealing members (125-1, 125-5) can be disposed between a bottom surface 135 of the redundant heat sink module 700 and a surface of the thermally conductive base member 430 to provide a first liquid-tight seal around a perimeter of the first outlet chamber 150-1 and a second liquid-tight seal around a perimeter of the second outlet chamber 150-2.

The second region of the surface to be cooled 12 can circumscribe the first region of the surface to be cooled 12. The thermally conductive base member 430 can be a metallic base plate. The thermally conductive base member 430 can be a heat pipe having a sealed vapor cavity.

In yet another example, a redundant heat sink module 700 for cooling a heat providing surface can include a first independent coolant pathway 701 and a second independent coolant pathway 702. The first independent coolant pathway 701 can include a first inlet chamber 145-1 formed within the redundant heat sink module 700 and a first outlet chamber 150-1 formed within the redundant heat sink module 700. The first outlet chamber 150-1 can have a first open portion configured to be enclosed by the heat providing surface 12 when the redundant heat sink module 700 is sealed against the heat providing surface 12. The first independent coolant pathway 702 can include a first plurality of orifices 155-1 extending from the first inlet chamber 145-1 to the first outlet chamber 150-1. The second independent coolant pathway 702 can include a second inlet chamber 145-2 formed within the redundant heat sink module 700 and a second outlet chamber 150-2 formed within the redundant heat sink module 700. The second outlet chamber 150-2 can have a second open portion configured to be enclosed by the heat providing surface 12 when the redundant heat sink module 700 is sealed against the heat providing surface 12. The second independent coolant pathway 702 can also include a second plurality of orifices 155-2 extending from the second inlet chamber 145-2 to the second outlet chamber 150-2.

The first plurality of orifices 155-1 can be arranged at an angle of about 20-80, 30-60, 40-50, or 45 degrees with respect to a bottom plane 19 of the redundant heat sink module 700. The first plurality of orifices 155-1 can be arranged in an array 76 organized into staggered columns 77 and staggered rows 78 such that a given orifice in a given column and a given row does not have a corresponding orifice in a neighboring row in the given column or a corresponding orifice in a neighboring column in the given row.

The redundant heat sink module 700 can include a plurality of anti-pooling orifices 156-1 extending from the first inlet chamber 145-1 to a rear wall of the first outlet chamber 150-1. The plurality of anti-pooling orifices 156-1 can be configured to deliver a plurality of anti-pooling jet streams 16 of coolant 50 to a rear portion of the first outlet chamber 150-1 when pressurized coolant 50 is provided to the first inlet chamber 145-1. The first inlet chamber 145-1 can have a volume of about 0.01-0.02, 0.01-0.05, 0.04-0.08, 0.07-0.15, 0.1-0.2, 0.15-0.25, 0.2-0.4, 0.3-0.5 in$^3$.

The redundant heat sink module 700 can include one or more boiling-inducing members 196 extending into the first outlet chamber 150-1 toward the heat providing surface 12. A flow clearance 197 can be provided between end portions of the boiling-inducing members 196 and a bottom plane 19 of the redundant heat sink module 700, as shown in FIG. 48. The flow clearance 197 can be about 0.001-0.0125, 0.001-0.05, 0.001-0.02, 0.001-0.01, or 0.005-0.010 in.

The first independent coolant pathway 701 can include an upwardly angled inlet port 105-1 fluidly connected to the first inlet chamber 145-1. The upwardly angled inlet port 145-1 can have a central axis 24 that defines an angle of about 10-80, 20-70, 30-60, or 40-50 degrees with respect to a bottom plane 19 of the redundant heat sink module 700. The redundant heat sink module 700 can include additional upwardly angled ports (105-2, 110-1, 110-2), as shown in FIG. 51A.

An additive manufacturing process, such as stereolithography, can be used to manufacture the heat sink module 700. The stereolithography process can include forming layers of material curable in response to synergistic stimulation adjacent to previously formed layers of material and successively curing the layers of material by exposing the layers of material to a pattern of synergistic stimulation corresponding to successive cross-sections of the heat sink module. The material curable in response to synergistic stimulation can be a liquid photopolymer.

Examples of Methods

In one example, a method of cooling two heat-providing surfaces (12-1, 12-2) within a server 400 using a cooling apparatus 1 having two series-connected heat sink modules (100-1, 100-2) can include providing a flow 51 of single-phase liquid coolant 50 to an inlet port 105-1 of a first heat sink module 100-1 mounted on a first heat-providing surface 12-1 within a server 400. A first amount of heat can be transferred from the first heat-providing surface 12-1 to the single-phase liquid coolant 50 resulting in vaporization of a portion of the single phase liquid coolant 50 thereby changing the flow 51 of single-phase liquid coolant 50 to two-phase bubbly flow containing liquid coolant 50 with vapor coolant dispersed as bubbles 275 in the liquid coolant 50. The two-phase bubbly flow can have a first quality ($x_1$). The method can include transporting the two-phase bubbly flow from an outlet port 110-1 of the first heat sink module 100-1 to an inlet port 105-1 of a second heat sink module 100-2.

The second heat sink module 100-2 can be mounted on a second heat-providing surface 12-2 within the server 400. A second amount of heat can be transferred from the second heat-providing surface 12-2 to the two-phase bubbly flow resulting in vaporization of a portion of the liquid coolant 50 within the two-phase bubbly flow thereby resulting in a change from the first quality ($x_1$) to a second quality ($x_2$). The second quality can be higher than the first quality ($x_2 > x_1$). The energy from the first amount of heat and the second amount of heat can be stored, at least in part, as latent heat in the two-phase bubbly flow and transported out of the server 400 through the cooling apparatus 1. The amount of heat transferred out of the server 400 can be a function of the amount of vapor formed within the two-phase bubbly flow and the heat of vaporization of the coolant.

Providing the flow 51 of single-phase liquid coolant 50 to the inlet port 105-1 of the first heat sink module 100-1 can include providing a flow rate of about 0.1-10, 0.2-5, 0.25-1.5, 0.3-2.5, 0.6-1.2, or 0.8-1.1 liters per minute of single-phase liquid coolant 50 to the first inlet 105-1 of the first heat sink module 100-1. The flow 51 of single-phase liquid coolant 50 can be a dielectric coolant such as, for example, HFE-7000, R-245fa, HFE-7100 or a combination thereof.

Providing the flow 51 of single-phase liquid coolant 50 to the first heat sink module 100-1 can include providing the flow 51 of single-phase liquid coolant 50 at a predetermined temperature and a predetermined pressure, where the predetermined temperature is slightly below the saturation temperature ($T_{sat}$) of the single-phase liquid coolant 50 at the predetermined pressure. The predetermined temperature can be about 0.5-20, 0.5-15, 0.5-10, 0.5-7, 0.5-5, 0.5-3, 0.5-1, 1-20, 1-15, 1-10, 1-7, 1-5, 1-3, 3-20, 3-15, 3-10, 3-7, 3-5, 5-20, 5-15, 5-10, 5-7, 7-20, 7-15, 7-10, 10-20, 10-15, or 15-20 degrees C. below the saturation temperature of the single-phase liquid coolant 50 at the predetermined pressure.

A pressure differential of about 0.5-5.0, 0.5-3, or 1-3 psi can be maintained between the inlet port 105-1 of the first heat sink module 100-1 and the outlet port 110-1 of the first heat sink module 100-1. The pressure differential can be suitable to promote the flow 51 to advance from the inlet port 105-1 of the first heat sink module 100-1 to the outlet port 110-1 of the first heat sink module 100-1.

A saturation temperature ($T_{sat}$, $x_2$) and pressure of the two-phase bubbly flow having a second quality ($x_2$) can be less than a saturation temperature ($T_{sat}$, $x_1$) and pressure of the two-phase flow having a first quality ($x_1$) (as shown in FIG. 14B), thereby allowing the second heat-providing surface 12-2 to be maintained at a lower temperature than the first heat-providing surface 12-1 when a first heat flux from the first heat-providing surface is approximately equal to a second heat flux from the second heat-providing surface.

The first quality ($x_1$) can be about 0-0.1, 0.05-0.15, 0.1-0.2, 0.15-0.25, 0.2-0.3, 0.25-0.35, 0.3-0.4, 0.35-0.45, 0.4-0.5, 0.45-0.55, and the second quality ($x_2$) can be greater than the first quality, such as, for example, 0-0.1, 0.05-0.15, 0.1-0.2, 0.15-0.25, 0.2-0.3, 0.25-0.35, 0.3-0.4, or 0.4-0.45 greater than the first quality.

The liquid component 50 of the two-phase bubbly flow that is transported between the first heat sink module 100-1 and the second heat sink module 100-2 can have a temperature slightly below its saturation temperature. The pressure of the two-phase bubbly flow can be about 0.5-5.0, 0.5-3, or 1-3 psi less than the predetermined pressure of the flow 51 of single-phase liquid coolant 50 provided to the inlet port 105-1 of the first heat sink module 100-1.

The first heat-providing surface 12-1 can be a surface of a microprocessor 415 within the server 400. The first heat-providing surface 12-1 can be a surface of a thermally conductive base member 430 in thermal communication with a microprocessor 415 within the server 400. The thermally conductive base member 430 can be a metallic base plate mounted on the microprocessor 415 using a thermal interface material.

In another example, a method of cooling two or more heat-providing surfaces (12-1, 12-2) using a cooling apparatus 1 having two or more fluidly connected heat sink modules (e.g. 100-1, 100-2) arranged in a series configuration can include providing a flow 51 of single-phase liquid coolant 50 to a first inlet port 105-1 of a first heat sink module 100-1 mounted on a first surface to be cooled 12-1. The flow 51 of single-phase liquid coolant 50 can have a predetermined pressure and a predetermined temperature at the first inlet port 105-1 of the first heat sink module 100-1. The predetermined temperature can be slightly below a saturation temperature of the coolant at the predetermined pressure. The method can include projecting the flow 51 of single-phase liquid coolant 50 against the first heat-providing surface 12-1 within the first heat sink module 100-1, where a first amount of heat is transferred from the first heat-providing surface 12-1 to the flow 51 of single-phase liquid coolant 50 thereby inducing phase change in a portion of the single-phase liquid coolant 50 and thereby changing the flow 51 of single-phase liquid coolant to two-phase bubbly flow containing a liquid coolant 50 and a plurality of vapor bubbles 275 dispersed within the liquid coolant 50. The plurality of vapor bubbles 275 can have a first number density.

The method can include providing a second heat sink module 100-2 mounted on a second heat-providing surface 12-2. The second heat sink module 100-2 can include a second inlet port 105-2 and a second outlet port 110-2. The method can include providing a first section of tubing 225 having a first end connected to the first outlet port 110-1 of the first heat sink module 100-1 and a second end connected to the second inlet port 105-2 of the second heat sink module 100-2. The first section of tubing 225 can transport the two-phase bubbly flow having the first number density of vapor bubbles from the first outlet port 110-1 of the first heat sink module 100-1 to the second inlet port 105-2 of the second heat sink module 100-2. The method can include projecting the two-phase bubbly flow having the first number density against the second heat-providing surface 12-2 within the second heat sink module 100-2, where a second amount of heat is transferred from the second heat-providing surface 12-2 to the two-phase bubbly flow having a first number density and thereby changing two-phase bubbly flow having a first number density to a two-phase bubbly flow having a second number density greater than the first number density.

A saturation temperature and pressure of the two-phase flow having a second number density can be less than a saturation temperature and pressure of the two-phase flow having a first number density, thereby allowing the second heat-providing surface 12-2 to be maintained at a lower temperature than the first heat-providing surface 12-1 when a first heat flux from the first heat-providing surface is approximately equal to a second heat flux from the second heat-providing surface.

The predetermined temperature of the flow 51 of single-phase liquid coolant 50 at the first inlet port 105-1 of the first heat sink module 100-1 can be about 0.5-20, 0.5-15, 0.5-10, 0.5-7, 0.5-5, 0.5-3, 0.5-1, 1-20, 1-15, 1-10, 1-7, 1-5, 1-3, 3-20, 3-15, 3-10, 3-7, 3-5, 5-20, 5-15, 5-10, 5-7, 7-20, 7-15, 7-10, 10-20, 10-15, or 15-20 degrees C. below the saturation temperature of the flow 51 of single-phase liquid coolant 50 at the predetermined pressure of the flow 51 of single-phase liquid coolant at the first inlet of the first heat sink module.

Providing the flow 51 of single-phase liquid coolant 50 to the inlet port 105-1 of the first heat sink module 100-1 can include providing a flow rate of about 0.1-10, 0.2-5, 0.3-2.5, 0.6-1.2, or 0.8-1.1 liters per minute of single-phase liquid coolant 50 to the first inlet port 100-1 of the first heat sink module 100-1.

The liquid in the two-phase bubbly flow being transported between the first heat sink module 100-1 and the second heat sink module 100-2 can have a temperature at or slightly below its saturation temperature, where a pressure of the two-phase bubbly flow having a first number density is about 0.5-5.0, 0.5-3, or 1-3 psi less than the predetermined pressure of the flow 51 of single-phase liquid coolant 50 provided to the first heat sink module 100-1.

The first heat sink module 100-1 can include an inlet chamber 145 formed within the first heat sink module and an outlet chamber 150 formed within the first heat sink module. The outlet chamber 150 can have an open portion enclosed by the first surface to be cooled 12-1 when the first heat sink module 100-1 is mounted on the first surface to be cooled 12-1. The first heat sink module 100-1 can include a plurality of orifices 155 extending from the inlet chamber 145 to the outlet chamber 150. Projecting the flow 51 of single-phase liquid coolant 50 against the first heat-providing surface 12-1 can include projecting a plurality of jet streams 16 of single-phase liquid coolant 50 through the plurality of orifices 155 into the outlet chamber 150 and against the first surface to be cooled 12-1 when the flow 51 of single-phase liquid coolant 50 is provided to the inlet chamber 145 from the first inlet port 105-1 of the first heat sink module 100-1. The first plurality of orifices 155 can have an average diameter of about 0.001-0.020, 0.001-0.2, 0.001-0.150, 0.001-0.120, 0.001-0.005, or 0.030-0.050 inches. Outlets of the plurality of orifices 155 can be arranged at a jet height 18 from the first surface to be cooled 12-1. The jet height 18 can be about 0.01-0.75, 0.05-0.5, 0.05-0.25, 0.020-0.25, 0.03-0.125, or 0.04-0.08 inches. At least one of the orifices 155 can have a central axis 74 arranged at an angle of about 30-60, 40-50, or 45 degrees with respect to the first surface to be cooled 12-1.

In another example, a method of cooling two microprocessors 415 on a motherboard 405 using a two-phase cooling apparatus 1 having two series-connected heat sink modules (100-1, 100-2) can include providing a flow 51 of single-phase liquid coolant 50 to an inlet port 105 of a first heat sink module 100-1 mounted on a first thermally conductive base member 430. The first thermally conductive base member 430 can be mounted on a first microprocessor 415 mounted on a motherboard 405, where heat is transferred from the first microprocessor 415 through the first thermally conductive base member 430 and to the flow 51 of single-phase liquid coolant 50 resulting in boiling of a first portion of the single-phase liquid coolant 50, thereby changing the flow 51 of single-phase liquid coolant 50 to two-phase bubbly flow having a first quality ($x_1$). The method can include transporting the two-phase bubbly flow from an outlet port 110 of the first heat sink module 100-1 to an inlet port 105 of a second heat sink module 100-2 through flexible tubing 225. The second heat sink module 100-2 can be mounted on a second thermally conductive base member 430 that is mounted on a second microprocessor 415 mounted on the motherboard 405. Heat can be transferred from the second microprocessor 415 through the second thermally conductive base member 430 and to the two-phase bubbly flow resulting in vaporization of a portion of liquid coolant 50 within the two-phase bubbly flow thereby resulting in a change from the first quality ($x_1$) to a second quality ($x_1$), the second quality being higher than the first quality (i.e. $x_2$ $x_1$).

The elements and method steps described herein can be used in any combination whether explicitly described or not. All combinations of method steps as described herein can be performed in any order, unless otherwise specified or clearly implied to the contrary by the context in which the referenced combination is made.

As used herein, the singular forms "a," "an," and "the" include plural referents unless the content clearly dictates otherwise.

Numerical ranges as used herein are intended to include every number and subset of numbers contained within that range, whether specifically disclosed or not. Further, these numerical ranges should be construed as providing support for a claim directed to any number or subset of numbers in that range. For example, a disclosure of from 1 to 10 should be construed as supporting a range of from 2 to 8, from 3 to 7, from 5 to 6, from 1 to 9, from 3.6 to 4.6, from 3.5 to 9.9, and so forth.

All patents, patent publications, and peer-reviewed publications (i.e., "references") cited herein are expressly incorporated by reference to the same extent as if each individual reference were specifically and individually indicated as being incorporated by reference. In case of conflict between the present disclosure and the incorporated references, the present disclosure controls.

The methods and compositions of the present invention can comprise, consist of, or consist essentially of the essential elements and limitations described herein, as well as any additional or optional steps, components, or limitations described herein or otherwise useful in the art.

It is understood that the invention is not confined to the particular construction and arrangement of parts herein illustrated and described, but embraces such modified forms thereof as come within the scope of the claims.

Several impingement technologies exist, but few have shown commercial promise and none have gained wide-scale commercial acceptance to date due to instability issues, relatively high flow rate requirements, limitations on scalability, and other shortcomings.

An improved heat sink module with one or more arrays of impinging jet streams 16 has been developed and is described herein. The heat sink modules can be connected in series and/or parallel configurations to cool a plurality of heat sources 12 simultaneously, thereby providing a scalable jet impingement technology. Importantly, the heat sink modules described herein are compact and easy to package within new and existing server housings and personal computer housings. The heat sink modules can also be easily packaged in a wide variety of other electrical or mechanical devices that require a highly energy efficient and scalable cooling apparatus 1.

The foregoing description has been presented for purposes of illustration and description. It is not intended to be exhaustive or to limit the claims to the embodiments disclosed. Other modifications and variations may be possible in view of the above teachings. The embodiments were chosen and described to explain the principles of the invention and its practical application to enable others skilled in the art to best utilize the invention in various embodiments and various modifications as are suited to the particular use contemplated. It is intended that the claims be construed to include other alternative embodiments of the invention except insofar as limited by the prior art.

What is claimed is:

1. A redundant heat sink module for transferring heat away from a surface to be cooled, the redundant heat sink module comprising:
    a first independent coolant pathway formed within the redundant heat sink module, the first independent coolant pathway comprising: a first inlet chamber; a first outlet chamber; and a first plurality of orifices extending from the first inlet chamber to the first outlet chamber, the first plurality of orifices configured to provide a first plurality of impinging jet streams of coolant against a first region of a surface to be cooled when the redundant heat sink module is mounted on the surface to be cooled and when pressurized coolant is provided to the first inlet chamber; and
    a second independent coolant pathway formed within the redundant heat sink module, the second independent coolant pathway comprising: a second inlet chamber; a second outlet chamber; and a second plurality of orifices extending from the second inlet chamber to the second outlet chamber, the second plurality of orifices configured to provide a second plurality of impinging jet streams of coolant against a second region of the surface to be cooled when the redundant heat sink module is mounted on the surface to be cooled and when pressurized coolant is provided to the second inlet chamber, wherein the second outlet chamber circumscribes the first outlet chamber.

2. The redundant heat sink module of claim 1, wherein the first plurality of orifices have an average jet height of about 0.01-0.75, 0.05-0.5, 0.05-0.25, 0.020-0.25, 0.03-0.125, or 0.04-0.08 in.

3. The redundant heat sink module of claim 1, wherein the first plurality of orifices have an average diameter of about 0.001-0.020, 0.001-0.2, 0.001-0.150, 0.001-0.120, 0.001-0.005, 0.020-0.045, 0.030-0.050 in, or 0.040 in.

4. The redundant heat sink module of claim 1, wherein the first coolant pathway comprises a hydrofoil located upstream of the first inlet chamber, the hydrofoil comprising a curved surface.

5. The redundant heat sink module of claim 1, wherein the first outlet chamber is adjacent to the second outlet chamber.

6. The redundant heat sink module of claim 1, wherein the first inlet chamber decreases in cross-sectional area in a direction of flow, and wherein the first outlet chamber increases in cross-sectional area in the direction of flow.

7. The redundant heat sink module of claim 1, further comprising a flow-guiding lip proximate an exit of the first outlet chamber, the flow-guiding lip comprising a surface having an angle of less than about 45 degrees with respect to a bottom plane of the redundant heat sink module.

8. The redundant heat sink module of claim 1, wherein the first plurality of orifices have an average diameter of D and an average length of L, and wherein L divided by D is greater than or equal to one or about 1-10, 1-8, 1-6, 1-4, or 1-3.

9. A redundant apparatus for cooling a heat source, the redundant apparatus comprising:
    a thermally conductive base member configured to be placed in thermal communication with the heat source, the thermally conductive base member comprising a surface to be cooled;
    a redundant heat sink module mounted on the thermally conductive base member, the redundant heat sink module comprising:
    a first independent coolant pathway formed within the redundant heat sink module, the first independent coolant pathway comprising: a first inlet chamber; a first outlet chamber; and a first plurality of orifices configured to provide a first plurality of impinging jet streams of coolant against a first region of the surface to be cooled when pressurized coolant is provided to the first inlet chamber; and a second independent coolant pathway formed within the redundant heat sink module, the second independent coolant pathway comprising: a second inlet chamber; a second outlet chamber; and a second plurality of orifices configured to provide a second plurality of impinging jet streams of coolant against a second region of the surface to be cooled when pressurized coolant is provided to the second outlet chamber; and one or more sealing members disposed between a bottom surface of the redundant heat sink module and a surface of the thermally conductive base member to provide a first liquid-tight seal around a perimeter of the first outlet chamber and a second liquid-tight seal around a perimeter of the second outlet chamber, wherein the second region of the surface to be cooled circumscribes the first region of the surface to be cooled.

10. The apparatus of claim 9, wherein the thermally conductive base member is a metallic base plate.

11. The apparatus of claim 9, wherein the thermally conductive base member is a heat pipe comprising a sealed vapor cavity.

12. A redundant heat sink module for cooling a heat providing surface, the heat sink module comprising:
- a first independent coolant pathway, comprising: a first inlet chamber formed within the redundant heat sink module; a first outlet chamber formed within the redundant heat sink module, the first outlet chamber having a first open portion, the first open portion configured to be enclosed by the heat providing surface when the redundant heat sink module is sealed against the heat providing surface; and a first plurality of orifices extending from the first inlet chamber to the first outlet chamber;
- a second independent coolant pathway, comprising: a second inlet chamber formed within the redundant heat sink module; a second outlet chamber formed within the redundant heat sink module, the second outlet chamber having a second open portion, the second open portion configured to be enclosed by the heat providing surface when the redundant heat sink module is sealed against the heat providing surface; and a second plurality of orifices extending from the second inlet chamber to the second outlet chamber; and
- a plurality of anti-pooling orifices extending from the first inlet chamber to a rear wall of the first outlet chamber, the plurality of anti-pooling orifices configured to deliver a plurality of anti-pooling jet streams of coolant to a rear portion of the first outlet chamber when pressurized coolant is provided to the first inlet chamber.

13. The redundant heat sink module of claim 12, wherein the first plurality of orifices are arranged at an angle of about 20-80, 30-60, 40-50, or 45 degrees with respect to a bottom plane of the redundant heat sink module.

14. The redundant heat sink module of claim 12, wherein the first plurality of orifices are arranged in an array, the array being organized into staggered columns and staggered rows such that a given orifice in a given column and a given row does not have a corresponding orifice in a neighboring row in the given column or a corresponding orifice in a neighboring column in the given row.

15. The redundant heat sink module of claim 12, further comprising one or more boiling-inducing members extending into the first outlet chamber toward the heat providing surface, wherein a flow clearance between end portions of the boiling-inducing members and a bottom plane of the redundant heat sink module is about 0.001-0.0125, 0.001-0.05, 0.001-0.02, 0.001-0.01, or 0.005-0.010 in.

16. The redundant heat sink module of claim 12, wherein the first independent coolant pathway further comprises an upwardly angled inlet port fluidly connected to the first inlet chamber, wherein the upwardly angled inlet port has a central axis that defines an angle of about 10-80, 20-70, 30-60, or 40-50 degrees with respect to a bottom plane of the redundant heat sink module.

17. The redundant heat sink module of claim 12, wherein the first inlet chamber has a volume of about 0.01-0.02, 0.01-0.05, 0.04-0.08, 0.07-0.15, 0.1-0.2, 0.15-0.25, 0.2-0.4, 0.3-0.5 $in^3$.

* * * * *